(12) United States Patent
Jiang et al.

(10) Patent No.: US 10,487,987 B2
(45) Date of Patent: Nov. 26, 2019

(54) LED FILAMENT

(71) Applicant: ZHEJIANG SUPER LIGHTING ELECTRIC APPLIANCE CO., LTD, Jinyun (CN)

(72) Inventors: Tao Jiang, Jiaxing (CN); Liqin Li, Jiaxing (CN)

(73) Assignee: ZHEJIANG SUPER LIGHTING ELECTRIC APPLIANCE CO., LTD., Jinyun (CN)

(*) Notice: Subject to any disclaimer, the term of this patent is extended or adjusted under 35 U.S.C. 154(b) by 65 days.

(21) Appl. No.: 15/384,311

(22) Filed: Dec. 19, 2016

(65) Prior Publication Data
US 2017/0130906 A1 May 11, 2017

Related U.S. Application Data

(63) Continuation-in-part of application No. 15/366,535, filed on Dec. 1, 2016, and a continuation-in-part of application No. 15/237,983, filed on Aug. 16, 2016.

(30) Foreign Application Priority Data

Aug. 17, 2015 (CN) .......................... 2015 1 0502630
Dec. 19, 2015 (CN) .......................... 2015 1 0966906
(Continued)

(51) Int. Cl.
F21K 9/232 (2016.01)
H01L 33/62 (2010.01)
(Continued)

(52) U.S. Cl.
CPC .............. *F21K 9/232* (2016.08); *F21K 9/238* (2016.08); *F21V 3/02* (2013.01); *H01L 33/62* (2013.01);
(Continued)

(58) Field of Classification Search
CPC ....... F21K 9/64; F21K 9/232; H01L 25/6753; F21Y 2101/50
See application file for complete search history.

(56) References Cited

U.S. PATENT DOCUMENTS 8,455,895 B2 6/2013 Chai et al.
9,016,900 B2 4/2015 Takeuchi et al.
(Continued)

FOREIGN PATENT DOCUMENTS

CN 101834263 A 9/2010
CN 102364710 A 2/2012
(Continued)

*Primary Examiner* — Sean P Gramling
(74) *Attorney, Agent, or Firm* — Im IP Law; C. Andrew Im; Cha Im

(57) ABSTRACT

An LED filament configured to emit omnidirectional light includes a linear array of LED chips operably interconnected to emit light upon energization and a conductive electrode. The linear array of LED chips is electrically connected with the conductive electrode. A light conversion coating encloses the linear array of the LED chip and the conductive electrode. The light conversion layer includes a top layer and a base layer conformally interconnected to form a unitary enclosure. The top layer is coated on a first side of the linear array of LED chips and the conductive electrode. The base layer is coated on a second side of the linear array of LED chips and the conductive electrode.

18 Claims, 93 Drawing Sheets

(30) Foreign Application Priority Data

| Jan. 22, 2016 | (CN) | 2016 1 0041667 |
|---|---|---|
| Apr. 27, 2016 | (CN) | 2016 1 0272153 |
| Apr. 29, 2016 | (CN) | 2016 1 0281600 |
| Jun. 3, 2016 | (CN) | 2016 1 0394610 |
| Jul. 7, 2016 | (CN) | 2016 1 0544049 |
| Jul. 22, 2016 | (CN) | 2016 1 0586388 |
| Nov. 1, 2016 | (CN) | 2016 1 0936171 |
| Dec. 6, 2016 | (CN) | 2016 1 1108722 |

(51) Int. Cl.

| *F21V 3/02* | (2006.01) |
|---|---|
| *F21K 9/238* | (2016.01) |
| *H01L 25/075* | (2006.01) |
| *F21Y 115/10* | (2016.01) |
| *F21V 3/06* | (2018.01) |
| *F21Y 107/50* | (2016.01) |
| *F21K 9/90* | (2016.01) |
| *F21V 19/00* | (2006.01) |
| *F21Y 103/33* | (2016.01) |
| *F21Y 103/37* | (2016.01) |
| *F21Y 107/00* | (2016.01) |

(52) U.S. Cl.
CPC .............. *F21K 9/90* (2013.01); *F21V 3/061* (2018.02); *F21V 3/062* (2018.02); *F21V 19/003* (2013.01); *F21Y 2103/33* (2016.08); *F21Y 2103/37* (2016.08); *F21Y 2107/00* (2016.08); *F21Y 2107/50* (2016.08); *F21Y 2115/10* (2016.08); *H01L 25/0753* (2013.01); *H01L 2224/48091* (2013.01); *H01L 2924/19107* (2013.01)

(56) References Cited

U.S. PATENT DOCUMENTS

| D761,216 | S | 7/2016 | Jiang |
|---|---|---|---|
| 9,447,929 | B2 | 9/2016 | Jiang |
| D768,891 | S | 10/2016 | Jiang et al. |
| 9,761,765 | B2 | 9/2017 | Basin et al. |
| 9,982,854 | B2 | 5/2018 | Ma et al. |
| 2004/0008525 | A1 | 1/2004 | Shibata |
| 2013/0058080 | A1 | 3/2013 | Ge et al. |
| 2013/0235592 | A1 | 9/2013 | Takeuchi et al. |
| 2013/0293098 | A1 | 11/2013 | Li et al. |
| 2014/0268779 | A1* | 9/2014 | Sorensen ............... F21K 9/232 362/249.06 |
| 2014/0369036 | A1 | 12/2014 | Feng |
| 2015/0069442 | A1 | 3/2015 | Liu et al. |
| 2015/0070871 | A1 | 3/2015 | Chen et al. |
| 2015/0255440 | A1 | 9/2015 | Hsieh |
| 2016/0091147 | A1 | 3/2016 | Jiang et al. |
| 2016/0091156 | A1 | 3/2016 | Li et al. |
| 2016/0091179 | A1 | 3/2016 | Jiang et al. |
| 2016/0102813 | A1 | 4/2016 | Ye et al. |
| 2016/0178135 | A1 | 6/2016 | Xu et al. |
| 2016/0178137 | A1 | 6/2016 | Jiang |
| 2016/0178138 | A1 | 6/2016 | Jiang |
| 2016/0198535 | A1 | 7/2016 | Ye et al. |
| 2016/0212809 | A1 | 7/2016 | Xiong et al. |
| 2016/0215936 | A1 | 7/2016 | Jiang |
| 2016/0215937 | A1 | 7/2016 | Jiang |
| 2016/0219658 | A1 | 7/2016 | Xiong et al. |
| 2016/0219666 | A1 | 7/2016 | Xiong et al. |
| 2016/0219672 | A1 | 7/2016 | Liu |
| 2016/0223180 | A1 | 8/2016 | Jiang |
| 2016/0223182 | A1 | 8/2016 | Jiang |
| 2016/0229621 | A1 | 8/2016 | Jiang et al. |
| 2016/0255694 | A1 | 9/2016 | Jiang et al. |
| 2016/0255699 | A1 | 9/2016 | Ye et al. |
| 2016/0270163 | A1 | 9/2016 | Hu et al. |
| 2016/0270164 | A1 | 9/2016 | Xiong et al. |
| 2016/0270165 | A1 | 9/2016 | Xiong et al. |
| 2016/0270166 | A1 | 9/2016 | Xiong et al. |
| 2016/0270173 | A1 | 9/2016 | Xiong |
| 2016/0270184 | A1 | 9/2016 | Xiong et al. |
| 2016/0290566 | A1 | 10/2016 | Jiang et al. |
| 2016/0290567 | A1 | 10/2016 | Jiang et al. |
| 2016/0290568 | A1 | 10/2016 | Jiang et al. |
| 2016/0290569 | A1 | 10/2016 | Jiang et al. |
| 2016/0290570 | A1 | 10/2016 | Jiang et al. |
| 2016/0290598 | A1 | 10/2016 | Jiang |
| 2016/0290609 | A1 | 10/2016 | Jiang et al. |
| 2016/0295706 | A1 | 10/2016 | Jiang |
| 2016/0309550 | A1 | 10/2016 | Xiong et al. |
| 2016/0323948 | A1 | 11/2016 | Xiong et al. |
| 2016/0341414 | A1 | 11/2016 | Jiang |
| 2016/0363267 | A1 | 12/2016 | Jiang et al. |
| 2017/0012177 | A1 | 1/2017 | Trottier |
| 2017/0051878 | A1 | 2/2017 | Jiang et al. |
| 2017/0074462 | A1 | 3/2017 | Jiang et al. |
| 2017/0084809 | A1 | 3/2017 | Jiang et al. |
| 2017/0130906 | A1 | 5/2017 | Jiang et al. |

FOREIGN PATENT DOCUMENTS

| CN | 206973307 U | 2/2012 |
|---|---|---|
| CN | 202252991 | 5/2012 |
| CN | 102751274 A | 10/2012 |
| CN | 103123949 A | 5/2013 |
| CN | 102751274 A | 10/2013 |
| CN | 203240337 | 10/2013 |
| CN | 203367275 U | 12/2013 |
| CN | 203384761 | 1/2014 |
| CN | 203413396 | 1/2014 |
| CN | 103560128 | 2/2014 |
| CN | 203453866 | 2/2014 |
| CN | 203585876 | 5/2014 |
| CN | 203628391 | 6/2014 |
| CN | 103939758 A | 7/2014 |
| CN | 103972364 A | 8/2014 |
| CN | 103994349 A | 8/2014 |
| CN | 104319345 A | 1/2015 |
| CN | 204083941 | 1/2015 |
| CN | 104456165 | 3/2015 |
| CN | 204289439 U | 4/2015 |
| CN | 104600174 | 5/2015 |
| CN | 204387765 U | 6/2015 |
| CN | 204678100 | 9/2015 |
| CN | 105140381 | 12/2015 |
| CN | 105161608 A | 12/2015 |
| CN | 105371243 | 3/2016 |
| CN | 105609621 A | 5/2016 |
| CN | 207034659 U | 2/2018 |
| CN | 108039402 A | 5/2018 |
| CN | 105090782 B | 7/2018 |
| CN | 105098032 A | 7/2018 |
| EP | 2760057 A1 | 7/2014 |
| GB | 2547085 A | 8/2017 |
| JP | 3075689 | 2/2001 |
| WO | 2011137662 A1 | 11/2011 |
| WO | 2014167458 A1 | 10/2014 |
| WO | 2017037010 A1 | 3/2017 |

* cited by examiner

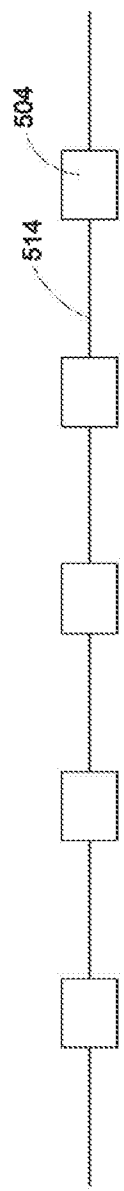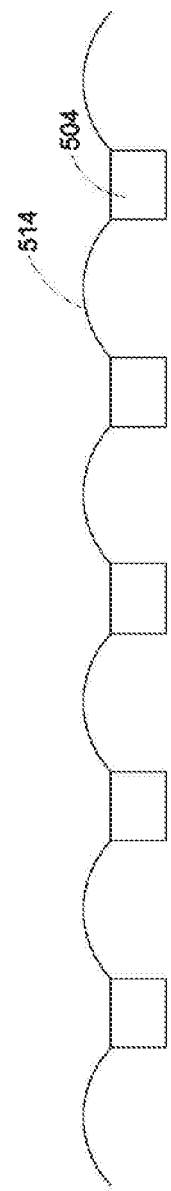

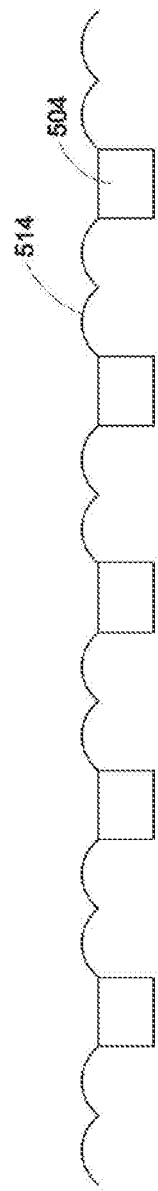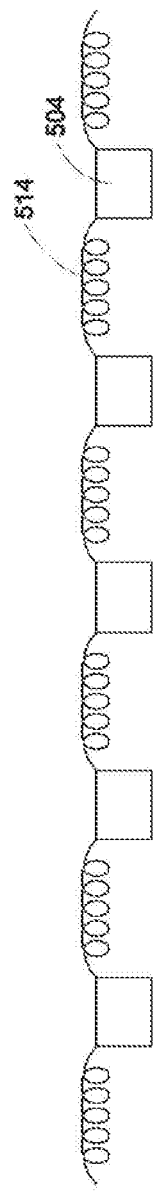

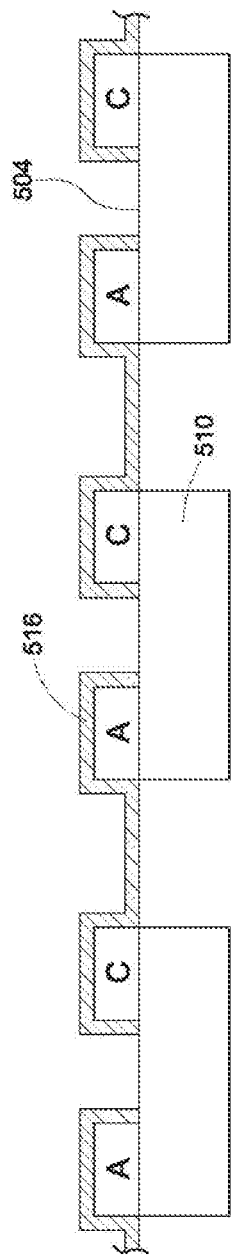
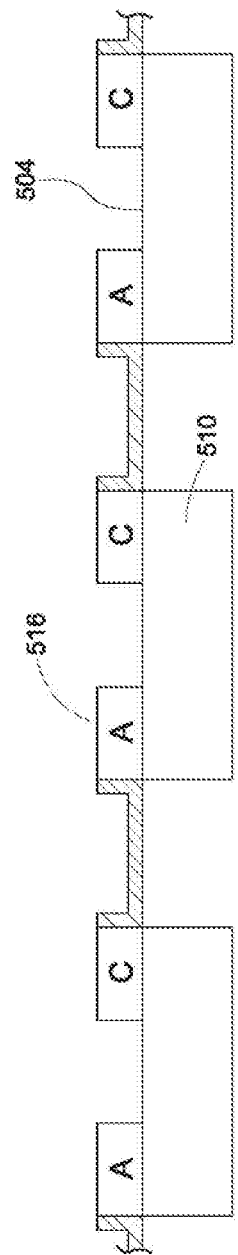
FIG.8A
FIG.8B

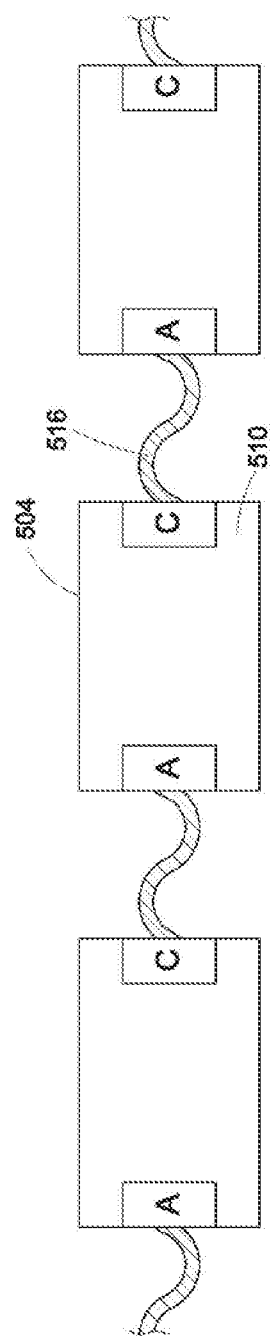
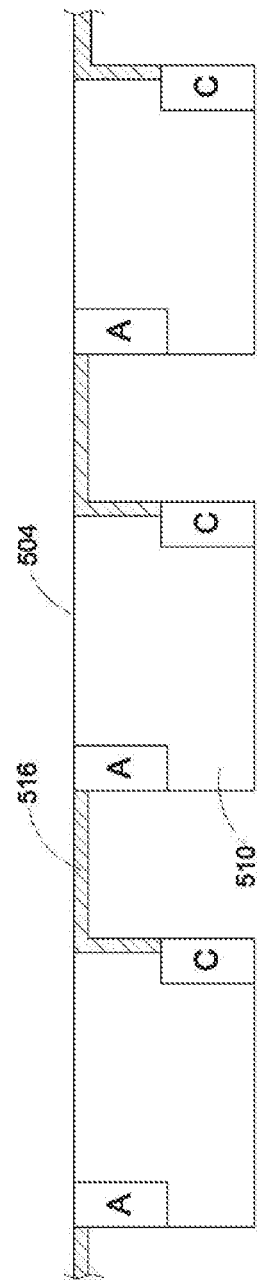

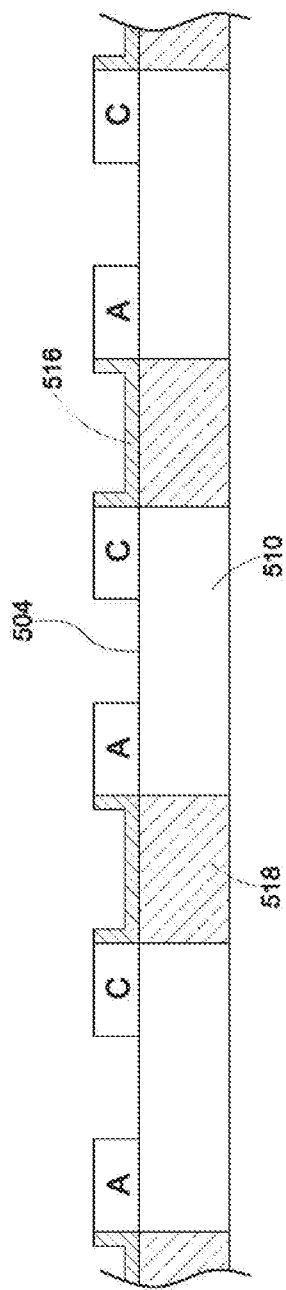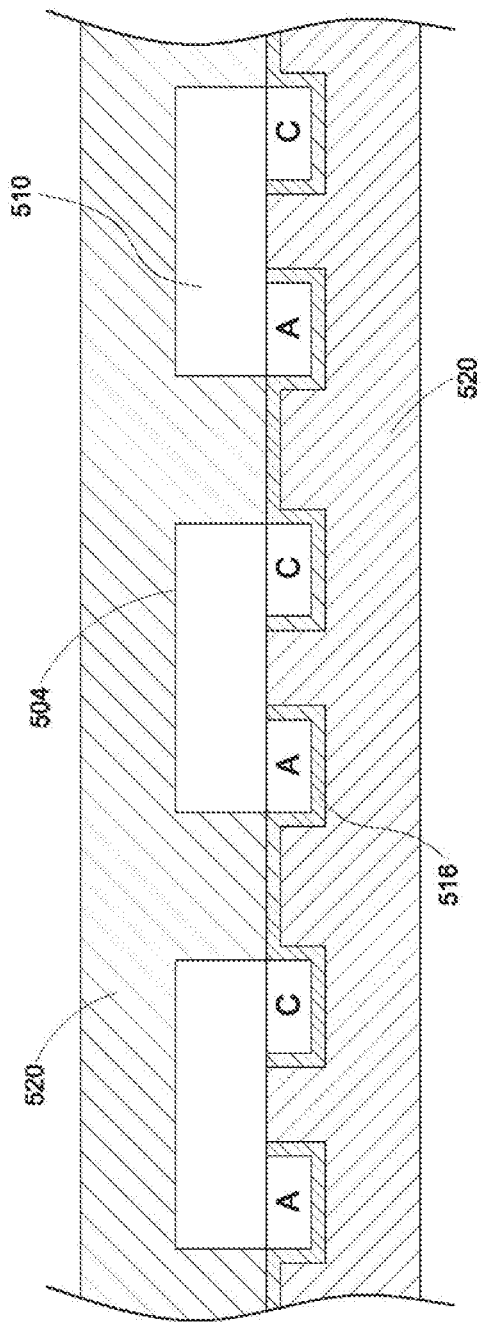
FIG. 8E
FIG. 8F

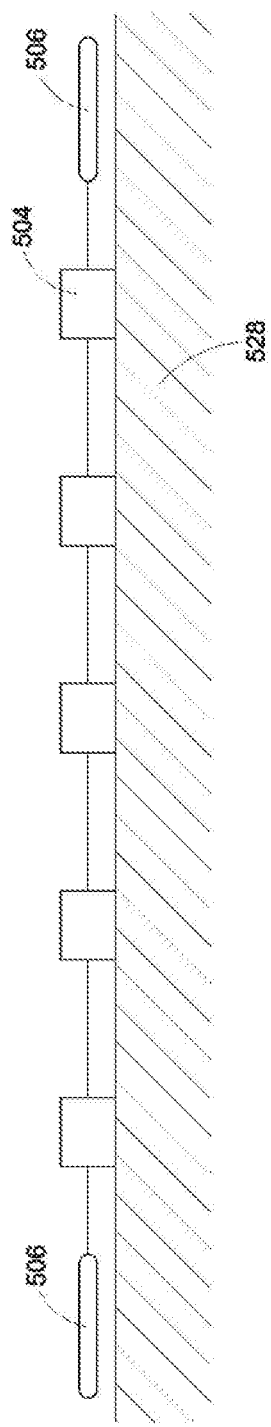
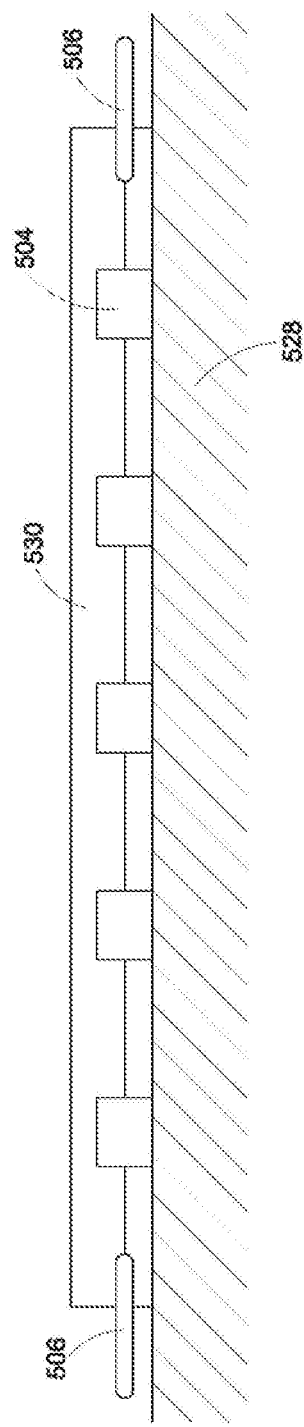
FIG.10A
FIG.10B

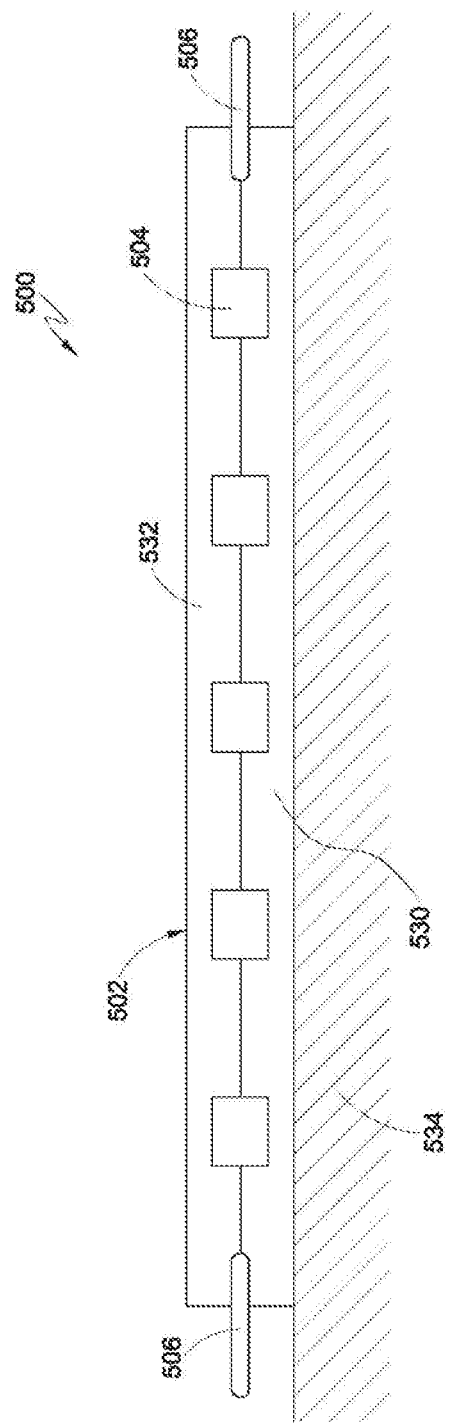

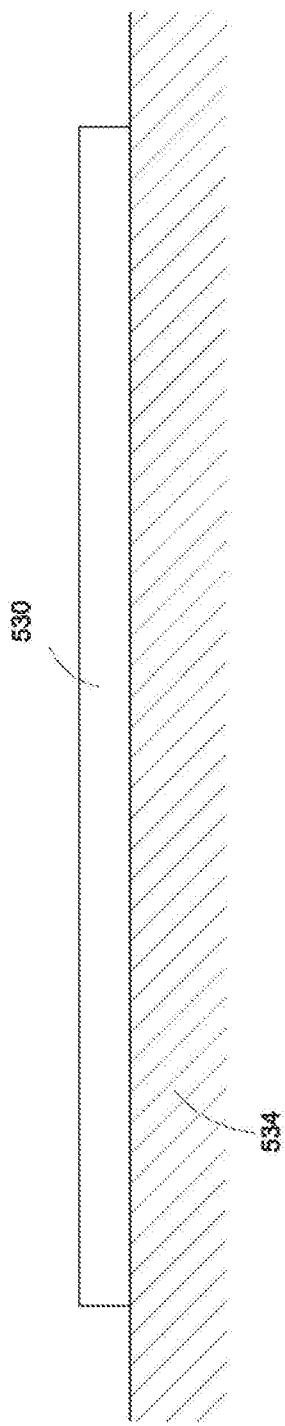
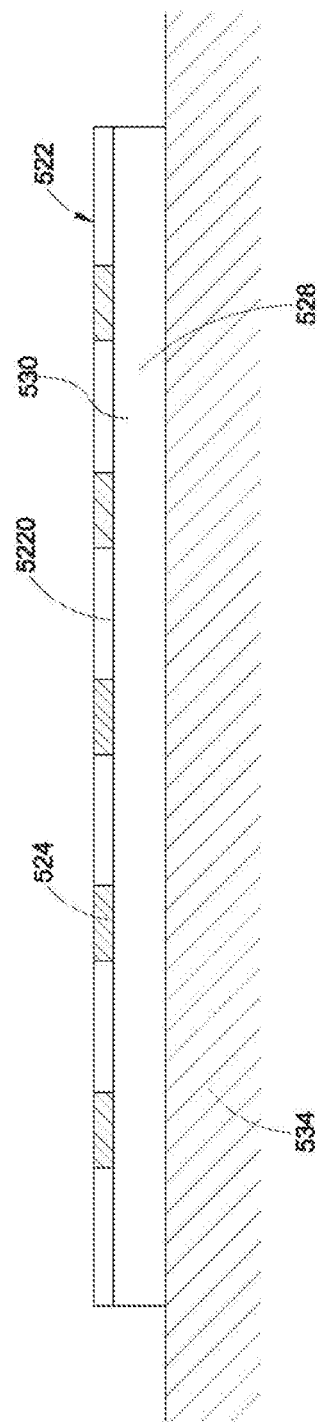
FIG.12A
FIG.12B

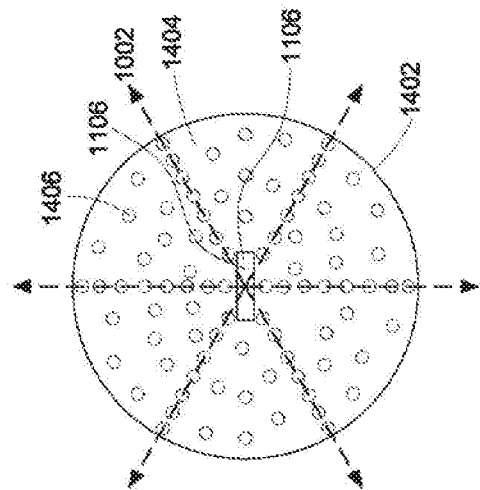
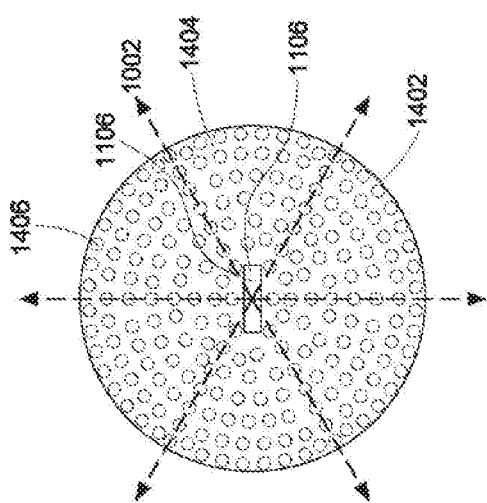
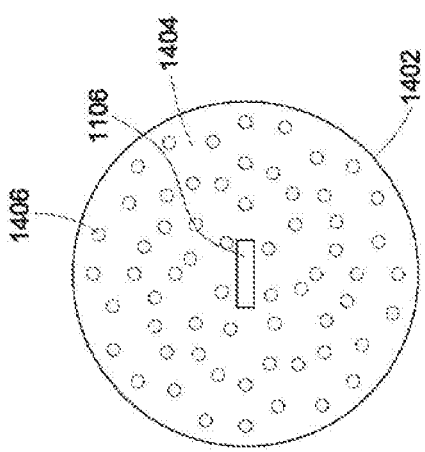
FIG.30C
FIG.30B
FIG.30A

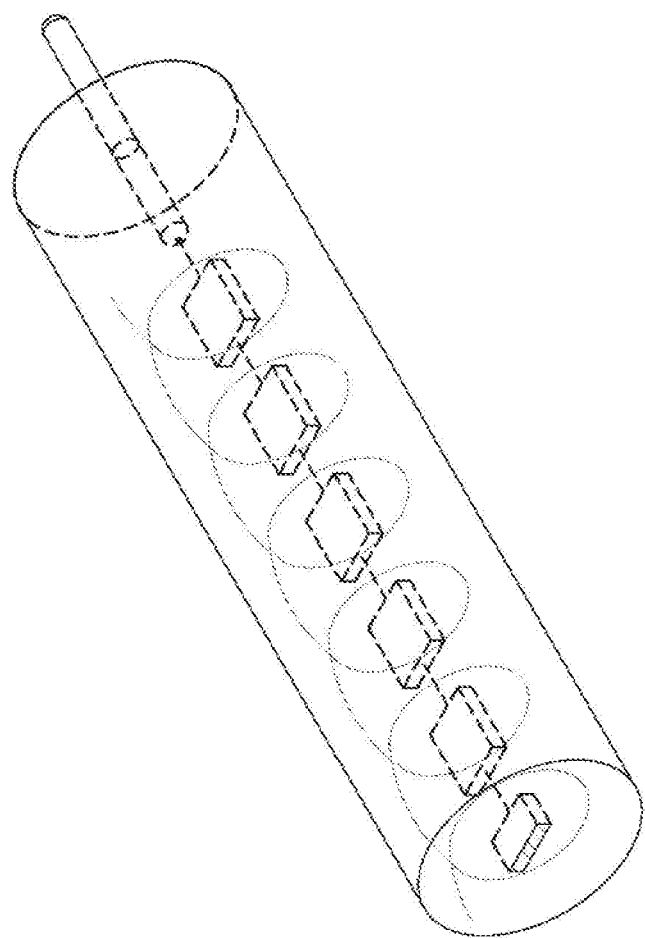

ically prone to be wasted. The bulb further includes a
LED FILAMENT

RELATED APPLICATIONS

The present application claims priority to CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016, CN201610936171.4 filed Nov. 1, 2016 and CN201611108722.4 filed Dec. 6, 2016, each of which is incorporated herein by reference in its entirety.

The present application is a continuation-in-part application of U.S. Ser. No. 15/366,535 filed Dec. 1, 2016, which claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016 and CN201610936171.4 filed Nov. 1, 2016, and which is a continuation-in-part application of U.S. Ser. No. 15/237,983 filed Aug. 16, 2016, which claims priority to CN201510502630.3 filed Aug. 17, 2015, CN201510966906.3 filed Dec. 19, 2015, CN201610041667.5 filed Jan. 22, 2016, CN201610272153.0 filed Apr. 27, 2016, CN201610281600.9 filed Apr. 29, 2016, CN201610394610.3 filed Jun. 3, 2016 and CN201610586388.7 filed Jul. 22, 2016, each of which is incorporated herein by reference in its entirety.

FIELD OF THE INVENTION

The present invention relates to LED luminaries. More particularly, this invention describes an LED filament for LED light bulbs.

BACKGROUND OF THE INVENTION

Incandescent light bulbs are a source of electric light that creates light by running electricity through a resistive filament, thereby heating the filament to a very high temperature, so that it glows and produces visible light. Incandescent bulbs are made in a wide range of sizes and voltages, from 1.5 volts to about 300 volts. The bulbs consist of a generally glass or plastic enclosure with a filament of tungsten wire inside the bulb through which an electrical current is passed. Incandescent lamps are designed as direct "plug-in" components that mate with a lampholder via a threaded Edison base connector (sometimes referred to as an "Edison base" in the context of an incandescent light bulb), a bayonet-type base connector (i.e., bayonet base in the case of an incandescent light bulb), or other standard base connector to receive standard electrical power (e.g., 120 volts A.C., 60 Hz in the United States, or 230V A.C., 50 Hz in Europe, or 12 or 24 or other D.C. voltage). The base provides electrical connections to the filament. Usually a stem or glass mount anchors to the base, allowing the electrical contacts to run through the envelope without gas or air leaks.

Incandescent light bulbs are widely used in household and commercial lighting, for portable lighting, such as table lamps, car headlamps, flashlights, and for decorative and advertising lighting. However, incandescent light bulbs are generally inefficient in terms of energy use and are subject to frequent replacement due to their limited lifetime (about 1,000 hours). Approximately 90% of the energy input is emitted as heat. These lamps are gradually being replaced by other, more efficient types of electric light such as fluorescent lamps, high-intensity discharge lamps, light emitting diodes (LEDs), etc. For the same energy input, these technologies give more visible light and generate much less heat. Particularly, LEDs consume a fraction of the energy used to illuminate incandescent bulbs and have a much longer lifetime (e.g. 50,000 to 75,000 hours). Furthermore, LED light sources are a very clean "green" light source and also provide good color reproduction.

LED light bulbs are far more efficient than traditional incandescent lamps, most notably because they use only a small fraction of the electricity of an incandescent. As traditional incandescent bulbs continue to be phased out, LED has become the mainstream light sources used on a variety of indoor and outdoor lighting fixtures. However, traditional LED light bulbs are not without its disadvantages, for example, the complicated designs which incorporate the heavy aluminum heat sinks and an electronic circuit for power conversion. Consequently, the cost is high and the shape is somewhat strange compared with the elegant incandescent bulbs people are accustomed to.

An LED filament bulb is a light bulb that uses LEDs as its filaments. Accordingly, it is desirable to provide a novel LED filament light bulb with improved performance and aesthetics that may be used as a better replacement for a typical incandescent light bulb than traditional LED light bulbs.

OBJECTS AND SUMMARY OF THE INVENTION

It is an object of the present invention that light is emitted from one or more LED filaments uniformly and evenly in all directions, instead of beaming in a direction while leaving everywhere else dark the way that many traditional LED light bulbs do. Thus, the LED filament light bulb features a close resemblance with the traditional incandescent bulb. Desirably, the visually unpleasant aluminum die cast for heat dissipation in traditional LED light bulbs is no longer required in the LED filament light bulb. Thus, the LED filament light bulb is perfect for homes, hotels, restaurants, bars and places where classic style and appearance is critical. Desirably, all electronics of the LED filament light bulb is nestled inside the light bulb which is almost not visible. Desirably, light produced by the LED filament light bulb is similar to natural light. It does not have any infrared or ultraviolet radiation and it is uniform and soft on the eyes. After the regulations that banned the sale of the traditional light bulbs, many homeowners could not put in compact fluorescent bulbs or other bogus LED lights into most of these old fixtures and chandeliers. Desirably, the LED filament light bulb fits well into all the lighting fixtures that used the outdated incandescent light bulbs. Desirably, the LED filament light bulb makes it easy to reuse these old and attractive lighting fixtures. Desirably, the LED filament light bulb have remarkable energy efficiency. Desirably, the LED filament has a long service life. This extended lifespan is enhanced by a constant current source that ensures stability of parameters and prolongs the life of the light bulb. Hence, the cost of investing in these bulbs will provide cost savings for up to a few decades in some cases. Desirably, the LED filament light bulb can be placed in places where dimming of lights is necessary. The LED filament light bulb gives off a warm inviting golden soft glow when used in table lamps or as accent lights. The LED filament light bulb is perfect for creating a very pleasant atmosphere in sitting rooms or bedrooms.

Therefore, it is an object of the claimed invention to provide a significantly improved LED filament for using with an LED light bulb. In accordance with an embodiment with the present invention, the LED filament configured for emitting omnidirectional light, comprising: a linear array of LED chips operably interconnected to emit light upon energization; a conductive electrode; the linear array of LED chips is electrically connected with the conductive electrode; and a light conversion coating enclosing the linear array of the LED chip and the conductive electrode, wherein: the light conversion layer includes a top layer and a base layer conformally interconnected to form a unitary enclosure; the top layer is coated on a first side of the linear array of LED chips and the conductive electrode; and the base layer is coated on a second side of the linear array of LED chips and the conductive electrode.

In accordance with an embodiment with the present invention, the linear array of LED chips and the conductive electrode interpose the base layer and the top layer.

In accordance with an embodiment with the present invention, the base layer is harder than the top layer.

In accordance with an embodiment with the present invention, the top layer includes at least one of a phosphor glue layer and a phosphor film layer; optionally, the top layer further includes a transparent layer; the base layer includes at least one of a phosphor glue layer and a phosphor film layer; and optionally, the base layer further includes a transparent layer.

In accordance with an embodiment with the present invention, the LED filament in claim 4, wherein: surface roughness Rz of the phosphor film layer is from 1 nm to 200 µm and surface roughness Rz of the phosphor glue layer is from 1 µm to 2 mm.

In accordance with an embodiment with the present invention, the phosphor film layer is made from a first adhesive binder doped with phosphor particles; and the phosphor glue layer is made from a second adhesive binder doped with phosphor particles.

In accordance with an embodiment with the present invention, the first adhesive binder is further doped with inorganic oxide particles; and the second adhesive binder is further doped with inorganic oxide particles.

In accordance with an embodiment with the present invention, visible light transmittance of the transparent layer is greater than 40%; and the transparent layer is made from at least one of silica gel, silicone resin and polyimide.

In accordance with an embodiment with the present invention, the top layer includes a phosphor glue layer; the base layer includes a phosphor film layer; the linear array of LED chips interposes the top layer and the base layer; the phosphor glue layer is made from a first adhesive binder doped with a plurality of first phosphor particles and a plurality of first inorganic oxide particles; and the phosphor film layer is made from a second adhesive binder doped with a plurality of second phosphor particles and a plurality of second inorganic oxide particles.

In accordance with an embodiment with the present invention, the first adhesive binder is made from a different material from which the second adhesive binder is made.

In accordance with an embodiment with the present invention, base layer is harder than the top layer.

In accordance with an embodiment with the present invention, the second adhesive binder is harder than the first adhesive binder.

In accordance with an embodiment with the present invention, the second adhesive binder is partially made from polyimide; and the first adhesive binder is made from silicone resin.

In accordance with an embodiment with the present invention, the mass ratio of the polyimide in the second adhesive binder is equal to or less than 10%.

In accordance with an embodiment with the present invention, the second phosphor particle is dimensionally smaller than the first phosphor particle.

In accordance with an embodiment with the present invention, the second inorganic oxide particle is dimensionally smaller than the first inorganic oxide particle.

In accordance with an embodiment with the present invention, the inorganic oxide particle is from 100 to 600 nm.

In accordance with an embodiment with the present invention, the inorganic oxide particle is Al2O3.

In accordance with an embodiment with the present invention, Shore hardness of the phosphor glue layer is from D40 to D70; and Shore hardness of the phosphor film layer is from D20 to D70.

In accordance with an embodiment with the present invention, the index of refraction of the phosphor film layer is equal to or less than 1.4.

In accordance with an embodiment with the present invention, the light transmittance of the phosphor film layer is 40% to 95%.

In accordance with an embodiment with the present invention, the adhesive binder is made from polyimide; and the mass ratio of the polyimide in the light conversion coating is equal to or less than 10%.

In accordance with an embodiment with the present invention, the adhesive binder is made from polyimide; the mass ratio of the adhesive binder in the light conversion coating is from 5% to 40%; and the rotation viscosity of the polyimide is from 5 Pa·s to 20 Pa·s.

In accordance with an embodiment with the present invention, the top layer includes a phosphor glue layer; the base layer includes a phosphor film layer; the base layer interposes the first linear array of LED chips and the second linear array of LED chips; the first linear array of LED chips interposes the first top layer and the base layer; the second linear array of LED chips interposes the second top layer and the base layer; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, the first linear array of LED chips and the second linear array of LED chips are in electrical communication with a same set of electric electrodes.

In accordance with an embodiment with the present invention, the top layer includes a phosphor glue layer; the base layer includes a phosphor film layer and a transparent layer; the phosphor film layer is harder than the transparent layer; the phosphor film layer interposes the linear array of LED chips and the transparent layer; the linear array of LED chips interposes the top layer and the phosphor film layer; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, at least one of the top layer and the base layer comprise the transparent layer, wherein the transparent layer has a thickness as integral multiples of ±20 of ½ or ¼ wavelength of the light.

In accordance with an embodiment with the present invention, Shore hardness of the phosphor film layer is 40 plus; and Shore hardness of the transparent layer is from D20 to D40.

In accordance with an embodiment with the present invention, the phosphor film layer has a thickness different from the transparent layer.

In accordance with an embodiment with the present invention, the top layer includes a phosphor glue layer; the base layer includes alternating sections of first portions and second portions; the first portion has a different hardness from the second portion;

In accordance with an embodiment with the present invention, the linear array of LED chips interposes the top layer and the base layer; the phosphor glue layer is made from an adhesive binder doped with a plurality of first phosphor particles and a plurality of first inorganic oxide particles; the first portion is made from a first adhesive binder doped with a plurality of phosphor particles and a plurality of inorganic oxide particles; and the second portion is made from a second adhesive binder doped with a plurality of phosphor particles and a plurality of inorganic oxide particles.

In accordance with an embodiment with the present invention, the first adhesive binder is harder than the second adhesive binder.

In accordance with an embodiment with the present invention, the top layer includes a phosphor glue layer; the base layer includes a phosphor film layer; the linear array of LED chips is enclosed by the top layer; at least part of the linear array of LED chips is disposed on a plane where is different from the plane that the conductive electrode disposed on; the phosphor glue layer is made from an adhesive binder doped with a plurality of first phosphor particles and a plurality of first inorganic oxide particles; and the phosphor film layer is made from an adhesive binder doped with a plurality of phosphor particles and a plurality of inorganic oxide particles.

In accordance with an embodiment with the present invention, the top layer includes a phosphor glue layer and a transparent layer; the base layer includes a phosphor film layer and a transparent layer; the phosphor film layer is harder than the transparent layer; the phosphor film layer interposes the linear array of LED chips and the transparent layer; the linear array of LED chips interposes the phosphor glue layer and the phosphor film layer; the phosphor glue layer interposes the transparent layer and the linear array of LED chips; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, the top layer includes a phosphor glue layer; at least one between the top layer and the base layer extends into the other one; the base layer includes a phosphor film layer; the linear array of LED chips interposes the top layer and the base layer; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, the mass ratio of the phosphors of the base layer is less than that of the phosphors of the top layer.

In accordance with an embodiment with the present invention, the mass ratio of the phosphors of the top layer is from 60% to 85%; and the mass ratio of the phosphors of the base layer is from 40% to 65%.

In accordance with an embodiment with the present invention, a linear array of LED chips operably interconnected to emit light upon energization; an insulation substrate;

a conductive electrode; a plurality of conductive wires and a plurality of conductive foils for electrically connecting the linear array of LED chips and the conductive electrode; and a light conversion coating covering the linear array of the LED chips and the conductive electrode, wherein: the conductive electrode is formed by two ends of a layer of the conductive foil; the linear array of LED chips and the conductive electrode are disposed in the insulation substrate; the conductive foil includes a plurality openings; the light conversion layer includes a top layer and a base layer conformally interconnected to form a unitary enclosure; the top layer is coated on a first side of the linear array of LED chips and the conductive electrode; and the base layer is coated on a second side of the linear array of LED chips and the conductive electrode.

In accordance with an embodiment with the present invention, the width of the opening is greater than the width of the LED chip configured to receive the LED chip.

In accordance with an embodiment with the present invention, the LED chip is a flip chip; the width of the opening, which is less than the width of the LED chip, is configured for the LED chip to mount around the opening; and the LED chip includes a soldering bump for electrically connecting the conductive foil and the LED chip.

In accordance with an embodiment with the present invention, the LED chip is a face-up chip; the LED chip includes a soldering bump and an extended bump; the soldering bump and the extended bump reach a same elevation; the LED chip is aligned in an upside-down position and electrically connected to the conductive foil via the soldering bump and the extended bump; and the soldering bump and the extended bump are respectively soldered on two sides of the conductive foil.

In accordance with an embodiment with the present invention, a first LED chip is configured to angle differently in relation to a second LED chip.

In accordance with an embodiment with the present invention, the light conversion coating further includes an auxiliary wire extending longitudinally in the LED filament for improving the toughness of the LED filament.

In accordance with an embodiment with the present invention, a linear array of LED chips operably interconnected to emit light upon energization; a conductive electrode;

a plurality of conductive wires for electrically connecting the linear array of LED chips and the conductive electrode; and a light conversion coating enclosing the linear array of LED chips and the conductive electrode, wherein: the light conversion layer includes a first phosphor glue layer, a second phosphor glue layer and a transparent layer; the first phosphor glue layer includes a linear series of pairwise tangent globular structures; the LED chip is enclosed in a central portion of the first phosphor glue layer; the transparent layer forms an external layer of the LED filament; and the second phosphor glue layer fills the gap between the transparent layer and the first phosphor glue layer.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures:

FIGS. 7A to 7D are schematic views of the linear array of LED devices in accordance with an embodiment of the present invention;

FIGS. 8A to 8F are schematic views of the linear array of LED devices in accordance with an embodiment of the present invention;

FIGS. 10A to 10C are schematic views of the LED filament in accordance with an embodiment of the present invention;

FIGS. 11A to 11C are schematic views of the LED filament in accordance with an embodiment of the present invention;

FIGS. 12A to 12D are schematic views of the LED filament in accordance with an embodiment of the present invention;

FIGS. 30A to 30C are cross sectional views of the LED filament in accordance with an embodiment of the present invention;

FIGS. 32A to 32G are see-through views of the LED filament in accordance with an embodiment of the present invention;

DETAILED DESCRIPTION OF THE EMBODIMENTS

Figure 1:
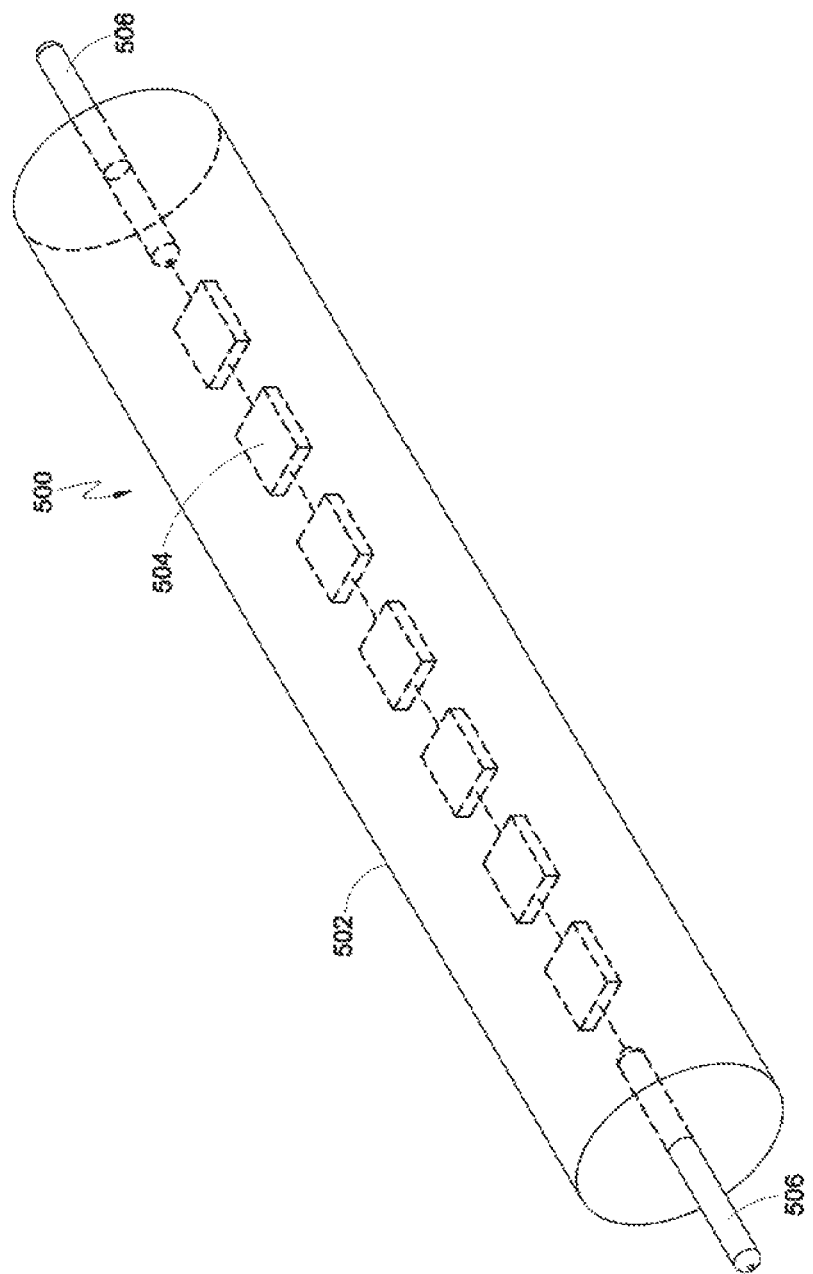
FIG. 1 is a see-through view of the LED filament in accordance with an embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on," "connected to," "coupled to" or "responsive to" (and/or variants thereof) another element, it can be directly on or directly connected, coupled or responsive to the other element or intervening elements may be present. In contrast, when an element is referred to as being "directly on," "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for purposes of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks. It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIG. 1 is a see-through view of the LED filament 500 according to an embodiment of the invention. The LED filament 500 includes a tubular enclosure 502, a linear array of LED devices 504 and an electrical connector 506. The linear array of LED devices 504 is disposed in the tubular enclosure 502 to be operable to emit light when energized through the electrical connector 506. The tubular enclosure is either straight or curvaceous. The tubular enclosure has a cross section in any regular shapes (e.g. circle and polygon) or irregular shapes (e.g. petal and star). In FIG. 1, the tubular enclosure 502 is a straight cylinder having a circular cross section. The tubular enclosure 502 is made of any optically transmissive materials through which optical radiation from the LED device 504 can pass without being totally absorbed or reflected, e.g. glass, plastic, resin and silicone.

Figure 2:
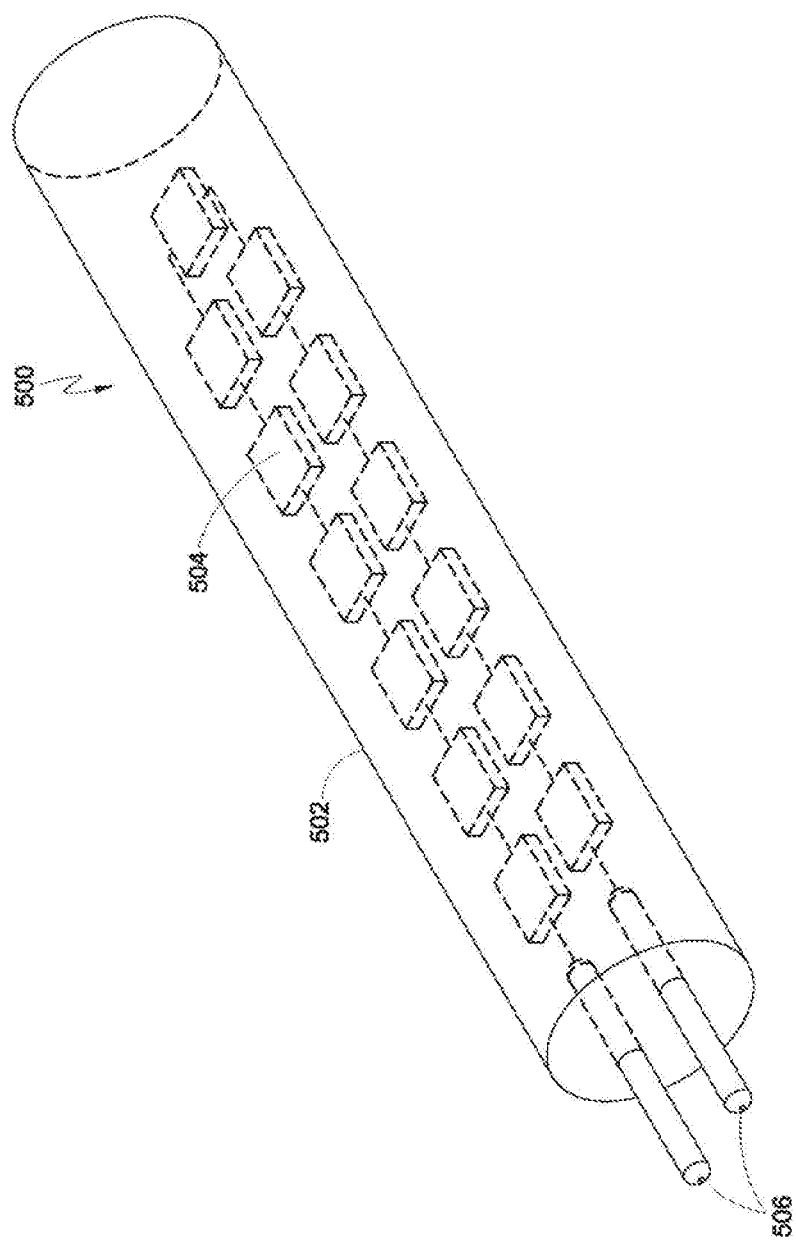
FIG. 2 is a see-through view of the LED filament in accordance with an embodiment of the present invention.
Figure 3:
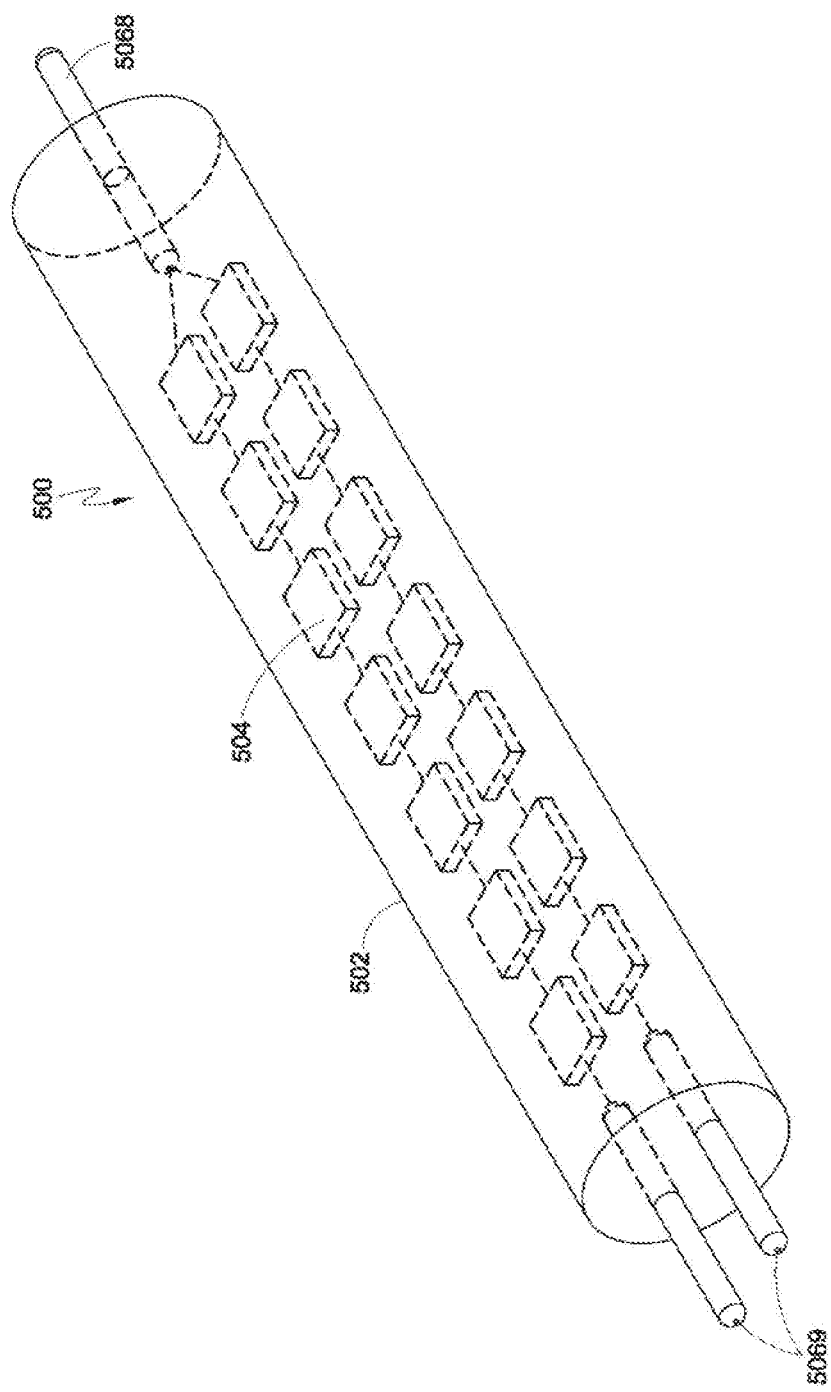
FIG. 3 is a see-through view of the LED filament in accordance with an embodiment of the present invention.

The linear array of LED devices 504 includes a plurality of LED devices 504 electrically coupled in parallel, in series or in a combination of both ways. In FIGS. 1 and 2, the linear array of LED devices 504 is formed by serially coupling a plurality of LED devices 504. In FIG. 1, the linear array of LED devices 504 defines a straight line in the tubular enclosure 502 along the longitudinal axis. In FIG. 2, the linear array of LED devices 504 defines a U-shaped curve extending axially in the tubular enclosure 502. In FIG. 3, the linear array of LED devise 504 includes a first set of serially coupled LED devices 504 and a second set of serially coupled LED devices 504. The first set of LED devices 504 is in parallel connection with the second set of LED devices 504. The linear array of LED devices 504 defines a straight pair of parallel lines extending axially in the tubular enclosure 502. Because there is only one path in which the current can flow in a series circuit, opening or breaking the circuit at any point causes the entire array of LED devices 504 to stop operating. By contrast, the same voltage is applicable to all circuit components connected in parallel. The total current is the sum of the currents through the individual components. Other things equal including luminary output, lower current in an individual LED device 504 results in better thermal performance.

The linear array of LED devices includes a liner array of single-die devices, multi-die devices or both to enable the LED filament 500 to glow across a broad field of angle. Going back to FIG. 1, in some embodiments, the linear array of LED devices 504 includes a plurality of individual LED dies connected by conductive glue, solder or welds. LED devices 504 having different colors can be mixed together to create white light. In other embodiments, the linear array of LED devices 504 includes a plurality of multi-die LED devices coupled together by a wire frame structure or in some other manner. The linear array of LED devices 504 emits light in a substantially omnidirectional or 360-degree pattern from the LED filament 500. Light is given off around the tubular enclosure roughly perpendicular to the envelope of the tubular enclosure in all directions. While the desired light intensity distribution may comprise any light intensity distribution, in one embodiment, the desired light intensity distribution conforms to the JEL801 standards or ENERGY STAR® Partnership Agreement Requirements for Luminous Intensity Distribution, each of which is incorporated herein by reference. Under ENERGY STAR® standards, an omnidirectional lamp is one configured to emit "an even distribution of luminous intensity (candelas) within the 0° to 135° zone (vertically axially symmetrical). Luminous intensity at any angle within this zone shall not differ from the mean luminous intensity for the entire 0° to 135° zone by more than 20%. At least 5% of total flux (lumens) must be emitted in the 135°-180° zone. Distribution shall be vertically symmetrical as measures in three vertical planes at 0°, 45°, and 90°." The Japanese standard JEL 801 stipulates that the luminary flux within 120 degrees from the beaming axis must be equal to or greater than 70% of the total flux of the light bulb.

Staying on FIG. 1, the linear array of LED devices 504 is made to be enclosed by the tubular enclosure 502 in a variety of ways. In some embodiments, the tubular enclosure 502 is formed directly on the linear array of LED devices 504 by dispensing a binder material such as liquid polymer coating containing various particles on the LED device 504. Simple as this may seem, the coating formed this way, could be unduly thick or undesirably nonuniform. In other embodiments, the tubular enclosure 502 is fabricated and tested independently of the linear array of LED devices 504. Subsequently, the tubular enclosure 502 is adhesively bonded to the linear array of LED devices 504. Bonding may be direct via a single adhesive layer or via one or more intermediate adhesive layers to form the LED filament 500 in a unitary structure comprising the linear array of LED devices 504 and the tubular enclosure 502. In an embodiment, the tubular enclosure 502 is combined with the LED device 504 at the wafer level. Alternatively, the tubular enclosure 502 is mounted onto individual LED dice. The cost for making the LED filament 500 decreases when we form the tubular enclosure 502 separately because defective tubular enclosures 502 can be identified and discarded before packaging. Optionally, the tubular enclosure 502 is sized to fit the lighting surface of the LED device 504.

Figure 4:
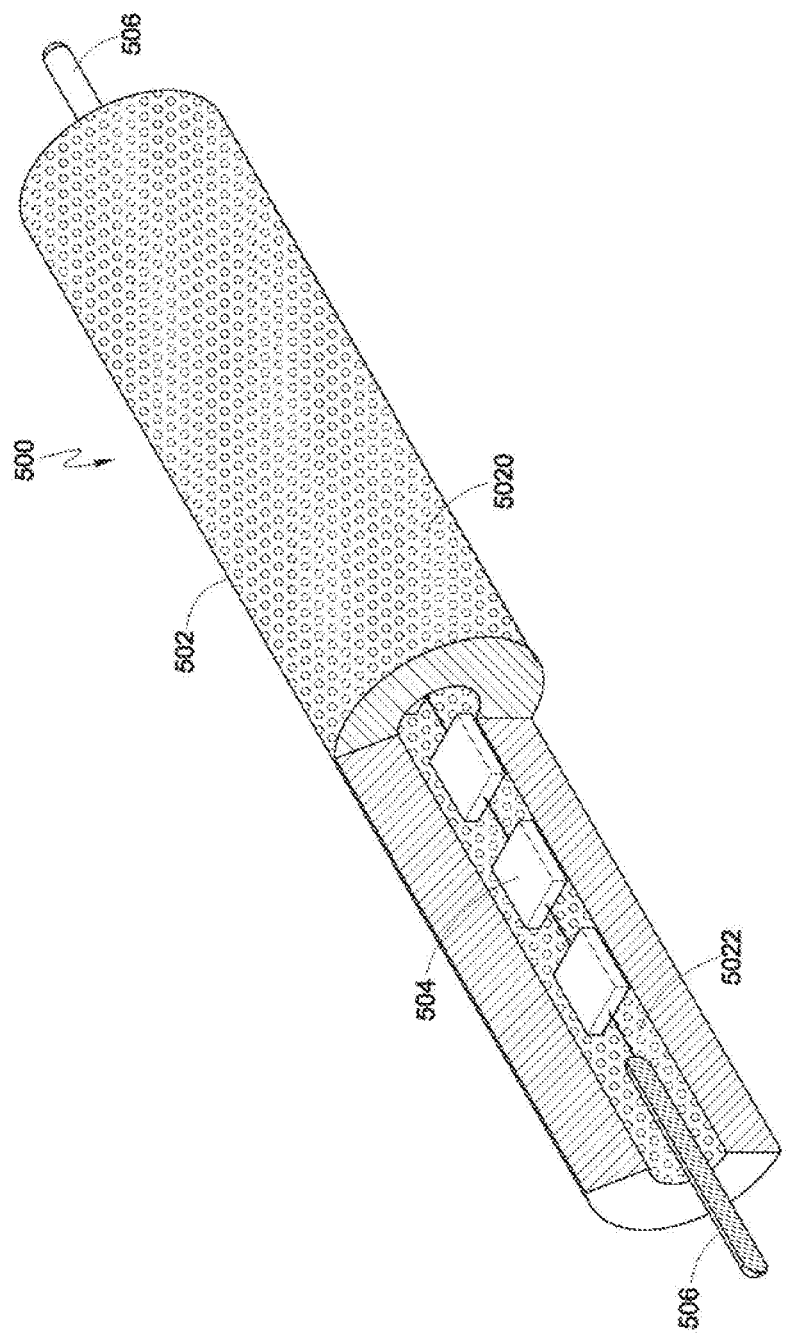
FIG. 4 includes a see-through view and a cut-open view of the LED filament in accordance with an embodiment of the present invention.

In FIG. 4, the LED filament 500 is radially severed into two sections. One of the sections is further axially sliced and disemboweled to show the inner surface 5022 of the tubular enclosure 502. The outer surface 5020 interfaces the air and the tubular enclosure 502. When the linear array of LED devices 504 is conformally wrapped around by the tubular enclosure 502, the inner surface 5022 interfaces the tubular enclosure 502 and the LED device 504. When the linear array of LED devices 504 is spaced apart from the tubular enclosure 502, the inner surface 5022 interfaces the tubular enclosure 502 and the filler in the space such as the air. In an embodiment, the tubular enclosure 502 includes a texturized or patterned surface 5020, 5022 for improving light extraction. In some embodiments, the tubular enclosure 52 includes an outer surface 5020 texturized to interface the air and the tubular enclosure 502. In other embodiments, the tubular enclosure 502 includes an inner surface 5022 texturized to interface the tubular enclosure 502 and the adjacent media such as the LED device 504 or the air.

Figure 5B:
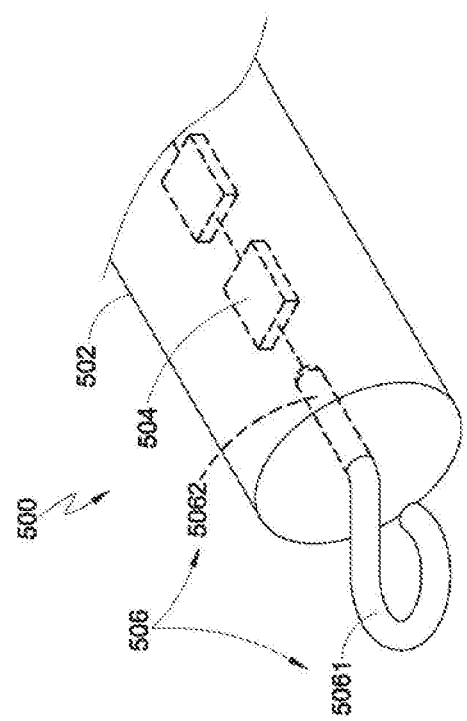
FIGS. 5A to 5D are schematic views of the electrical connector in accordance with an embodiment of the present invention.
Figure 5A:
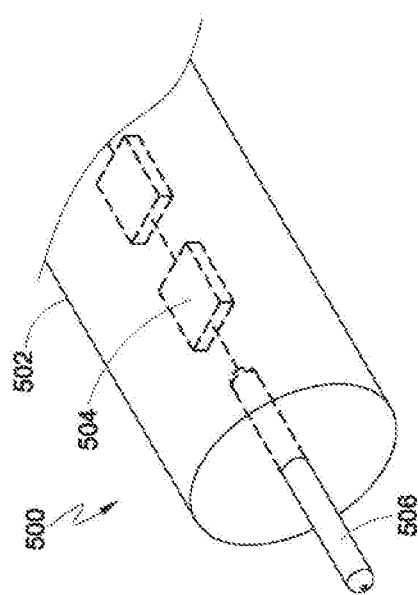
Figure 5D:
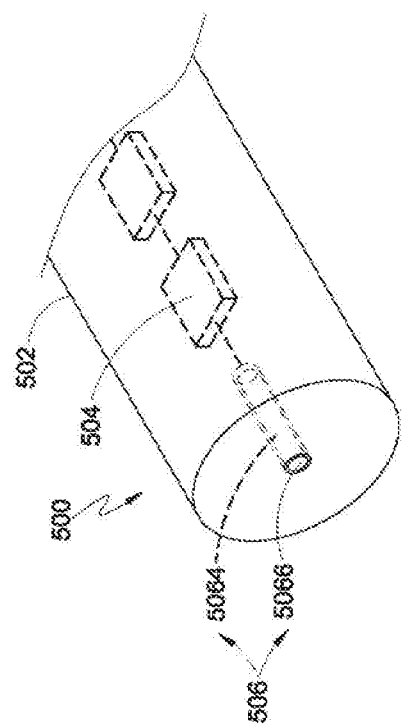
Figure 5C:
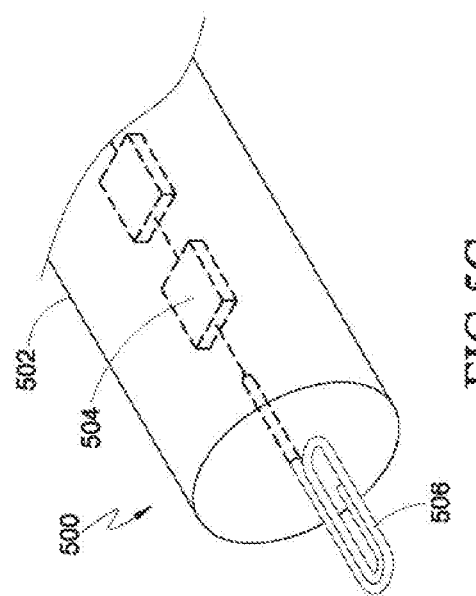

Going back to FIG. 1, the electrical connector 506, which is electrically connected to the linear array of LED devices 504, is configured to receive electrical power for energizing the linear array of LED devices 504. The number, shape and position of the electrical connectors 506 depends on intended purposes of an application. FIGS. 5A to 5C show a truncated LED filament 500 for highlighting the electrical conductor 506. For example, in FIG. 5A, the electrical connector 506 includes a metallic pin 506 electrically connected to the linear array of LED devices 504. A portion of the pin 506 is rooted in the tubular enclosure 502 in electrical connection with the linear array of LED devices 504. The other portion of the pin 506 sticks out from the tubular enclosure 502 for receiving electrical power. Alternatively, in FIG. 5B, the electrical connector 506 includes a metallic hook 506. The shank 5062 of the hook 506 is rooted in the tubular enclosure 502 in electrical connection with the linear array of LED devices 504. The throat 5060 of the hook 506 sticks out from the tubular enclosure 502 for receiving electrical power. Alternatively, in FIG. 5C, the electrical connector 506 includes a metallic fastener 506 such as binder or clip for physically and electrically attaching to the power source. Alternatively, in FIG. 5D, the electrical connector 506 includes a metallic receptacle 506. The well 5064 of the receptacle 506 is embedded in the tubular enclosure 502 in electrical connection with the linear array of LED devices 504. The opening 5066 of the receptacle 506 is pluggable by the male element of a power source for receiving electrical power. In some embodiments, the electrical connector 506 includes an aperture as a female element for receiving a male element of the LED light bulb. In FIG. 1, the LED filament 500 includes exactly two electrical connectors 104. A first electrical connector 506, which is attached to a first end of the tubular enclosure 502, is positive. A second electrical connector 506, which is attached to a second end of the tubular enclosure 502, is negative. In FIG. 2, the tubular enclosure 502 includes exactly two electrical connectors 506. A first electrical connector 506 is positive and a second electrical connector 506 is negative. However, both electrical connectors 506 are attached to a same end of the tubular enclosure 502. In FIG. 3, the tubular enclosure 502 includes exactly three electrical connectors 506. A first electrical connector 5068, which is attached to a first end of the tubular enclosure 502, is the common ground. A second electrical connector 5069, which is attached to a second end of the tubular enclosure 502, is positive. A third electrical connector 5069, which is also attached to the second end of the tubular enclosure 502, is positive. In some embodiments, the LED filament 500 is configured to maintain the desired posture by and only by physically attaching the electrical conductor 506 of the LED filament 500 to the lead wire of the LED light bulb. The LED filament 500 is like an arch bridge and the lead wire abutment. The LED filament 500 maintains its posture in the LED light bulb by pressing its compression forces against the lead wire.

Figure 6B:
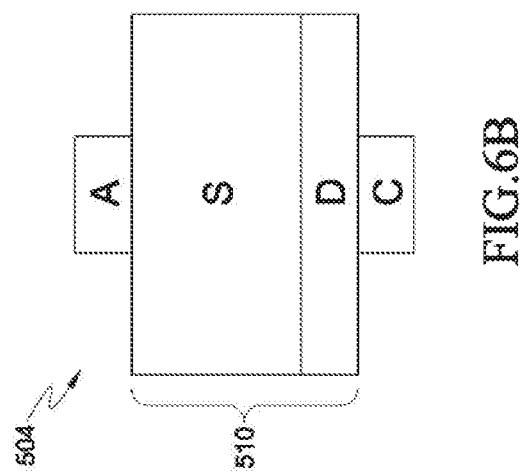
FIGS. 6A to 6H are schematic views of the LED device in accordance with an embodiment of the present invention.
Figure 6A:
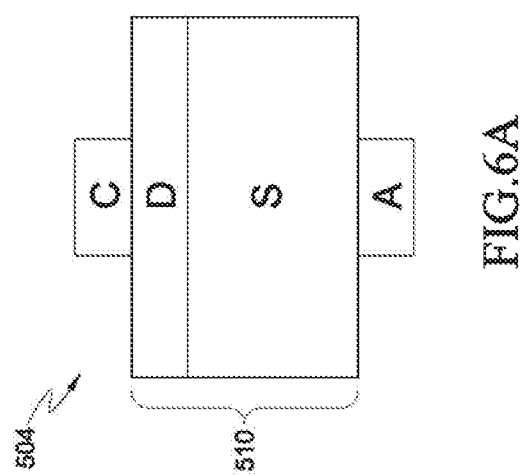
Figure 6D:
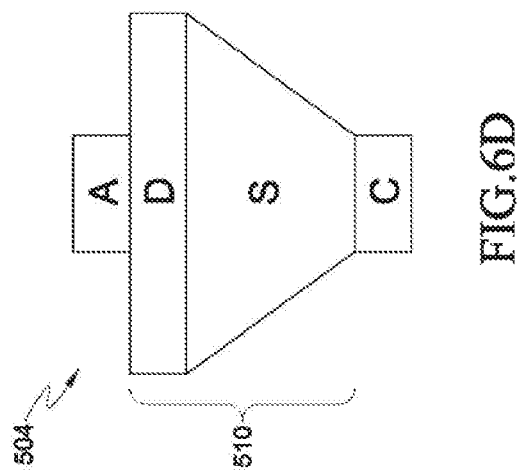
Figure 6C:
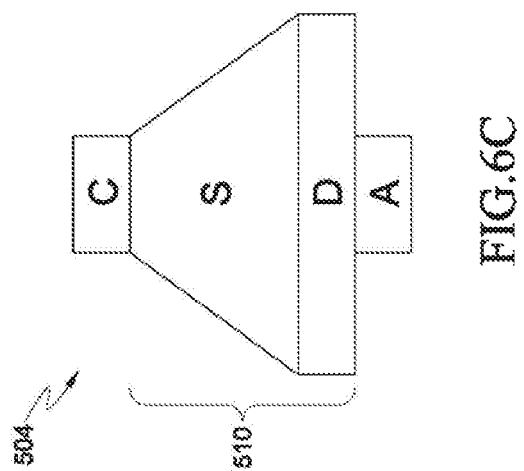
Figure 6E:
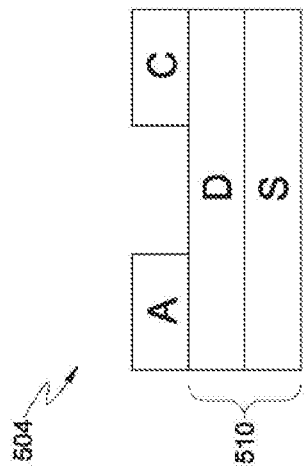
Figure 6F:
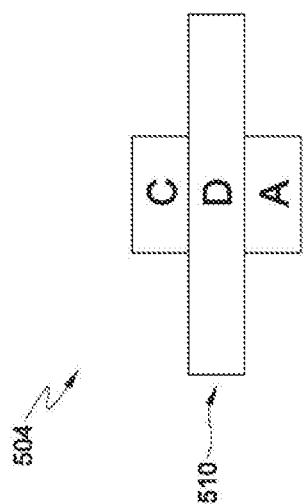
Figure 6H:
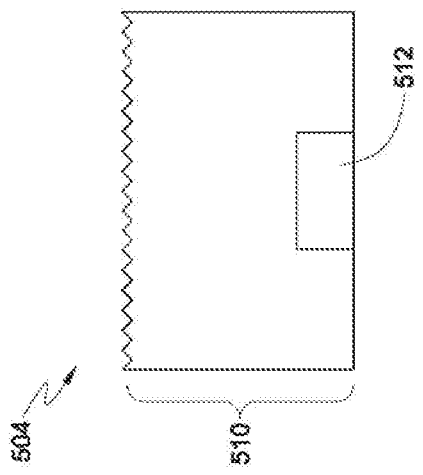
Figure 6G:
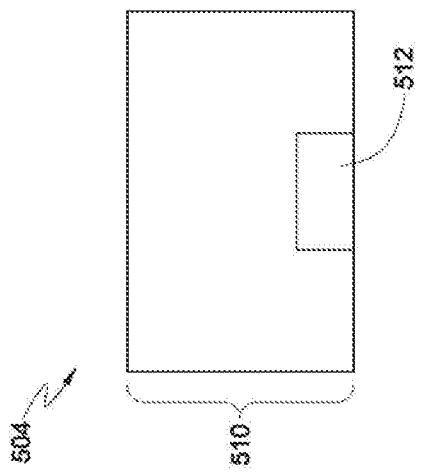

FIGS. 6A to 6E are diagrams of the LED device 504 configured to glow in the LED filament 500 in FIG. 1. The LED device 504 includes an LED die 510 that comprises a diode layer D and a substrate S. The diode layer D is configured to emit light upon energization, by applying a voltage between an anode contact A and a cathode contact C through the electrical connector 506 in FIG. 1. The diode layer D may comprise organic or inorganic materials. In inorganic devices, the substrate S is made of silicon carbide, sapphire or any other single element or compound semiconductor material. The diode layer D comprises silicon carbide, gallium nitride, gallium arsenide, zinc oxide or any other single element or compound semiconductor material, which may be the same as or different from the substrate S. The thickness of the substrate S is between about 100 μm and about 250 μm. Thinner and thicker substrates may be used or the substrate may not be used at all. The cathode C and anode A contacts are formed of metal or other conductors, and may be at least partially transparent, reflective or both. In FIG. 6A, light emission takes place directly from the diode layer D. Alternatively, in FIG. 6B, light emission takes place from diode layer D through the substrate S. In FIGS. 6C and 6D, the substrate S is shaped to enhance emission from sidewalls of the substrate S to provide other desirable effects. In FIG. 6E, the substrate itself may be thinned considerably or eliminated entirely, so that only a diode layer D is present. In FIGS. 6A-6E, the anode A and the cathode C are provided on opposite sides of the LED die 510. In FIG. 6F, the anode A and the cathode C are provided on the same side of the LED die 510. In each of the above embodiments, the anode A and cathode C contacts may be of various configurations. Multiple contacts of a given type also may be provided. The linear array of LED devices 504 are electrically connected by electrically connecting the anode and cathode contacts of each of the LED devices 504 in proper sequence. In some embodiments, the anode and cathode contacts are totally absent from the LED device 504, which includes a p-junction and an n-junction. The linear array of LED devices 504 are electrically connected by electrically connecting the p-junction and the n-junction of each of the LED device 504 in proper sequence. FIG. 6G is a generalization of FIGS. 6A-6F. The LED device 504 comprises a LED die 510 that includes a diode layer D of FIGS. 6A-6F and may also include a substrate S of FIGS. 6A-6D. The LED device 504 is configured to emit light upon energization through one or more electrical contacts 512, which may include the anode A and the cathode C of FIGS. 6A-6F. The LED device 504 can emit light of different colors and can also emit radiation outside the visible spectrum such as infrared or ultraviolet. The color of the emitted light is determined by the material properties of the semiconductor used in the LED die 510. The LED die 510 can be made from many different materials, e.g. gallium nitride (GaN). Referring to FIG. 6H, in an embodiment, the LED die 510 includes a texturized surface. Roughening the surface of the LED die 510 increases light extraction of the nitride-based LED device. Texturization is obtainable by using plasma etching directly on the top epilayer. However, the etching process destroys a large portion of the junction, reducing the amount of area in which the light is supposed to be generated. To avoid damaging the thin p-GaN layer, an indiumtin-oxide layer (ITO) can be used as the roughened layer. After completing the traditional planar GaN LED device, the surface of the LED die is texturized using natural lithography, in which the randomly deposited polystyrene spheres (PSs) were distributed as a natural mask for dry etching. After the surface-texturing process, the output power of the GaN LED device is significantly increased as compared to that of the conventional LED devices.

Going back to FIG. 6G, most of the electricity in an LED device 504 becomes heat rather than light (about 70% heat and 30% light). Thus, it is necessary to limit the junction temperature to a value that guarantees a desired lifetime. In some embodiments, the LED device 504 comprises a high-power LED die 510 capable of being loaded at a high voltage but at a lower current. Other things equal, the LED device 504 maintains an acceptable luminary output without comprising thermal performance.

Staying on FIG. 6G, in some embodiments, the linear array of LED devices 504 includes a plurality of LED devices 504 in which an individual LED die 510 has an elongated top view approximating a hypothetical rectangle having a longitudinal axis substantially parallel to the longitudinal axis of the linear array of LED devices 504. Other things equal, the greater the aspect ratio of the hypothetical rectangle, the less likely light gets blocked by opaque components in an LED filament such as the electrical contacts 512 and wirings for connecting the electrical contacts 512. Preferably, the aspect ratio is from 2:1 to 10:1. Examples are 28×14 and 20×10.

The LED filament is configured to emit white light in a variety of ways. Although illustrated as having exactly one LED die 510 in FIGS. 6A-6H, the LED device 504 may be provided to have a plurality of LED dies 510 as well, each of which may be configured to emit the same or different colors of light, mounted on a common substrate S. The multi-die device may be grouped on the substrate S in clusters or other arrangements such that the linear array of LED devices 504 outputs a desired pattern of light. In some embodiments, the multi-die LED devices 504 is configured to provide white light based on the combination of the colors of light emitted by each of its component LED dies 510. For example, a multi-die LED device 504 is configured to emit light having a spectral distribution including at least four different color peaks (i.e., having local peak wavelengths in wavelength ranges corresponding to at least four different colors of light) to provide the white light. Alternatively, to produce white light, a plurality of LED devices 504 emitting light of different colors may be used. The light emitted by the plurality of LED device 504 is combined to produce white light of a desired intensity, color or both. For example, when red-, green- and blue-emitting LED devices 504 are energized simultaneously, the resulting combined light appears white, or nearly white, depending on the relative intensities of the component red, green and blue sources. Alternatively, the light from a single-color LED device 504 may be converted into white light by surrounding the LED device 504 with a wavelength conversion material, such as phosphor particles. The term "phosphor" may be used herein to refer to any materials that absorb light at one wavelength and re-emit light at a different wavelength, regardless of the delay between absorption and re-emission and regardless of the wavelengths involved. Accordingly, the term "phosphor" is used herein to refer to materials that are sometimes called fluorescent or phosphorescent. In general, phosphors absorb light having shorter wavelengths and re-emit light having longer wavelengths. As such, some or all of the light emitted by the LED device 504 at a first wavelength may be absorbed by the phosphor particles, which may responsively emit light at a second wavelength. For example, a single blue emitting LED device 504 may be surrounded with a yellow phosphor, such as cerium-doped yttrium aluminum garnet (YAG). The resulting light, which is a combination of blue light and yellow light, may appear white to an observer. In an embodiment, the LED die 510 emits blue light. The white light many applications require may be achieved by converting a portion of the blue light into yellow light. When emitted, the combination of blue and yellow light appears white.

Going back to FIG. 1, the linear array of LED devices is electrically connected to emit light upon energization by applying a voltage through the electrical connector 104. Electrical connections between the LED devices and the electrical connector can be made in a variety of ways depending on the advantages an LED filament is expected to pursue. Examples include wire bonding, conductive glue, flexible printed circuit (FPC) film and any combination of the above. In FIG. 7A, interconnections between the LED devices 504 are made by wire bonding. Wire bonding is a method known in the art for making interconnections between electronic components. The bonding wire 514 is made of copper, gold or any suitable alloy. In some embodiments, the bonding wire 514 includes a spring between the LED devices 504 it connects. When the linear array of LED devices 504 is stretched or compressed in the LED filament, the bonding wire 514, when shaped like a spring, absorbs the mechanical energy that could otherwise open the circuit or damage the structure of the linear array of LED devices 504. Generally, the greater the sinuosity of the bond wire 514, the more mechanical energy the bond wire 514 is capable of storing. The sinuosity is the ratio of the curvilinear length along the bond wire 514 and the Euclidean distance between the end points of the bond wire 514. Preferably, the sinuosity is from 2 to 8. Most preferably, the sinuosity is from 3 to 6. In FIGS. 7B and 7C, the bonding wire 514 includes a bow-shaped spring between the LED devices 504 it connects. In FIG. 7D, the bonding wire 514 includes a helical spring between the LED devices 514 it connects.

Staying on FIGS. 7A-7D, when the tubular enclosure is formed directly on the linear array of LED devices 504 by dispensing a liquid binder such as polymer coating on the LED device 504, a variety of incidents may negatively impact the quality of the LED filament produced through wire bonding. During wire bonding, the bonding wire 514 is attached at both ends to the ohmic contacts of the LED device 504 using a combination of downward pressure, ultrasonic energy, and in some cases heat, to make a weld. The LED device 504 could be inadvertently shattered or burned during wire bonding. Moreover, ohmic contacts of the LED device 504, if having a tarnished or uneven surface, will comprise bond strength and subject the LED filament to potential failure. Furthermore, the bonding could be dislocated when the liquid polymer is being dispensed on the bonding wire attaching, otherwise properly or improperly, to the adjacent LED devices 504. To mitigate such problems, in some embodiments, interconnections between the LED devices 504 are made with glue wires made from electrically conductive glue continuously applied between the anode and cathode contacts of adjacent LED devices 504. Electrically conductive glue is formed by doping electrically conductive particles in an elastic binder. The electrically conductive particle can be gold or silver. Preferably, the electrically conductive particle is made from optically transmissive materials such as nano-silver, nano-carbon tubes and graphene. In some embodiments, wavelength conversion particles are blended in the electrically conductive glue for enhanced light conversion. The elastic binder can be silicone, epoxy or polyimide. Preferably, the elastic binder for the electrically conductive glue is the same material from which the tubular enclosure is made. The glue wire is thus seamlessly integrated into the tubular enclosure and is made capable of stretching or compressing in perfect sync with the tubular enclosure. The glue wire can be fabricated with the aid of glue dispenser capable of 3-D maneuvers. FIGS. 8A and 8B are side views of the linear array of the LED devices 504 where, for example, the anode A and cathode C contacts are provided on the same side of the LED die 510. In FIG. 8A, the glue wire 516 connecting the adjacent LED devices 504 covers substantially the entire surface of the anode A and cathode C contacts. In FIG. 8B, the glue wire 516 connecting the adjacent LED devices 504 partially covers the anode A and cathode C contacts. FIGS. 8C and 8D are top views of the linear array of LED devices 504 where the anode A and cathode C contacts are provided on the same side of the LED die 510. In FIGS. 8A and 8B, the glue wire 516 follows a straight line to connect the adjacent LED devices 504. In some embodiments, the glue wire 516 includes a curve of any kind depending for absorbing potentially destructive mechanical energy. Preferably, the sinuosity of the curve us from 3 to 8. Most preferably, the sinuosity of the curve is from 2 to 6. In FIG. 8C, the glue wire 516 is drawn to define an S-shaped curve between the LED devices 504 it connects in anticipation of deformation resulting from the LED filament being stretched or compressed. In FIG. 8D, when the anode A and cathode C contacts are not exactly aligned along the longitudinal axis of the linear array of the LED devices 504, the glue wire 516 makes a turn—for example—at the corner of the LED device 504 to complete the electrical connection for the adjacent LED devices 504. In FIG. 8E, the linear array of LED devices 504 includes a plurality of platforms 518 to fill the gap between the adjacent LED devices 504. Preferably, the platform 518 is made from the same material from which the tubular enclosure is made. The upper surface of the platform 518 provides a continuous path for the glue wire 516 to run from the anode A contact of the LED devices 504 to the cathode C contact of the adjacent LED device 504. In FIG. 8F, alternatively, a mold 520 is made to follow the contour of the anode A and cathode C contacts of the linear array of LED devices 504. The mold 520, when properly deployed, defines a gap between the mold 520 and the linear array of LED devices 504. The glue wire 516 is formed by filling the gap with electrically conductive glue. In some embodiments, the anode A and cathode C contacts—potentially blocking light where they are disposed over the diode region—are eliminated from the LED die 510. The glue wire 516 is thus configured to connect the p-junction of an LED device 504 and the n-junction of an adjacent LED device 504.

Figure 9A:
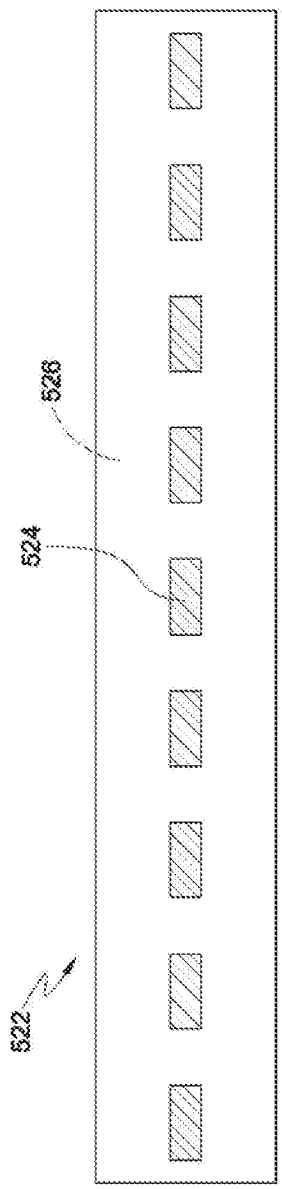
FIGS. 9A and 9B are schematic views of the LED filament in accordance with an embodiment of the present invention.
Figure 9B:
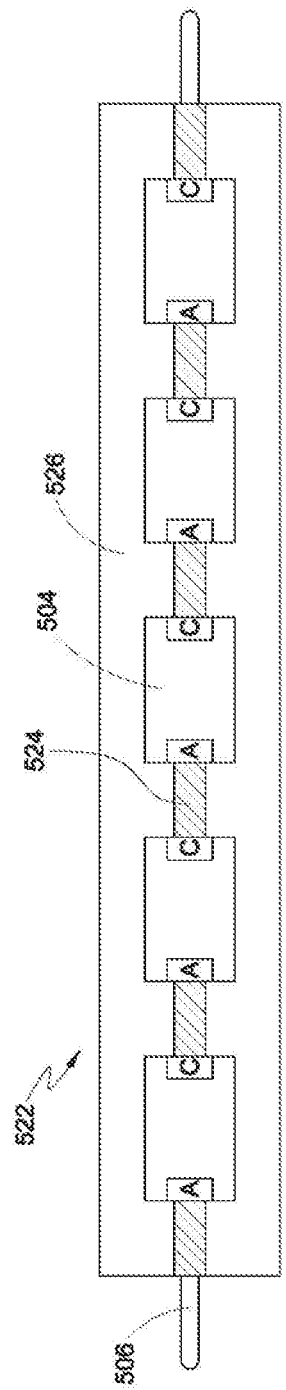

In yet another embodiment, interconnections between the LED devices is made with a strip of flexible printed circuit (FPC) film 522. FIG. 9A is a top view of the FPC film 522 prior to connecting with the linear array of LED devices and the electrical connector. FIG. 9B is a top view of the FPC film 522 after connecting with the linear array of LED devices 504 and the electrical connector 506. The strip of FPC film 522 includes a plurality of conductive tracks 524 laminated onto a strip of thin and nonconductive substrate 526. The strip of FPC film 522 mechanically supports the linear array of LED devices 504 with the strip of nonconductive substrate 526. The conductive track 524 electrically connects the linear array of LED devices 504 by connecting the anode A contact of the LED device 504 to the cathode contact C of the adjacent LED device 504. The nonconductive substrate 526 is an optically transmissive film, preferably having transmittance of 92% or more. For example, the nonconductive substrate 526 is a thin film made from Polyimide. The conductive track 524 can be made from electrical conductors such as indium tin oxide (ITO), silver nanoparticles or carbon nanotubes (CNTs). In an embodiment, the conductive track 524 is made from silver nanoparticles doped with gold for reliable connection with the ohmic contact of the LED device 504. The conductive track 524 can come in many patterns. For example, in FIG. 9A the conductive track 524 defines a set of slanted parallel lines. In FIG. 9B, the conductive track 524 defines a slanted grid. Preferably, the conductive track 524 has a thickness of from 1 nm to 1 mm. Preferably, the line in the set of the parallel lines and the grid has a width of from 1 µm to 1 cm. Some light is blocked by the conductive track 524 even when the conductive track 524 is made from transparent materials such as ITO. In some embodiments, the plurality of conductive tracks 524 cover less than 100% of the nonconductive substrate 526 to maximize the light traveling both ways through the nonconductive substrate 526. Preferably, the ratio of the total area covered by the plurality of conductive tracks 524 to the area of the FPC film 522 is from 0.1% to 20%. The strip of FPC film 522 is suitable for the LED filament designed to be bendable. When the conductive track 524 is properly patterned, e.g. a set of slanted parallel lines, a reliable electrical connection for the linear array of LED devices 504 is assured because a broken line would not break the connection.

According to an embodiment of the present invention, the method of making the LED filament includes the following steps:

S20: Arrange a linear array of LED devices 504 spaced apart from one another and an electrical connector 506 on a mount surface;

S22: Electrically and physically connect the linear array of LED devices 504 and the electrical connector 506; and S24: Dispose the linear array of LED devices 504 in a tubular enclosure.

Figure 10C:
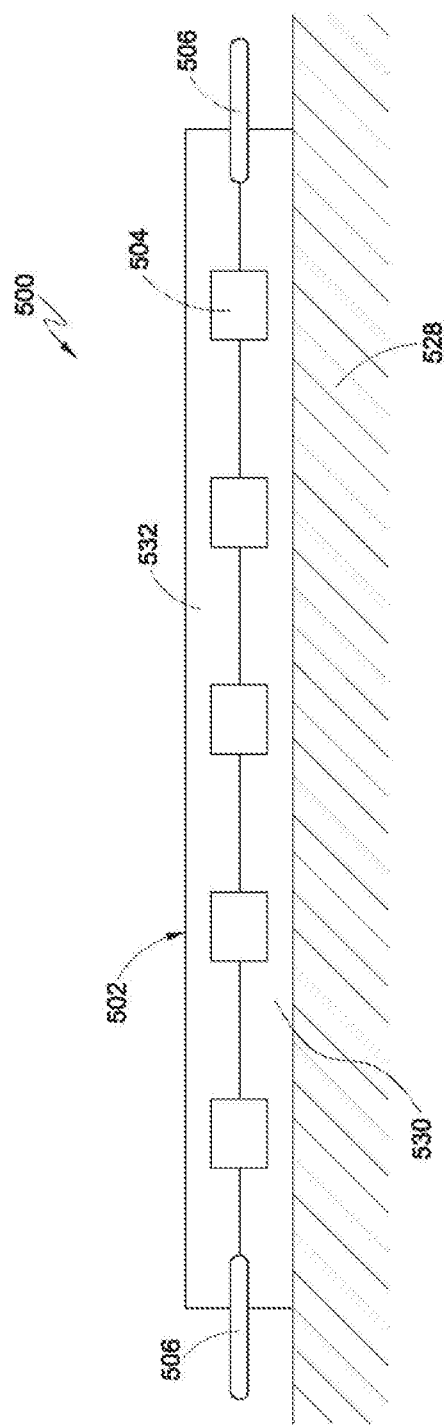

S20 and S22 have been performed in FIG. 10A. S24 is being performed in FIG. 10B. In FIG. 10C, S20, S22 and S24 have all been performed. The mount surface 528 is any surface capable of supporting the linear array of LED devices 504 and the electrical connector 506 throughout the steps of the method. Usually, the mount surface 528 is a substantially planar surface. In some embodiments, the mount surface 528 is a three dimensional surface whose shape depends on a desired totality of considerations such as: the posture the LED filament 500 is expected to maintain in the LED light bulb; the posture each individual LED device 504 is expected to maintain in relation to the rest of the linear array of LED devices 504; the shape of the tubular enclosure 502; the texture of the outer surface of the tubular enclosure 502; and the position of the linear array of LED devices 504 in the tubular enclosure 502. Each one of the linear array of LED devices 504 is properly aligned with the adjacent LED device 504 on the mount surface 528 depending on the location of the anode and cathode contacts on the LED device 504 and depending on the type of electrical connection to be made for the linear array of LED devices 504 in S22. In S22, the electrical connection is made with bond wire, conductive glue, FPC film or a combination of the above. The linear array of LED devices 504 is electrically connected in parallel, in series or in a combination of both ways.

In some embodiments where a cluster of LED filaments is assembled on a large mount surface, the method of making an LED filament further includes the following step:

S26: Depanel the cluster of LED filaments.

In S26, an LED filament depaneled from the cluster may include a linear array of LED devices or a plurality of linear arrays of LED devices depending on the application.

Staying on FIGS. 10A, 10B and 10C, in an embodiment, the tubular enclosure 502 is made from a cured transparent binder such as a cured transparent polymer. The tubular enclosure 502 includes a first portion 503, which is made first; and a second portion 532, which is made later. The first portion 530 of the tubular enclosure 502 is or is not structurally or otherwise distinguishable from the second portion 532 of tubular enclosure 502. The mount surface 528 in S20 is provided by a panel 528 separable from the linear array of LED devices 504. The panel is made of suitable solid materials such as glass or metal. In some embodiments, the panel further includes a side wall for containing and sometimes shaping the tubular enclosure 502 on the panel especially when, for example, a pre-curing liquid polymer is involved during manufacturing. In an embodiment, S24 includes the following steps:

S240: Dispense a first strip of transparent polymer over the linear array of LED devices;

S242: Reverse the linear array of LED devices on the panel; and

S244: Dispense a second strip of transparent polymer over the linear array of LED devices.

Staying on FIGS. 10A, 10B and 10C, in S240, the first strip of liquid polymer is dispensed over the linear array of LED devices 504 to form the first portion 530 of the tubular enclosure 502. Surface tension, which at the size of an LED device 504 is large in relation to gravitational forces, in combination with viscosity allows the strip of liquid polymer to conformally cover all corners of the linear array of LED devices 504, including the gaps between the LED devices 504. It is desirable to do a fast cure, such as a UV cure, because the normal drop in viscosity during a thermal cure would cause most liquid polymers to flow away from the linear array of LED devices 504. In S242, the linear array of LED devices 504, which is now at least partially enclosed by the first portion 530 of the tubular enclosure, is flipped over on the panel and remains unharmed without additional care when the linear array of LED devices 504 was not adhesively attached to the panel 528 in S20. In some embodiments, the linear array of LED devices 504 was adhesively attached on the panel 528 with adhesive materials such as photoresist for semiconductor fabrication and die bond glue. The linear array of LED devices 504 can be separated from the panel 528 after dissolving the adhesive material with proper solvents such as acetone. Residuals of adhesive material remaining on the linear array of LED devices 504 are flushed away before moving to S244. In S244, like in S240, the second strip of liquid polymer is dispensed over the linear array of LED devices 504, which has been enclosed, at least partially, by the first portion 530 of the tubular enclosure 502. The second strip of liquid polymer is then cured and forms the second portion 532 of tubular enclosure 502. We now have an LED filament 500 comprising the linear array of LED devices 504 disposed in the tubular enclosure 502 operable to emit light when energized through the electrical connector 506.

In another embodiment, the tubular enclosure is made from, for example, cured transparent polymer. However, the mount surface in S20 for the linear array of LED device and the electrical connector is provided by a strip of cured transparent polymer that will form the first portion of the tubular enclosure. S20 includes the following steps:

S200: Dispense a first strip of transparent polymer on a panel; and

S202: Arrange a linear array of LED devices spaced apart from one another and an electrical connector on the first strip of transparent polymer.

In the embodiment, S24 includes the following step:

S244: Dispense a second strip of transparent polymer over the linear array of LED devices.

Figure 11A:
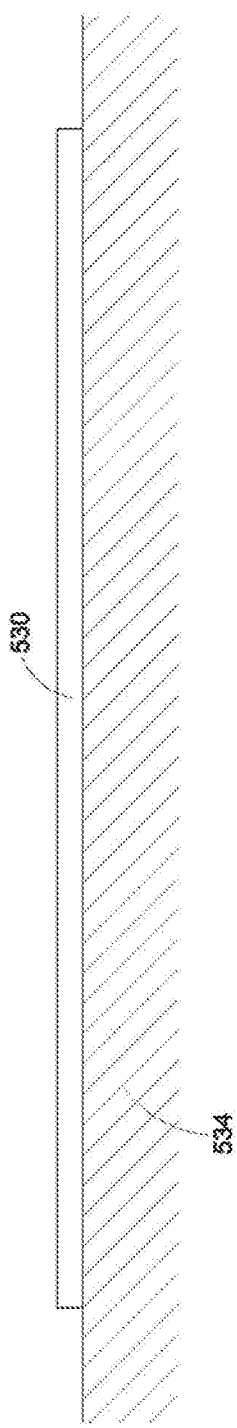
Figure 11B:
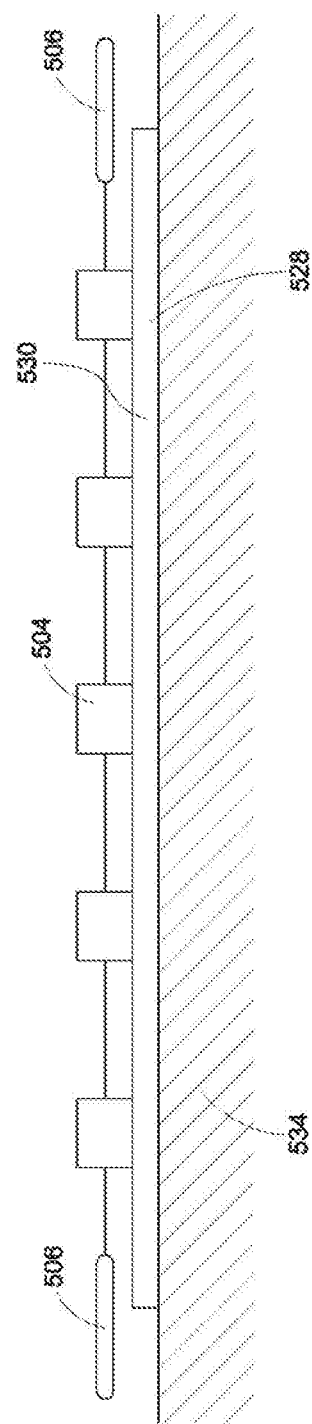

S200 has been performed in FIG. 11A. S202 has been performed in FIG. 11B. S244 has been performed in FIG. 11C. In S200, the first strip of liquid polymer is dispensed on a panel 534. The first strip of liquid polymer is then cured on the panel to form the first portion 530 of the tubular enclosure 502. The mount surface 528 in S20 is provided by the first strip 530 of cured polymer separable from the panel 534. The first portion 530 of the tubular enclosure 502 provides a surface capable of supporting the linear array of LED devices 504 and the electrical connector 506 throughout the steps of the method. The first strip of liquid polymer is then cured on the panel to form the first portion 530 of the tubular enclosure 502. The mount surface 528 in S20 is provided by the first strip of cured polymer separable from the panel 534. The panel 534 is made of suitable solid materials such as glass or metal. In other embodiments, the panel 534 further includes a side wall for containing and sometimes shaping the tubular enclosure 502 on the panel 534 especially when, for example, pre-curing liquid polymer is involved during manufacturing. In S202, to strengthen the combination when the linear array of LED devices 504 and the electrical connector 506 are disposed on the first portion 530 of the tubular enclosure 502, optionally, an upper surface of the first portion 530 of the tubular enclosure 502 is melted. The linear array of LED devices 504 and the electrical connector 506 are then at least partially immersed into the first portion 530 of the tubular enclosure 502 before the upper surface cools down. In S244, like in S200, the second strip of liquid polymer is dispensed over the linear array of LED devices 504, which has been disposed on or at least partially enclosed by the first portion 530 of the tubular enclosure 502. The second strip of liquid polymer is then cured and forms the second portion 532 of tubular enclosure 502. The linear array of LED devices 504, which is now enclosed by the unitary structure of the first portion 530 of the tubular enclosure 502 and the second portion 532 of the tubular enclosure 502, can be taken away from the panel 534 and remains unharmed without additional care when the first portion 530 of the tubular enclosure 502 was not adhesively attached to the panel 534. In some embodiments, the first portion 530 of tubular enclosure 502 was adhesively attached to the panel 534 with adhesive materials such as photoresist for semiconductor fabrication and die bond glue. The first portion 530 of tubular enclosure 502 can be separated from the panel 534 after dissolving the adhesive material with proper solvents such as acetone. Residuals of adhesive material remaining on first portion 530 of the tubular enclosure 502 are flushed away. We now have an LED filament 500 comprising the linear array of LED devices 504 disposed in the tubular enclosure 502 operable to emit light when energized through the electrical connector 506.

In some embodiments, the first portion of the tubular in S200 is configured to be capable of withstanding potential destructions resulting from manufacturing procedures such as wire bonding. In some embodiments, the first portion of the tubular includes a hardener. For example, the hardener includes a pre-determined concentration of particles harder than the liquid polymer in which the particles are embedded. Light conversion particles such as phosphor particles are harder than the binder materials such as silicone and resin. Thus, the first portion of the tubular can be made harder by increasing the concentration of the light conversion particles in the transparent binder. In an embodiment, the first portion of tubular enclosure is configured to have a Shore hardness of from D20 to D70 when the ratio of the volume of the light conversion particles in the first portion of the tubular enclosure to the volume of the transparent binder in the first portion of the tubular enclosure is from 20% to 80%. Alternatively, the ratio of the weight of the light conversion particles in the first portion of the tubular enclosure to the weight of the transparent binder in the first portion of the tubular enclosure is from 20:80 to 99:1. In other embodiments, the first portion of the tubular enclosure is thickened such that the thickness enables the first portion of the tubular enclosure to withstand potential destructions resulting from manufacturing procedures such as wire bonding. Preferably, the thickness of the first portion of the tubular enclosure is from 0.01 to 2 mm. Most preferably, the thickness of the first portion of the tubular enclosure is from 0.1 to 0.5 mm.

In yet another embodiment, the tubular enclosure is made from, for example, cured transparent polymer. However, the mount surface in S20 for the linear array of LED device and the electrical connector is provided by a strip of cured transparent polymer that will form a first portion of the tubular enclosure. S20 includes the following steps:

S210: Dispense a first strip of transparent polymer on a panel;

S212: Dispose a strip of FPC film on the first strip of transparent polymer; and S214: Arrange a linear array of LED devices spaced apart from one another and an electrical connector on the strip of FPC film.

In the embodiment, S24 includes the following step:

S244: Dispense a second strip of transparent polymer over the linear array of LED devices.

Figure 12C:
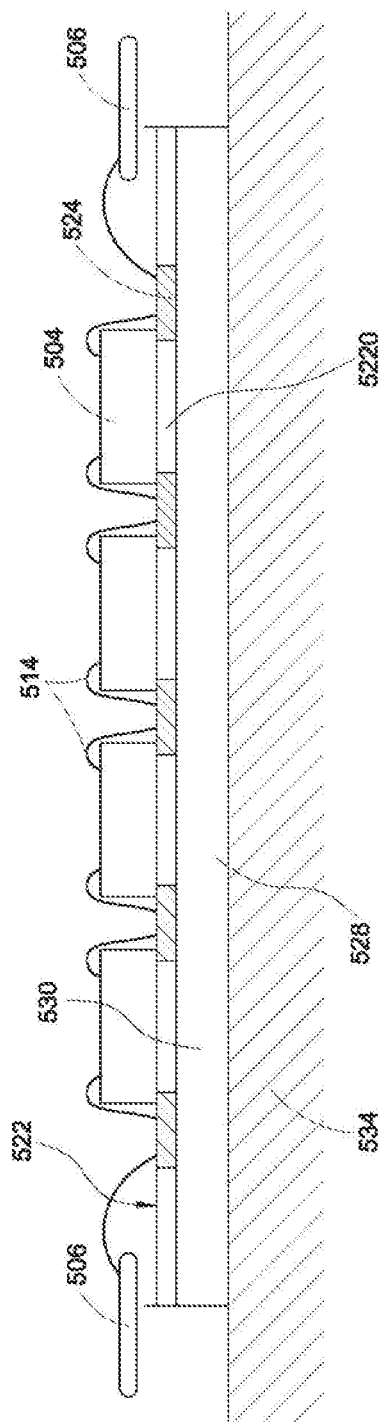
Figure 12D:
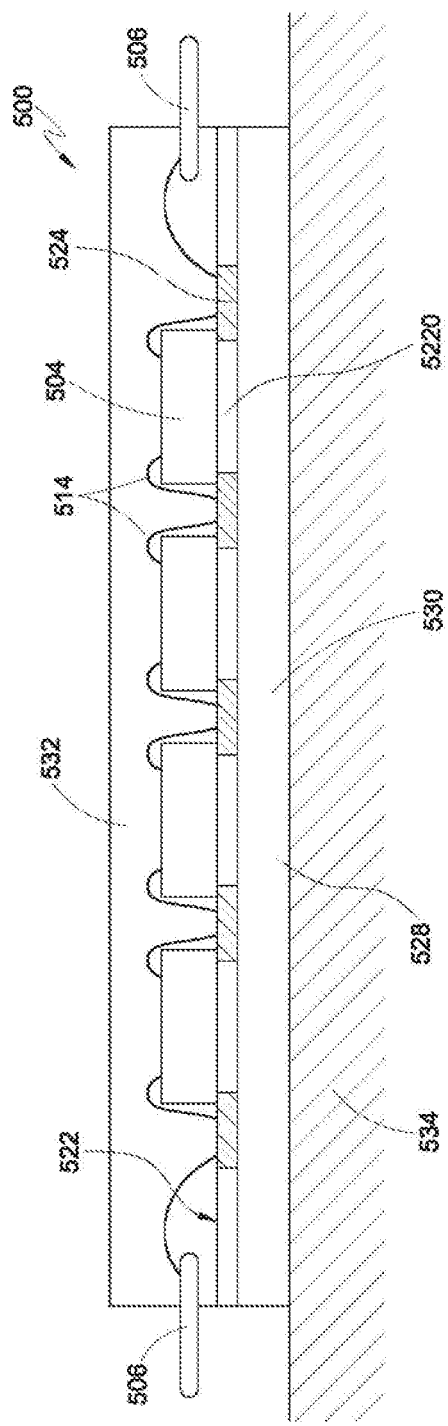

S210 has been performed in FIG. 12A. S212 has been performed in FIG. 12B. S214 has been performed in FIG. 12C. S244 has been performed in FIG. 12D. In S210, the first strip of liquid polymer is dispensed on a panel 534. The panel 534 is made of suitable solid materials such as glass or metal. In other embodiments, the panel 534 further includes a side wall for containing and sometimes shaping the tubular enclosure 502 on the panel 534 especially when, for example, pre-curing liquid polymer is involved during manufacturing. The first strip of liquid polymer is then cured on the panel 534 to form the first portion 530 of the tubular enclosure 502. The mount surface 528 in S20 is provided by the first strip of cured polymer separable from the panel 534. The first portion 530 of the tubular enclosure 502 provides a surface capable of supporting the linear array of LED devices 504 and the electrical connector 506 throughout the steps of the method. In S212, to strengthen the combination when the strip of FPC film 522 is disposed on the first portion 530 of the tubular enclosure 502, optionally, an upper surface of the first portion 530 of the tubular enclosure 500 is melted. The strip of FPC film 522 is then at least partially immersed into the first portion 530 of the tubular enclosure 502 before the upper surface cools down. In some embodiments, the strip of PFC film 522 includes a linear array of apertures 5220 punched by, for example, a stamping press. Optionally, the aperture 5220 is dimensionally smaller than the LED device 504. In these embodiments, each of the linear array of LED devices 504 straddles exactly one of the linear array of the apertures 5220. Thus, light coming from the linear array of LED devices 504 will not be blocked by the strip of FPC film 522. In S22, a combination of wire bonding and FPC film 522 is employed to electrically and connect the linear array of LED devices 504. The bonding wire 514 is attached to a conductive track 524 of the strip of FPC film 522 on a first end and attached to an ohmic contact of the LED device 504 on a second end. In S244, like in S210, the second strip of liquid polymer is dispensed over the linear array of LED devices 504, which has been disposed on or at least partially enclosed by the first portion 530 of the tubular enclosure 502. The second strip of liquid polymer is then cured and forms the second portion 532 of tubular enclosure 502. The linear array of LED devices 504, which is now enclosed by the unitary structure of the first portion 530 of the tubular enclosure 502 and the second portion 532 of the tubular enclosure 502, can be taken away from the panel 534 and remains unharmed without additional care when the first portion 530 of the tubular enclosure 502 was not adhesively attached to the panel 534. In some embodiments, the first portion 530 of tubular enclosure 502 is adhesively attached to the panel 534 with adhesive materials such as photoresist for semiconductor fabrication and die bond glue. The first portion 530 of tubular enclosure 502 can be separated from the panel after dissolving the adhesive material with proper solvents such as acetone. Residuals of adhesive material remaining on first portion 530 of the tubular enclosure 502 are flushed away. We now have an LED filament 500 comprising the linear array of LED devices 504 disposed in the tubular enclosure 502 operable to emit light when energized through the electrical connector 506.

In an embodiment, the tubular enclosure is a monolithic structure. In some embodiments, the monolithic structure shares a uniform set of chemical and physical properties throughout the entire structure. Being structurally indivisible, the monolithic structure need not be a uniform structure. In other embodiments, the monolithic structure includes a first portion and a second portion having a different property from the first portion. In another embodiment, the tubular enclosure includes a set of otherwise divisible layers or modules interconnected to form a unitary structure of the tubular enclosure. In FIGS. 14 to 19, the tubular enclosure includes a set of interconnected layers configured to form a unitary structure of the tubular enclosure. In FIGS. 20 to 23C, the tubular enclosure includes a set of interconnected modules configured to form a unitary structure of tubular enclosure.

Figure 24:
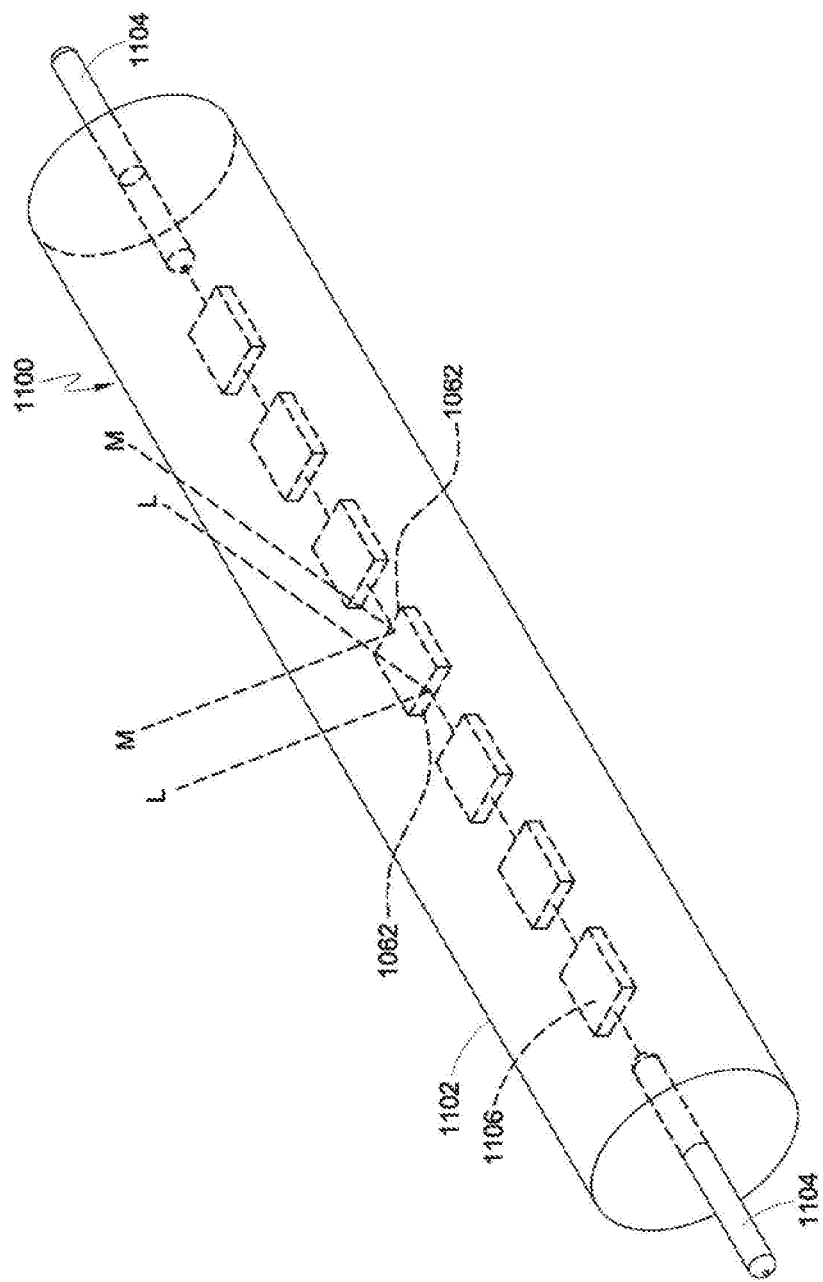
FIG. 24 is a see-through view of the LED filament in accordance with an embodiment of the present invention.
Figure 25A:
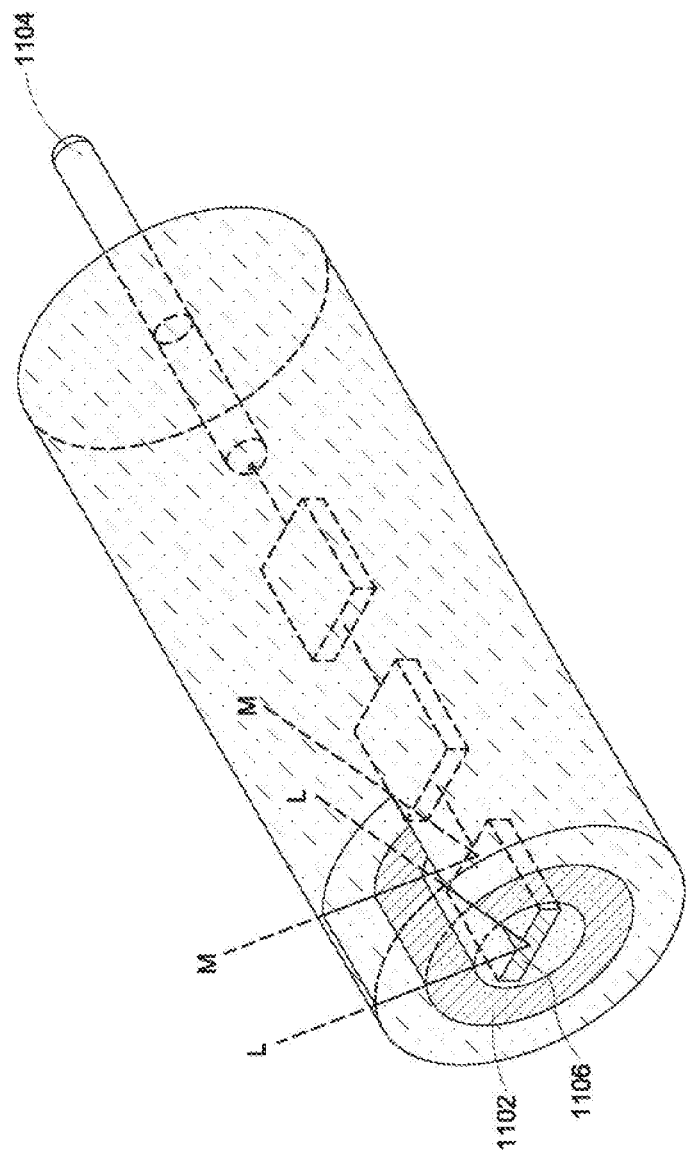
FIGS. 25A and 25B are cutaway views of the LED filament in accordance with an embodiment of the present invention.
Figure 25B:
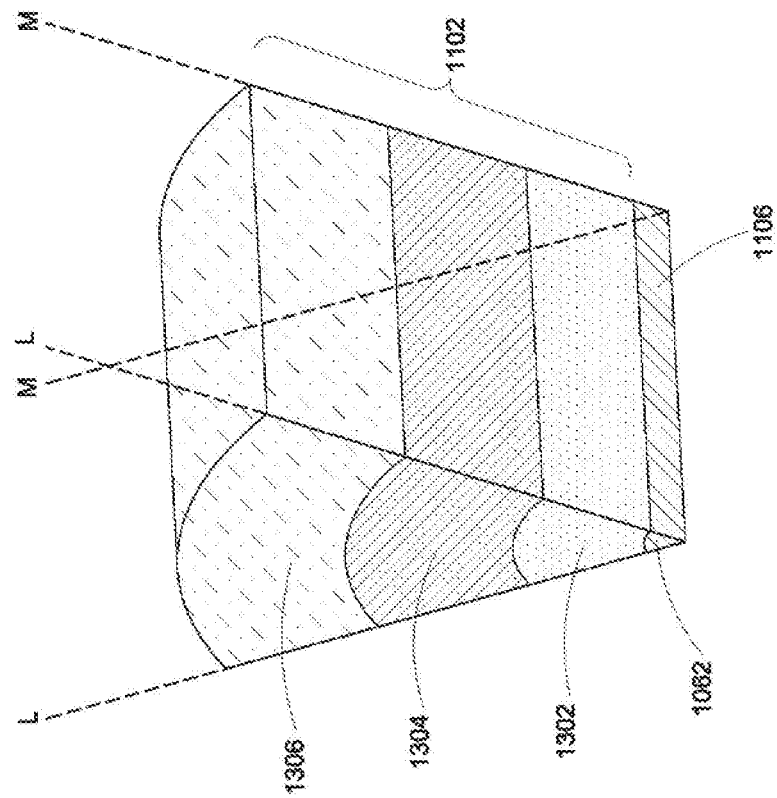

Shifting to FIG. 24, the line L-L cuts the LED filament 1100 in FIG. 24 radially exactly along a lateral surface 1062 of the LED device 106. Likewise, the line M-M cuts the LED filament 1100 radially exactly along the other lateral surface 1062 of the LED device 106. FIG. 25A is a perspective view showing the cross section of the LED filament 100 cut by the line L-L. Carved out along the cross section in FIG. 25A, FIG. 25B shows a cutaway of the LED filament defined by the line L-L and the line M-M. The tubular enclosure is a tubular structure having exactly one layer or a plurality of distinct layers. In the embodiment in FIG. 26, the tubular enclosure 1102 has exactly one layer 1402 over the LED device 1106. In the embodiment in FIG. 25B, the tubular enclosure 1102 is a multi-layered structure over the LED device 1106. Each layer of the tubular enclosure 1102 is configured to add a distinctive function to the LED filament 1100. For example, the tubular enclosure 1102 in FIG. 25B includes three layers 1302, 1304, 1306.

Figure 26:
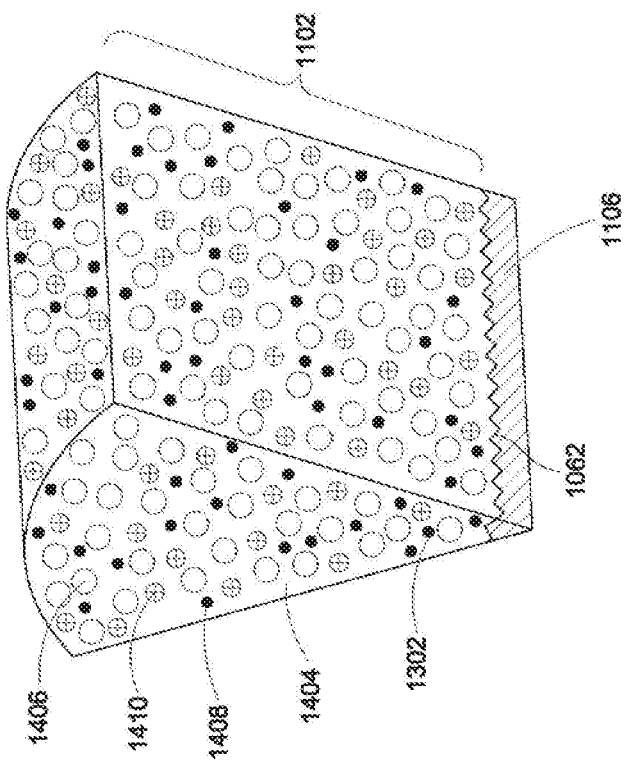
FIG. 26 is a cutaway view of the LED filament in accordance with an embodiment of the present invention.

FIG. 26 shows a cutaway of the LED filament in FIG. 24 in which the tubular enclosure 1102 has exactly one unitary layer over the LED device 1106. In an embodiment, the LED device 1106 has a textured light emission surface 11064 to increase light extraction from the diode layer by reducing total internal reflection. The light emission surface 1064 includes the surface of the diode layer D, the surface of the substrate S or both. The light emission surface 1064 is treated with subtractive processes such as etching, cutting and grinding wherein material is removed from the light emission surface 1064 to create the desired texture.

In an embodiment, the tubular enclosure includes a wavelength conversion layer. The wavelength conversion layer includes a transparent binder 404 in which a plurality of light conversion particles 406, such as phosphor particles, are embedded. The phosphor particles may be formed from any suitable phosphor capable of converting light of one wavelength into another wavelength. Cerium(III)-doped YAG is often used for absorbing the light from the blue LED device 106 and emits in a broad range from greenish to reddish, with most of output in yellow. This yellow emission combined with the remaining blue emission gives the white light, which can be adjusted to color temperature as warm (yellowish) or cold (blueish) white. The pale yellow emission of the Ce3+:YAG can be tuned by substituting the cerium with other rare earth elements such as terbium and gadolinium and can even be further adjusted by substituting some or all of the aluminium in the YAG with gallium. Alternatively, some rare-earth doped Sialons are photoluminescent and can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. Thus, it is suitable for using as green down-conversion phosphor for white-light LED filaments; a yellow variant is also available. To generate white light, a blue LED device is used with a yellow phosphor, or with a green and yellow SiAlON phosphor and a red CaAlSiN3-based (CASN) phosphor. In an embodiment, the wavelength conversion layer is configured to convert light emitting from the LED device into light having a color temperature from 2400 to 2600 K by, for example, embedding in the transparent binder an appropriate combination of yellow-and-green phosphor and red phosphor.

The amount of light absorbed and re-emitted by the light conversion particles is generally proportional to the amount of light conversion particles that the light passes through before egressing the LED filament. However, if the light passes through too much light conversion particles, part of the re-emitted light can be blocked from emitting from the LED filament, by the excess light conversion particles. This reduces the overall light emitting efficiency of the LED filament. The amount of light conversion particles that the LED light passes through can be varied by varying the concentration of light conversion particles, the thickness of the wavelength conversion layer, or both. In an embodiment, light from the linear array of LED devices passes through a sufficient amount of light conversion particles so that substantially all of the light is absorbed and re-emitted at a different wavelength of light. At the same time, the re-emitted light does not pass through an excess light conversion material so that the re-emitted light is not blocked from emitting from LED filament. By providing a sufficient amount of light conversion particles to provide full conversion without blocking, the light conversion particles are in state of optimal conversion. The amount of light conversion particles for optimal conversion depends on the size and luminous flux of the LED filament. The greater the size and luminous flux, the greater the amount of light conversion particles needed. Under optimal conversion, the light emitted from the LED filament is composed primarily of photons produced by the light conversion particles. Preferably, the ratio of the volume of the light conversion particles in the wavelength conversion layer to the volume of the transparent binder in the wavelength conversion layer is from 20:80 to 99:1. Preferably, the ratio of the weight of the light conversion particles in the wavelength conversion layer to the weight of the transparent binder in the wavelength conversion layer is from 20% to 50%. In some embodiments, however, it may be desirable to allow a small portion of the light to be transmitted through the light conversion particles without absorption for purposes of modifying the chromaticity of the resulting radiation of the LED filament. For example, the LED filament emits less than 10% of the emission power of primary radiation in the absence of the light conversion material particles. In other words, the conversion particles absorb 90% or more of the light from the linear array of LED devices.

Figure 31C:
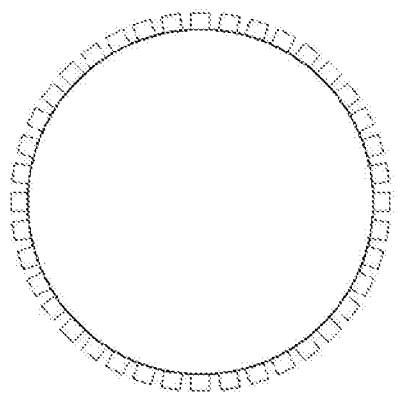
FIGS. 31A to 31C are cross sectional views of the LED filament in accordance with an embodiment of the present invention.
Figure 31B:
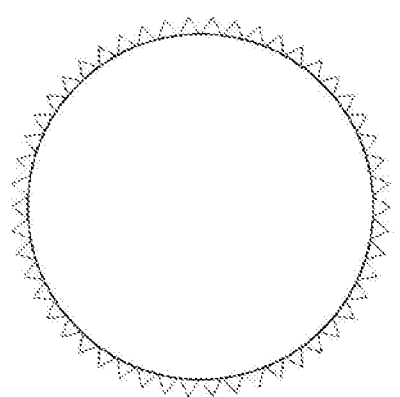
Figure 31A:
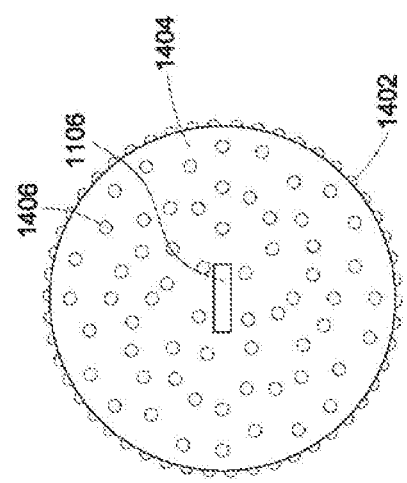

Referring to FIG. 31A, suitable materials for the transparent binder 1404 include silicone, resin and epoxy. However, these materials, having a thermal conductivity from 0.01 to 2 W/(m·K), are poor thermal conductors in relation to the light conversion particles 406 like phosphor, which has a thermal conductivity of from 1 to 20 W/(m·K). Excess heat trapped inside the wavelength conversion layer 1402 compromises the performance of the heat-sensitive LED devices 1106. Moreover, the transparent binder 1404, when bathed in excess heat, becomes brittle and unpleasantly yellow over time. Thus, it is desirable to configure the wavelength conversion layer 1402 in a way heat is efficiently transferred away from the LED device 1106 from the wavelength conversion layer 1402. In an embodiment, the wavelength conversion layer 1402 includes a plurality of heat transfer paths 1002 extending in a substantially radial direction for transferring heat away from the LED device 1106 and the wavelength conversion layer 1402. In FIG. 31A, the concentration of light conversion particles 1406 in the transparent binder 1404 is so low that the heat transfer paths are mostly broken because the majority of the light conversion particles 1406, sealed by the transparent binder 1404, are far apart from one another. By contrast, in FIG. 31B, the concentration of the light conversion particles 1406 is high enough for the light conversion particles 1406 to form a plurality of heat transfer paths 11002 by lining up the light conversion particles 1406 successively along a substantially radial direction because the majority of the light conversion particles 1406, not being completely sealed by the transparent binder 1404, are at least partially in direct contact with neighboring light conversion particles 1406 on a same light transfer path 1002. Preferably, the ratio of the volume of the light conversion particles in the wavelength conversion layer to the volume of the transparent binder in the wavelength conversion layer is from 20:80 to 99:1. Preferably, the ratio of the weight of the light conversion particles in the wavelength conversion layer to the weight of the transparent binder in the wavelength conversion layer is from 20% to 50%. As previously discussed, if the light passes through too much light conversion particles 1406, part of the re-emitted light can be blocked from emitting from the wavelength conversion layer 1402 by the excess light conversion particles 1406. By providing a sufficient concentration of light conversion particles 1406 for sufficient heat transfer paths 1002 without blocking, the light conversion particles 1406 are in state of thermal optimum. Preferably, under the thermal optimum, the ratio of the volume of the light conversion particles 1406 in the wavelength conversion layer 1402 to the volume of the transparent binder 404 in the wavelength conversion layer 402 is from 20:80 to 99:1. Preferably, the ratio of the weight of the light conversion particles 406 in the wavelength conversion layer 402 to the weight of the transparent binder 404 in the wavelength conversion layer is from 20% to 50%. Given the same concentration, the plurality of heat transfer paths 1001 that otherwise would not exist if the light conversion particles 1406 are evenly dispersed throughout the transparent binder 1404 can be formed by maneuvering the distribution of the light conversion particles 1406 in the transparent binder 1404 where the plurality of heat transfer paths 1001 are planned. The concentration of the light conversion particles 1406 in FIG. 30C is comparable to the concentration of the light conversion particles 1406 in FIG. 30A. As previously stated, the heat transfer paths in FIG. 30A are mostly broken. By contrast, in FIG. 30C, the wavelength conversion layer 1402 includes the plurality of heat transfer paths 1002 similar in shape to a spoke having the LED device 1106 as a hub. The concentration of the light conversion particles 1406 along the planned paths is high enough for the light conversion particles 1406 to form a plurality of heat transfer paths 1002, e.g. like a spoke, by lining up the light conversion particles 406 successively along a substantially radial direction because the majority of the light conversion particles 1406 are at least partially in direct contact with neighboring light conversion particles 1406 in the que. The heat transfer path 1002 passes through the wavelength conversion layer 1402 in which the concentration of the light conversion particles 1406 is appreciably lower than the concentration of the light conversion particles 1406 that lays out the heat transfer path 1002. By elevating the concentration of the light conversion particles 1406 only where the heat transfer path 1002 is planned in the transparent binder 1404, the heat transfer paths 1002 can be obtained while mitigating the problem of light blocking resulting from excessive concentration of the light conversion particles 1406. In some embodiments, the heat transfer path 1002 further includes a gap filler for tightening up the contact between the light conversion particles 1406 on the heat transfer path 1002. For example, the heat transfer path 1002 further includes a plurality of nanoparticles such as $TiO_2$, $Al_2O_3$, $SiO_3$, $ZrO_2$, CaO, SrO, BaO, silicon carbide, silicon nanoparticles. These nanoparticles, having a thermal conductivity from 10 to 50 W/(m·K), are dimensionally much smaller than the light conversion particles that constitute the primary ingredient of the heat transfer path 1002. For example, the nanoparticle is from 10 to 300 nm. Preferably, the nanoparticle is from 20 to 100 nm. The nanoparticles help close the gaps between the light conversion particles 406 on the heat transfer path 1002. Other things equal, the heat transfer path 1002, when further including nanoparticles, becomes a more efficient heat conduit because the light conversion particles 406 on the heat transfer path 1002 are in a tighter contact with one another than in the absence of nanoparticles.

Soft materials such as silicone and resin are suitable materials for the transparent binder. A bendable LED filament is made possible with these highly elasto-plastic materials. However, sometimes it is desirable to use these inherently soft materials to provide a LED filament capable of self-sustained plastic deformation such that external support structures can be minimized or even eliminated when the LED filament is expected to maintain a particular posture when it is connected to a lighting fixture such as LED light bulb. The posture could be a straight line extending vertically, horizontally or in any other direction. The posture could be curves of any kind, including simple curves such as arc and polygon and complex curves such as helix, petal and gift ribbon. In an embodiment, the wavelength conversion layer includes a posture maintainer such that the LED filament is capable of self-sustained plastic deformation. For example, the posture maintainer includes a pre-determined concentration of particles harder than the transparent binder in which the particles are embedded. Alternatively, the posture maintainer includes a wire system embedded in the transparent binder. Moreover, the posture maintainer includes an aperture system embedded in the transparent binder. Light conversion particles such as phosphor participles are harder than the binder materials such as silicone and resin. Thus, the wavelength conversion layer can be made harder by increasing the concentration of the light conversion particles in the transparent binder. In an embodiment, the hardened wavelength conversion layer includes alternate coatings of the transparent binder and the phosphor particles. The wavelength conversion layer is thus configured to exhibit an even concentration of the phosphor particles throughout the wavelength conversion layer. In some embodiments, the wavelength conversion layer is configured to have a Young's modulus from $0.1 \times 10^{10}$ to $0.3 \times 10^{10}$. In other embodiments to be used with LED light bulbs, the wavelength conversion layer is configured to have a Young's modulus from $0.15 \times 10^{10}$ to $0.25 \times 10^{10}$ Pa.

Figure 32A:
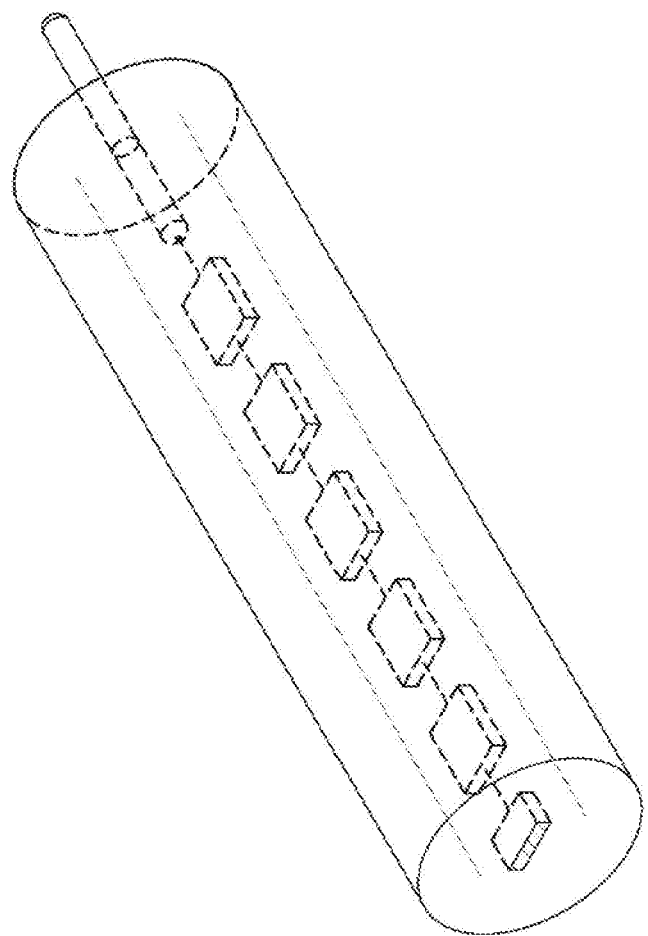
Figure 32B:
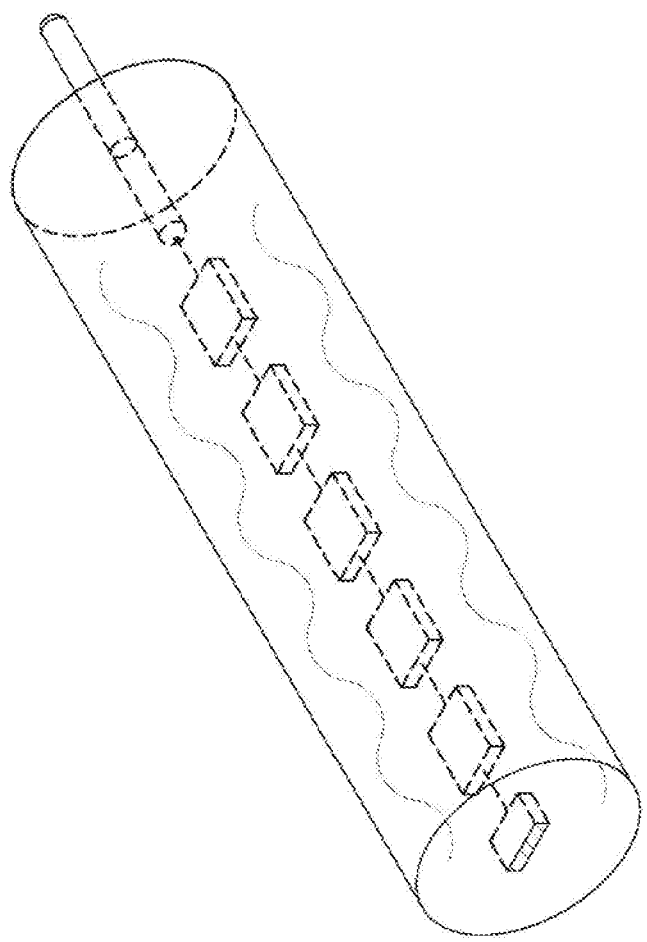
Figure 32D:
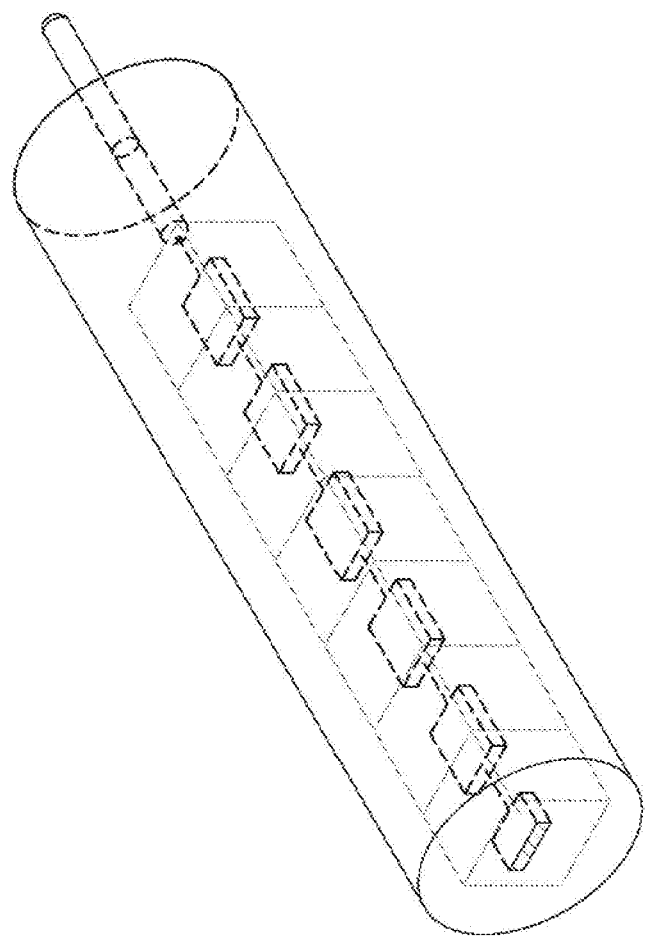
Figure 32E:
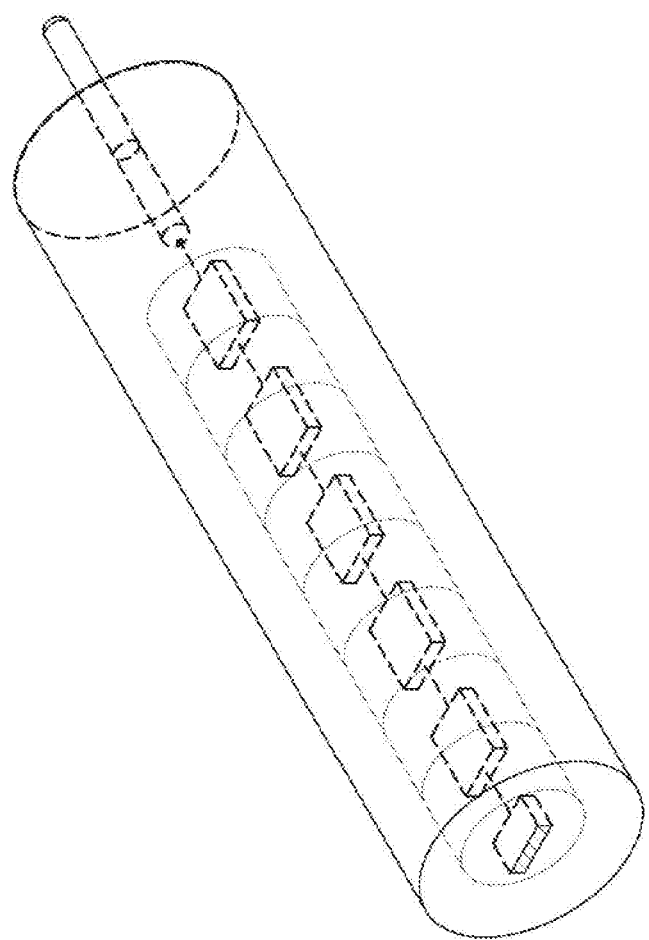

In another embodiment, the posture maintainer includes a wire system embedded in the transparent binder to reinforce the wavelength conversion layer comprising primarily elastic binder materials such as silicone or resin. The wire is made from resilient materials such as copper and glass fiber and preferably light transmissive materials such as nanotubes. The wire system comes in many structures of 2-D (e.g. FIGS. 32A to 32B) or 3-D (e.g. FIGS. 32C to 32F) depending on the application. In FIG. 32A, the wire system includes a simple set of straight wires extending longitudinally in the wavelength conversion layer. In FIG. 32B, the wire system includes a set of sinuous springs extending longitudinally in the wavelength conversion layer. In FIG. 32C, the wire system includes a helical spring extending longitudinally in the wavelength conversion layer. In FIGS. 32D and 32E, the wire system includes a grid structure extending in the wavelength conversion layer along the longitudinally axis of the LED filament. In FIG. 32D, the wire system includes a rectilinear grid extending in the wavelength conversion layer along the longitudinally axis of the LED filament. In FIG. 32E, the wire system includes a curvilinear grid extending in the wavelength conversion layer along the longitudinally axis of the LED filament.

Figure 32F:
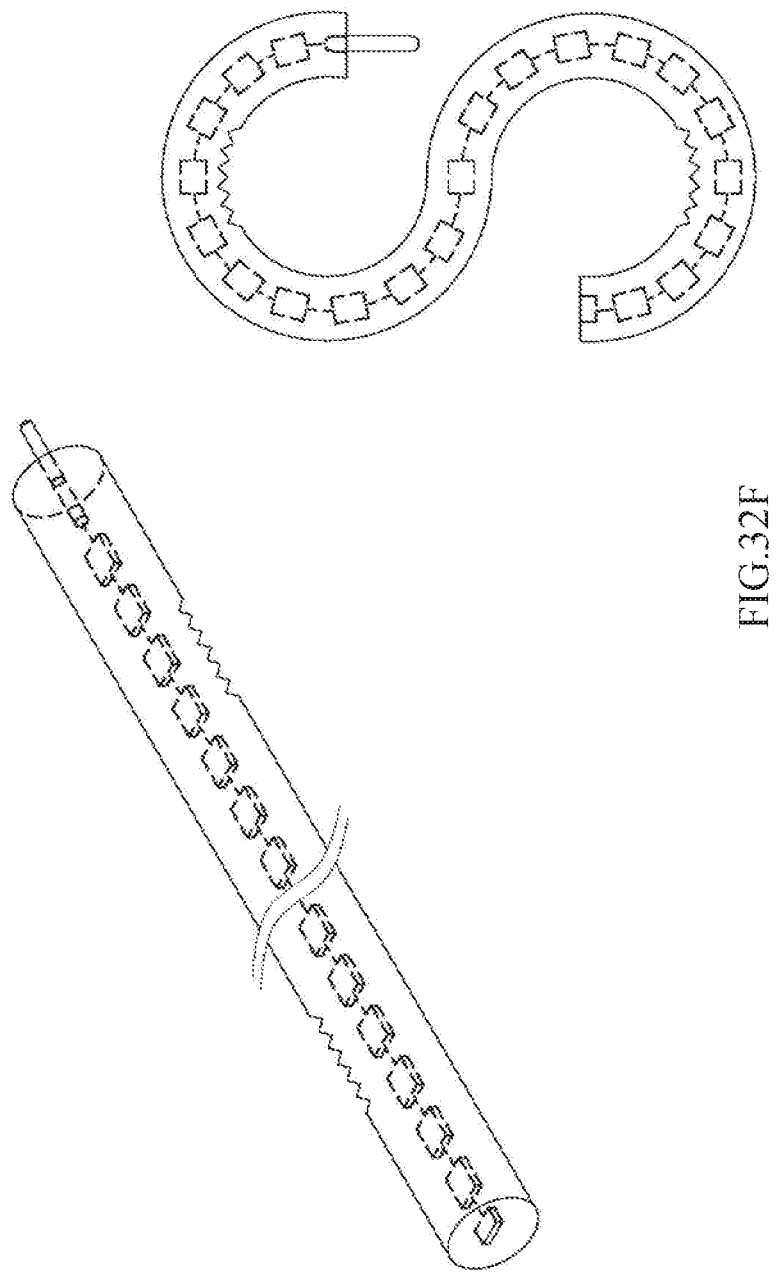
Figure 32G:
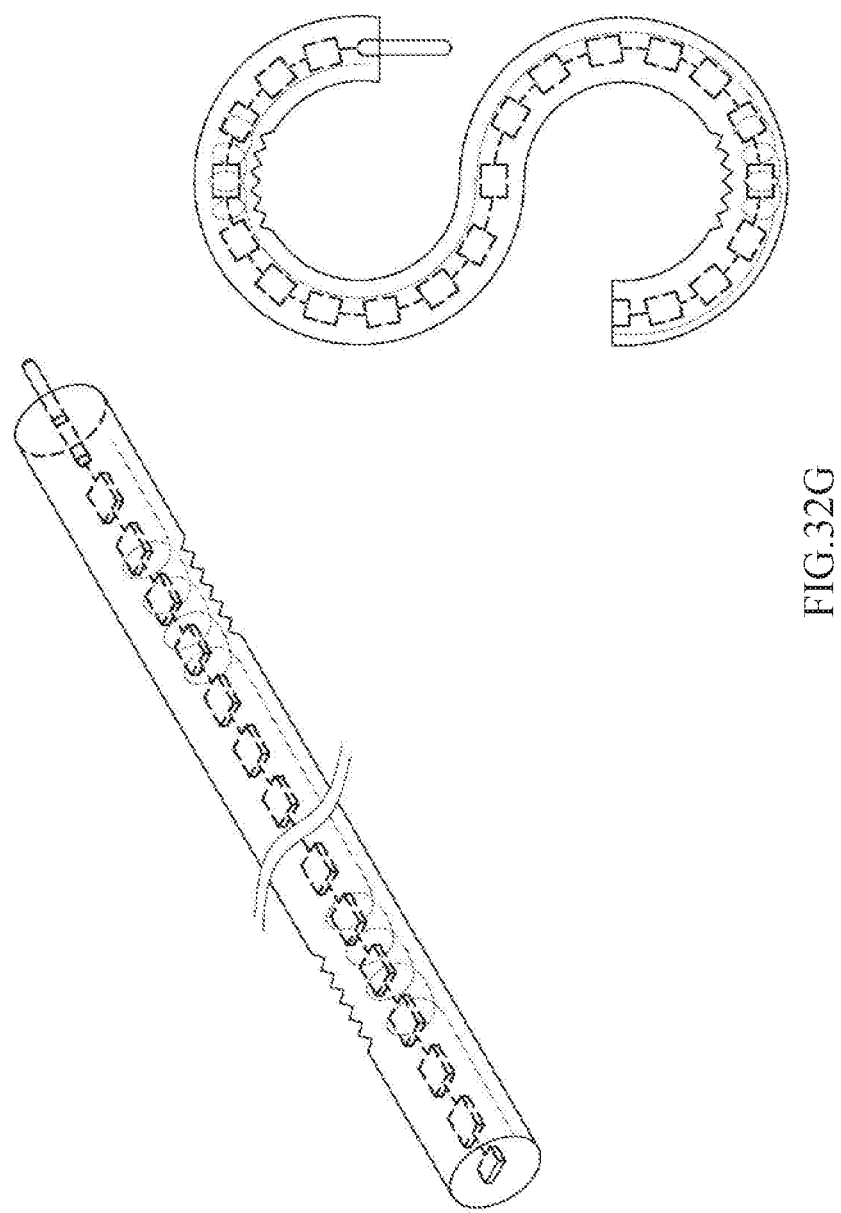

In yet another embodiment, the posture maintainer includes an aperture system on the surface of the wavelength conversion layer where tight turns are planned for the posture the LED filament is expected to maintain in an application. In FIG. 32F, for example, the LED filament is expected to maintain an S-shaped posture. A set of apertures is deployed at the inner part of the wavelength conversion layer where the tight turn is planned. The set of apertures makes it easier for the LED filament to maintain the S-shaped posture by accommodating compression at the inner part of the tight turn. In some embodiments, the wire system includes a combination of the structures illustrated above. In FIG. 32G, for example, the wire system includes a combination of straight wire, helical spring and aperture system. The helical spring is deployed in the wire system only where the tight turns are planned for the posture the LED filament is expected to maintain in an application. Otherwise, only the straight line is deployed. A set of apertures is deployed at the inner part of the wavelength conversion layer where the tight turn is planned.

The tubular enclosure of an LED filament, potentially functioning as a lens when light from the LED device passes through it. In some embodiment, the tubular enclosure includes a beam shaper. The beam shaper includes an outer optical surface and an inner optical surface. When the two optical surfaces have an equal curvature, the beam shaper has no optical power. In other words, the light transmissive portion would neither converge nor diverge light coming from the LED light source though a real lens, which has nonzero thickness, is always slightly positive. Alternatively, the outer optical surface has a different curvature from that of the inner optical surface. The light transmissive portion is thus configured to either focus or disperse the light beaming from the LED light source in a desired fashion by means of refraction. When the lamp tube takes the shape of a circular cylinder, the light transmissive portion forms a cylindrical lens. Turning to FIG. 9, in an embodiment, the inner optical surface 901 and the outer optical surface 902 are both convex and have an equal radius of curvature, making the light transmissive portion 105 an equiconvex cylindrical lens. Thus, the light transmissive portion 105 neither focuses nor disperses light coming from the LED light source 202.

The light transmissive portion of a lamp tube, potentially functioning as a lens when light from the LED light source passes through it, includes an outer optical surface and an inner optical surface. When the two optical surfaces have an equal curvature, the light transmissive portion has no optical power. In other words, the light transmissive portion would neither converge nor diverge light coming from the LED light source though a real lens, which has nonzero thickness, is always slightly positive. Alternatively, the outer optical surface has a different curvature from that of the inner optical surface. The light transmissive portion is thus configured to either focus or disperse the light beaming from the LED light source in a desired fashion by means of refraction. When the lamp tube takes the shape of a circular cylinder, the light transmissive portion forms a cylindrical lens. Turning to FIG. 9, in an embodiment, the inner optical surface 901 and the outer optical surface 902 are both convex and have an equal radius of curvature, making the light transmissive portion 105 an equiconvex cylindrical lens. Thus, the light transmissive portion 105 neither focuses nor disperses light coming from the LED light source 202.

In another embodiment, the outer optical surface is convex but the inner optical surface is concave, making the light transmissive portion a meniscus cylindrical lens. Turning to FIG. 10, in some embodiments, the concave outer optical surface 902 is steeper than the convex inner optical surface 901, making the light transmissive portion 105 thinner at the center than at the periphery. The light transmissive portion 105 is thus configured to convert light coming from the LED light source 202 into a converged beam like what a collimator does. Turning to FIG. 11, in other embodiments, the convex outer optical surface 902 is steeper than the concave inner surface 901, making the light transmissive portion 105 thicker at the center than at the periphery. The light transmissive portion 105 is thus configured to convert light coming from the LED light source 202 into a focused beam of light.

Figure 13:
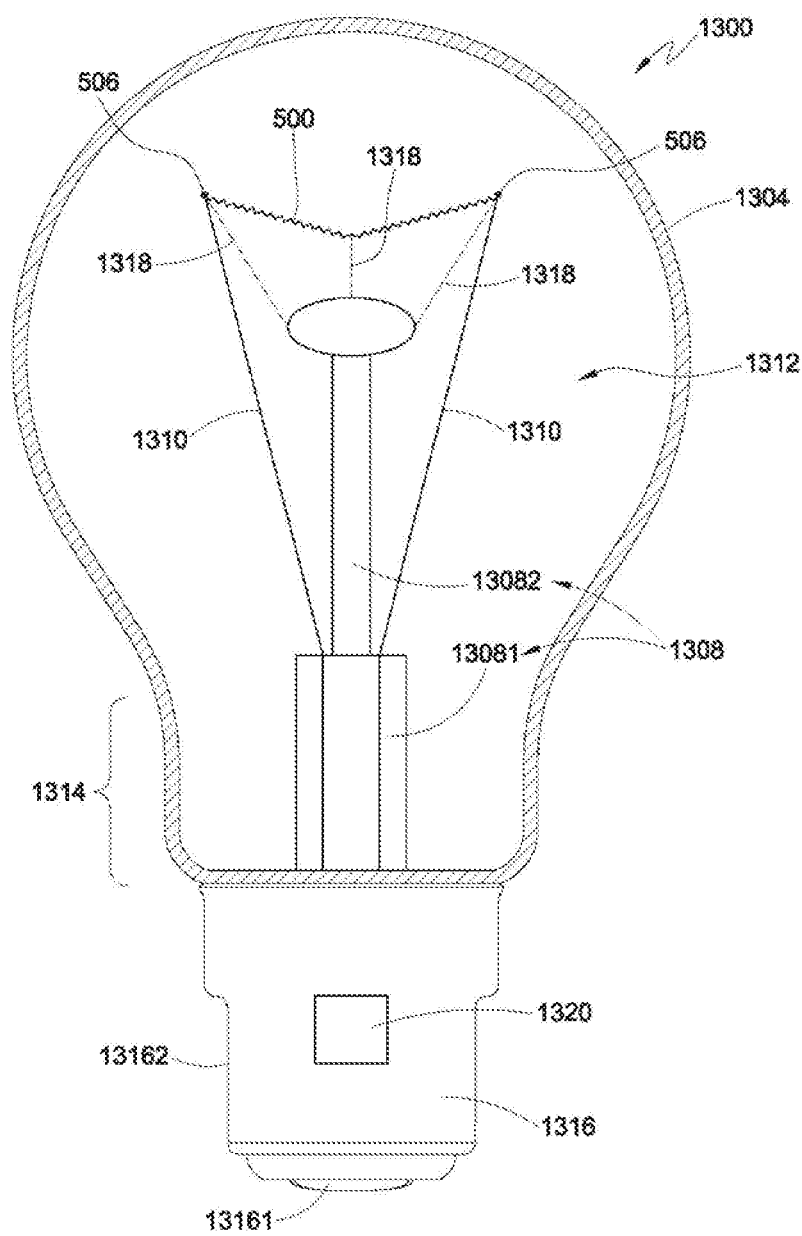
FIG. 13 is a front view of the LED light bulb in accordance with an embodiment of the present invention.

In yet another embodiment, the outer optical surface is convex but the inner optical surface is either planar or also convex. Turning to FIG. 12, in some embodiments, a portion of the inner optical surface 901 is planar, making a portion of the light transmissive portion 105 a plano-convex cylindrical lens. The portion of the light transmissive portion 105 is thus configured to convert light coming from the LED light source 202 into a collimated beam of light. Turning to FIG. 13, in other embodiments, the inner optical surface 901 is also convex, making the light transmissive portion 105 a bi-convex cylindrical lens. Functionally similarly, the light transmissive portion 105 is configured to convert light coming from the LED light source 202 into a collimated beam of light.

Figure 14:
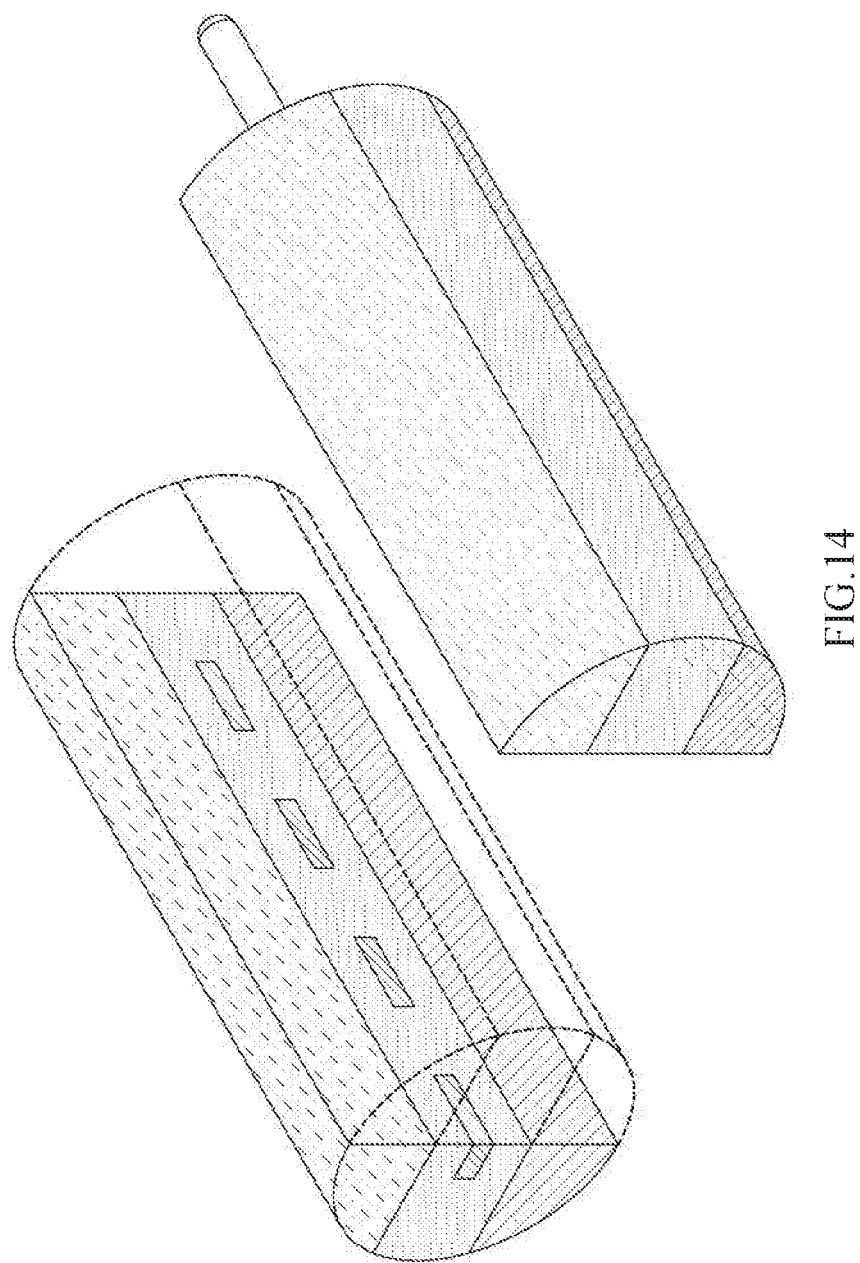
FIG. 14 is a cutaway view of the LED filament in accordance with an embodiment of the present invention.
Figure 15:
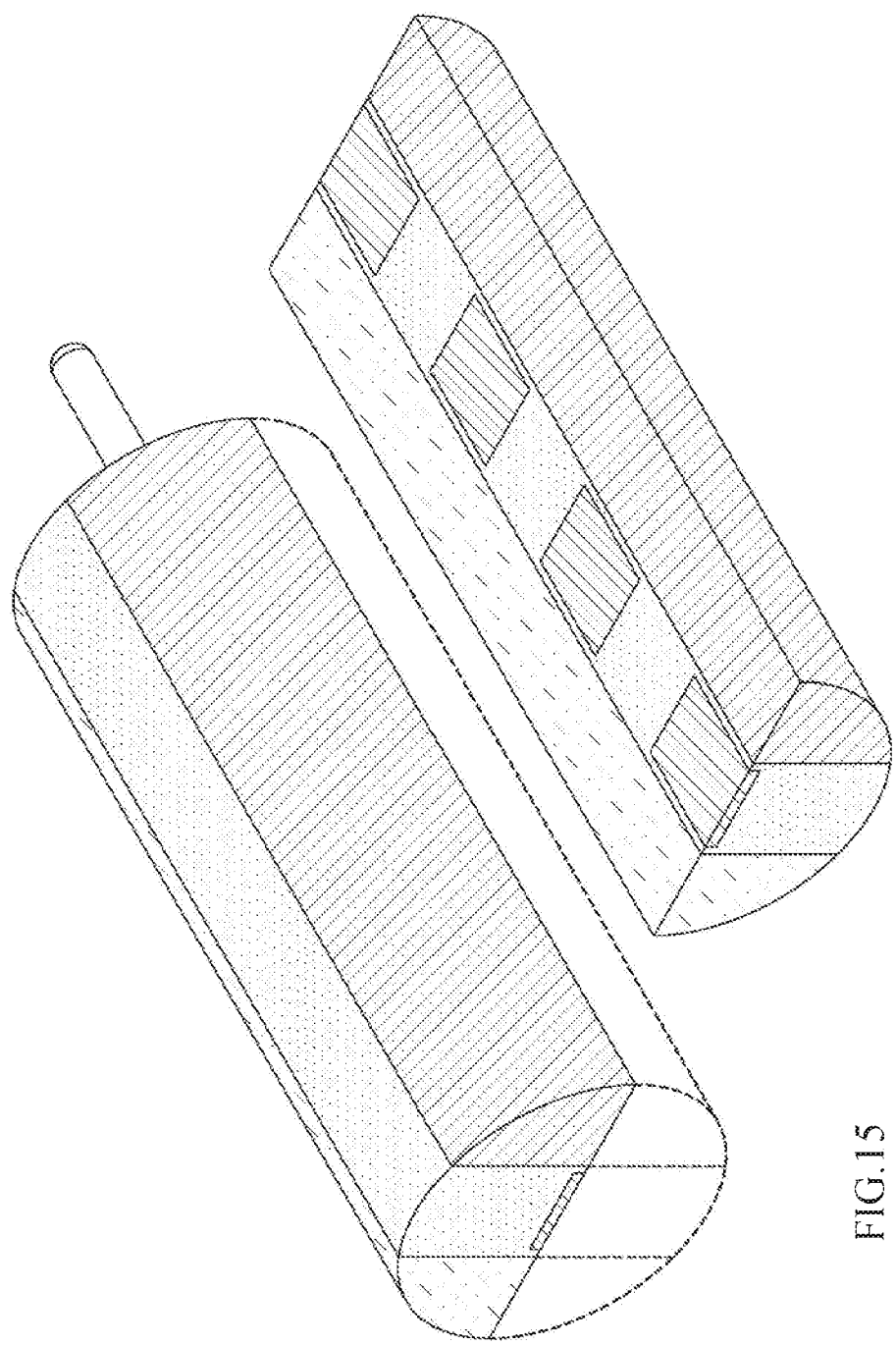
FIG. 15 is a cutaway view of the LED filament in accordance with an embodiment of the present invention.
Figure 16:
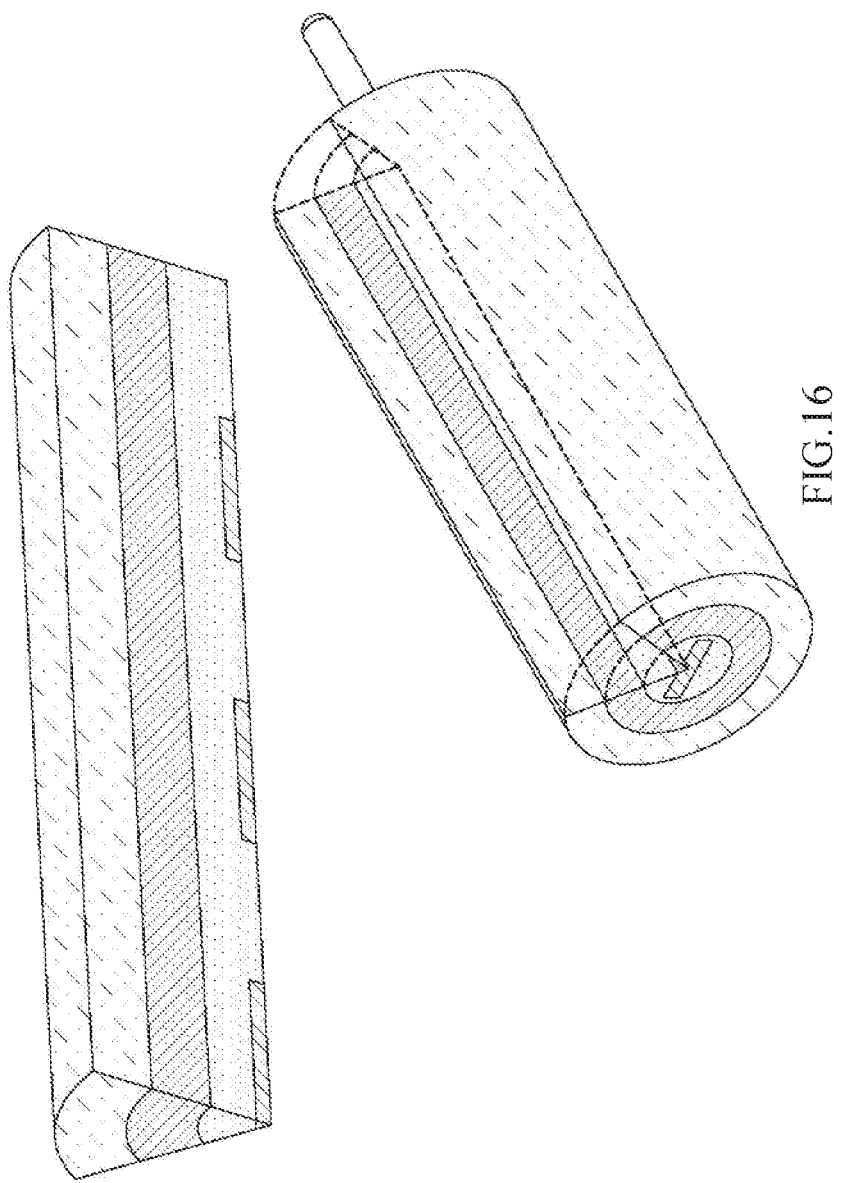
FIG. 16 is a cutaway view of the LED filament in accordance with an embodiment of the present invention.
Figure 17:
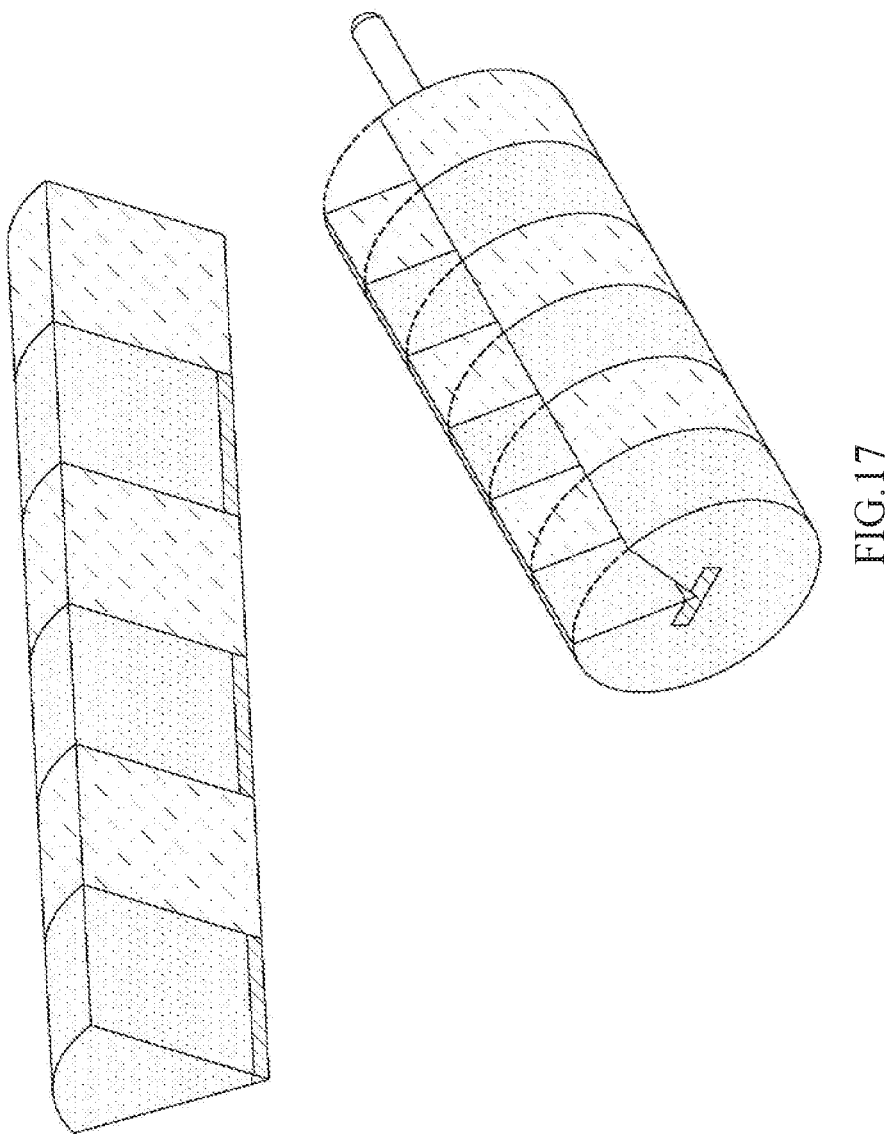
FIG. 17 is a cutaway view of the LED filament in accordance with an embodiment of the present invention.
Figure 18:
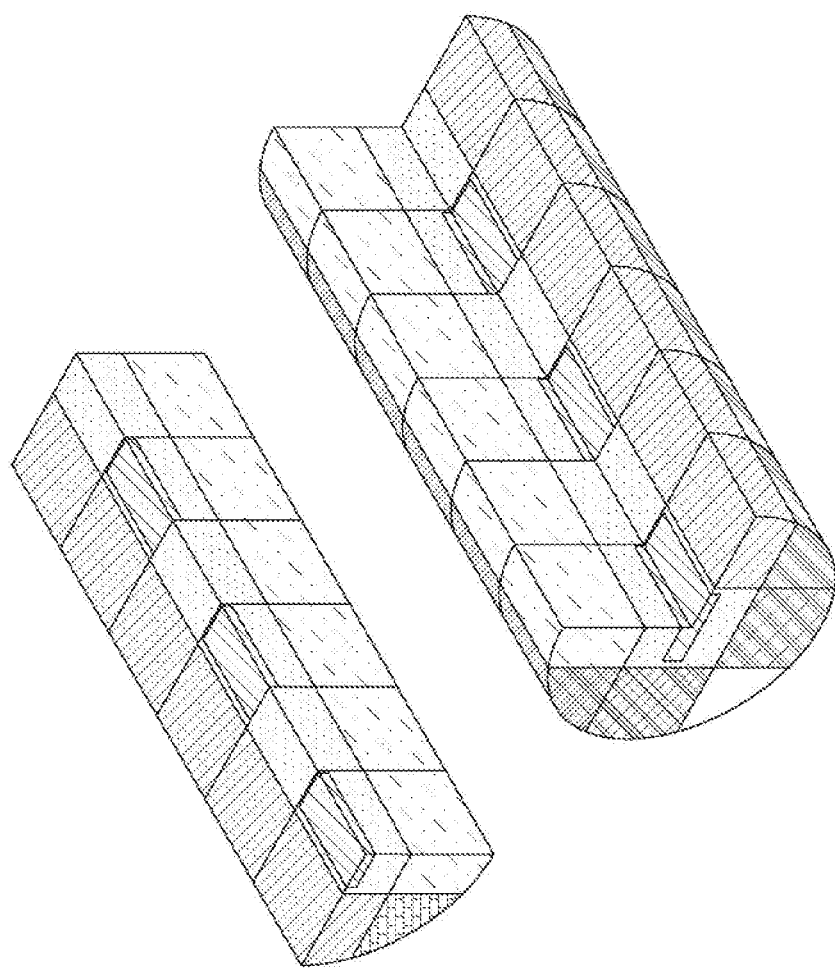
FIG. 18 is a cutaway view of the LED filament in accordance with an embodiment of the present invention.
Figure 19:
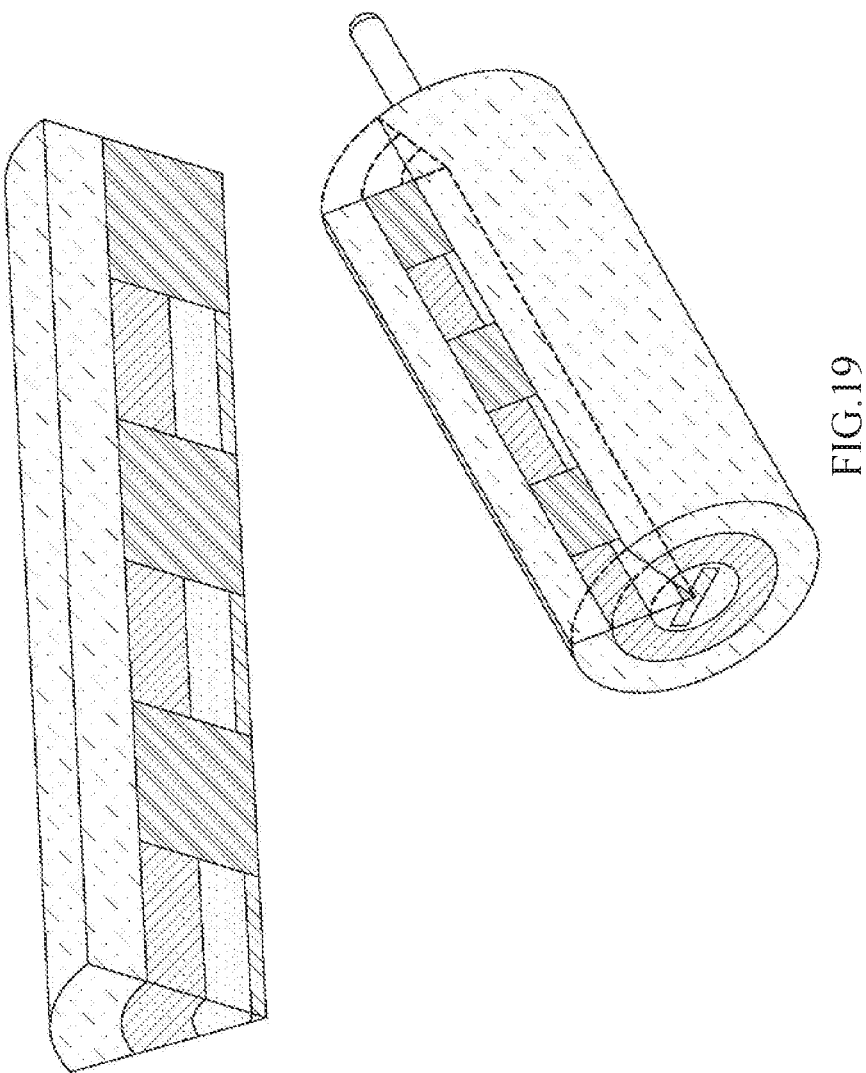
FIG. 19 is a cutaway view of the LED filament in accordance with an embodiment of the present invention.
Figure 20:
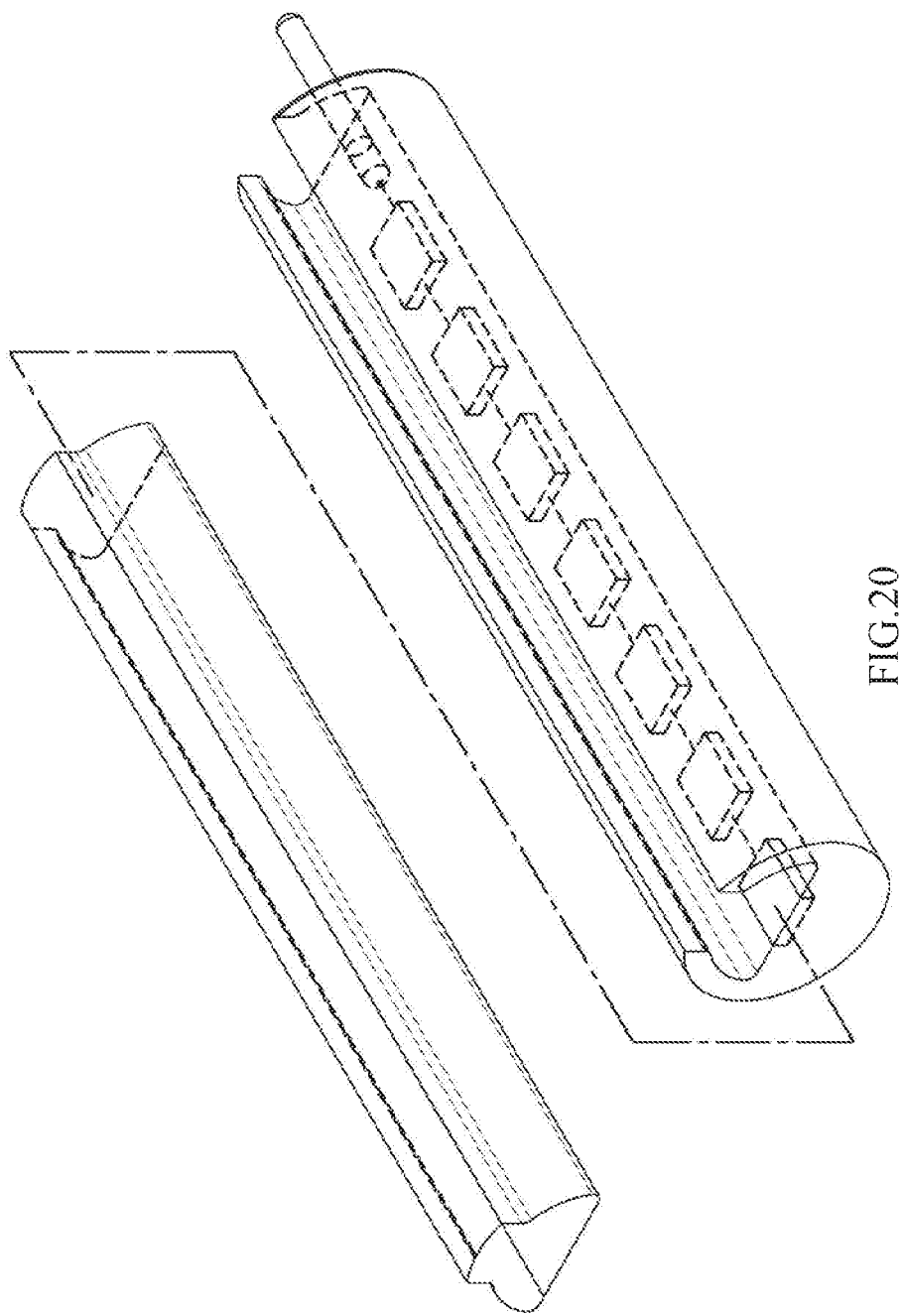
FIG. 20 is a cutaway view of the LED filament in accordance with an embodiment of the present invention.
Figure 21:
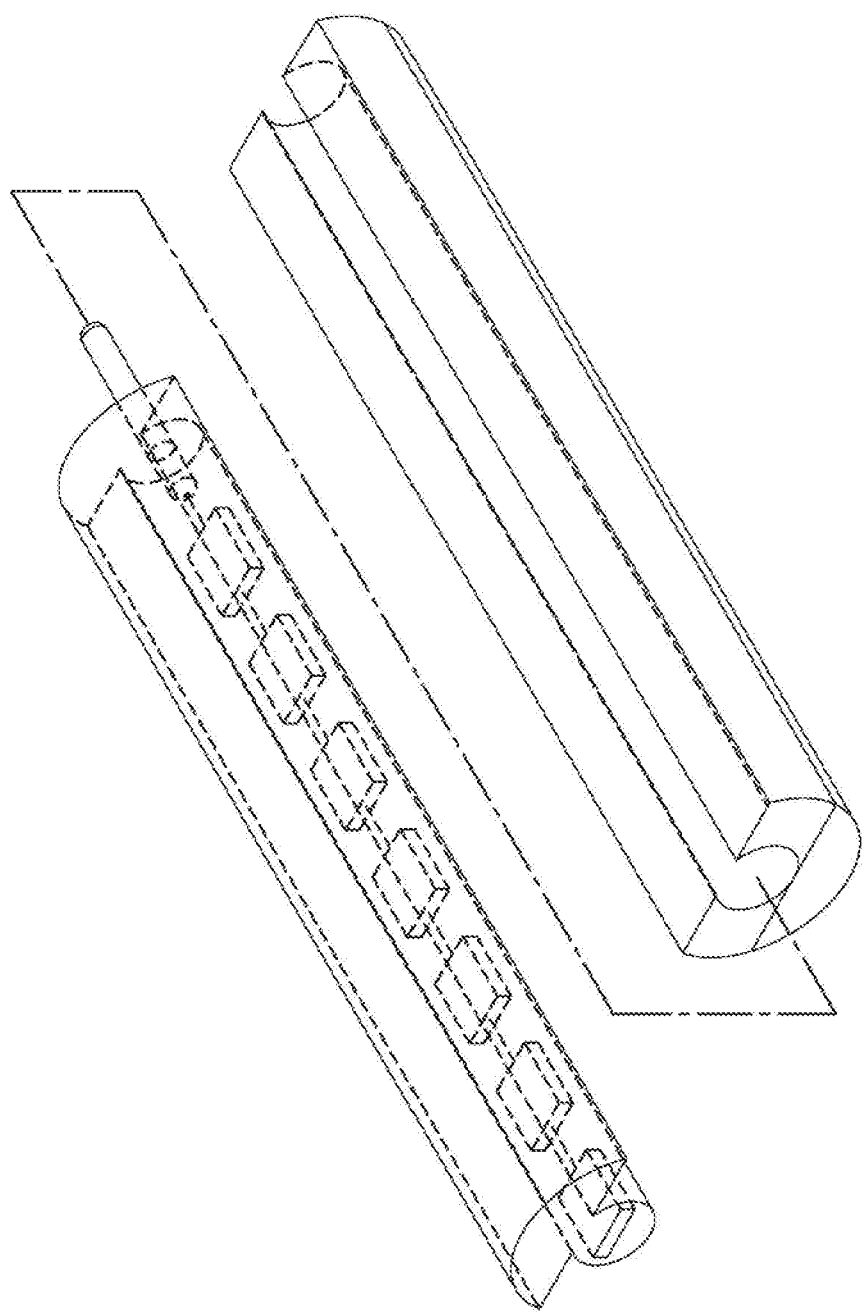
FIG. 21 is a cutaway view of the LED filament in accordance with an embodiment of the present invention.
Figure 22:
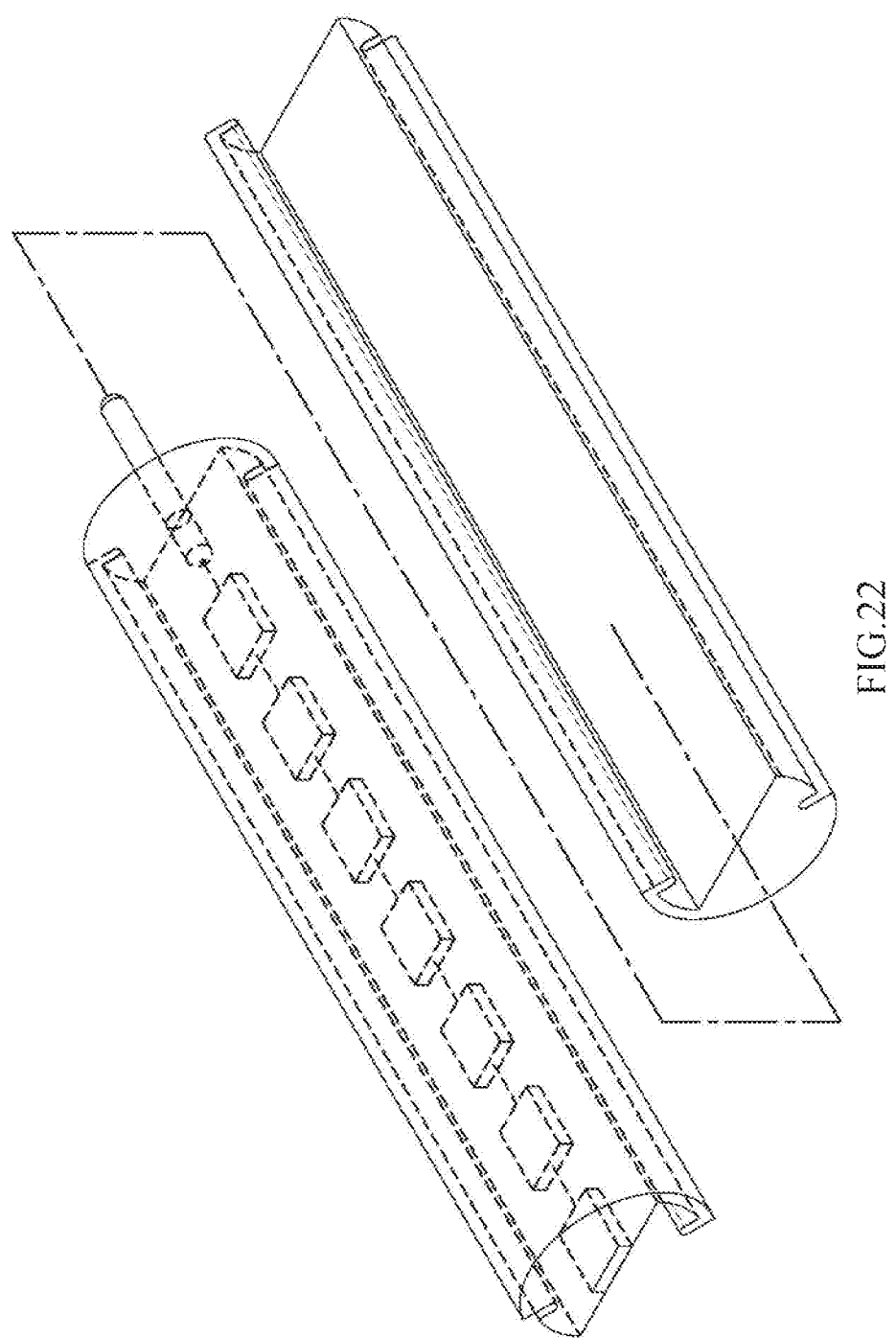
FIG. 22 is a cutaway view of the LED filament in accordance with an embodiment of the present invention.
Figure 23A:
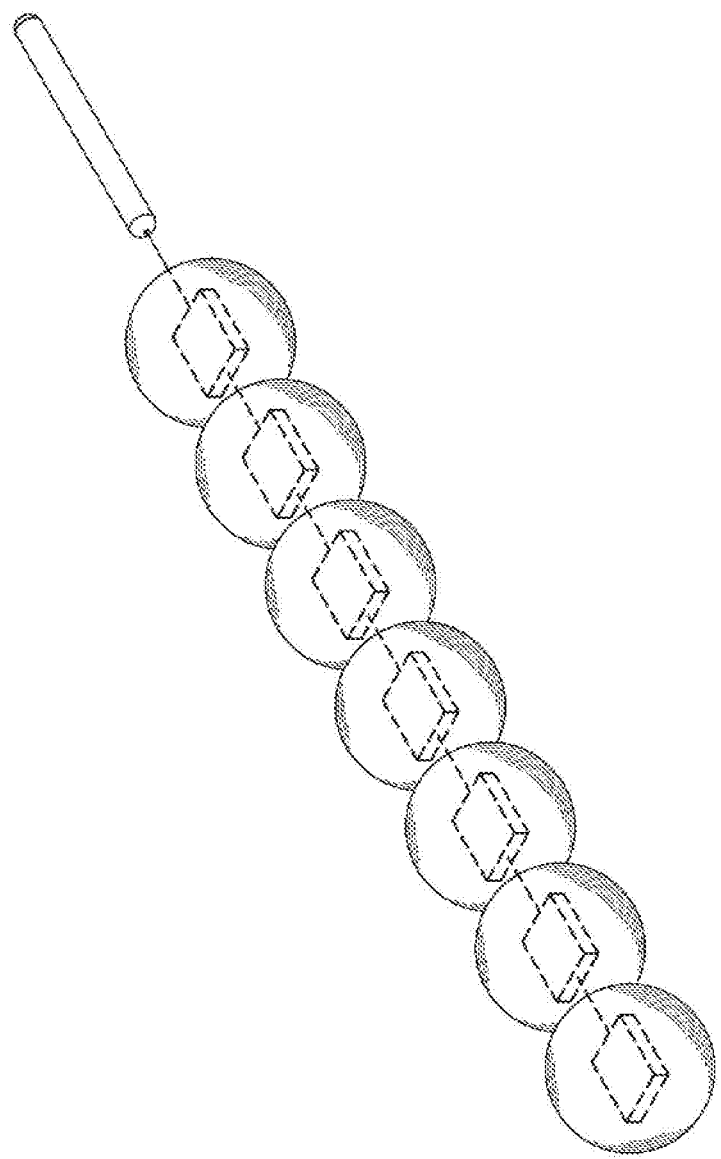
FIGS. 23A to 23C are see through views of the LED filament in accordance with an embodiment of the present invention.
Figure 23B:
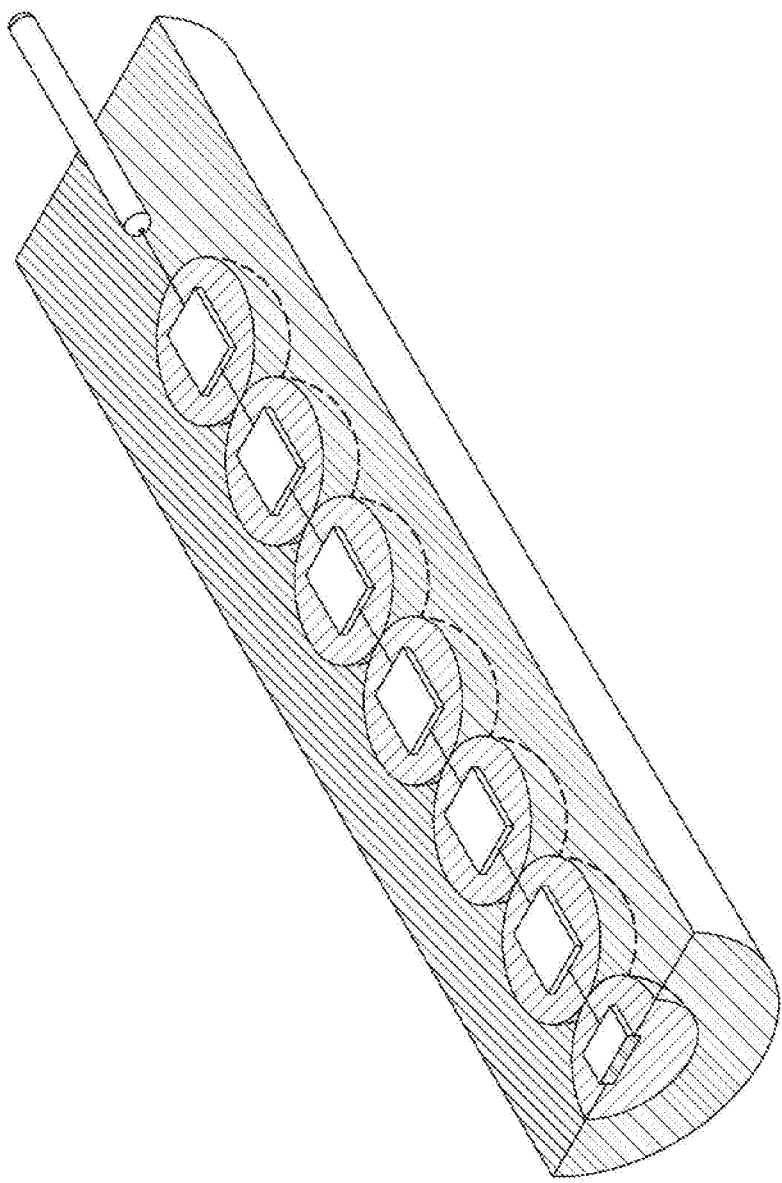
Figure 23C:
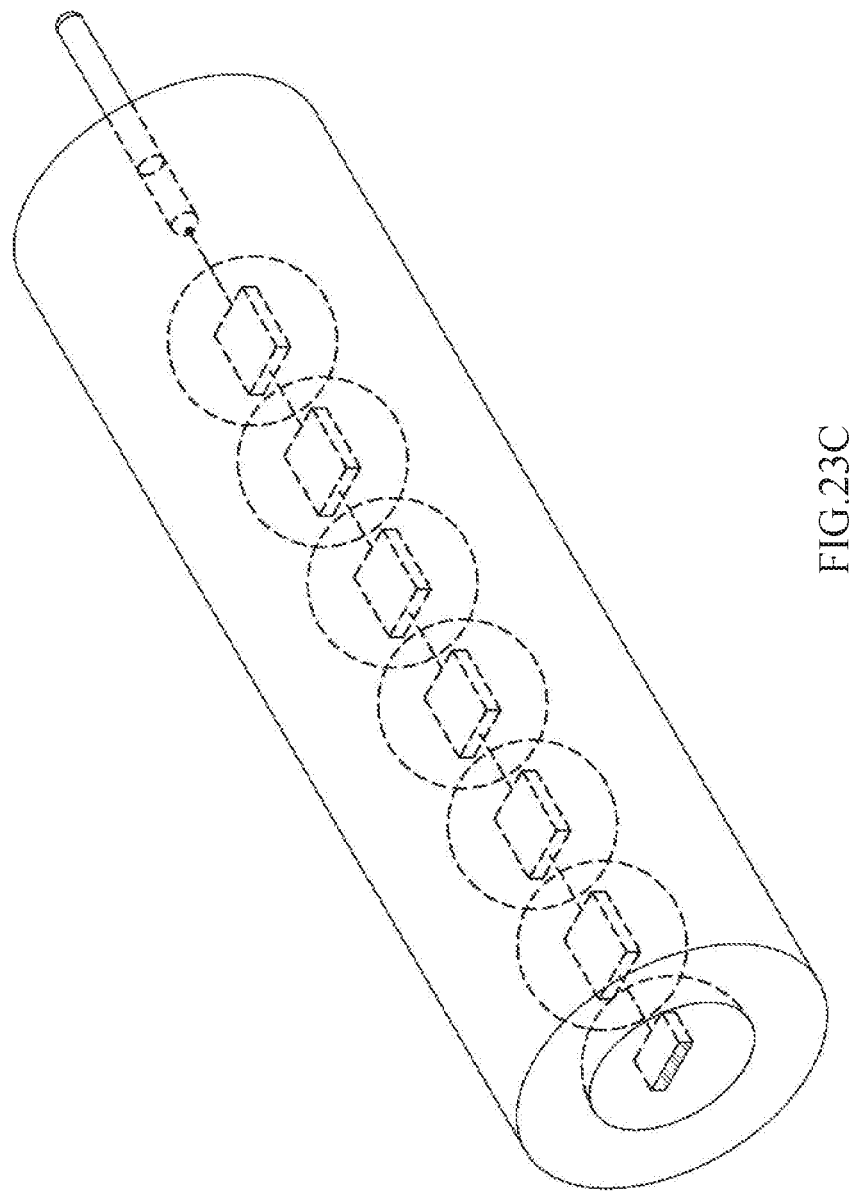

In still another embodiment, the outer optical surface is concave but the inner optical surface is either planar or also concave. Turning to FIG. 14, in some embodiments, a portion of the inner optical surface 901 is planar, making a portion of the light transmissive portion 105 a plano-concave cylindrical lens. The portion of the light transmissive portion 105 is thus configured to diverge light coming from the LED light source 202 across a wider filed of angle. Turning to FIG. 15, in other embodiments, the inner optical surface 901 is also concave, making the light transmissive portion 105 a bi-concave cylindrical lens. Functionally similarly, the light transmissive portion 105 is configured to diverge light coming from the LED light source 202 across a wider field of angle.

In an embodiment, the outer surface of the tubular enclosure is provided by a polished layer. An LED filament having a glossy finish may be aesthetically appealing to some people. However, the LED filament may suffer from total internal reflection or poor heat dissipation. In another embodiment, the outer surface of the tubular enclosure is provided by a texturized layer. The texturized layer improves light extraction by reducing total internal reflection. The texturized layer enhances heat dissipation by providing the tubular enclosure with a greater surface area than a polished layer does. In FIG. 31A, for example, the textured layer is formed by a sufficient concentration of the light conversion particles 1406 found close to but bulging from the outer surface of the wavelength conversion layer 1402. By contrast, in FIGS. 31B and 31C, the tubular enclosure includes a dedicated texturized layer having different patterns such as wedge and cube.

Yttrium aluminum garnet (YAG), typically having a refractive index (RI) of about 1.8, is an example of a common phosphor that may be used. The RI of the phosphor particles and the RI of the binder material can be the same or different. In an embodiment, the binder material includes a transparent material having an RI that is substantially matched to that of the wavelength conversion particles embedded therein. For example, the binder material includes a high-index silicone having an RI of about 1.6 or greater. By providing the wavelength conversion particles in a substantially index-matched binder material, light scattering losses due to differences in the RI of the binder material and the wavelength conversion particles can be reduced or eliminated.

Figure 27:
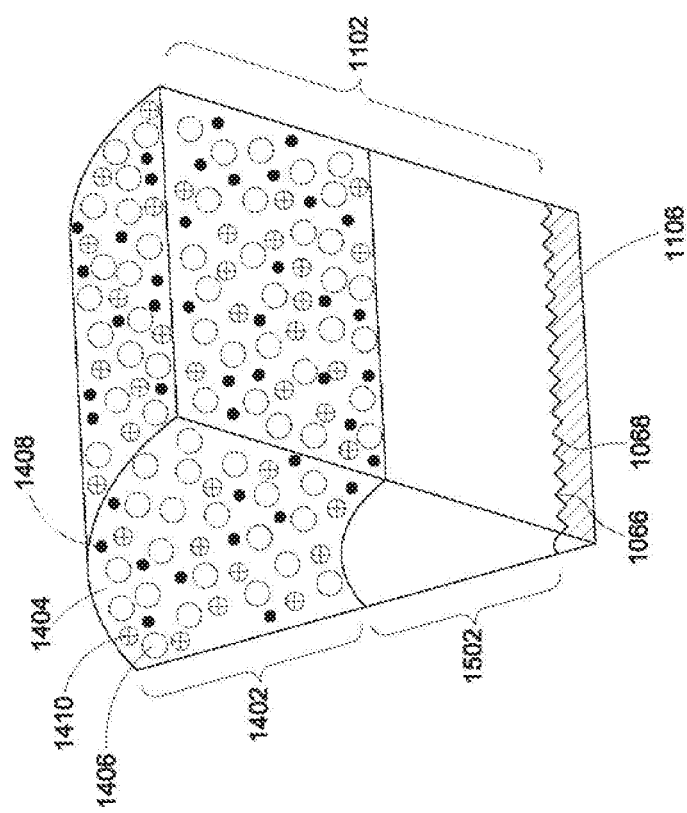
FIG. 27 is a cutaway view of the LED filament in accordance with an embodiment of the present invention.

Referring to FIG. 27, in some embodiments, a plurality of nanoparticles 1408 is embedded in the transparent binder 1404 that formed the wavelength conversion layer 1402. The nanoparticles are dispersed throughout the transparent binder 1404 of the wavelength conversion layer 1404. By including nanoparticles with a RI higher than that of the host medium—the transparent binder—the effective RI of the host medium is increased. The presence of nanoparticles in the transparent binder brings the RI of the transparent binder (e.g., regular silicone with an RI of about 1.5) closer to the RI of the phosphor particles (with an RI of about 1.8). When these two elements are not closely index-matched, the difference in RI results in light scattering because typical phosphor particles are substantially larger (about 5.5 µm) than the wavelength of light emitted from the LED device (450 nm for a blue LED). Light extraction efficiency increases when the difference in RI between the phosphor particle and the transparent binder is reduced. However, the efficiency only increases up to a point. If the effective RI of the transparent binder gets too high, the light extraction efficiency will decrease due to total internal reflection at the flat interface of the wavelength conversion layer and any surrounding medium having a lower RI (e.g., silicone or air). An acceptable effective RI for the wavelength conversion layer is approximately 1.7, providing optimal index-matching with manageable levels of total internal reflection. The nanoparticles may comprise several different materials such as $TiO_2$, $Al_2O_3$, $SiO_3$, $ZrO_2$, CaO, SrO, BaO, diamond, silicon carbide, silicon nanoparticles. The RI of both $TiO_2$ and diamond is approximately 2.5. The volume of nanoparticles that is needed to adjust the effective RI of the wavelength conversion layer by a certain amount can be easily calculated using Vegard's Law which states that the relationship between volume and RI is linear. For example, if the wavelength conversion layer material has a RI of 1.5 and the target effective RI is 1.7, then the wavelength conversion layer should comprise approximately 20% TiO2 nanoparticles by volume. Other material combinations and compositions may also be used. For example, some embodiments may have greater than 5% nanoparticles by volume. Other embodiments may have greater than 10% nanoparticles by volume. Still other embodiments may include 20-40% by volume. The concentration of the nanoparticles depends on such factors as the material being used and the desired RI adjustment.

Figure 28:
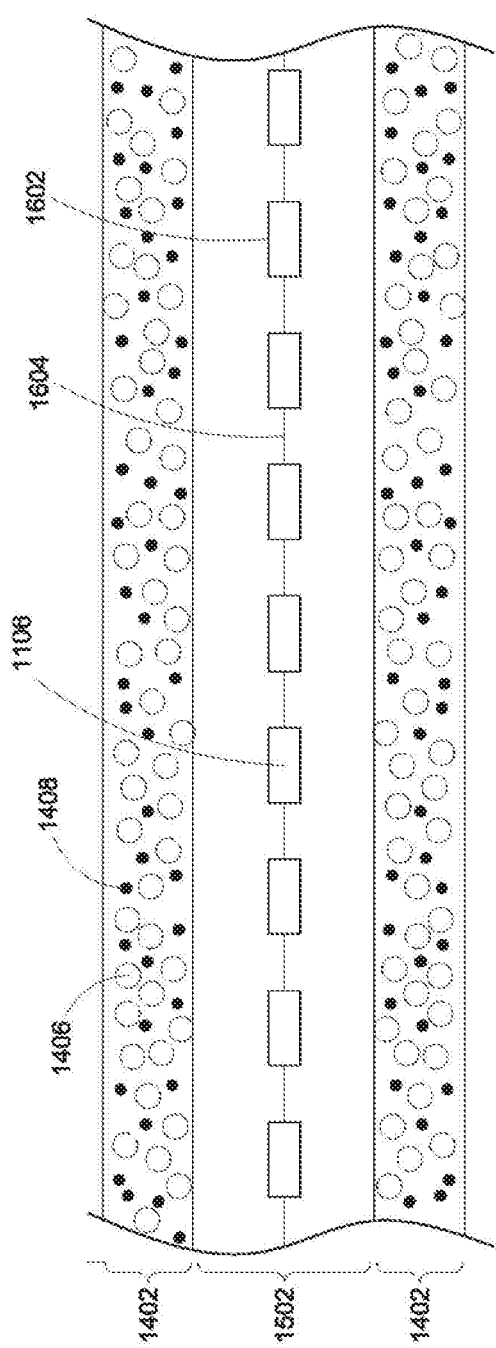
FIG. 28 is a cross-sectional view of the LED filament in accordance with an embodiment of the present invention.
Figure 29:
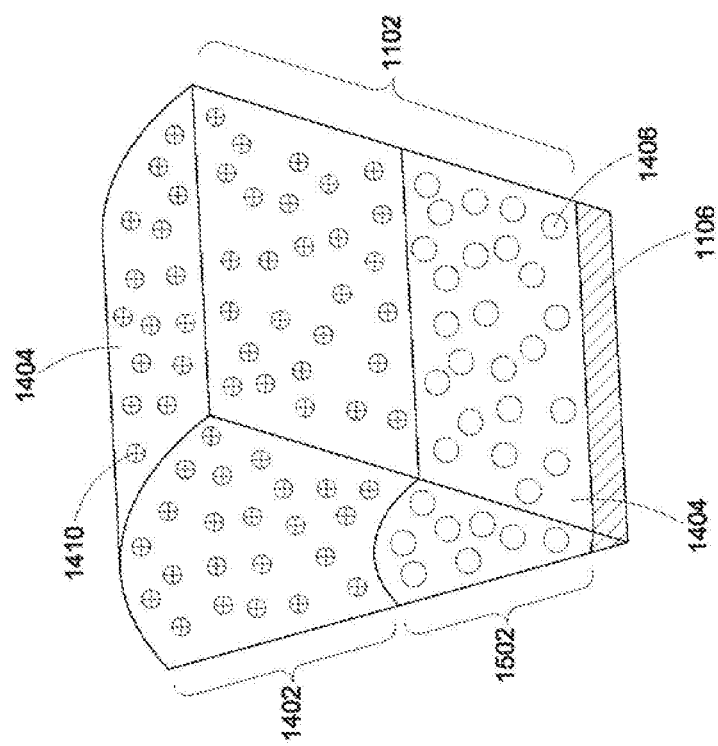
FIG. 29 is a cutaway view of the LED filament in accordance with an embodiment of the present invention.

Referring to FIG. 27, sometimes it is desirable to load the wavelength conversion layer 1402 with a high volume of light conversion particles 1406. There would be less space in the wavelength conversion layer 1402 for nanoparticles 1408. As discussed above, the nanoparticles 1408 are used to adjust the effective RI of the wavelength conversion layer 1402. When the nanoparticles 1408 do not produce a large enough RI shift in the wavelength conversion layer 1402, the space layer 1502 can compensate for those cases. In addition to shifting RI, the spacer layer 1502, when interposed between the LED device 1106 and the wavelength conversion layer 1402, enables a uniform thickness of the wavelength conversion layer 1402 to produce uniform white light, which entails a proper combination of blue light and the phosphor light. However, a variety of factors cause the thickness of the wavelength conversion layer to be uneven when it is disposed directly over the LED device. The surface of the LED device might be, intentionally or unintentionally, uneven. For example, in FIG. 27, the wavelength conversion layer would be thinner at the point 1066 than at the point 1068 when the surface of the LED device 1106 is texturized. Moreover, the array of LED devices does not define a perfectly even interface for the wavelength conversion layer to sit on. In FIG. 28, for example, the wavelength conversion layer would be thinner at the point 1602 than at the point 1604. Where the wavelength conversion layer is relatively thin, blue light would dominate because there would be insufficient contribution of light from the phosphors. The spacer layer 1502 in FIGS. 27 and 28 eliminates the problem by forming a level interface for the wavelength conversion layer to sit on. The spacer layer 1502 can be made of many different materials such as silicone, epoxy, oil, dielectrics, and other materials. The material should be chosen such that the RI of the spacer layer 1502 is smaller than the RI of the LED device 1106 and the RI of the wave length conversion layer 1402. A portion of the light that enters the spacer layer 1502 is then incident on the interface between the spacer layer 1502 and the wavelength conversion layer 1402. At the interface the light sees a step-up in RI and passes into wavelength the conversion layer 1402 with minimal reflection. If the light is reflected or backscattered in the wavelength conversion layer 1402, it will see the RI step-down at the spacer layer 1502 interface and has a finite chance of being reflected back into the wavelength conversion layer 1402 because of the TIR phenomenon.

Index-matching the transparent binder 1404 with the phosphor particles 1406 reduces scattering within the wavelength conversion layer 1402. However, such reduction in scattering adversely affects the uniformity of the color temperature distribution in the LED filament. To mitigate the negative effect, light scattering particles (LSPs) are disposed proximate to the LED device 106. The LSPs are distributed around the LED device so that the individual photons are redirected before they are emitted to randomize the point where they exit the device. This has the effect of evening out the color temperature distribution such that an outside observer sees roughly the same color over a broad range of viewing angles. The LSPs should have a high RI relative to the surrounding medium, creating a large RI differential between the materials. Because the RI differential causes refraction, it would also be possible to use an LSP material that has a low RI relative to the surrounding medium. The LSPs create localized non-uniformities in the medium that force the light to deviate from a straight path. When the light strikes one or more of the scattering particles the RI differential between the medium and the particles causes the light to refract and travel in a different direction. A large RI differential yields a more drastic direction change for an incident photon. For this reason, materials with a high RI work well in mediums such as silicone or epoxy. Another consideration when choosing a light scattering material is the optical absorbance of the material. Large particles backscatter more of the light inside the package before it can escape the device, decreasing the total luminous output of the device. Thus, preferred scattering particle materials have a high RI relative to the medium and a particle size comparable to the wavelength of the light propagating through the host medium. Ideally, LSPs ensure maximum forward or sideways scattering effect for a given spectrum while minimizing light loss due to backscattering and absorption. The LSPs can comprise many different materials, e.g., silica gel, silicon nanoparticles and zinc oxide (ZnO). Various combinations of materials or combinations of different forms of the same material may be used to achieve a desired scattering effect. Various percentages of composition of the LSPs can be used as dictated by the application. Depending on the materials used, the LSPs will typically be found in concentrations ranging from 0.01% to 5% by volume. Other concentrations can be used; however, the loss due to absorption increases with the concentration of the scattering particles. Thus, the concentrations of the LSPs should be chosen to maintain an acceptable loss figure. In some embodiments, the light scattering particles have diameters that range from 0.1 μm to 2 μm. In some cases, it may be desirable to use LSPs of different sizes. For example, in one embodiment a first plurality of LSPs may comprise titania, silica and diamond, and a second plurality of LSPs may comprise fused silica, titania and diamond. Many other combinations are possible to achieve a desired color temperature distribution.

The LSPs can be dispersed anywhere in the LED filament so long as they are proximate to the LED device such that substantially all of the emitted light has a good probability of interacting with the LSPs. In the embodiment shown in FIG. 26, the LSPs 1410 are dispersed in the wavelength conversion layer 1402 throughout the binder material 1404 along with the nanoparticles 1408 and the phosphor particles 1406. Because the wavelength conversion layer is disposed on the LED device 1106, substantially all of the light travels through the wavelength conversion layer 1402 where the LSPs are dispersed before egressing the LED filament. In other embodiments, the LSPs are dispersed throughout a binder material in a dedicated light scattering layer disposed over the LED device. In FIG. 27, the wavelength conversion layer 1402 is sandwiched by the light scattering layer 1502 and LED device 1106. The LSPs 1410 are dispersed in the light scattering layer 1502 throughout the binder material 1504. Because the light scattering layer 1502 is disposed all over the LED device 1106, all of the light, converted by wavelength conversion layer 1402, must subsequently travel through the light scattering layer 1502 before egressing the LED filament.

FIG. 13 shows an LED light bulb 1300 having an LED filament 1302 of the present invention as the light source. In an embodiment, the LED light bulb 1300 comprises a light transmissive envelope 1304, a base 1316, a stem press 1308, an LED filament 500 and a plurality of lead wires 1310. The light transmissive envelope 1304 is a bulbous shell made from light transmissive materials such as glass and plastic. The light transmissive envelope 1304 includes a bulbous main chamber 1312 for housing the LED filament 1302 and sometimes a neck 1314 dimensionally adapted for attaching to the base 1316. At least part of the 1316 base is metal and includes a plurality of electrical contacts 13161, 13162 for receiving electrical power from a lampholder. The light transmissive envelope 1304 is mounted with its neck 1314 on the base 1316. The stem press 1308 is mounted on the base 1316 within the light transmissive envelope 1304 for holding the lead wire 1310 and the LED filament 1302 in position while keeping the positive and negative currents insulated from each other. The lead wire 1310 extends in a substantially axial direction from the base 1316 through the neck 1314 all the way into the main chamber 1312. The lead wire 1310 physically and electrically connects the electrical contact 13161, 13162 of the base 1316 and an electrical connector 506 of the LED filament. Electrical power is communicated from the lampholder to the base 1316 and all the way to the LED filament 500 through the lead wire 1310 when the base 1316 and the lampholder are properly connected. The LED light bulb 1300 is thus configured to emit light omnidirectionally. In some embodiments, the LED light bulb 1300, including exactly one LED filament 500, is configured to emit light omnidirectionally. In other embodiments, the LED light bulb 1300, including a plurality of LED filaments 500, is configured to emit light omnidirectionally. In addition to brining electrical power for the LED filament 500, the lead wire 1310 also supports the LED filament 500 to maintain a desired posture in the main chamber 1312.

In some embodiment where the lead wire 1310 alone do not provide sufficient support, the LED light bulb 1300 further includes a plurality of support wires 1318 to help the LED filament 500 maintain a desired posture in the main chamber 1312. In some embodiments, the support wire 1318 is made of carbon spring steel for additional damping protection. Preferably, the support wire 1318 is not in electrical communication with any part of the LED light bulb 1300. Thus, negative impact resulting from thermal expansion or heat is mitigated. When the LED filament 500 defines a sinuous curve in the main chamber 1312, the lead wire 1310 supports the LED filament 500 either at the crest of the curve, the trough of the curve or anywhere between the crest and the trough. The support wire 1318 attaches to the LED filament 500 in a variety of ways. For example, the lead wire 1310 includes a hook or claw at a tip. The throat of the hook is snugly closed around the LED filament 500. Alternatively, the claw is snugly closed around the LED filament 500.

In an embodiment, the LED light bulb include exactly two lead wires 1310. The base includes a top end, a bottom end and a side surface. The light transmissive envelope 1304 is mounted with its neck 1314 on the top end of the base 1306. The base 1316 includes a foot electrical contract 13161 at the bottom end and a base electrical contact 13162 on the side surface. A first lead wire 1310 physically and electrically connects the foot electrical contact 13161 and a first electrical connector 506 of the LED filament 500. A second lead wire 1310 physically and electrically connects the base electrical contact 13162 and a second electrical connector 506 of the LED filament 500. For example, the lead wire 1310 and the electrical contact 506 is fastened together by soldering. The filler metal includes gold, silver, silver-based alloy or tin. Alternatively, when the electrical connector 506 includes an aperture and the lead wire 1310 includes a hook structure at a tip, the lead wire 1310 and the electrical connector 506 is fastened by closing the throat of the hook against the aperture. In some embodiments, the LED light bulb 1300 further includes a rectifier 1320, which is in electrical connection with the electrical contact 13161, 13162 of the base 1316 and the lead wire 1310, for converting AC electricity from the lampholder into DC electricity to drive the LED filament 500.

Preferably, the base 1316 has a form factor compatible with industry standard light bulb lampholder. Specifications for light bulb bases and sockets largely overseen by two organizations. The American National Standards Institute (ANSI) is an organization that publishes C81.61 and C81.62, while International Electrotechnical Commission (IEC) publishes 60061-1 and 60061-2. Edison screw lamp base and lampholder examples include but are not limited to the E-series described in ANSI C81.61 and C81.62: E5 midget, E10 miniature, E11 mini-candelabra, E12 candelabra, E17 intermediate, E26/24 single-contact medium, E26d double-contact medium, E26/50×39 skirted medium, E26/53×39 extended skirted medium, E29/53×39 extended skirted admedium, E39 single-contact mogul, E39d double-contact mogul, EP39 position-oriented mogul, and EX39 exclusionary mogul. Multiple-pin lamp base and lampholder examples include but are not limited to the G-series described in ANSI C81.61 and C81.62: GY two-pin for T, G4 two-pin for single-ended TH, GU4 two-pin for MR11 GLS lamps, GZ4 two-pin for projection lamps, G5 fluorescent miniature two-pin, 2G7 four-pin compact fluorescent, GZ10 bipin, G16t three-contact lug for PAR lamps, G17t three-pin prefocus for incandescent projection lamps. Bayonet lamp base and lampholder examples include but are not limited to the B-series described in ANSI C81.61 and C81.62: B/BX8.4d small instrument panel, BA9/12.5 miniature, BAW9s for HY21 W, BA15s candelabra single contact, BAZ15d double contact with offset, and BY22d multipurpose sleeved double contact.

In an embodiment, the light transmissive envelope 1304 is made from a light transmissive material with good thermal conductively, e.g. glass, plastic. In another embodiment, the light transmissive envelope 1304 is configured to absorb a portion of the blue light emitted by the LED filament 500 to obtain a warmer color temperature. To make the light warmer, for example, the light transmissive envelope 1304 is made from a material doped with yellow particles. Alternatively, the light transmissive envelope is coated with a yellow film. In yet another embodiment, the light transmissive envelope 1304, which is hermetically connected to the base 1306, is charged with a gas having greater thermal conductivity than the air such as hydrogen, nitrogen and a mixture of both. In additional to greater heat dissipation, humidity, potentially undermining the electronics of the LED light bulb 1300, is thus removed from the light transmissive envelope 1304. In an embodiment, hydrogen accounts for from 5% to 50% of the volume of the light transmissive envelope 1304. In still another embodiment, the light transmissive envelope 1304 is sealed at an internal pressure of from 0.4 to 1.0 ATM.

The stem press 1308 is made from an electrically insulative material such as glass or plastic. The shape and dimension of the stem press 1308 depends a totality of considerations such as the number of LED filaments 500 the LED light bulb 1300 has, the posture the LED filament 500 is expected to maintain in the main chamber 1312r; the manner the lead wire 1310 supports the LED filament 1302; the number of lead wires 1310 the LED light bulb 1300 has; whether the LED light bulb 1300 further includes support wires 1318; and whether or how a heatsink finds itself in the LED light bulb. In an embodiment, the stem press 1308 extends barely above the base. In another embodiment, the stem press extends above the base 1316 and into the neck 1314. In yet another embodiment, the stem press 1308 extends above the base 1316, through the neck 1314 and into the main chamber 1312. In some embodiments, the stem press 1308 is made from an electrically insulative material have good thermal conductivity such as aluminium oxide and aluminium nitride. In other embodiments, the stem press 1308 includes an opening for evacuating the air from the light transmissive envelope 1304 and for charging the light transmissive envelope 1304 with the desired amount of gas.

In some embodiments, the LED light bulb further includes a heatsink. The heatsink is made from materials have good thermal conductivity such as metal, thermal ceramics and thermal plastic. In some embodiments, the stem press, the base or both is made from a same material from which the heatsink is made. In other embodiments, an integral piece including a combination of at least two of the stem press, the base and the heat sink is formed with a same material to reduce the thermal resistance of the LED light bulb. The heatsink is in thermal communication with the LED filament and ambient air for transferring heat coming from the LED device to the ambient air. Preferably, the heatsink is in thermal communication with, in addition to the LED filament and ambient air, the stem press, the lead wire, the support wire, the base or any combination of the above.

Figure 44A:
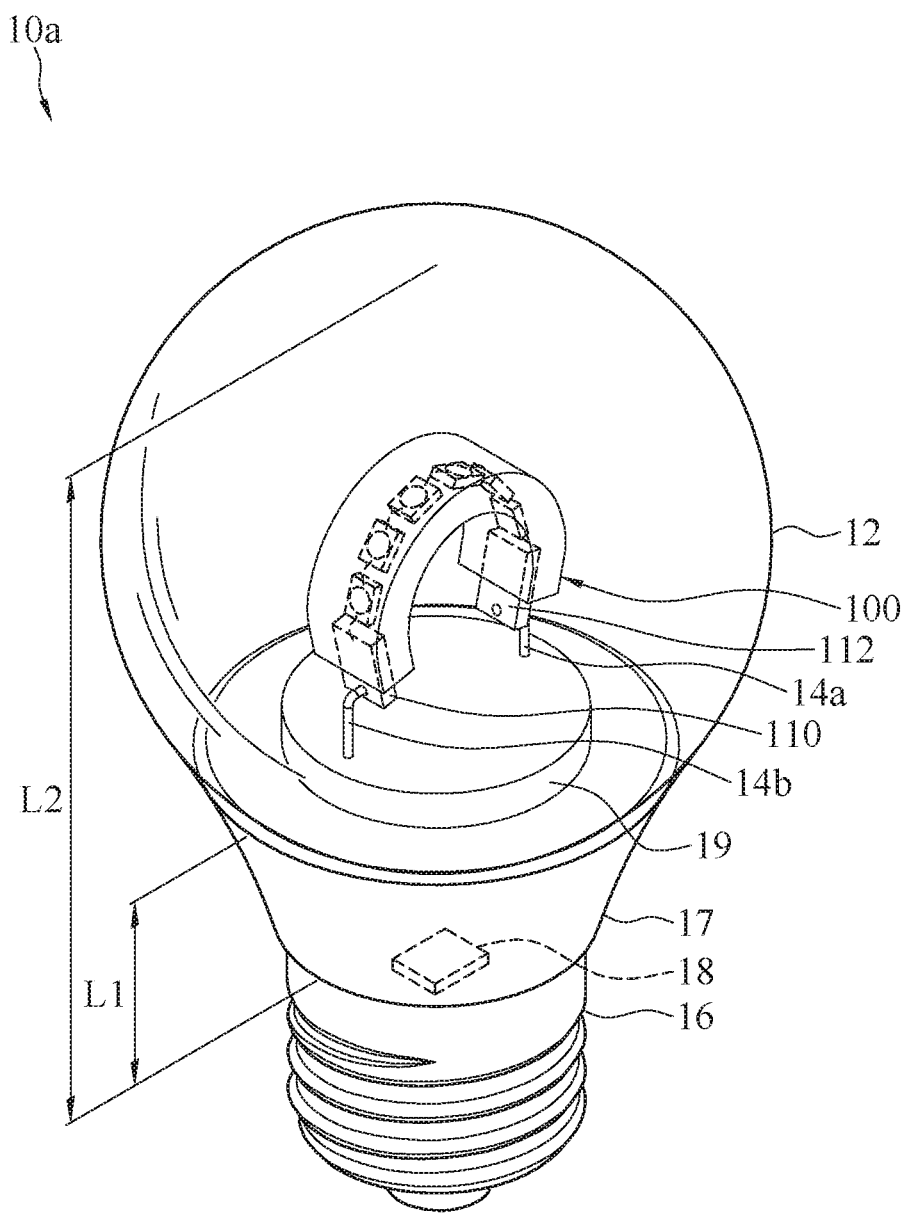
FIGS. 44A and 44B illustrate a perspective view of an LED light bulb according to a first and a second embodiments of the present disclosure.

The LED filament is designed to maintain a posture within the chamber to obtain an omnidirectional light emission. In FIG. 44A, the LED light bulb comprises a light transmissive envelope, a base, a stem press, exactly one LED filament, exactly a pair of lead wires, a heatsink and a rectifier. The heatsink is disposed between the light transmissive envelope and the base. The rectifier is disposed within the heatsink. The stem press includes a stump-like structure projecting from the base. The LED filament defines an arc extending substantially vertically in the light transmissive envelope. For easy reference, a Cartesian coordinate system is oriented for the LED light bulb where: (1) the interface connecting the light transmissive envelope and heatsink falls on the x-y plane; and (2) the z-axis, also the central axis of the LED light bulb, intersects the interface at point O. In the embodiment, the end point of the arc reaches as high as point H1 on the y-axis. The distance between the end points of the LED filament on the x-y plane is D. The length of LED filament on the y-axis is A. The posture of the LED filament in the LED light bulb is defined by all points in the set (0, y, z+H1), where z goes up from 0 to A and then from A back to 0 as y goes from −D/2 to 0 and then from 0 to D/2. The length of the heatsink along the z-axis is L1. The length of the combination of the light transmissive envelope and the heatsink along the z-axis is L2. The greater the ratio L1/L2 is, the LED light bulb is configured to have a better heat dissipation but potentially compromised filed of angle when the LED filament is elevated to a higher position within the light transmissive envelope. Preferably, the ratio L1/L2 is from 1/30 to 1/3.

Figure 44B:
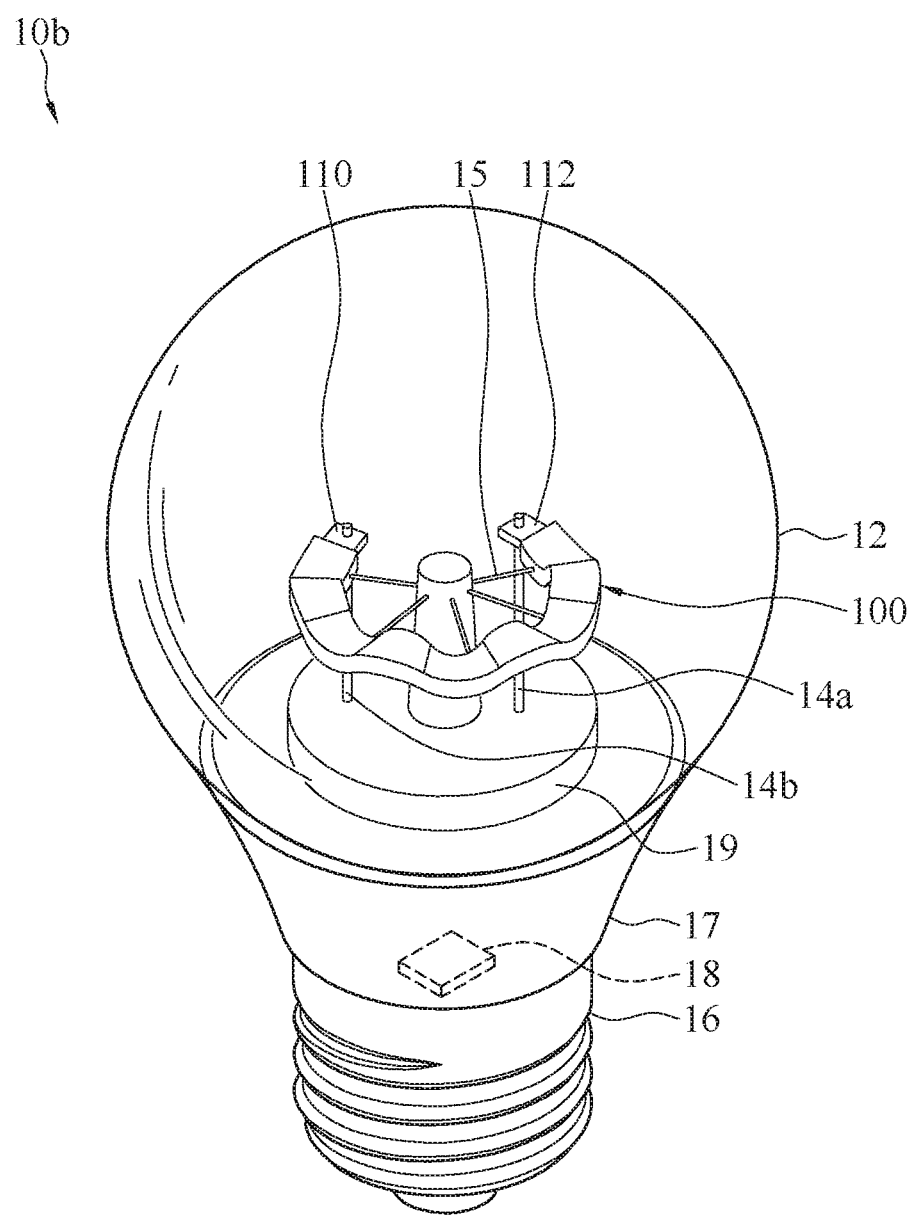

In FIG. 44B, the LED light bulb comprises a light transmissive envelope, a base, a stem press, exactly one LED filament, exactly a pair of lead wires, a heatsink, a rectifier and a plurality of support wires. The heatsink is disposed between the light transmissive envelope and the base. The rectifier is disposed within the heatsink. The stem press, unlike the one in FIG. 12A, further includes a post portion for elevating the LED filament to a desired position in the light transmissive envelope. The plurality of support wires radiates (horizontally, for example) from the post portion to form a spoke-and-hub structure in the light transmissive envelope. The support wire is attached to the post portion at a first end and to the LED filament at a second end. In the embodiment, the LED filament defines a sinuous curve along an arc meandering substantially horizontally in the light transmissive envelope. The sinuous curve oscillates in the range from H1+A1 to H1−A1 on the y-axis, where H1 represents the average height of the LED filament in the LED light bulb and A1 the amplitude of the sinuous curve the LED filament defines. The plurality of support wires has a same length R. The posture of the LED filament in the LED light bulb is defined by all points in the set (x, y, z+H1), where −R=<x=<R; −R=<y=<R; and −A1=<z=<A1. The LED filament, seen through the light transmissive envelope, is aesthetically pleasing when it is glowing or not. Moreover, omnidirectional light emission is made possible with only one LED filament having a posture like this. The quality as well the cost for producing omnidirectional LED light bulbs is thus improved because fewer interconnections of parts are needed when only one LED filament is involved.

Figure 45A:
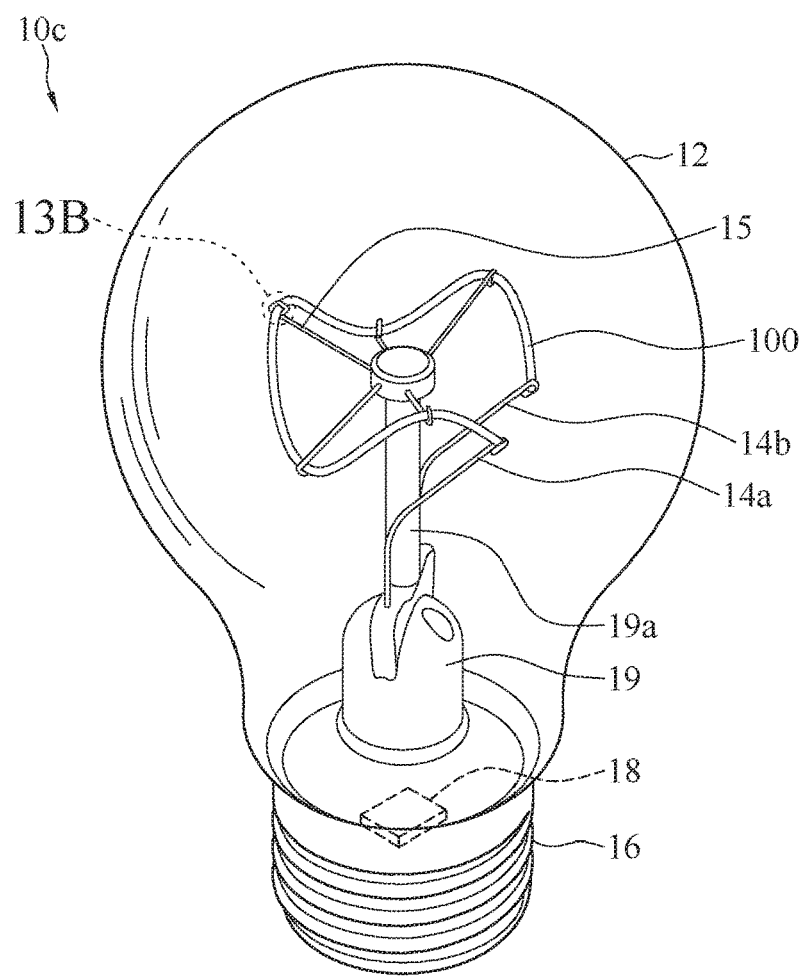
FIG. 45A illustrates a perspective view of an LED light bulb according to a third embodiment of the present disclosure.

In FIG. 45A, the LED light bulb comprises a light transmissive envelope, a base, a stem press, exactly one LED filament, exactly a pair of lead wires, a rectifier and a plurality of support wires. The light transmissive envelope has a bulbous main chamber for housing the LED filament and a neck for connecting the light transmissive envelope to the base. The rectifier is disposed within the base. The plurality of support wires radiates (slightly deviating from the horizon, for example) from the post portion to form a spoke-and-hub structure in the light transmissive envelope. The support wire is attached to the post portion at a first end and to the LED filament at a second end. In the embodiment, the LED filament defines a sinuous curve along an arc meandering substantially horizontally in the light transmissive envelope. The sinuous curve oscillates in the range from $H2+A2$ to $H2-A2$ on the y-axis, where $H2$ represents the average height of the LED filament in the LED light bulb and $A2$ the amplitude of the sinuous curve the LED filament defines. $A2$ is greater than $A1$; likewise, $H2$ is greater than $H1$. Consequently, the stem press in FIGS. 44A and 44B is a shorter structure projecting from projecting from the base. By contrast, the stem press we need in FIG. 45A to elevate the LED filament to a higher position in the main chamber becomes a longer structure having, for example, a basal portion and an elongated post portion. The plurality of support wires has a same length R. The posture of the LED filament in the LED light bulb is defined by all points in the set $(x, y, z+H2)$, where $-R=<x=<R$; $-R=<y=<R$; and $-A2=<z=<A2$.

Figure 46A:
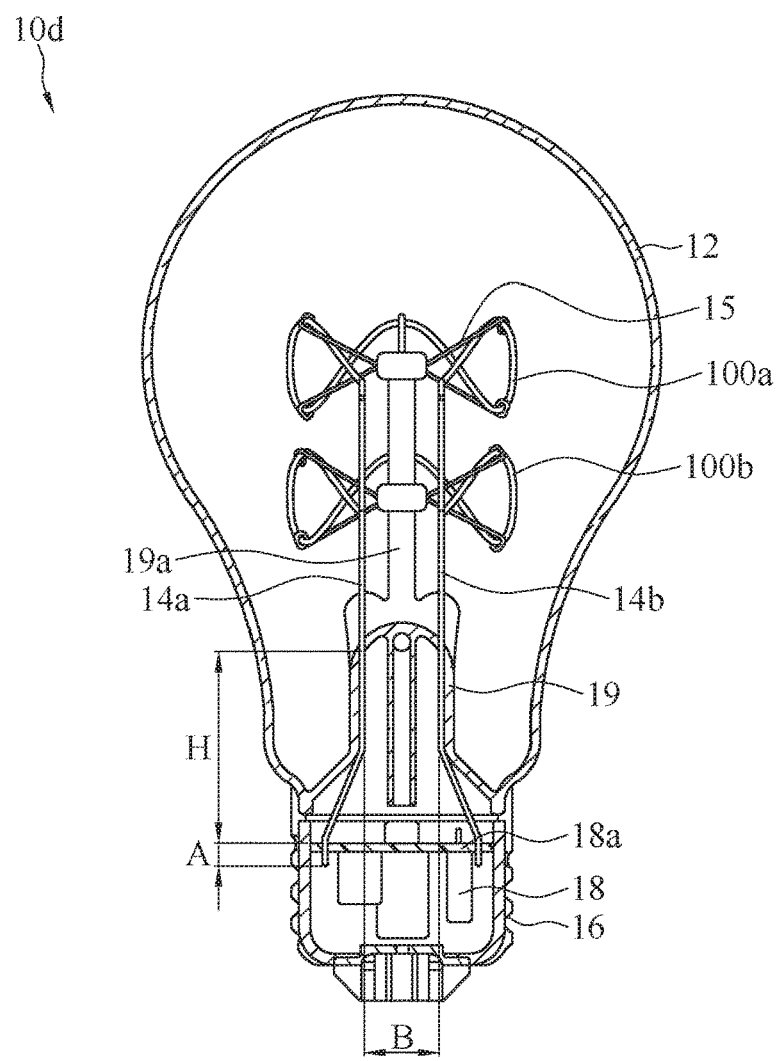
FIG. 46A illustrates a cross-sectional view of an LED light bulb according to a fourth embodiment of the present disclosure.

In FIG. 46A, the LED light bulb comprises a light transmissive envelope, a base, a stem press, an upper LED filaments, a lower LED filament, an upper set of lead wires, a lower set of lead wire, a rectifier and exactly two sets of support wires. The light transmissive envelope has a bulbous main chamber for housing the LED filament and a neck for connecting the light transmissive envelope to the base. The rectifier is disposed within the base. The set of support wires radiate (slightly deviating from the horizon, for example) from the post portion to form a spoke-and-hub structure in the light transmissive envelope. The support wire is attached to the post portion at a first end and to the LED filament at a second end. The upper set of support wires is configured to hold the upper LED filament in position. The lower set of support wires is configured to hold the lower LED filament in position. Other things equal, a shorter LED filament is needed to produce the same luminosity of omnidirectional light with the LED light bulb in FIG. 46A than the LED light bulb in FIG. 45A. Likewise, the LED light bulb in FIG. 46A is amenable to a smaller girth than the LED light bulb in FIG. 45A. In the embodiment, the LED filament defines a sinuous curve along an arc meandering substantially horizontally in the light transmissive envelope. The higher LED filament defines a higher sinuous curve oscillating in the range from $H3+A3$ to $H3-A3$ on the y-axis, where $H3$ represents the average height of the higher LED filament in the LED light bulb and $A3$ the amplitude of the first sinuous curve the higher LED filament defines. The lower LED filament defines a lower sinuous curve oscillating in the range from $H4+A3$ to $H4-A3$ on the y-axis, where $H4$ represents the average height of the lower LED filament in the LED light bulb and $A3$ the amplitude of the lower sinuous curve the lower LED filament defines. $H4$ is less than $H3$ on the y-axis, making one LED filament higher in the light transmissive envelope than the other one. $A3$ is chosen to be, for example, the same as that of the higher sinuous curve. The plurality of support wires have a same length R. The posture of the higher LED filament in the LED light bulb is defined by all points in the set $(x, y, z+H3)$, where $-R=<x=<R$; $-R=<y=<R$; and $-A3=<z=<A3$. The posture of the lower LED filament in the LED light bulb is defined by all points in the set $(x, y, z+H4)$, where $-R=<x=<R$; $-R=<y=<R$; and $-A3=<z=<A3$.

In the embodiment in FIG. 46A, the rectifier, which is disposed in the base, includes a circuit board in electrical communication with the lead wire. The pair of lead wires are parallelly spaced apart from each other. The upper portion of the lead wire is attached to the pair of LED filaments. The intermediate portion of the lead wire is fixedly attached to the basal portion of the stem press by passing through the basal portion. The lower portion of the lead wire is fixedly attached to the rectifier. In an embodiment, the circuit board includes an L-shaped aperture cut into the circumference of the circuit board. The lead wire includes a hook at the tip. The hook is configured to interlock the aperture for reliable soldering between the lead wire and the circuit board. The lead wire has a proper length for connecting the circuit board and the LED filament. In an embodiment, for purposes of safety, the lead wire has a length determined by D (mm). $D=A+\sqrt{(B-3.2)^2+C^2}$, where 3.2 is the electricity safety spacing; A is the aggregate of the thickness of the circuit board and the length of the lead wire projecting downwards from the circuit board; B is the distance between the pair of lead wires; and C is distance from the entry point of the lead wire into the basal portion to the entry point of lead wire into the circuit board. Preferably, the length of the lead wire we need to reach the lower LED filament (L1) is from 0.5 D to 2 D. Most preferably, L1 is from 0.75 D to 1.5 D. The length of the lead wire we need to reach the upper LED filament (L2) is L1+(H3−H4).

In some embodiments, a layer of reflective materials, e.g. white paint, is coated to the support wire, the stem press, the upper surface of the base in the light transmissive envelope or any combination of the above for directing light outwards. In other embodiments, a layer of graphene, which has good thermal conductivity, is coated to the support wire, the stem press, the upper surface of the base in the light transmissive envelope or any combination of the above for better heat dissipation.

Figure 47A:
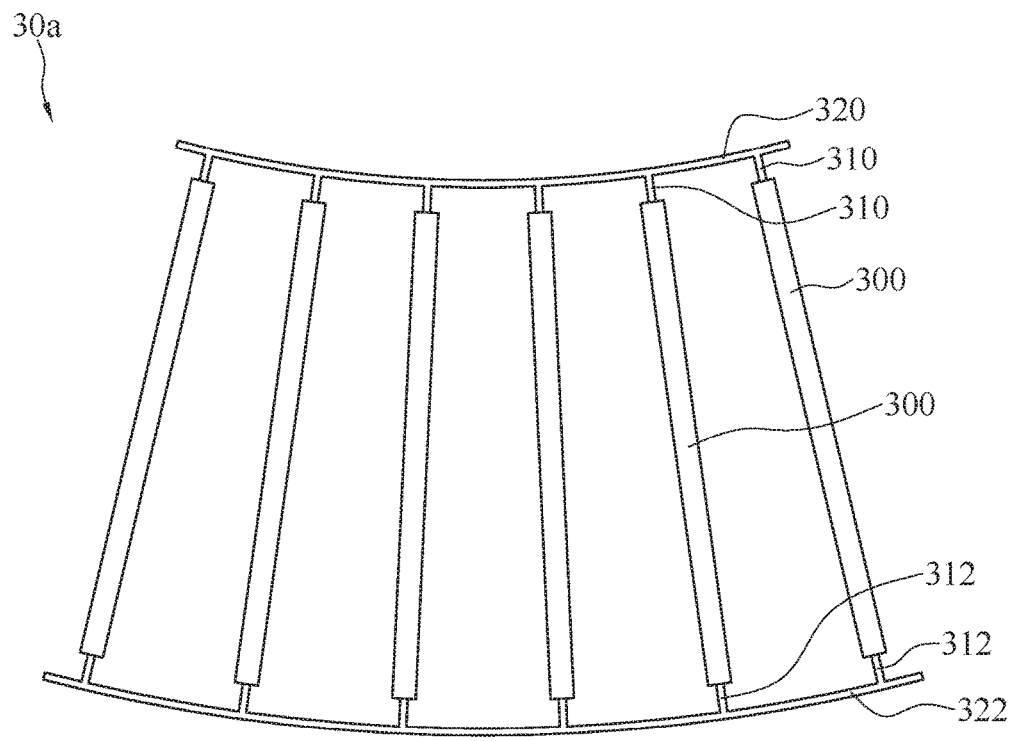
FIGS. 47A to 47D illustrate top views of LED filament modules according to embodiments of the present disclosure.
Figure 47B:
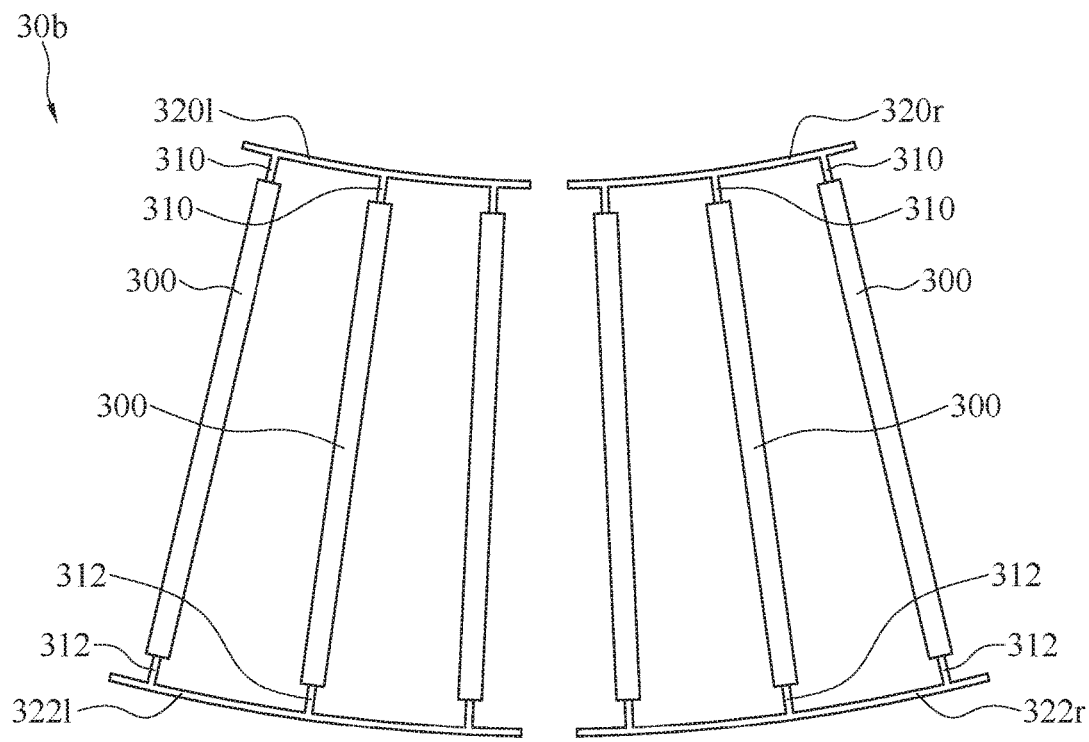
Figure 47C:
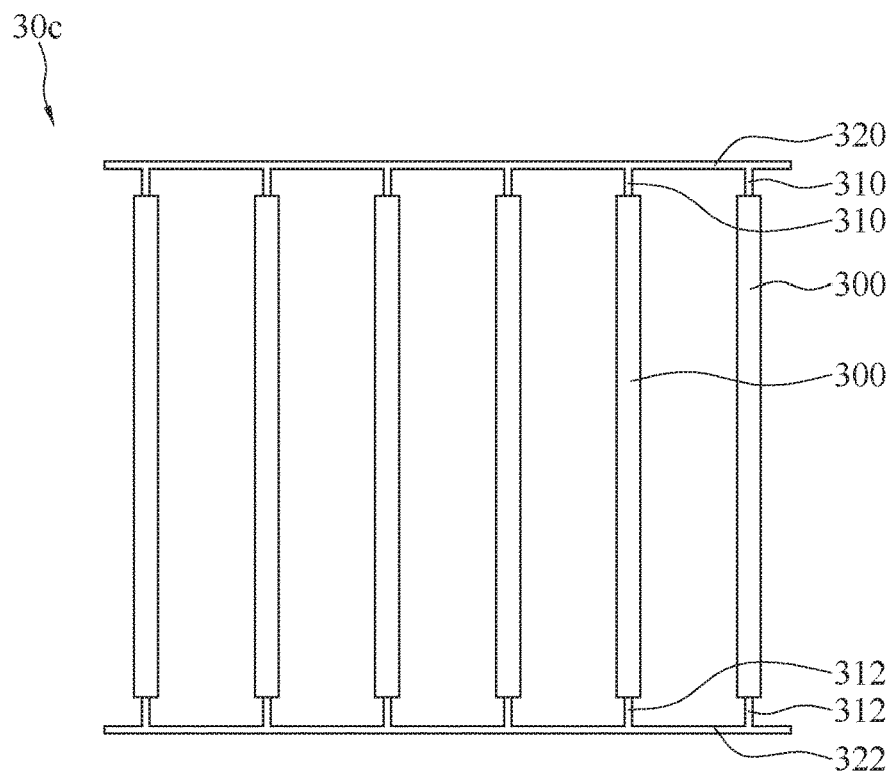
Figure 47D:
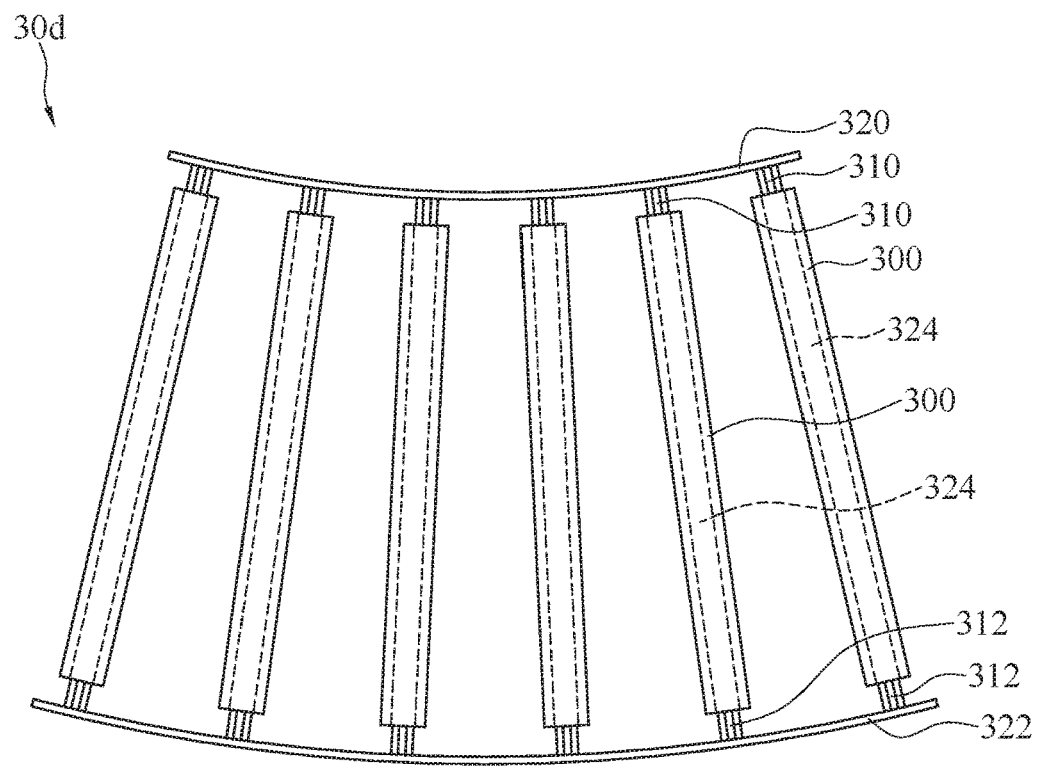
Figure 47E:
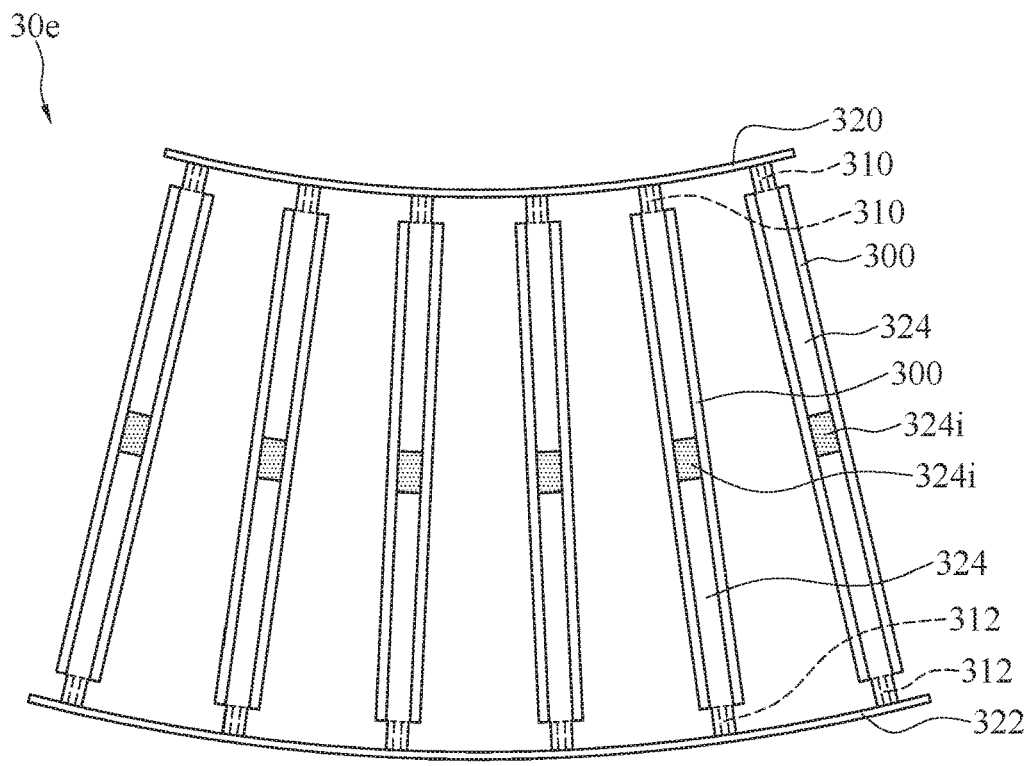
FIGS. 47E and 47F illustrate bottom views of LED filament modules according to embodiments of the present disclosure.
Figure 47F:
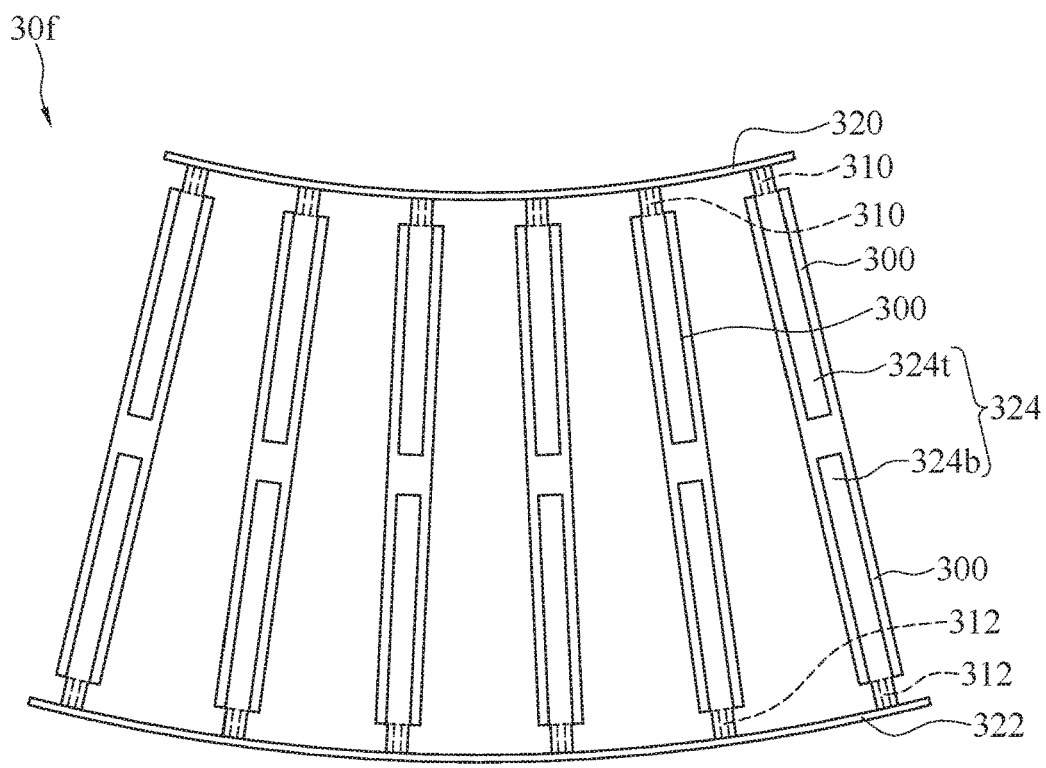
Figure 47G:
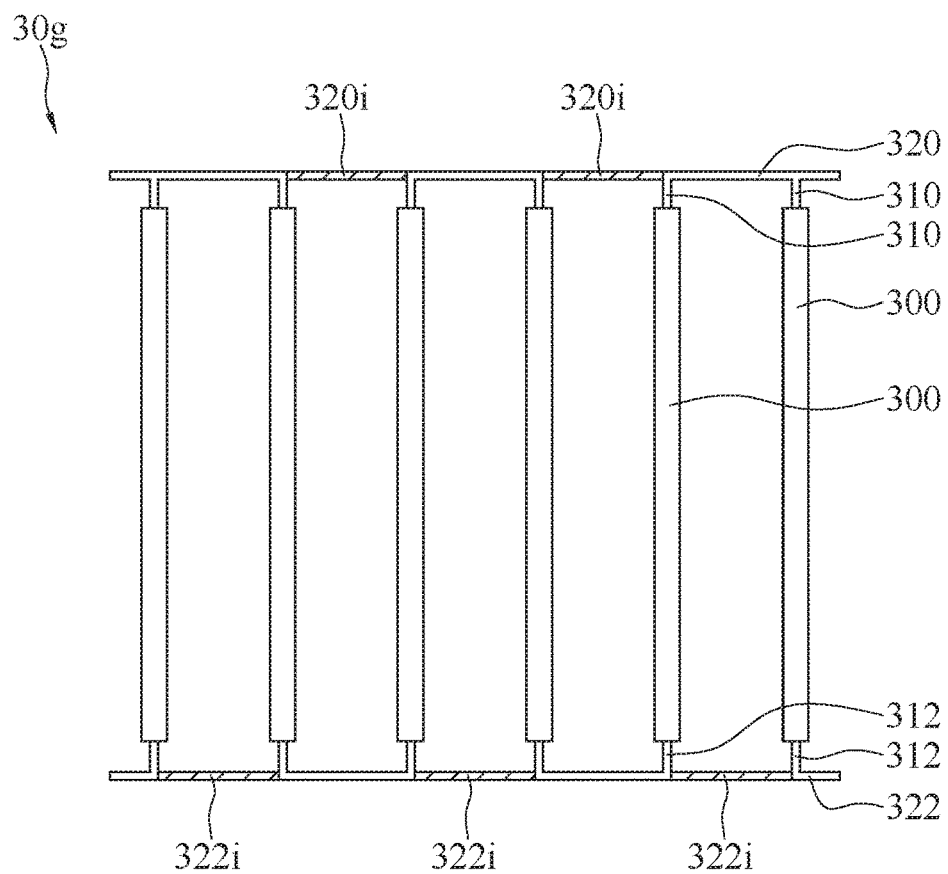
FIG. 47G illustrates a top view of an LED filament module according to another embodiment of the present disclosure.
Figure 47H:
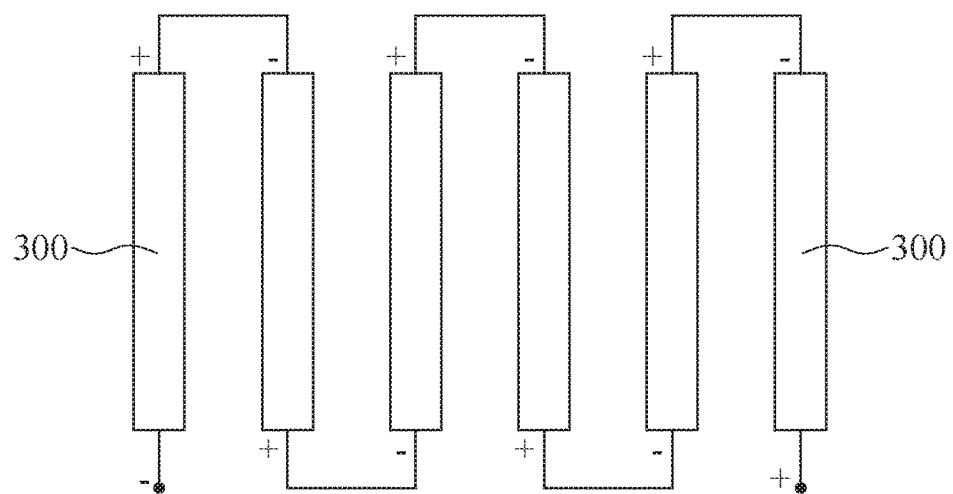
FIG. 47H illustrates a schematic circuit of the LED filament module of FIG. 47G.

FIGS. 47A to 47C show a LED filament module comprising the LED filament of the present invention. The LED filament module includes a frame and a plurality of LED filaments operably connected to the frame. The frame comes in a variety of shapes to enable the plurality of LED filaments to jointly glow omnidirectionally in the LED light bulb. In some embodiments, the frame is made of an electrically conductive material such as copper. The plurality of LED filaments, in electrically communication with the frame, receive electrical power from the frame. In other embodiments, the frame is made of an electrically insulative material such as plastic. The LED filament module further includes an electrical wire system embedded in the frame. The plurality of LED filaments, in electrically communication with the electrical wire system, receives electrical power from the electrical wire system. Preferably, the frame is made from materials having good thermal conductivity such as aluminum alloy. Preferably, the frame is made from flexible materials such as copper wire to accommodate the shape of the LED filament module. Preferably, the frame is made from light transmissive materials such as plastic. The plurality of LED filaments are electrically interconnected in series, in parallel or in a combination of both. In FIG. 47A, the LED module looks like a balcony rail. The frame includes a top rail and a bottom rail defining a pair of concentric arcs. The LED filament is attached to the top rail at one end and to the bottom rail at the other end. The plurality of LED filaments, spaced apart from one another, straddle the top rail and the bottom rail. In FIG. 47C, the top rail and the bottom rail define a pair of parallel lines. The LED filament is attached to the top rail at one end and to the bottom rail at the other end. The plurality of LED filaments, pairwise parallel, straddle the top rail and the bottom rail. In FIGS. 47D to 47F, the frame further includes a plurality of balusters configured to spatially coincide the plurality of LED filaments throughout the frame. The baluster is attached to the top rail at one end and the bottom rail at the other end. The baluster is either electrically conductive or insulative. In FIG. 47D, the plurality of balusters, spaced apart from one another, straddle the top rail and the bottom rail. While the top rail and the bottom rail are physically connected with the baluster, the baluster is not supposed to put the top rail and the bottom rail in electrical communication with each another. Insulation is obtained in a variety of ways. The entire baluster is made from or coated with an electrically insulative material. Alternatively, the interface where the baluster and the rail are joined is electrically insulative. Alternatively, the otherwise electrically conductive baluster includes an insulator. In FIG. 47E, the insulator is, for example, a piece of plastic or ceramics. In FIG. 47F, the insulator is air. In the embodiments in FIGS. 47A to 47F, the plurality of LED filaments are electrically connected in parallel. In other embodiments, the plurality of LED filaments are electrically connected in series. In FIG. 47G, the frame includes a plurality of insulators to form a serial circuit. The plurality of LED filaments are connected in series. The top rail includes a plurality of electrical conductors and a plurality of electrical insulators. The insulator is interposed between the conductors. Likewise, the bottom rail includes a plurality of electrical conductors and a plurality of electrical insulators. The insulator is interposed between the conductors. The frame is configured to form a serial circuit as shown in FIG. 47H. In some embodiments, the frame includes a plurality of diodes to form a serial circuit.

Figure 47I:
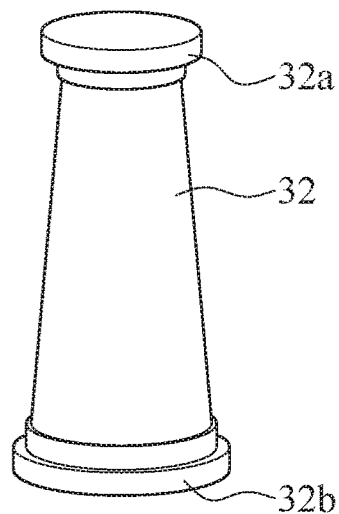
FIG. 47I illustrates a perspective view of a jig for shaping the LED filament module according to an embodiment of the present disclosure.
Figure 47J:
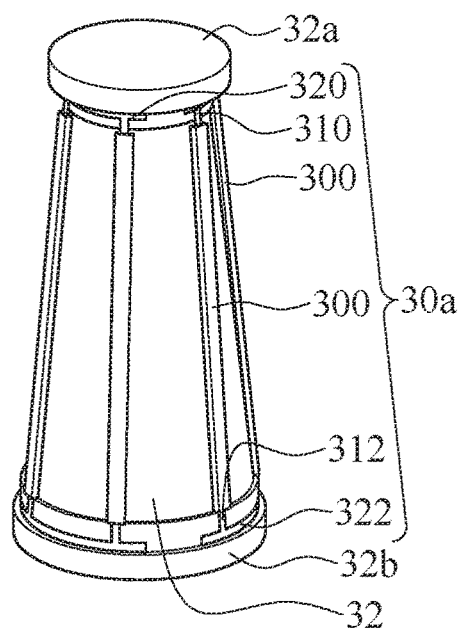
FIG. 47J illustrates a perspective view of the LED filament module of FIG. 47A being shaped by the jig.
Figure 47K:
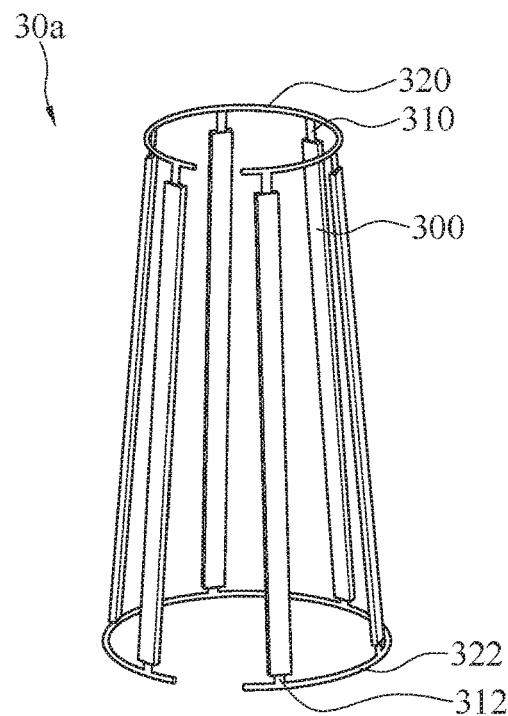
FIG. 47K illustrates a perspective view of the shaped LED filament module of FIG. 47A.
Figure 47L:
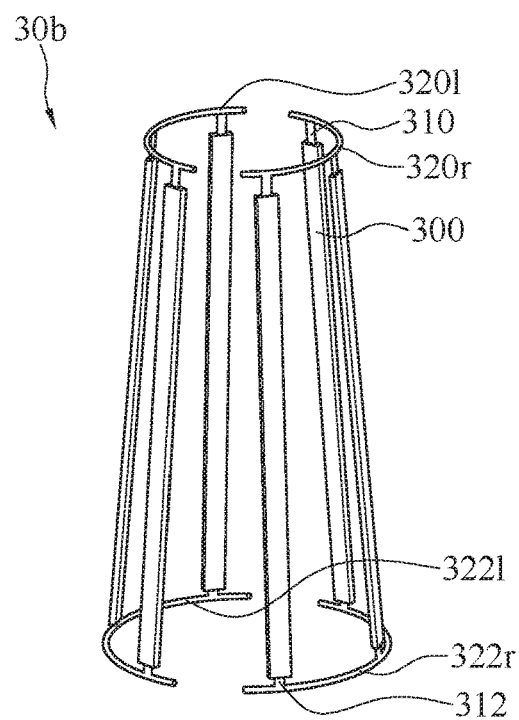
FIG. 47L illustrates a perspective view of the shaped LED filament module of FIG. 47B.
Figure 48A:
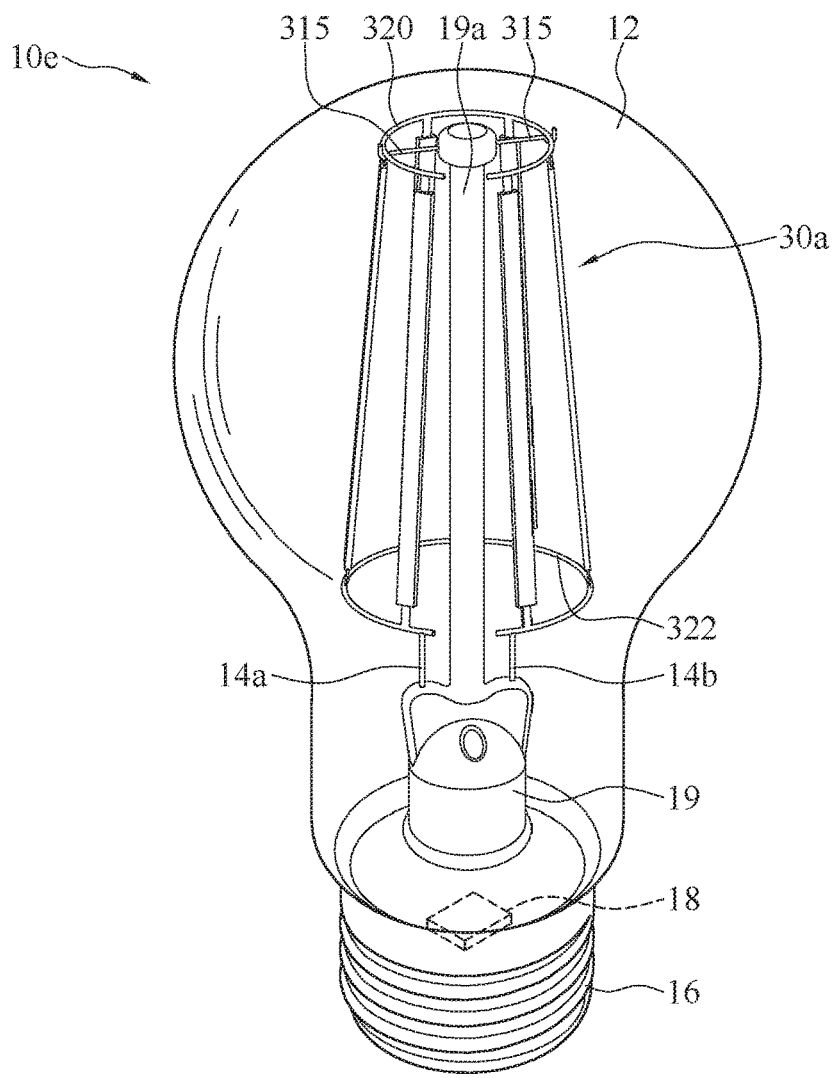
FIG. 48A illustrates a perspective view of an LED light bulb according to another embodiment of the present disclosure.

A spindle is provided to facilitate assembly of the LED filament module. The shape of the spindle depends on the posture the LED filament module is expected to maintain when it is deployed in the LED light bulb. In FIGS. 47I and 47J, the spindle approximates a truncated cone for constructing LED filament modules like those shown in FIGS. 47K and 47L. The plurality of LED filaments and the frame are assembled on the lateral surface of the cone. The frame is given shape by pressing the upper rail against the tapered portion of the spindle and by pressing lower rail against the base portion of the spindle. The LED filament is lined up one by one around the cone straddling the upper rail and the lower rail. In FIG. 47K, the LED filament module is constructed with the spindle for using with the LED light bulb in FIG. 47A. Exactly one opening is left with the circle defined by the upper rail. Exactly one opening is left with the circle defined by the lower rail. In FIG. 47L, the LED filament module is constructed with the spindle for using with the LED light bulb in FIG. 48C. Exactly two openings are left in the circle defined by the upper rail. Exactly two openings are left in the circle defined by the lower rail. In FIG. 48D, exactly one opening is left with the circle defined by the upper rail. However, exactly two openings are left with the circle defined by the lower rail. In FIG. 48A, the LED filament module is mounted within the main chamber of the light transmissive envelope axially around the post portion of the stem press. The LED filament module is kept in position with a plurality of support wires and a plurality of lead wires. The support wire is attached to the tip of the post portion of the stem press at one end and attached to the upper rail of the frame at the other end. The lead wire is attached to the basal portion of the stem press at one end and attached to the lower rail of the frame at the other end. In the embodiment, a pair of the support wires extend diametrically from the tip of the post portion of the stem press.

Figure 48B:
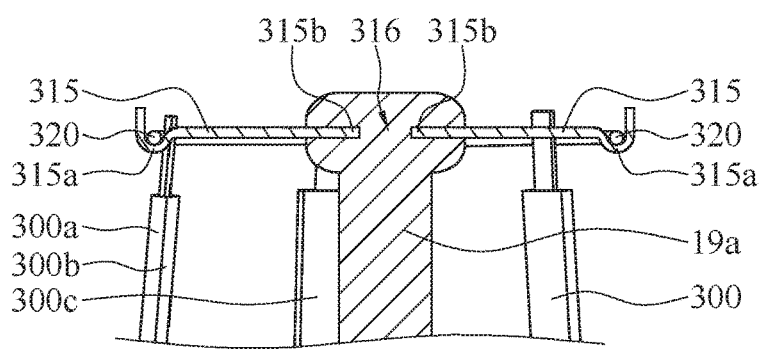
FIG. 48B illustrates a partial cross-sectional view of FIG. 48A.
Figure 48C:
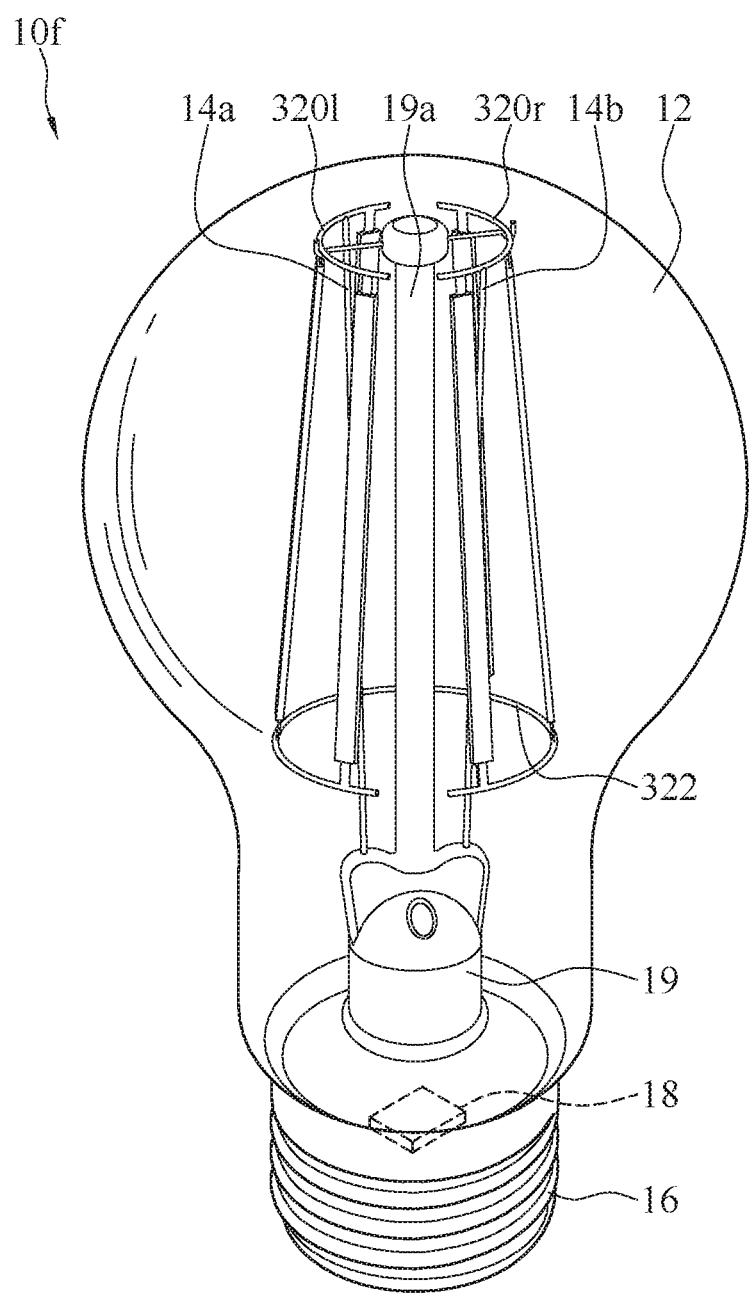
FIGS. 48C and 48D illustrate perspective views of LED light bulbs according to other embodiments of the present disclosure.
Figure 48D:
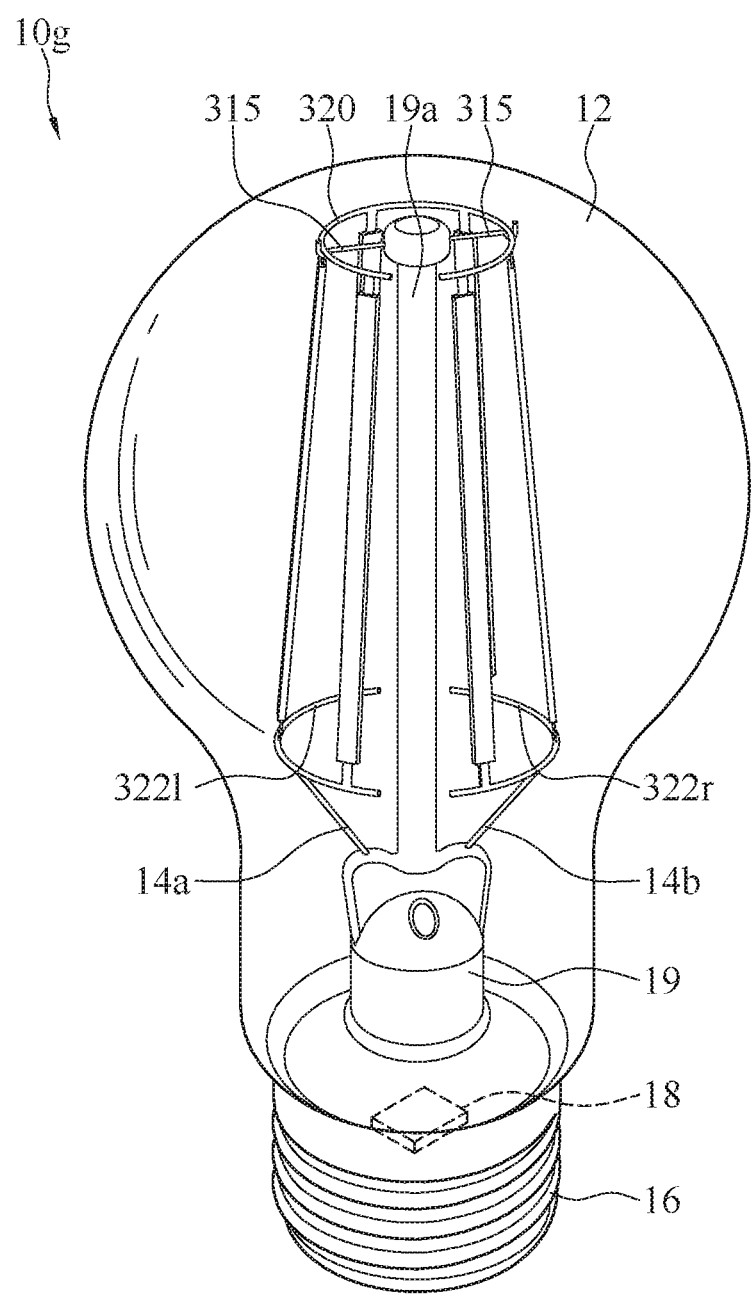

Referring to FIG. 48B, the post portion includes a swollen portion at the top end. The support wire is fixedly embedded in the swollen portion at one end. The support wire includes a hook at the other end. The throat of the hook, facing upwards, is configured to receive the upper rail of the frame in the throat. In FIG. 48C, the left half of the LED filament module is disposed within the left half of main chamber of the light transmissive envelope axially around the post portion of the stem press. The right half of LED filament module is disposed within the right half of main chamber of the light transmissive envelope axially around the post portion of the stem press. The LED filament module is kept in position with a plurality of support wires and a plurality of lead wires. In the embodiment, the left support wire is attached to the tip of the post portion of the stem press at one end and attached to the left upper rail of the frame at the other end. The left lead wire is attached to the basal portion of the stem press at one end and attached to the left upper rail of the frame at the other end. Similarly, the right support wire is attached to the tip of the post portion of the stem press at one end and attached to the right upper rail of the frame at the other end. The right lead wire is attached to the basal portion of the stem press at one end and attached to the right upper rail of the frame at the other end. In FIG. 48D, the LED filament module is mounted within the main chamber of the light transmissive envelope axially around the post portion of the stem press. The LED filament module is kept in position with a plurality of support wires and a plurality of lead wires. In the embodiment, the support wire is attached to the tip of the post portion of the stem press at one end and attached to the upper rail of the frame at the other end. The left lead wire is attached to the basal portion of the stem press at one end and attached to the left lower rail of the frame at the other end. Similarly, the right lead wire is attached to the basal portion of the stem press at one end and attached to the right lower rail of the frame at the other end. In some embodiments, the plurality of lead wires extend vertically to the frame of the LED filament module. In other embodiments like the one in FIG. 48D, the pair of lead wires project from the basal portion in a V-pattern.

Figure 33:
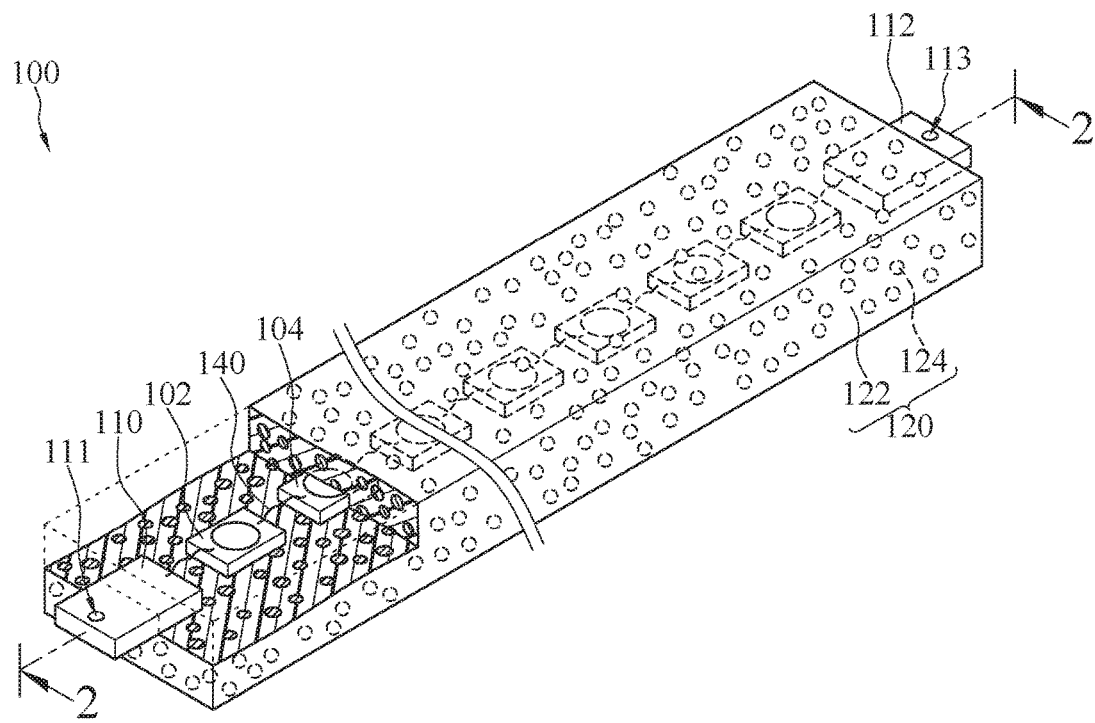
FIG. 33 illustrates a perspective view of an LED light bulb with partial sectional view according to a first embodiment of the LED filament.
Figure 34:
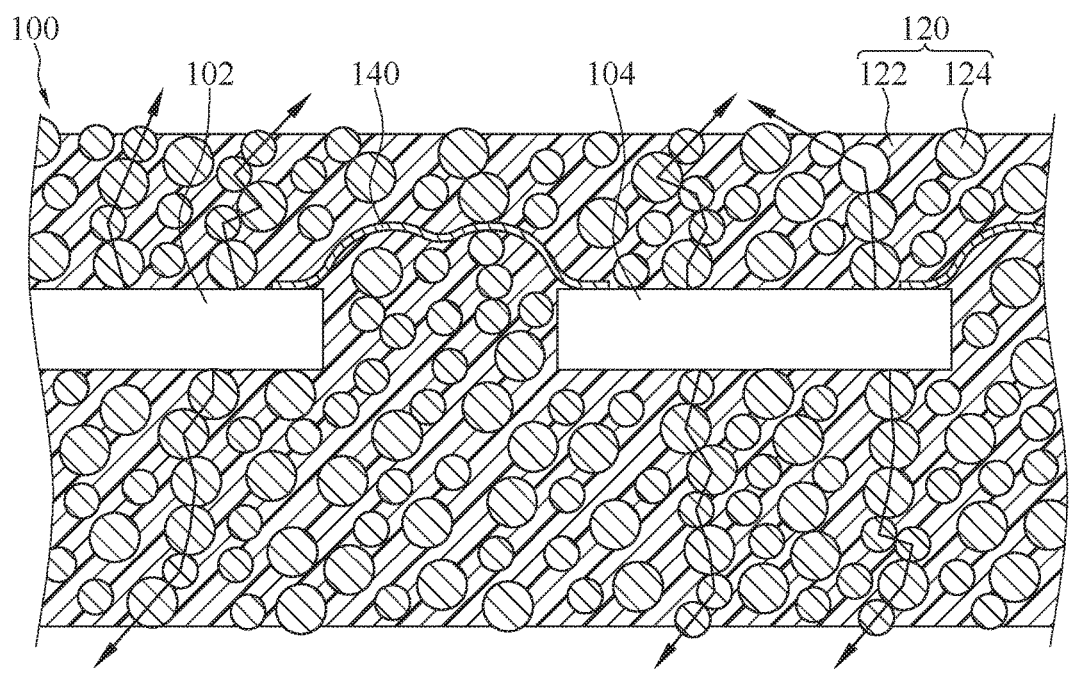
FIG. 34 illustrates a partial cross-sectional view at section 2-2 of FIG. 33.

Please refer to FIGS. 33 and 34. FIG. 33 illustrates a perspective view of an LED filament with partial sectional view according to a first embodiment of the present disclosure while FIG. 34 illustrates a partial cross-sectional view at section 2-2 of FIG. 33. According to the first embodiment, the LED filament 100 comprises a plurality of LED chips 102, 104, at least two conductive electrodes 110, 112, and a light conversion coating 120. The conductive electrodes 110, 112 are disposed corresponding to the plurality of LED chips 102, 104. The LED chips 102, 104 are electrically coupled together. The conductive electrodes 110, 112 are electrically connected with the plurality of LED chips 102, 104. The light conversion coating 120 coats on at least two sides of the LED chips 102, 104 and the conductive electrodes 110, 112. The light conversion coating 120 exposes a portion of two of the conductive electrodes 110, 112. The light conversion coating 120 comprises an adhesive 122 and a plurality of phosphors 124.

LED filament 100 emits light while the conductive electrodes 110, 112 are applied with electrical power (electrical current sources or electrical voltage sources). In this embodiment, the light emitted from the LED filament 100 is substantially close to 360 degrees light like that from a point light source. An LED light bulb 10a, 10b, illustrated is in FIGS. 44A and 44B, utilizing the LED filament 100 is capable of emitting omnidirectional light, which will be described in detailed in the followings.

As illustrated in the FIG. 33, the cross-sectional outline of the LED filament 100 is rectangular. However, the cross-sectional outline of the LED filament 100 is not limited to rectangular, but may be triangle, circle, ellipse, square, diamond, or square with chamfers.

Each of LED chips 102, 104 may comprise a single LED die or a plurality of LED dies. The outline of the LED chip 102, 104 may be, but not limited to, a strip shape. The number of the LED chips 102, 104 having strip shapes of the LED filament 100 could be less, and, correspondingly the number of the electrodes of the LED chips 102, 104 is less, which can improve the illuminating efficiency since the electrodes may shield the illumination of the LED chip, thereby affecting the illumination efficiency. In addition, the LED chips 102, 104 may be coated on their surfaces with a conductive and transparent layer of Indium Tin Oxide (ITO). The metal oxide layer contributes to uniform distribution of the current diffusion and to increase of illumination efficiency. Specifically, the aspect ratio of the LED chip may be 2:1 to 10:1; for example, but not limited to, 14×28 or 10×20. Further, the LED chips 102, 104 may be high power LED dies and are operated at low electrical current to provide sufficient illumination but less heat.

The LED chips 102, 104 may comprise sapphire substrate or transparent substrate. Consequently, the substrates of the LED chips 102, 104 do not shield/block light emitted from the LED chips 102, 104. In other words, the LED chips 102, 104 are capable of emitting light from each side of the LED chips 102, 104.

The electrical connections among the plurality of LED chips 102, 104 and the conductive electrodes 110, 112, in this embodiment, may be shown in FIG. 33. The LED chips 102, 104 are connected in series and the conductive electrodes 110, 112 are disposed on and electrically and respectively connected with the two ends of the series-connected LED chips 102, 104. However, the connections between the LED chips 102, 104 are not limited to that in FIG. 33. Alternatively, the connections may be that two adjacent LED chips 102, 104 are connected in parallel and then the parallel-connected pairs are connected in series.

Figure 35A:
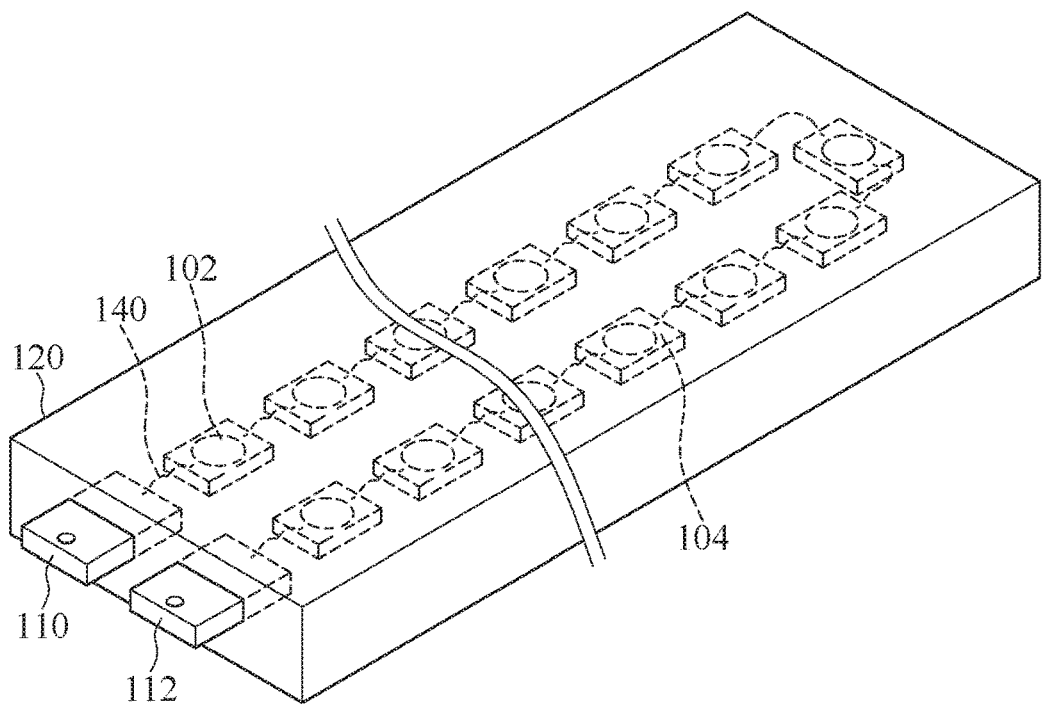
FIGS. 35A and 35B illustrate disposition of the metal electrodes and the plurality of LED chips according to other embodiments of the LED filament.
Figure 35B:
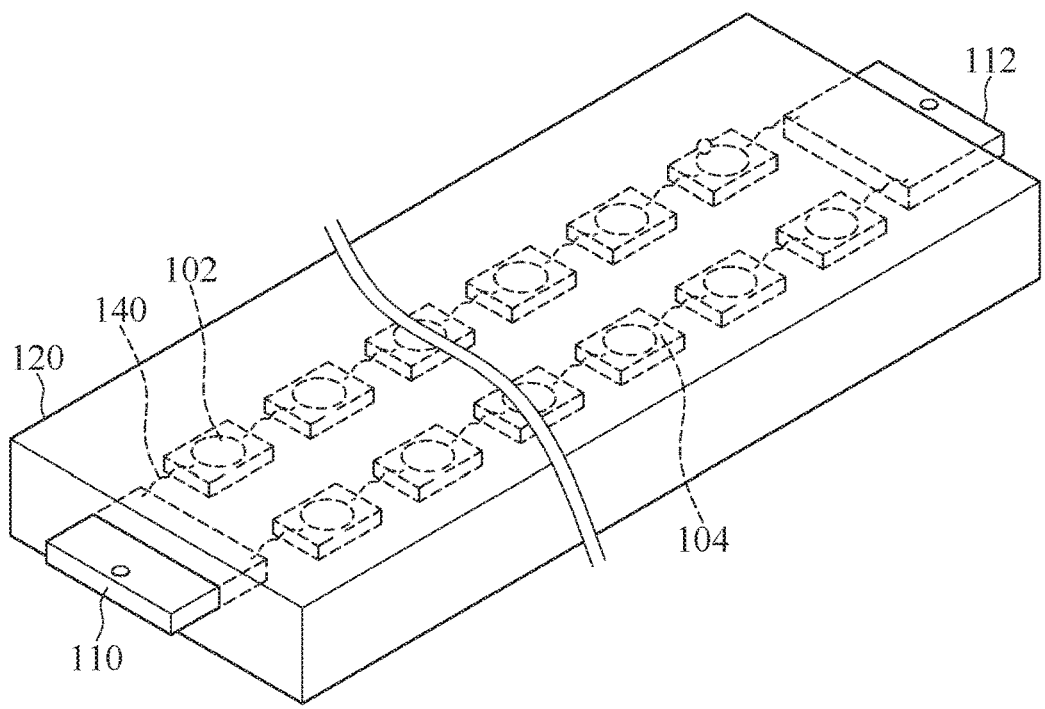

According to this embodiment, the conductive electrodes 110, 112 may be, but not limited to, metal electrodes. The conductive electrodes 110, 112 are disposed at two ends of the series-connected LED chips 102, 104 and a portion of each of the conductive electrodes 110, 112 are exposed out of the light conversion coating 120. The arrangement of the conductive electrodes 110, 112 is not limited to the aforementioned embodiment. Please refer to FIGS. 35A and 35B which illustrate disposition of metal electrodes and a plurality of LED chips according to other embodiments of the LED filament. In the embodiment of FIG. 35A, the LED chips 102, 104 are connected in series and the two ends of the series-connected LED chips 102, 104 are positioned at the same side of the LED filament 100 to form an U shape. Accordingly, the two conductive electrodes 110, 112 are positioned at the same side as the ends of the series-connected LED chips 102, 104. According to the embodiment of FIG. 35B, the LED chips 102, 104 are disposed along two parallel LED strips and the LED chips 102, 104 along the same LED strip are connected in series. Two conductive electrodes 110, 112 are disposed at two ends of the two parallel and series-connected LED chips 102, 104 and electrically connected to each of ends of the series-connected LED chips 102, 104. In this embodiment of FIG. 35B, there are, but not limited to, only two conductive electrodes 110, 112. For examples, the LED filament 100, in practices, may comprise four sub-electrodes. The four sub-electrodes are connected to four ends of the series-connected LED chips 102, 104, respectively. The sub-electrodes may be connected to anode and ground as desired. Alternatively, one of two conductive electrodes 110, 112 may be replaced with two sub-electrodes, depending upon the design needs.

Please further refer to FIG. 44A. The conductive electrodes 110, 112 has through holes 111, 113 (shown in FIG. 33) on the exposed portion for being connected with the conductive supports 14a, 14b of the LED light bulb 10a.

Please refer to FIGS. 33 and 34 again. According to this embodiment, the LED filament 100 further comprises conductive wires 140 for electrically connecting the adjacent LED chips 102, 104 and conductive electrodes 110, 112. The conductive wires 140 may be gold wires formed by a wire bond of the LED package process, like Q-type. According to FIG. 34, the conductive wires 140 are of M shape. The M shape here is not to describe that the shape of the conductive wires 140 exactly looks like letter M, but to describe a shape which prevents the wires from being tight and provides buffers when the conductive wires 140 or the LED filament 100 is stretched or bended. Specifically, the M shape may be any shape formed by a conductive wire 140 whose length is longer than the length of a wire which naturally arched between two adjacent LED chips 102, 104. The M shape includes any shape which could provide buffers while the conductive wires 104 are bended or stretched; for example, S shape.

The light conversion coating 120 comprises adhesive 122 and phosphors 124. The light conversion coating 120 may, in this embodiment, wrap or encapsulate the LED chips 102, 104 and the conductive electrodes 110, 112. In other words, in this embodiment, each of six sides of the LED chips 102, 104 is coated with the light conversion coating 120; preferably, but not limited to, is in direct contact with the light conversion coating 120. However, at least two sides of the LED chips 102, 104 may be coated with the light conversion coating 120. Preferably, the light conversion coating 120 may directly contact at least two sides of the LED chips 102, 104. The two directly-contacted sides may be the major surfaces which the LED chips emit light. Referring to FIG. 33, the major two surfaces may be the top and the bottom surfaces. In other words, the light conversion coating 120 may directly contact the top and the bottom surfaces of the LED chips 102, 104 (upper and lower surfaces of the LED chips 102, 104 shown in FIG. 34). Said contact between each of six sides of the LED chips 102, 104 and the light conversion coating 120 may be that the light conversion coating 120 directly or indirectly contacts at least a portion of each side of the LED chips 102, 104. Specifically, one or two sides of the LED chips 102, 104 may be in contact with the light conversion coating 120 through die bond glue. In some embodiments, the die bond glue may be mixed with phosphors to increase efficiency of light conversion. The die bond glue may be silica gel or silicone resin mixed with silver powder or heat dissipating powder to increase effect of heat dissipation thereof. The adhesive 122 may be silica gel. In addition, the silica gel may be partially or totally replaced with polyimide or resin materials (e.g., silicone resin) to improve the toughness of the light conversion coating 120 and to reduce possibility of cracking or embrittlement.

The phosphors 124 of the light conversion coating 120 absorb some form of radiation to emit light. For instance, the phosphors 124 absorb light with shorter wavelength and then emit light with longer wavelength. In one embodiment, the phosphors 124 absorb blue light and then emit yellow light. The blue light which is not absorbed by the phosphors 124 mixes with the yellow light to form white light. According to the embodiment where six sides of the LED chips 102, 104 are coated with the light conversion coating 120, the phosphors 124 absorb light with shorter wavelength out of each of the sides of the LED chips 102, 104 and emit light with longer wavelength. The mixed light (longer and shorter wavelength) is emitted from the outer surface of the light conversion coating 120 which surrounds the LED chips 102, 104 to form the main body of the LED filament 100. In other words, each of sides of the LED filament 100 emits the mixed light.

The light conversion coating 120 may expose a portion of two of the conductive electrodes 110, 112. Phosphors 124 is harder than the adhesive 122. The size of the phosphors 124 may be 1 to 30 um (micrometer) or 5 to 20 um. The size of the same phosphors 124 are generally the same. In FIG. 34, the reason why the cross-sectional sizes of the phosphors 124 are different is the positions of the cross-section for the phosphors 124 are different. The adhesive 122 may be transparent, for example, epoxy resin, modified resin or silica gel, and so on.

The composition ratio of the phosphors 124 to the adhesive 122 may be 1:1 to 99:1, or 1:1 to 50:1. The composition ratio may be volume ratio or weight ratio. Please refer to FIG. 34 again. The amount of the phosphors 124 is greater than the adhesive 122 to increase the density of the phosphors 124 and to increase direct contacts among phosphors 124. The arrow lines on FIG. 34 show thermal conduction paths from LED chips 102, 104 to the outer surfaces of the LED filament 100. The thermal conduction paths are formed by the adjacent and contacted phosphors. The more direct contacts among the phosphors 124, the more thermal conduction paths forms, the greater the heat dissipating effect the LED filament 100 has, and the less the light conversion coating becomes yellow. Additionally, the light conversion rate of the phosphors 124 may reach 30% to 70% and the total luminance efficiency of the LED light bulb 10a, 10b is increased. Further, the hardness of the LED filament 100 is increased, too. Accordingly, the LED filament 100 may stand alone without any embedded supporting component like rigid substrates. Furthermore, the surfaces of cured LED filament 100 are not flat due to the protrusion of some of the phosphors 124. In other words, the roughness of the surfaces and the total surface area are increased. The increased roughness of the surfaces improves the amount of light passing the surfaces. The increased surface area enhances the heat dissipating effect. As a result, the overall luminance efficiency of the LED light filament 100 is raised.

Next, LED chips 102, 104 may comprise LED dies which emit blue light. The phosphors 124 may be yellow phosphors (for example Garnet series phosphors, YAG phosphors), so that the LED filament 100 may emit white light. In practices, the composition ratio of phosphors 124 to the adhesive 122 may be adjusted to make the spectrum of the white light emitted from the LED filament 100 closer to that emitted from incandescent bulbs. Alternatively, the phosphors 124 may be powders which absorb blue light (light with shorter wavelength) and emit yellow green light (hereinafter referred to yellow green powders) or emit red light (hereinafter referred to red powders) (light with longer wavelength). The light conversion coating 120 may comprise less red powders and more yellow green powders, so that the CCT (corrected color temperature) of the light emitted from the LED filament 100 may close to 2,400 to 2,600 K (incandescent light).

As mention above, a desired deflection of the LED filament 100 may be achieved by the adjustment of the ratio of phosphors 124 to the adhesive 122. For instance, the Young's Modulus (Y) of the LED filament 100 may be between $0.1 \times 10^{10}$ to $0.3 \times 10^{10}$ Pa. If necessary, the Young's Modulus of the LED filament 100 may be between $0.15 \times 10^{10}$ to $0.25 \times 10^{10}$ Pa. Consequently, the LED filament 100 would not be easily broken and still possess adequate rigidity and deflection.

Figure 36:
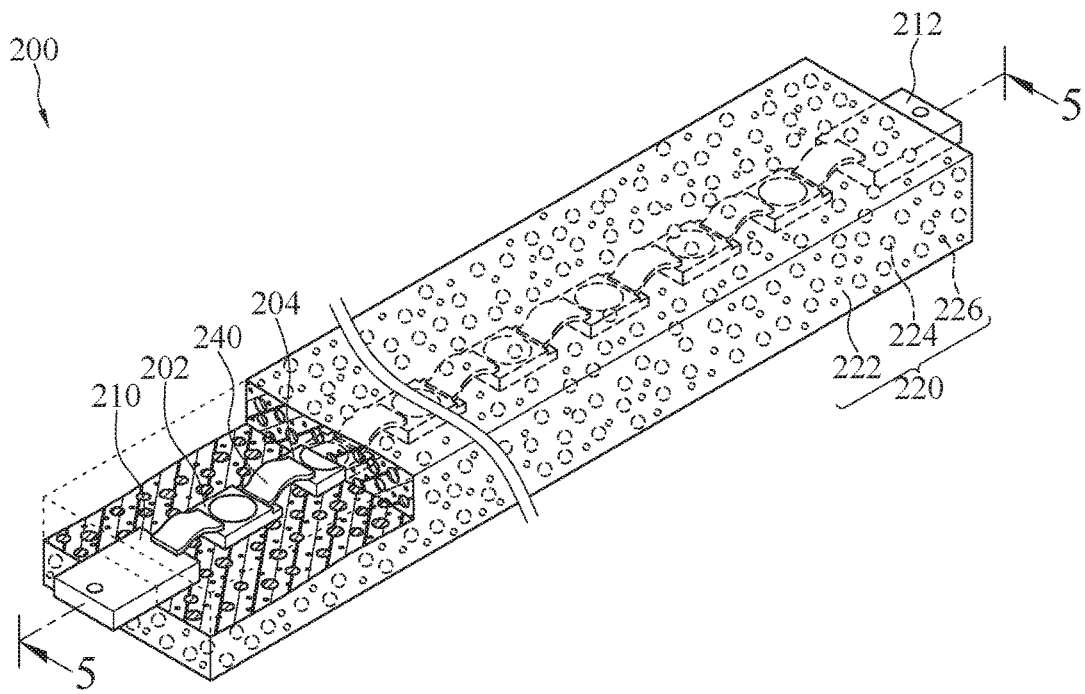
FIG. 36 illustrates a perspective view of an LED filament with partial sectional view according to a second embodiment of the present disclosure.
Figure 37:
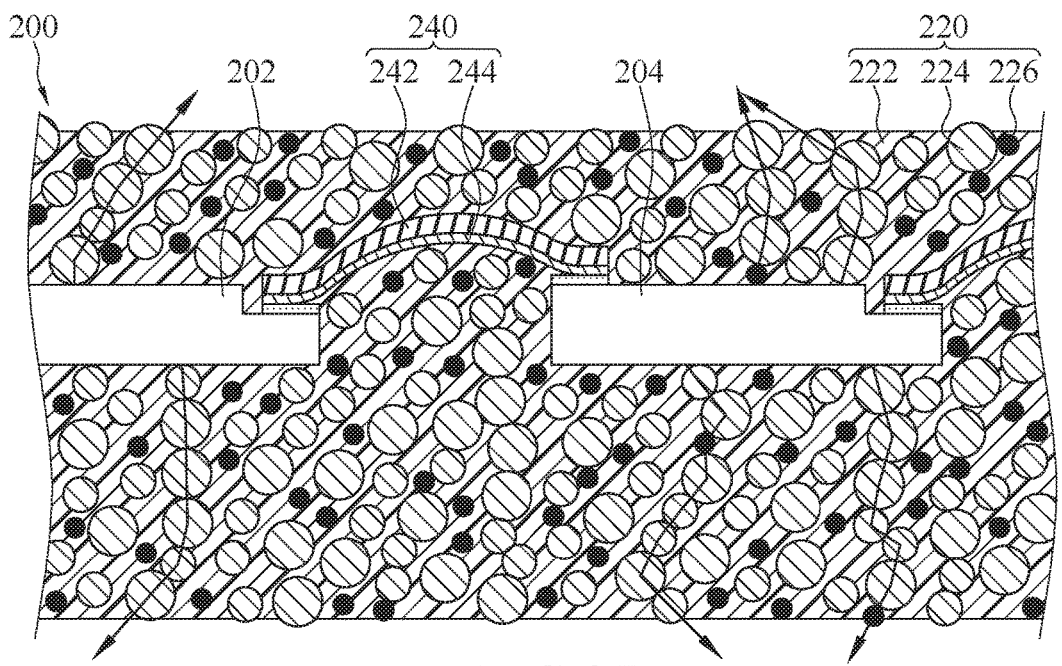
FIG. 37 illustrates a partial cross-sectional view at section 5-5 of FIG. 36.

Please refer to FIGS. 36 to 37. FIG. 36 illustrates a perspective view of an LED light bulb with partial sectional view according to a second embodiment of the LED filament and FIG. 37 illustrates a partial cross-sectional view at section 5-5 of FIG. 36.

According to the second embodiment of the LED filament 200, the LED filament 200 comprises a plurality of LED chips 202, 204, at least two conductive electrodes 210, 212, and a light conversion coating 220. The conductive electrodes 210, 212 are disposed corresponding to the plurality of LED chips 202, 204. The plurality of LED chips 202, 204 and the conductive electrodes 212, 214 are electrically connected therebetween. The light conversion coating 220 coats on at least two sides of the LED chips 202, 204 and the conductive electrodes 210, 212. The light conversion coating 220 exposes a portion of two of the conductive electrodes 210, 212. The light conversion coating 220 comprises an adhesive 222, a plurality of inorganic oxide nanoparticles 226 and a plurality of phosphors 224.

The size of the plurality of inorganic oxide nanoparticles 226 is around 10 to 300 nanometers (nm) or majorly is around 20 to 100 nm. The size of the plurality of inorganic oxide nanoparticles 226 is lesser than that of the phosphors 224. The plurality of the inorganic oxide nanoparticles 226 may be, but not limited to, aluminium oxides ($Al_2O_3$), silicon oxide ($SiO_2$), zirconium oxide (Zirconia, $ZrO_2$), titanic oxide ($TiO_2$), Calcium oxide (CaO), strontium oxide (SrO), and Barium oxide (BaO).

As shown in FIG. 37, the inorganic oxide nanoparticles 226 and the phosphors 224 are mixed with the adhesive 222. The unit prices and the hardness of the inorganic oxide nanoparticles 226 and the phosphors 224 are different. Therefore, a desired deflection, thermal conductivity, hardness, and cost of the LED filament 200 may be reached by adjustment of the ratio of the adhesive 222, phosphors 224 to the inorganic oxide nanoparticles 226 affects. In addition, due that the size of the inorganic oxide nanoparticles 226 is lesser than that of the phosphors 224, the inorganic oxide nanoparticles 226 may fill into the gaps among the phosphors 224. Hence, the contact area among the phosphors 224 and the inorganic oxide nanoparticles 226 is increased and thermal conduction paths are increased as shown by arrow lines on FIG. 37, too. Further, the inorganic oxide nanoparticles 226 may deflect or scatter light incident thereon. The light deflection and scattering make the light emitted from phosphors 224 mixed more uniformly and the characteristics of the LED filament 200 becomes even better. Furthermore, the impedance of the inorganic oxide nanoparticles 226 is high and no electrical leakage would happen through the inorganic oxide nanoparticles 226.

In some embodiments, the phosphors 224 are substantially uniformly distributed in the adhesive 222 (for instance, in silica gel, the polyimide or resin materials). Each of the phosphors 224 may be partially or totally wrapped by the adhesive 222 to improve the cracking or embrittlement of the light conversion coating 220. In the case that not each of the phosphors 224 is totally wrapped by the adhesive 222, the cracking or embrittlement of the light conversion coating 220 is still improved. In some embodiments, silica gel may be mixed with the polyimide or resin materials to form the light conversion coating 220.

The LED filament 200 further comprises a plurality of circuit film 240 (or call as transparent circuit film) for electrically and correspondingly connected among the plurality of LED chips and the conductive electrodes. Specifically, the plurality of circuit film 240 is electrically connecting the adjacent LED chips 202, 204 and conductive electrodes 210, 212. The light conversion coating 220 may encapsulate the plurality of circuit film 240.

Figure 38A:
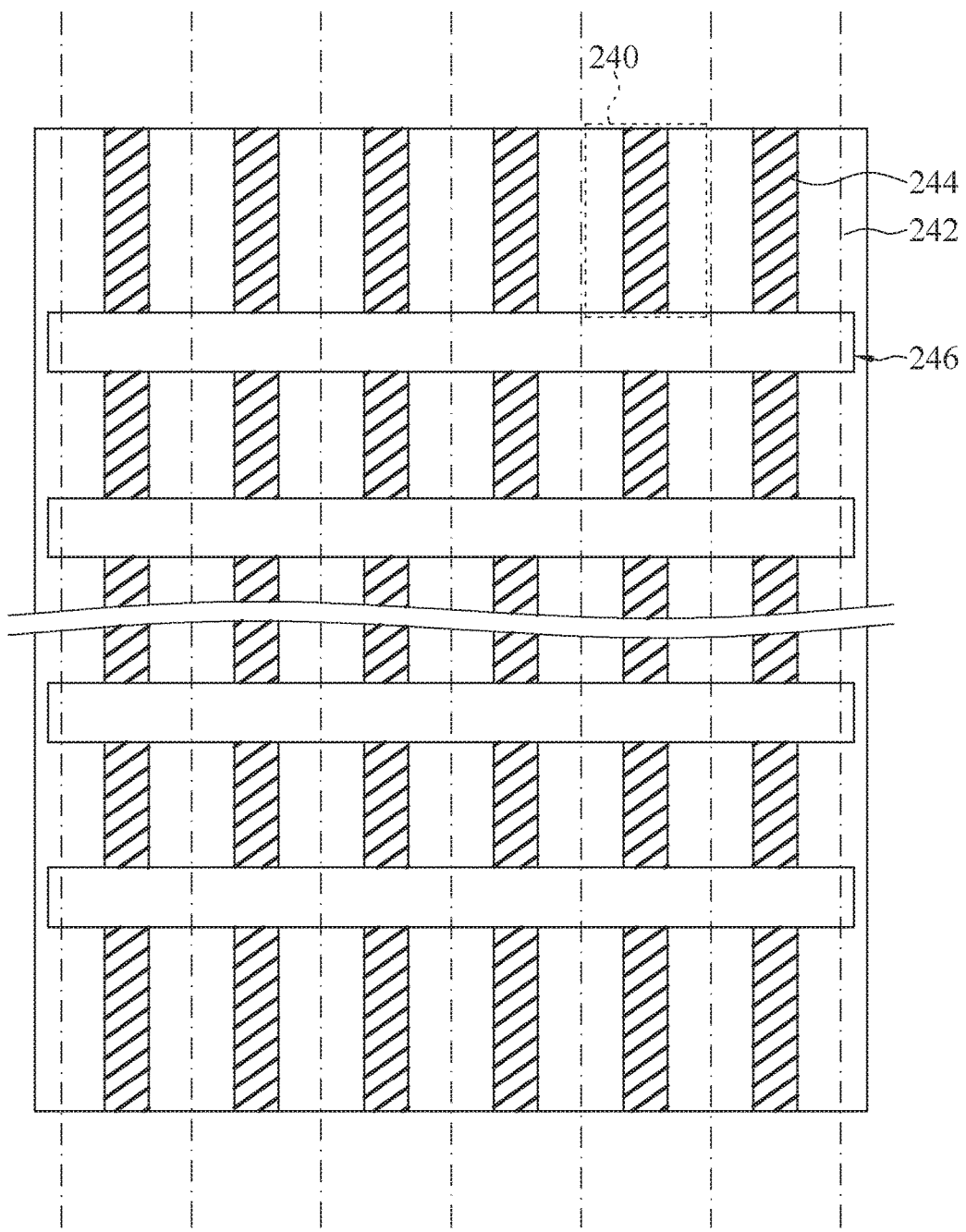
FIG. 38A illustrates a first embodiment of the uncut circuit film according to the second embodiment of the LED filament.

Please refer to FIG. 38. FIG. 38A illustrates a first embodiment of the uncut circuit film according to the second embodiment of the LED filament 200. Each of the circuit films 240 comprises a first film 242 and a conductive circuit 244 disposed on the first film 242. The first film 242 in one embodiment may be, but not limited to, a thin film. In order to be easily understood the embodiments, the following description uses thin film as an example for the first film 242. However, the thin film 242 is not the only embodiment for the first film 242. The thin film 242 may be a transparent or translucent film. The transparent film may allow light emitted from the LED chips 202, 204 and/or phosphors 124 to pass. The conductive circuits 244 are electrically and correspondingly connected among the plurality of LED chips 202, 204 and the conductive electrodes 210, 212. In this embodiment, the conductive circuits 244 are of bar shape and substantially parallel to each other. However, the conductive circuits 244 may be in other shape or pattern. Please refer to FIG. 39A which illustrates a second embodiment of the uncut circuit film according to the second embodiment of the LED filament. Each of the circuit films 240a comprises a thin film 242a and a conductive circuit 244a disposed on the thin film 242a. The conductive circuits 244a are substantially parallel lines electrically connected with pads of adjacent LED chips 202, 204 as shown in FIG. 39B. Please refer to FIG. 40A which illustrates a third embodiment of the uncut circuit film according to the second embodiment of the LED filament. Each of the circuit films 240b comprises a thin film 242b and a conductive circuit 244b disposed on the thin film 242b. The conductive circuits 244b are crossover lines electrically connected with pads of adjacent LED chips 202b, 204b as shown in FIG. 40B. The width of the lines may be 10 micrometers (um) and the thickness of the lines may be 2 um. The pattern or shape of the conductive circuits 244, 244a, 244b are not limited to the above-mentioned embodiments, any pattern or shape which is capable of connecting pads of adjacent LED chips 202, 204 and conductive electrodes 210, 212 are feasible.

The thin film 242 may be, but not limited to, Polyimide film (PI film). Transmittance of the polyimide film is above 92%. The material of the conductive circuit 244 may be, but not limited to, indium tin oxide (ITO), nano-silver plasma, metal grids, or nano-tubes. The advantages of Silver include good reflection and low light absorption. Nano-scaled silver lines in grid shape have advantages of low resistance and high penetration of light. In addition, gold-doped nano-silver lines may enhance the adherence between the pads of the LED chips 202, 204 and the sliver lines (conductive circuits).

Please refer to FIG. 38A again. The circuit film 240 may be made by firstly forming conductive circuits 244 on a thin film 242, and then forming slots 246 on the thin film 242 with the conductive circuits 244.

Please refer to FIG. 38A. The conductive circuits 244 do not cover the whole surface of the thin film 242. Consequently, light emitted from the LED chips 202, 204 can pass through the circuit film 240 at least from the portion of the thin film 242 where the conductive circuits 244 do not occupy. In the second embodiment, the circuit film 240 is used to electrically connect with adjacent LED chips 202, 204 and the conductive electrodes 210, 212. The circuit film 240 has the advantages of wider conductive lines, better deflection, and better toughness (less possibility of being broken) than the conductive wires 140 in the first embodiments.

Regarding the electrical connection among the circuit film 240, LED chips 202, 204, and the conductive electrodes 210, 212, conductive glues may be applied on the surfaces of the LED chips 202, 204 and the conductive electrodes 210, 212 where the conductive circuits 244 are going to electrically connect. The conductive glues may be, but not limited to, silver paste, solder paste (tin paste), or conductive glues doped with conductive particles. Then, dispose the circuit film 240 on the LED chips 202, 204 and the conductive electrodes 210, 212 with adequate alignment and cure the circuit film 240 and the conductive glues by heat or UV.

Figure 41A:
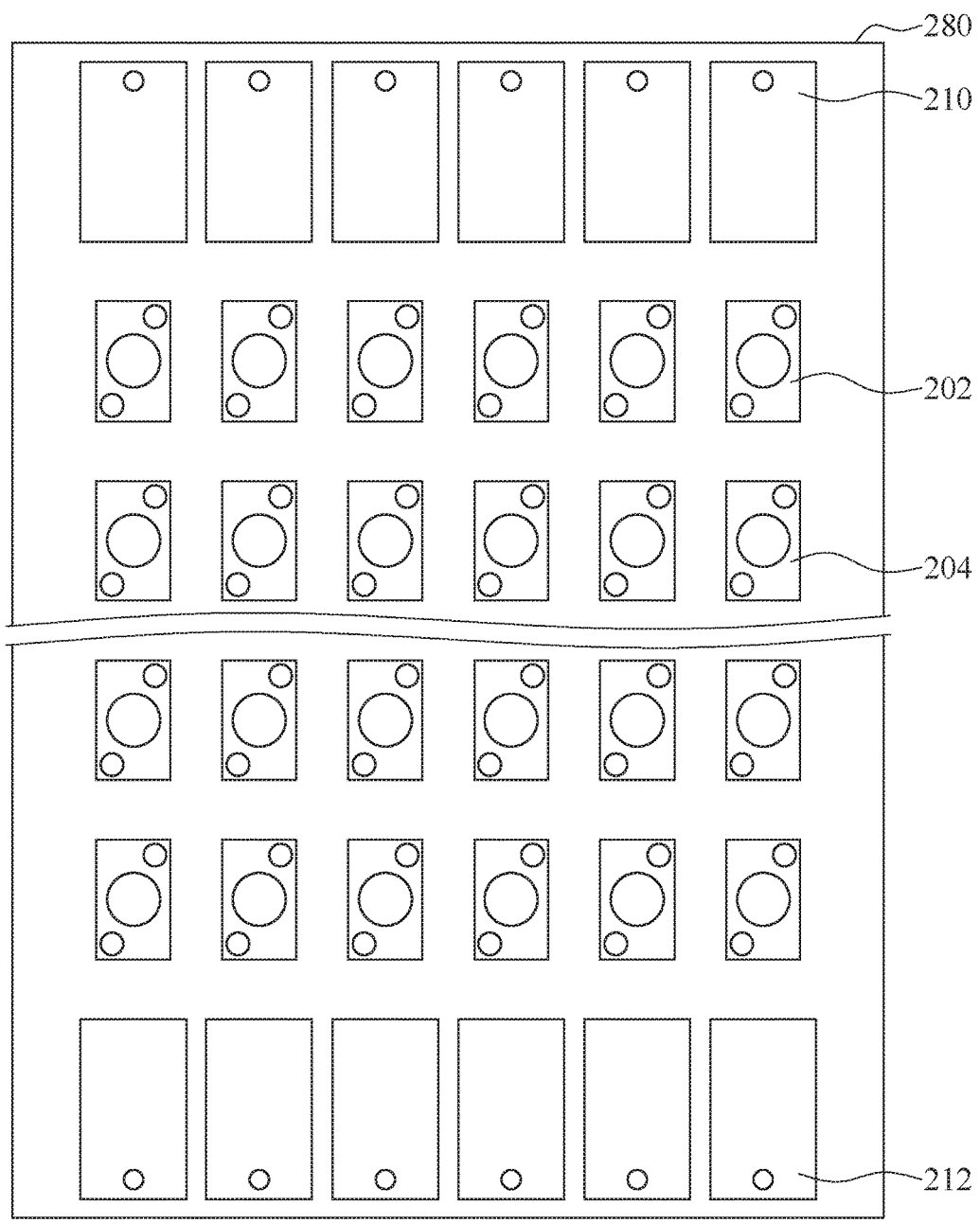
FIGS. 41A to 41E illustrate a manufacturing method of an LED filament according to a first embodiment of the present disclosure.
Figure 41B:
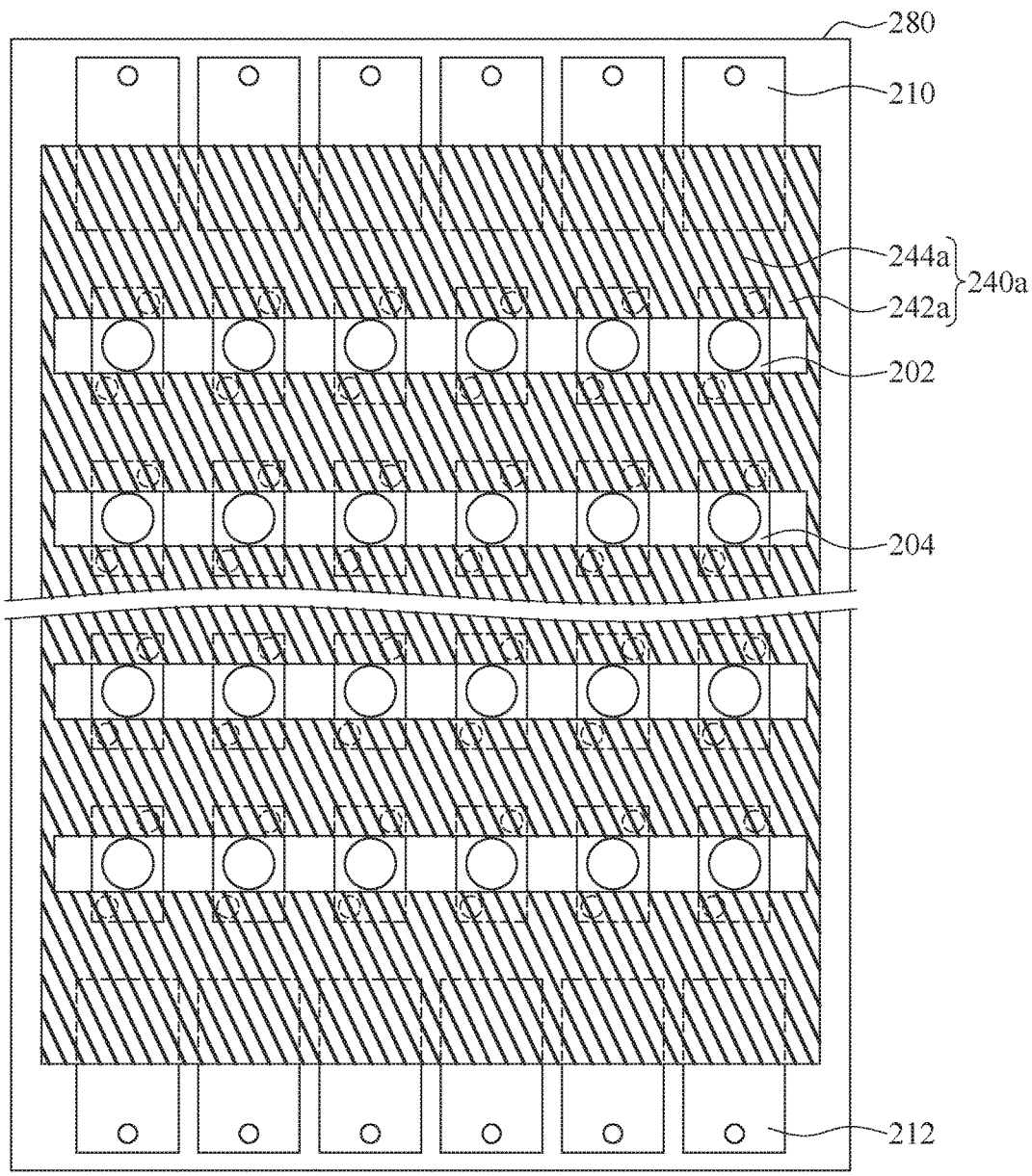

Please refer to FIGS. 41A to 41E which illustrate a manufacturing method of an LED filament according to a first embodiment. The manufacturing method of the LED filament 200 comprises:

S20: dispose LED chips 202, 204 and at least two conductive electrodes 210, 210 on a carrier 280, referring to FIG. 41A;

S22: electrically connect the LED chips 202, 204 with the conductive electrodes 210, 212, referring to FIG. 41B; and S24: dispose a light conversion coating 220 on the LED chips 202, 204 and the conductive electrodes 210, 212. The light conversion coating 220 coats on at least two sides of the LED chips 202, 204 and the conductive electrodes 210, 212. The light conversion coating 220 exposes a portion of at least two of the conductive electrodes 210, 212. The light conversion coating 220 comprises adhesive 222 and a plurality of phosphors 224, referring to FIG. 41C to 41E.

In S20, the plurality of LED chips 202, 204 are disposed in a rectangular array. Each column of the LED chips 202, 204, at the end of the manufacturing process, may be cut into a single LED filament 200. During disposition of the LED chips 202, 204, the anodes and cathodes of the LED chips 202, 204 should be properly orientated for later connected in series or parallel. The carrier 280 may be, but not limited to, glass substrate or metal substrate. The carrier 280 may be, but not limited to, a plate like that shown in FIG. 41A, or a plate with a groove like the carrier 180 shown in FIG. 42. The groove is for being disposed with the base layer 120b.

Figure 39A:
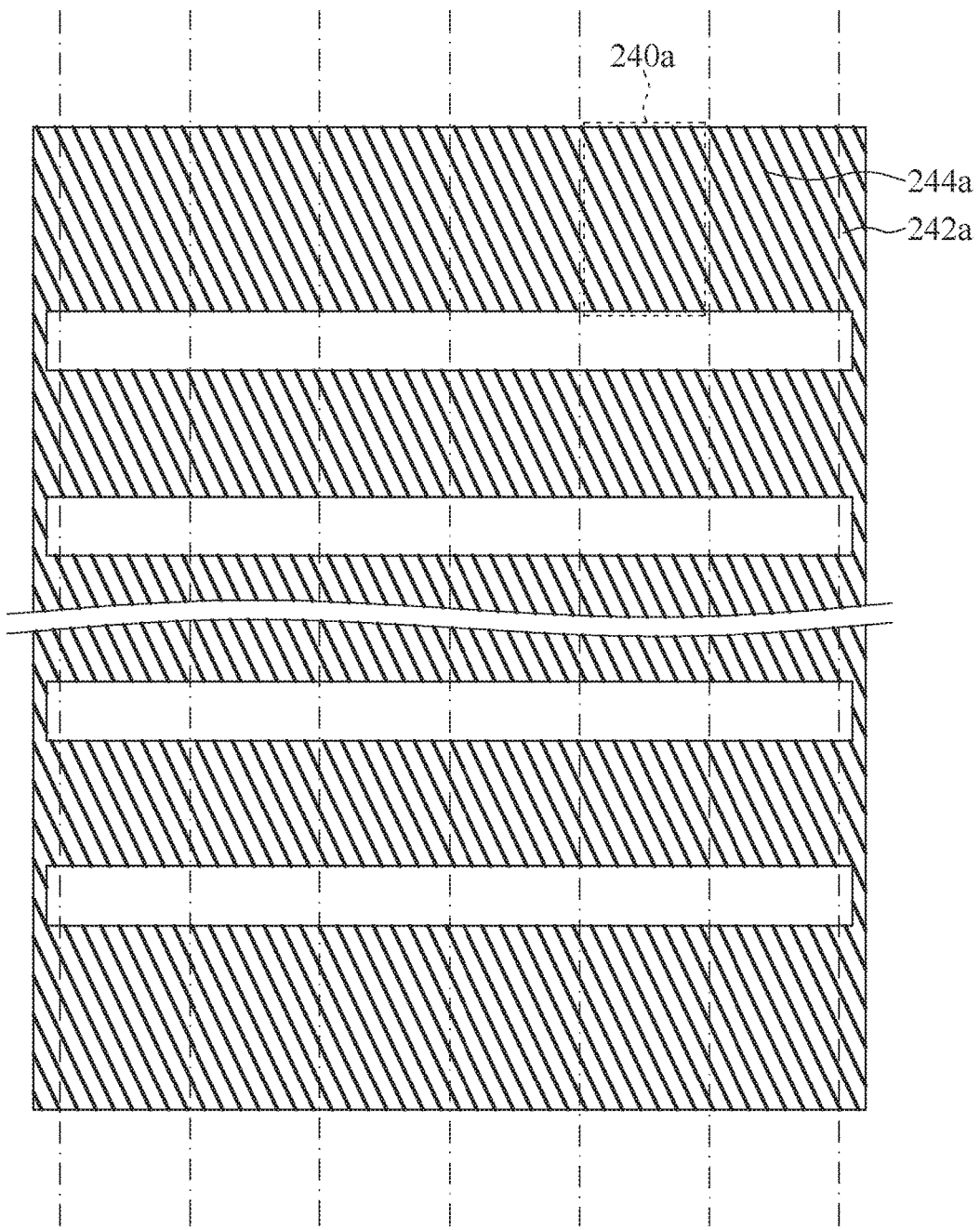
FIG. 39A illustrates a second embodiment of the uncut circuit film according to the second embodiment of the LED filament.

In S22, the uncut circuit film 240a is similar to the circuit film 240a shown in FIG. 39A. The LED chips 202, 204 and the conductive circuit 210, 212 are electrically connected by the parallel conductive lines. Alternatively, the circuit film 240, 240b shown, respectively, in FIG. 38A or 38A may be used in S22. The conductive wires 140 shown in FIG. 34 can be used in S22, too.

In S24, the light conversion coating 220 may be coated on the LED chips 202, 204 and the conductive electrodes 210, 212 by different method. Firstly, taking FIG. 41C to 41E as an example, the manufacturing method of S24 comprises:

S240: coat a light conversion sub-layer (top layer 220a) on a surface of the LED chips 202, 204 and the conductive electrodes 210, 212 which is not contact with the carrier 280;

S242: flip over the LED chips 202, 204 and the conductive electrodes 210, 212 disposed with the top layer 220a; and S244: coat a light conversion sub-layer (base layer 220b) on a surface of the LED chips 202, 204 and the conductive electrodes 210, 212 which are not coated with the top layer 220a.

In order to distinguish the light conversion sub-layers in S240 and in S244, the light conversion sub-layer in S240 is referred to top layer 220a and the light conversion sub-layer in S244 is referred to base layer 220b hereinafter.

In S240, after the LED chips 202, 204 and the conductive electrodes 210, 212 are coated with the top layer 220a, the adhesive 222 and the phosphors 224 will fill out the gaps among the LED chips 202, 204 and the conductive electrodes 210, 212. Then, proceed with a curing process to harden the top layer which encapsulates the upper part of the LED chips 202, 204 and the conductive electrodes 210, 212 and exposes a portion of at least two of the conductive electrodes 210, 212. The curing process may be done by heat or UV.

In S242, the flip-over of the semi-finished piece may be done by two different ways in accordance with different situations. Concerning the first flip-over way, the LED chips 202, 204 and the conductive electrodes 210, 212 are disposed on the carrier 280 without any adherences with the carrier 280. S242 can be done by flip the cured semi-finished piece over directly. Then, place the flipped-over semi-finished piece on the carrier 280 again. (The semi-finished piece is the cured LED chips 202, 204 and the conductive electrodes 210, 212 covered with the top layer 220a.)

As for the second way, glues are applied on the carrier 280. The glues are, for instance, photoresist in semiconductor process, or die bond glues. The glues (photoresist or die bond glues) is for temporarily fixing the LED chips 202, 204 and the conductive electrodes 210, 212 on the carrier 280. The glue may be removed by acetone or solvent and the semi-finished piece is separated from the carrier 280. If necessary, the remained glues may be removed by an additional cleaning process.

Figure 41C:
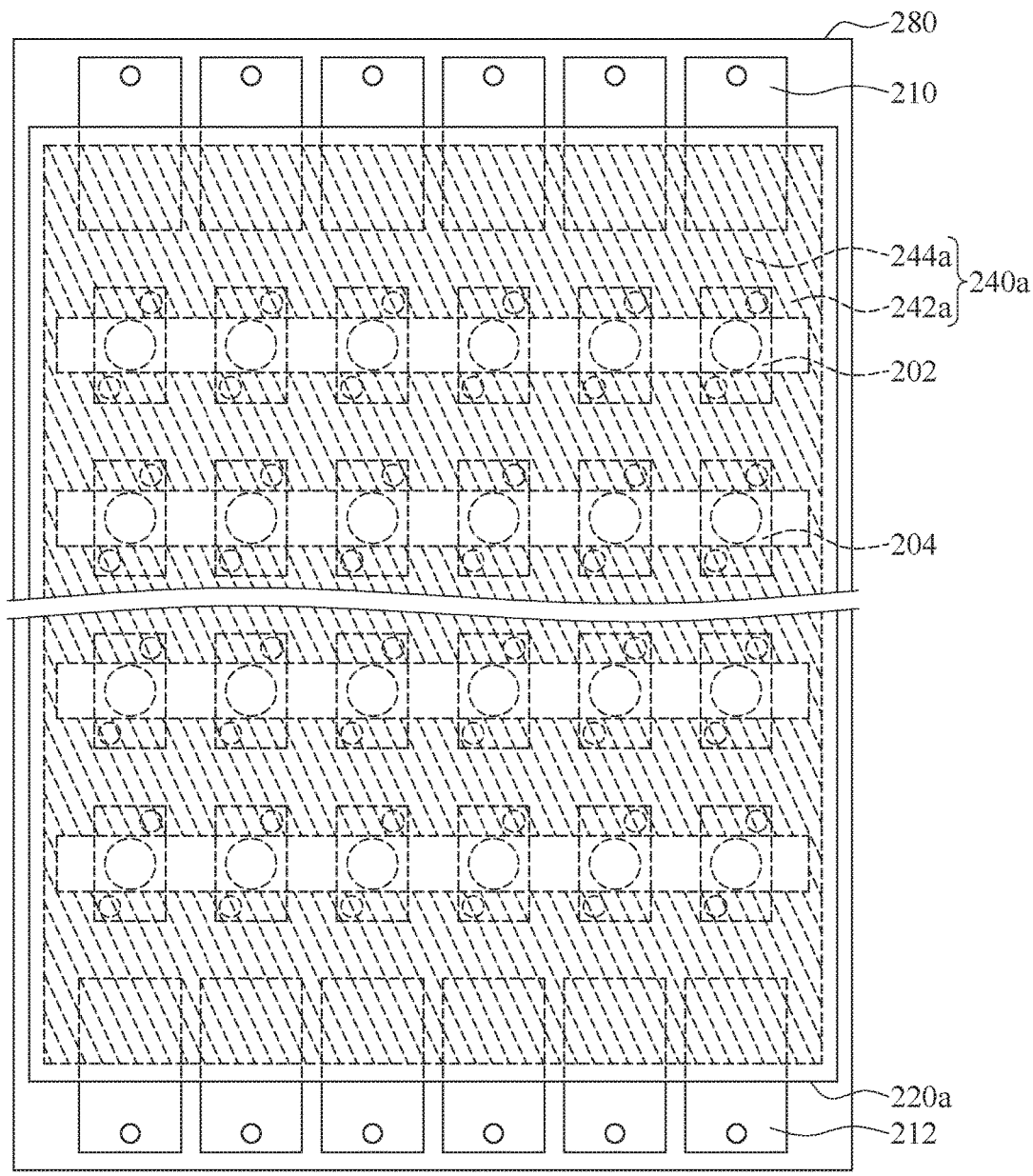
Figure 41D:
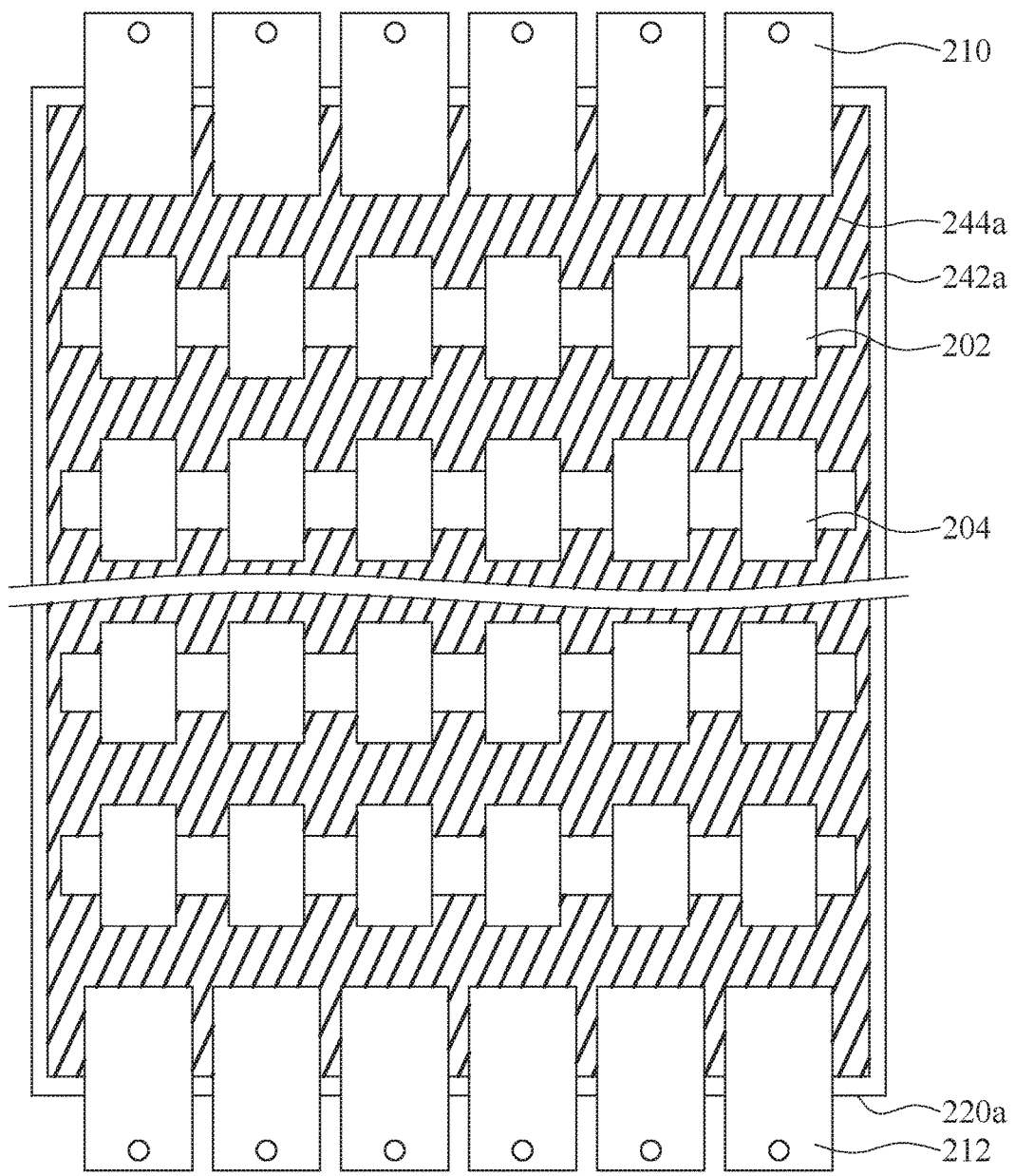
Figure 41E:
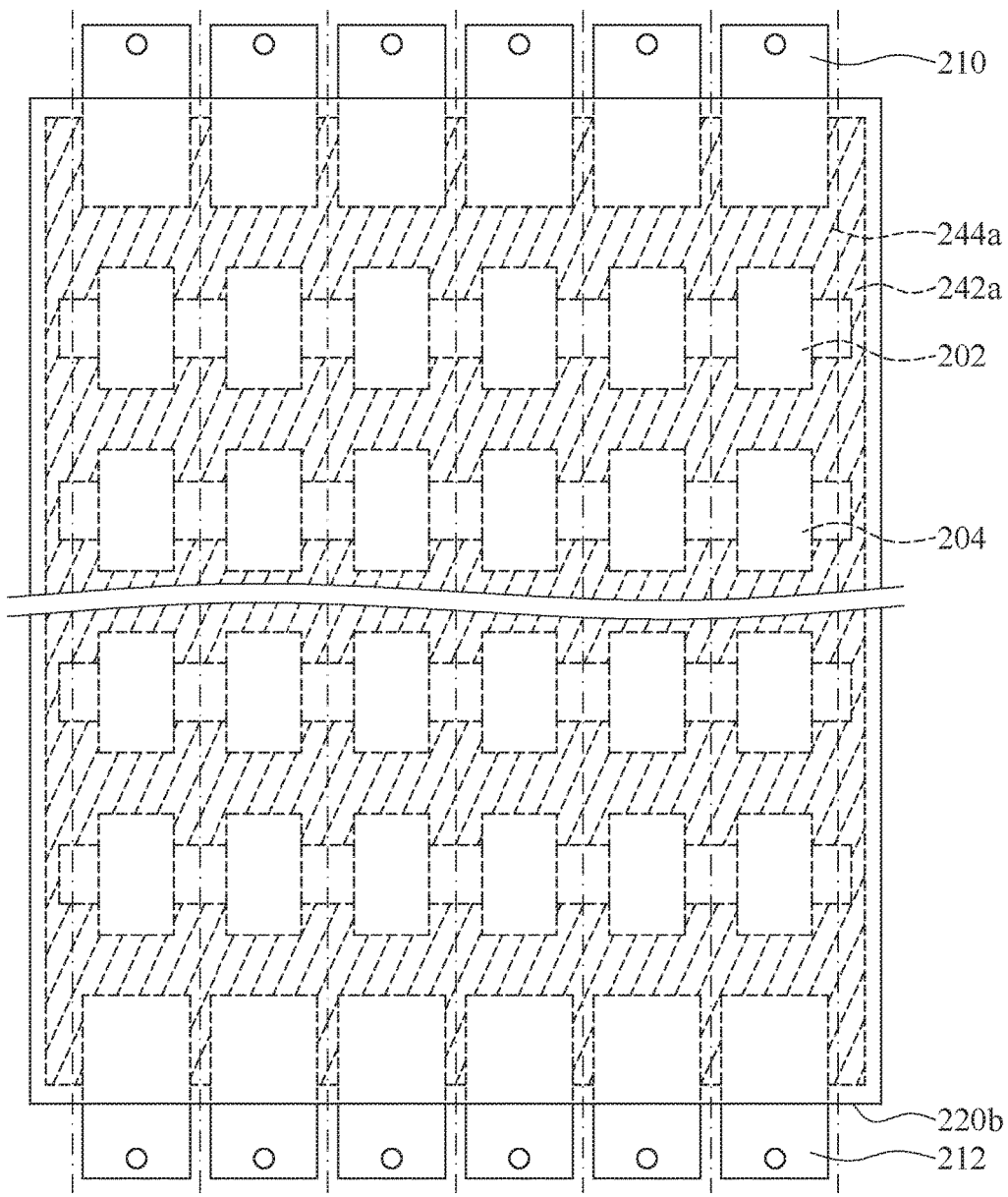

In S244, referring to FIG. 41E, cure the base layer 220b after the base layer 220b is coated on the surface of the LED chips 202, 204 and the conductive electrodes 210, 212.

Referring to FIG. 41C, the top layer 220a is slightly greater than the uncut circuit film 240a. However, it is not a requirement. The sizes of the top layer 220a may be the same as or lesser than that of the uncut circuit film 240a. Referring to FIG. 41E, the area of the top layer 220a is substantially the same as that of the base layer 220b. It is not a requirement, either. In implementation, the area of the top layer 220a may be greater or lesser than the area of the base layer 220b. FIG. 41E illustrates a semi-finished LED filament where a plurality of LED filaments 200 are integrated into one piece.

After S24, the method may further comprise S26: cut the semi-finished LED filament along the dot-and-dash lines shown in FIG. 41E. Each cut portion is an LED filament 200. The semi-finished LED may be cut every other two dot-and-dash lines.

Figure 38B:
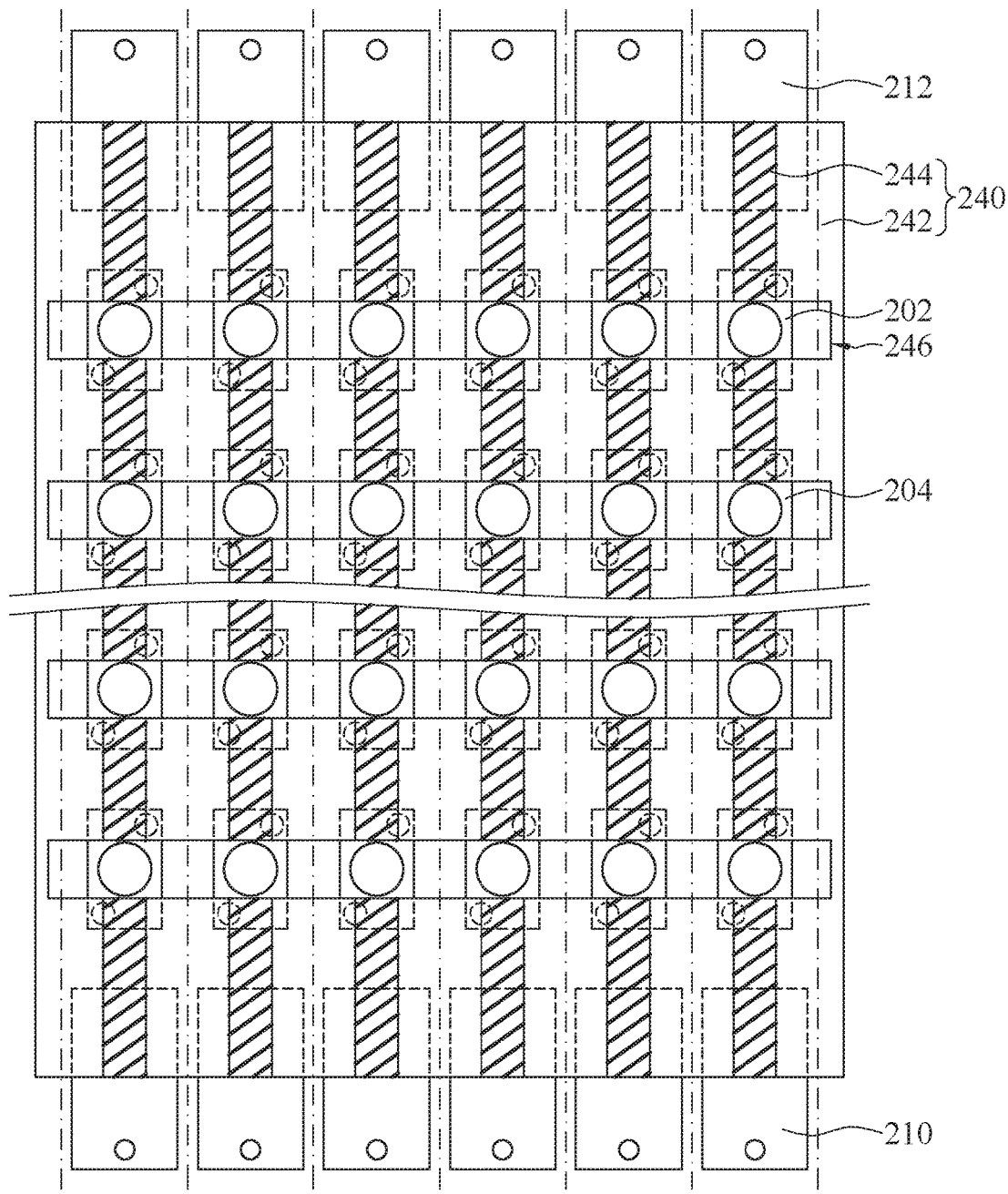
FIG. 38B illustrates the alignment between the LED chips and the first embodiment of the uncut circuit film of FIG. 38A.
Figure 39B:
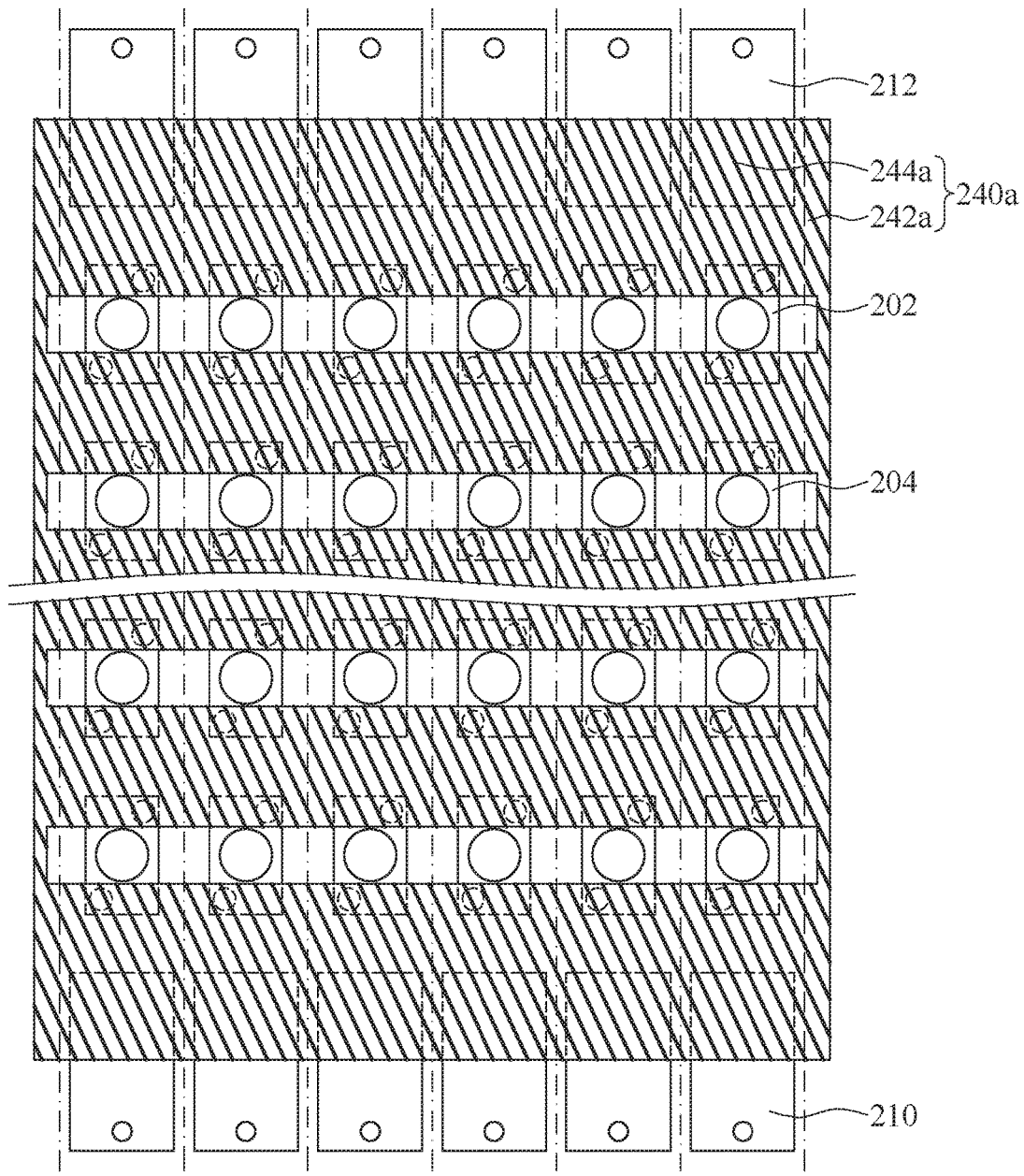
FIG. 39B illustrates the alignment between the LED chips and the second embodiment of the uncut circuit film of FIG. 39A.
Figure 40A:
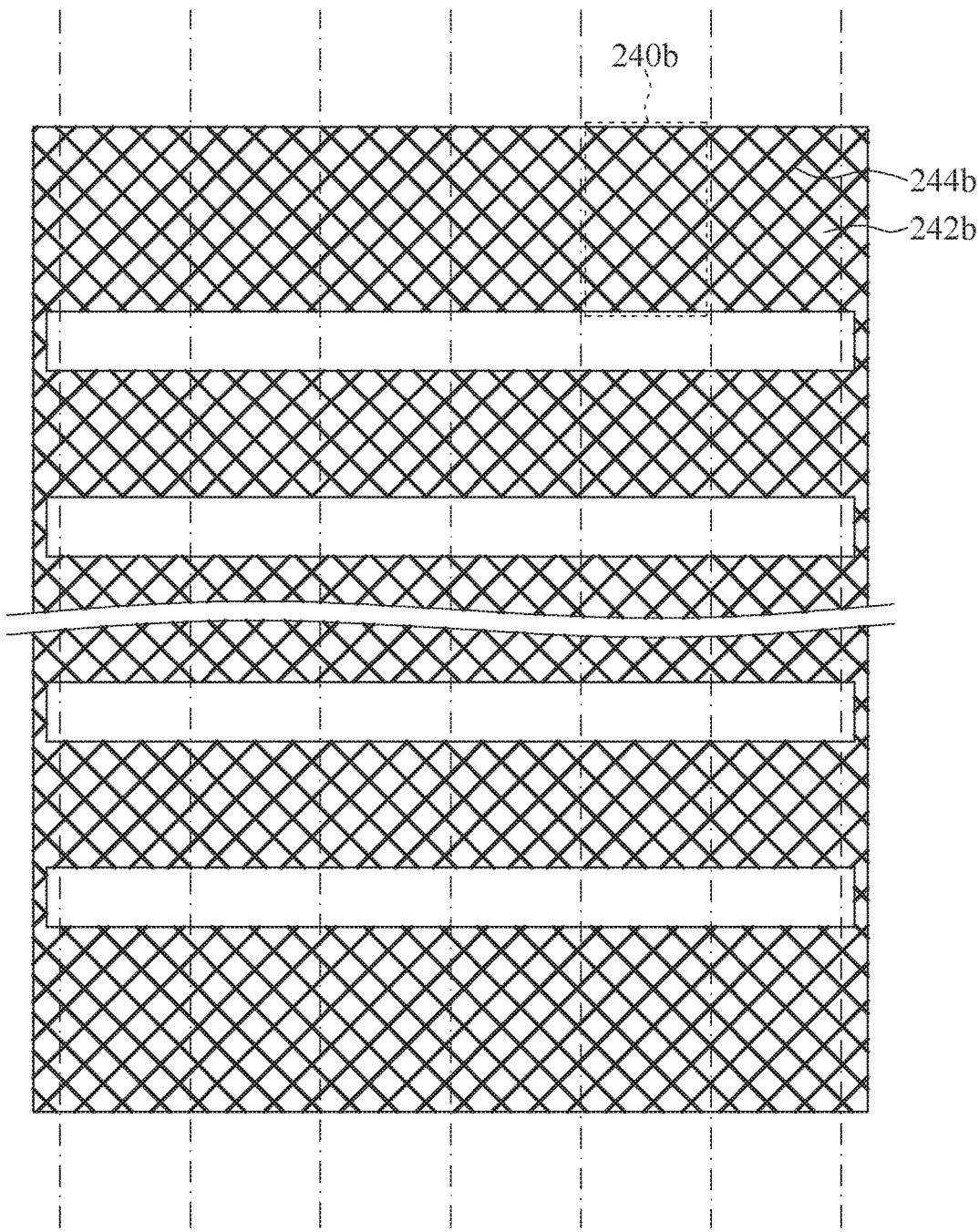
FIG. 40A illustrates a third embodiment of the uncut circuit film according to the second embodiment of the LED filament.
Figure 40B:
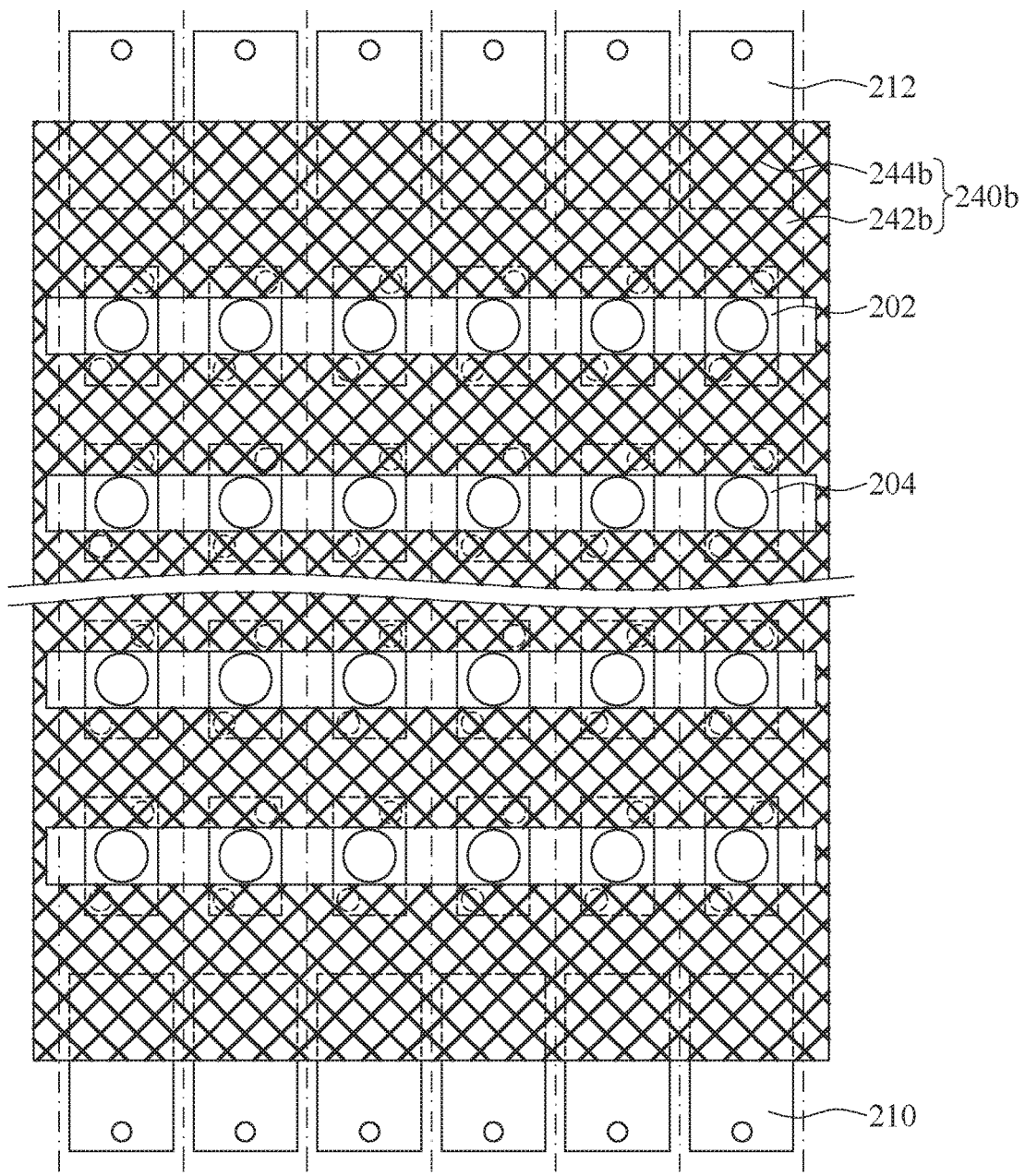
FIG. 40B illustrates the alignment between the LED chips and the third embodiment of the uncut circuit film of FIG. 40A.

FIGS. 38B, 39B and 40B illustrate uncut circuit films 240, 240a, 240b of FIGS. 38A, 39A and 40A covering the LED chips 202, 204 and the conductive electrodes 210, 212 with proper alignment.

The method of FIGS. 41A to 41E illustrates each LED filament are disposed in a rectangular array manner. Alternatively, the disposition of S20 may be a single column of LED chips 202, 204. In the consequence, S26 may be omitted.

Figure 42:
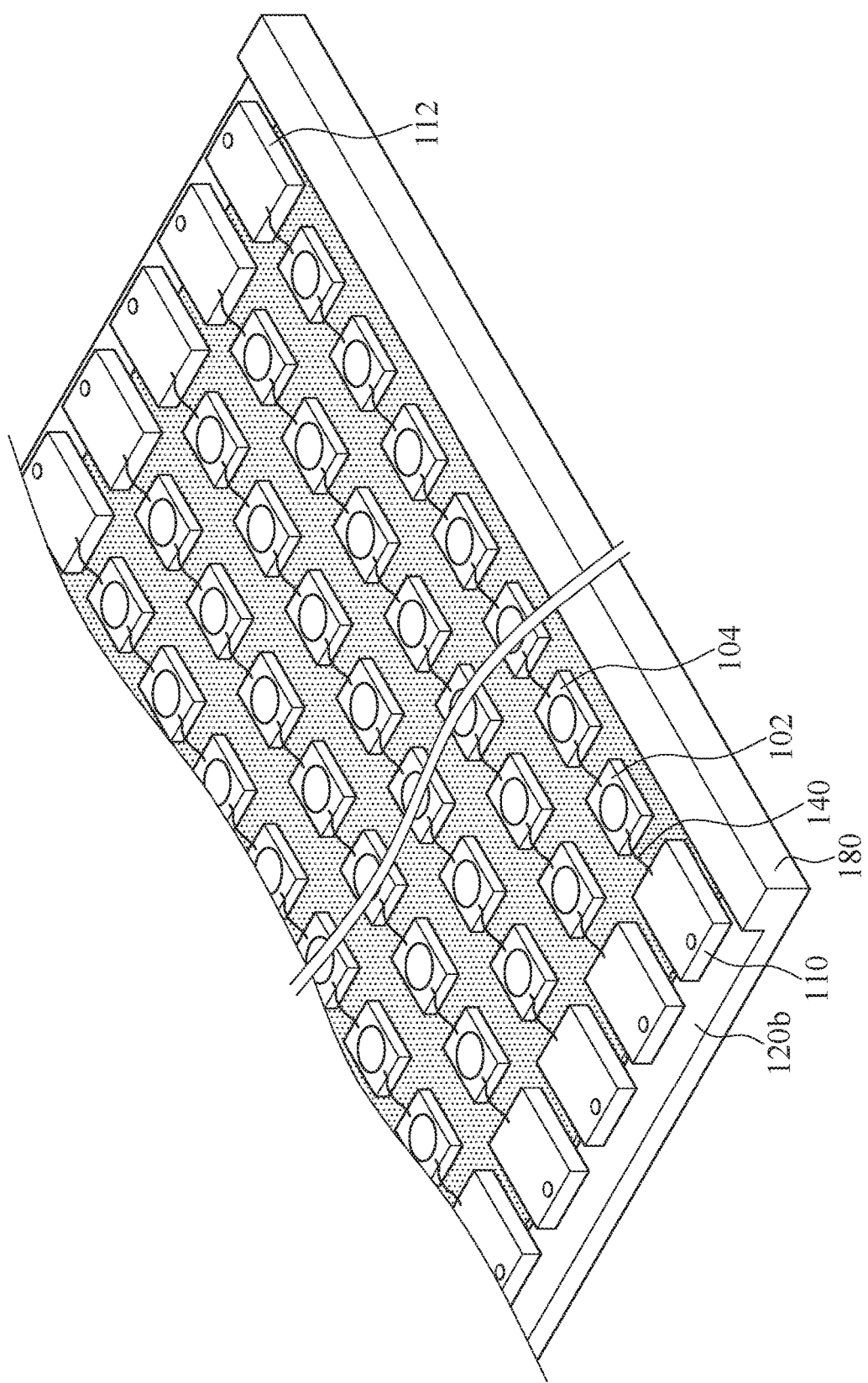
FIG. 42 illustrates a manufacturing method of an LED filament according to a second embodiment of the present disclosure.

Please refer to FIG. 42 for the second embodiment of the manufacturing method for the LED filament 200. The method comprises:

S20A: coat a light conversion sub-layer (a base layer 120b) on a carrier 180;

S20B: dispose LED chips 102, 104 and conductive electrodes 110, 112 on the base layer 120b;

S22: electrically connect the LED chips 102, 104 with the conductive electrodes 110, 112; and S24: coat a light conversion sub-layer (top layer 120a) on the LED chips 102, 104 and the conductive electrodes 110, 112. The top layer 120a coats on the LED chips 102, 104 and the conductive electrodes 110, 112. The top layer 120a and the base layer 120b expose a portion of at least two of the conductive electrodes 110, 112. The light conversion coating 120 (top layer 120a and the base layer 120b) comprises adhesive 122 and a plurality of phosphors 124.

As shown in FIG. 42, the base layer 120b is a part of the light conversion coating 120 and comprises an adhesive 122 and phosphors 124. In the embodiment of FIG. 42, the base layer 120b is, but not limited to, coated on the carrier 180 with a groove. Alternatively, the carrier 180 can be omitted. In other words, the base layer 120b may be place on a work table without any carrier 180. The LED chips 102, 104 and the conductive electrodes 110, 112 are disposed on the base layer 120b.

The thickness of the base layer 120b may be 50 to 100 um. The composition ratio of phosphors 124 to the adhesive 122 can be adjusted and the thickness of the base layer 120b may be around 60 to 80 um. After S20, a pre-curing process may be used to slightly cure the base layer 120b so that the LED chips 102, 104 and the conductive electrodes 110, 112 can be fixed on the base layer 120b. Besides, the LED chips 102, 104 and the conductive electrodes 110, 112 may be fixed on the base layer 120b by die bond glues.

After the electrical connection of S22, the top layer 120a is coated on the LED chips 102, 104 and the conductive electrodes 110, 112 and then a curing process is proceeded with to cure the top layer 120a. Consequently, the flip-over of S242 and glue-removing process are omitted.

According to the embodiment of FIG. 42, after S24, the process of S26 may be proceeded with.

The base layer 120b is used for carrying the LED chips 102, 104 and the conductive electrodes 110, 112 and its thickness may be 0.5 to 3 millimeters (mm) or 1 to 2 mm.

The composition ratio of phosphors 124 to the adhesive 122 may be adjusted accordingly to make the base layer 120b hard enough to sufficiently carry the LED chips 102, 104 and the conductive electrodes 110, 112 and for the following process like wire bond. The Shore D Hardness of the base layer 120b may be at least 60 HD. Hence, the overall LED filament 10a will have enough hardness, rigidity and deflection. The electrical conductivity of the connection among the LED chips 102, 104 and the conductive electrodes 110, 112 can be maintained even though the LED filament 10a is bent.

In accordance with the embodiment of FIG. 42, the hardness of the cured base layer 120b is better to be sufficient to carry the LED chips 102, 104 and the conductive electrodes 110, 112 and to support for the wire bonding process. However, the top layer 120a is not required to have the same hardness as the base layer 120b. Accordingly, the adjustment of ratio of the phosphors 124 to the adhesive 122 is more flexible. Alternatively, the light conversion coating 120 may comprise inorganic oxide nanoparticles 224 (not shown in FIG. 42).

Figure 43A:
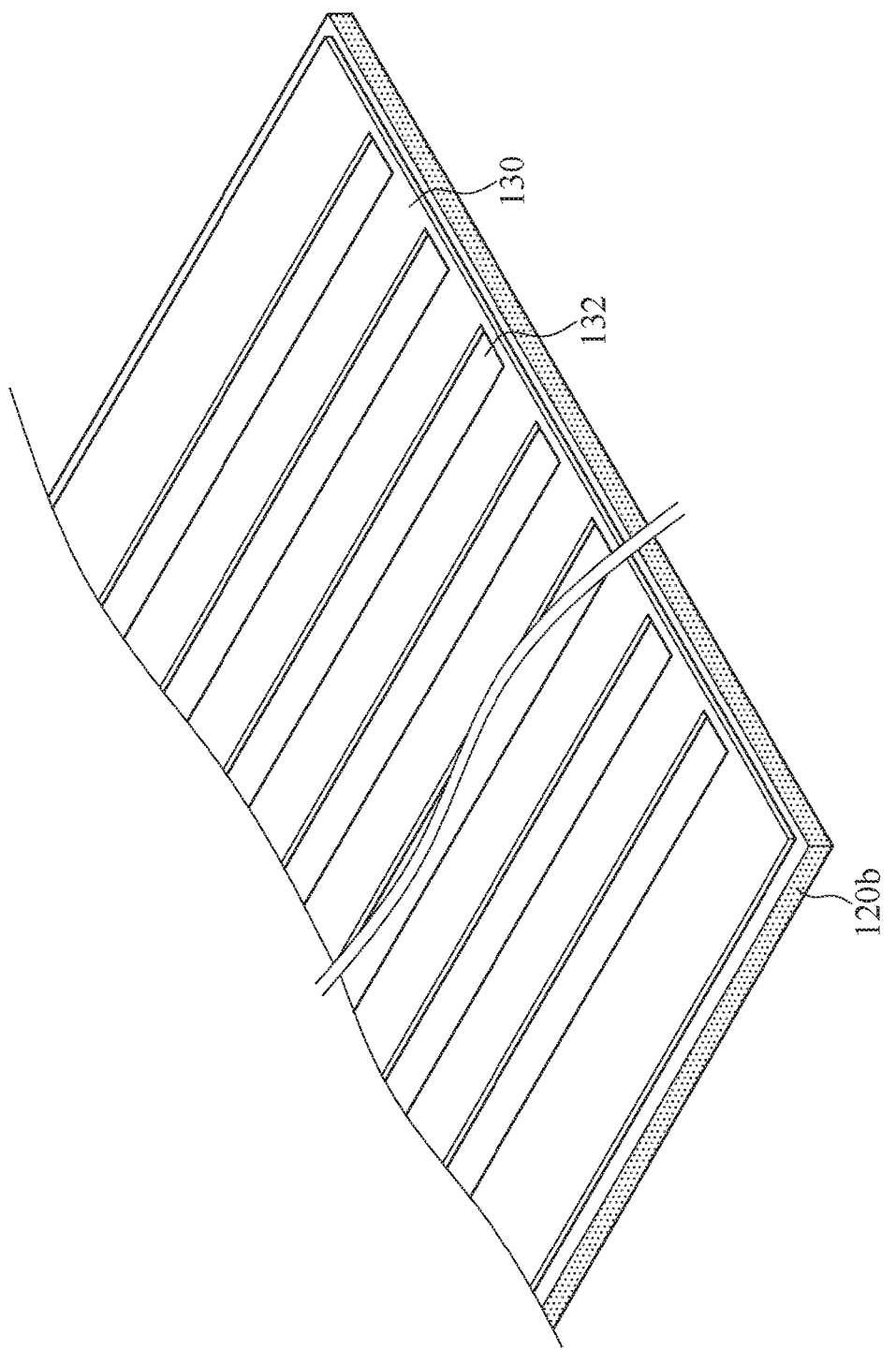
FIGS. 43A to 43E illustrate a manufacturing method of an LED filament according to a third embodiment of the present disclosure.
Figure 43B:
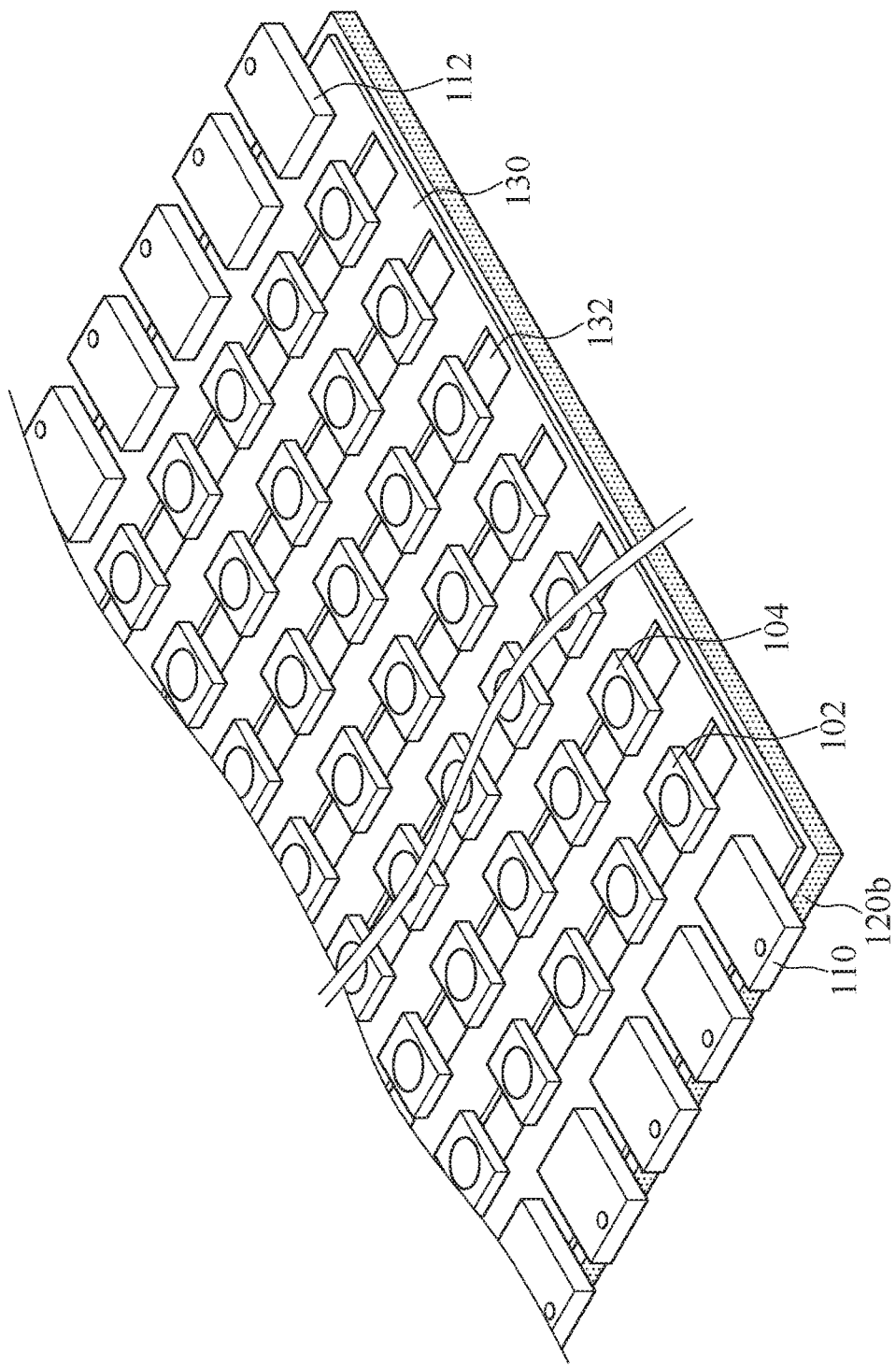
Figure 43C:
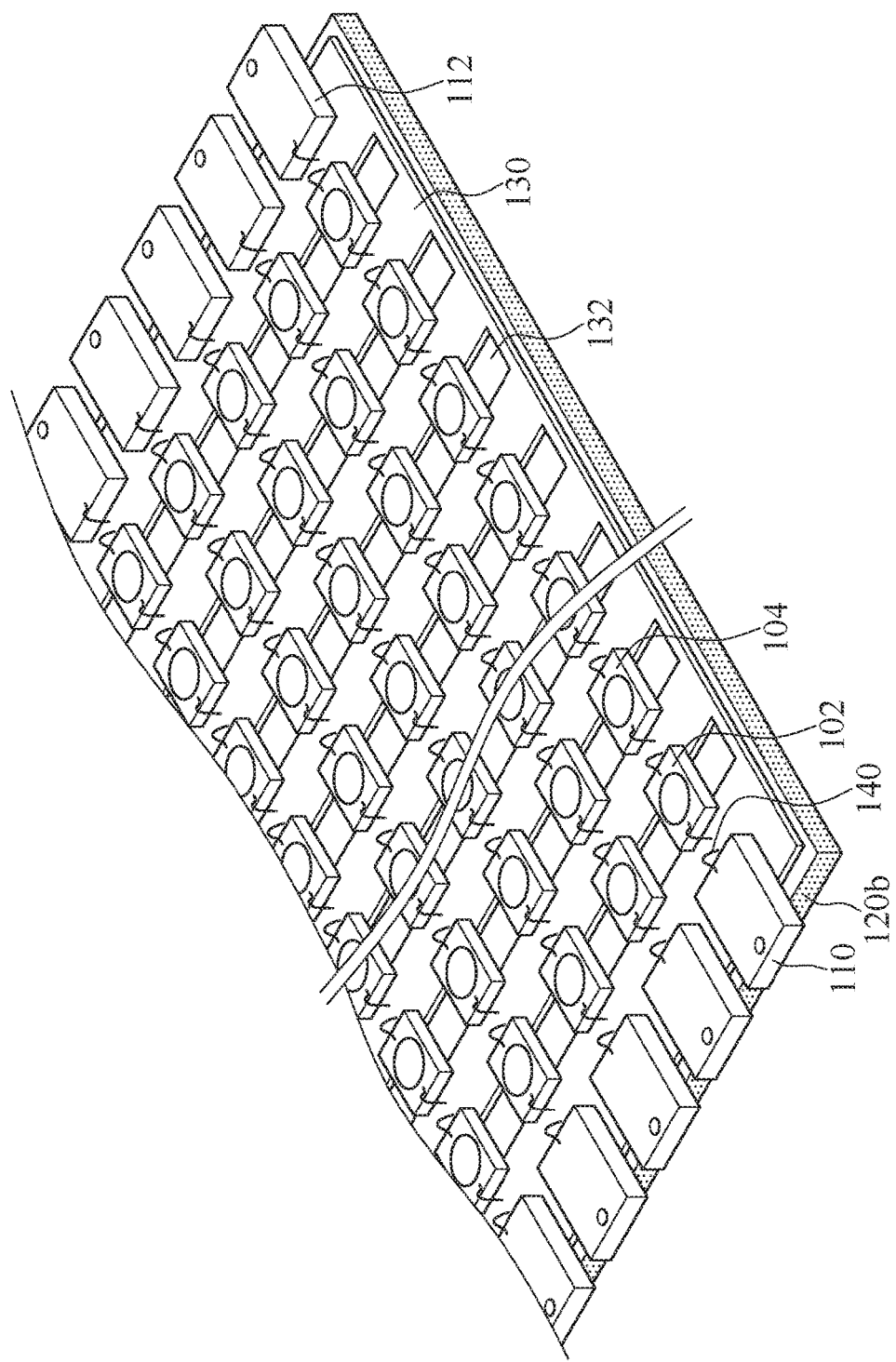

Next, please refer to FIGS. 43A to 43E which illustrate a manufacturing method of an LED filament according to a third embodiment. The manufacturing method for an LED filament 10a comprises:

S202: dispose conductive foil 130 on a light conversion sub-layer (base layer 120b), referring to FIG. 43A;

S204: dispose a plurality of LED chips 102, 104 and a plurality of conductive electrodes 110,112 on the conductive foil 130, referring to FIG. 43B;

S22: electrically connect the LED chips 102, 104 with the conductive electrodes 110, 112, referring to FIG. 43C; and S24: coat a light conversion sub-layer (top layer 120a) on the surfaces of the LED chips 102, 104 and the conductive electrode 110, 112 where may be not in contact with the conductive foil 130. The light conversion coating 120 (including the base layer 120b and the top layer 120a) coats on at least two sides of the LED chips 102, 104 and the conductive electrodes 110, 112. The light conversion coating 120 exposes a portion of at least two of the plurality of conductive electrodes 110, 112. The light conversion coating 120 comprises adhesive 122 and phosphors 124.

Please refer to FIG. 43A, the light conversion coating of S202 is called as the base layer 120b. The conductive foil 130 may have a plurality of openings 132. The width of each of the openings 132 may be lesser than the length of the LED chips 102, 104 and each of the openings 132 is aligned with the portion of the LED chips 102, 104 which emits light. Therefore, light emitted from LED may pass through the openings 132 without any shielding or blocking.

The conductive foil 130 may be, but not limited to, a copper foil coated with silver. The openings 132 may be formed by punching or stamping on a copper foil.

Before S202, the method may comprise a pre-step: dispose the base layer 120b on a carrier (like 180 of FIG. 42) or on a work table.

In S204, please refer to FIG. 43B. The LED chips 102, 104 and the conductive electrodes 110, 112 are disposed on the conductive foil 130. As above-mentioned, the light emitting portions of the LED chips 102, 104 are better to align with the openings 132.

Please refer to FIG. 43C. The electrical connection of S22 may be accomplished by wire bonding process like that shown in FIG. 33. As shown in FIG. 43C, the LED chips 102, 104 and the conductive electrodes 110, 112 are electrically connected together in series.

Figure 43D:
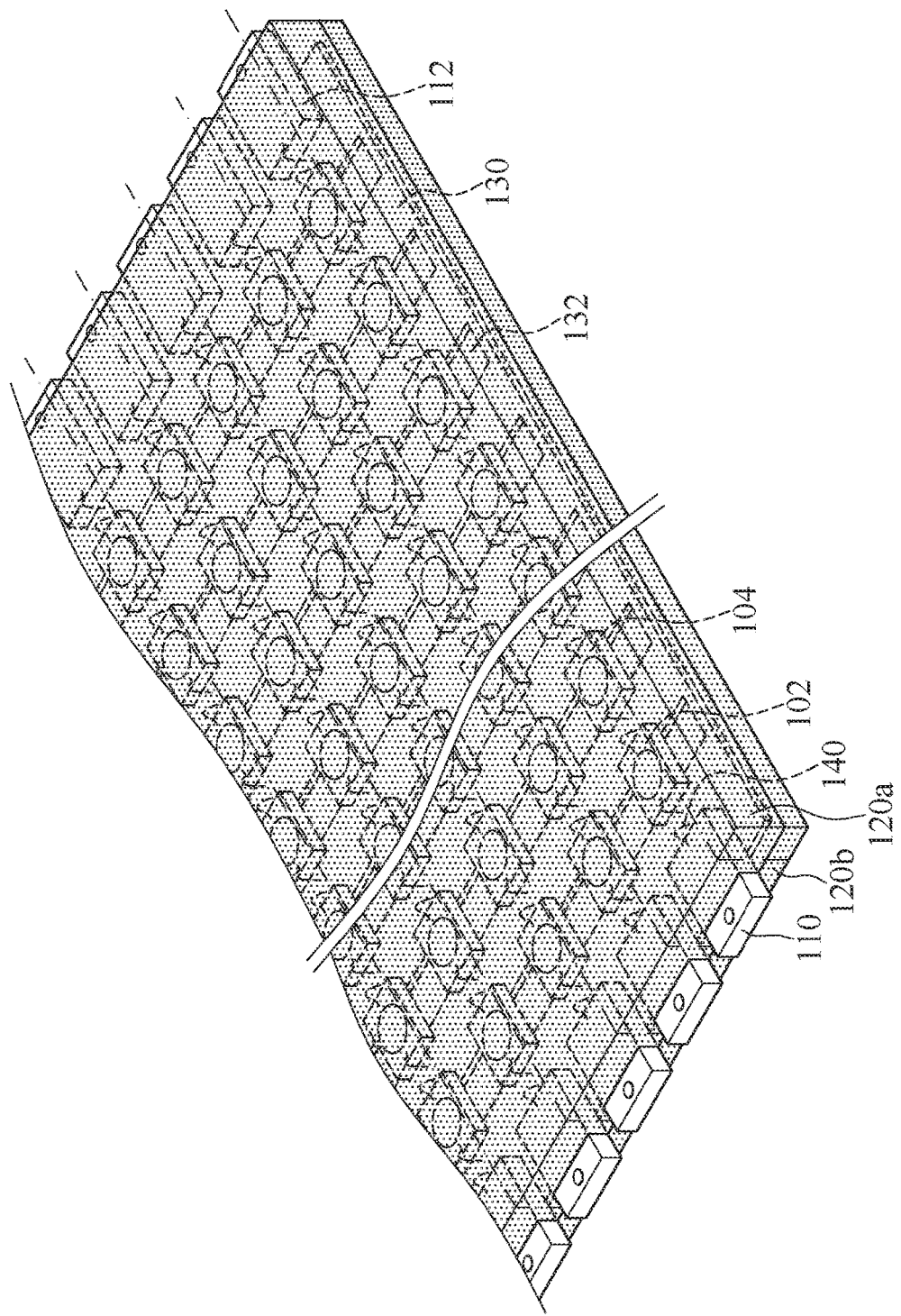

Next, please refer to FIG. 43D. Like the embodiment of FIG. 42, the light conversion sub-layer may be referred to top layer 120a. The top layer 120a fills out the gaps among the LED chips 102, 104 and the conductive electrodes 110, 112 including the gaps under the LED chips 102, 104 and the openings 132.

Regarding the disposition of the top layer 120a, there are a few methods to proceed with. The first one is to coat a mixture of the adhesive 122 and the phosphors 124 on the LED chips 102, 104 and the conductive electrodes 110, 112. The second one is to firstly coat a layer of phosphors 124 on the LED chips 102, 104 and the conductive electrodes 110, 112, and secondly coat a layer of adhesive 122 thereon (two disposition steps). Thereafter, cure the layer of adhesive 122 and the layer of phosphors 124. The third one is to repeat the above two disposition steps until a required thickness is reached. Thereafter, a curing process is proceeded with. In comparison with the three methods, the uniformity of the light conversion coating 120 done by the third method might be better. Additionally, the disposition (coating) of the adhesive 122 or the phosphors 124 may be done by spraying.

Figure 43E:
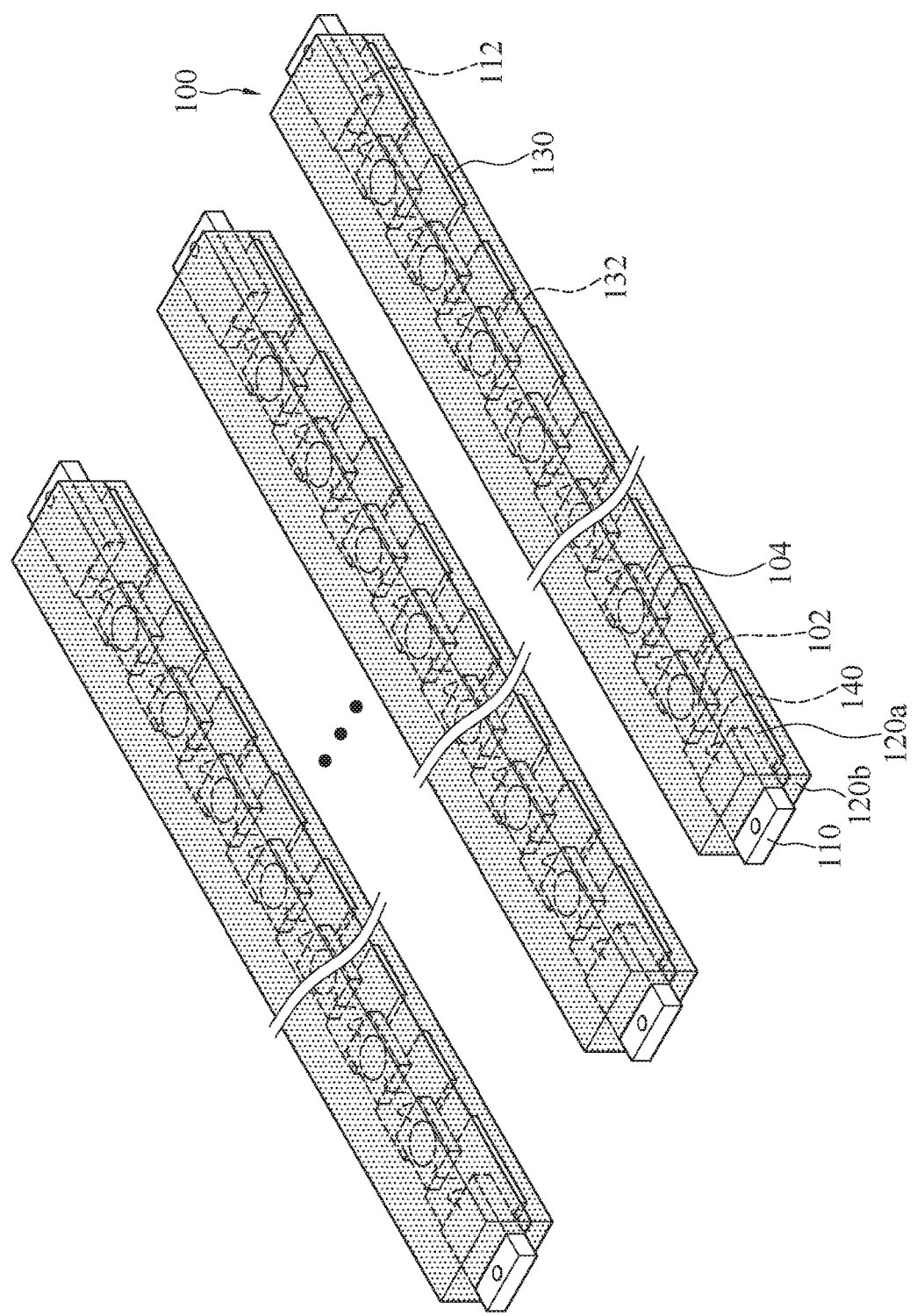

After S24, a cut process may be proceeded with, referring to FIG. 43E. Cut LED filaments 100 are manufactured as shown in FIG. 43E.

In accordance with the embodiment of FIG. 43A to 43E, the LED chips 102, 104 and the conductive electrodes 110, 112 are electrically connected together through conductive foil 130 and conductive wire 140. The flexibility of the electrical connections is enhanced. Accordingly, when the LED filament 100 is bent, the electrical connections would not be easily broken.

Please refer to FIGS. 44A and 44B which illustrate a perspective view of LED light bulb applying the LED filaments according to a first and a second embodiments. The LED light bulb 10a, 10b comprises a bulb shell 12, a bulb base 16 connected with the bulb shell 12, at least two conductive supports 14a, 14b disposed in the bulb shell 12, a driving circuit 18 electrically connected with both the conductive supports 14a, 14b and the bulb base 16, and a single LED filament 100 disposed in the bulb shell 12.

The conductive supports 14a, 14b are used for electrically connecting with the conductive electrodes 110, 112 and for supporting the weight of the LED filament 100. The bulb base 16 is used to receive electrical power. The driving circuit 18 receives the power from the bulb base 16 and drives the LED filament 100 to emit light. Due that the LED filament 100 emits light like the way a point light source does, the LED bulb 10a, 10b may emit omnidirectional light. In this embodiment, the driving circuit 18 is disposed inside the LED light bulb. However, in some embodiments, the driving circuit 18 may be disposed outside the LED bulb.

The definition of the omnidirectional light depends upon the area the bulb is used and varies over time. The definition of the omnidirectional light may be, but not limited to, the following example. Page 24 of Eligibility Criteria version 1.0 of US Energy Star Program Requirements for Lamps (Light Bulbs) defines omnidirectional lamp in base-up position requires that light emitted from the zone of 135 degree to 180 degree should be at least 5% of total flux (lm), and 90% of the measured intensity values may vary by no more than 25% from the average of all measured values in all planes (luminous intensity (cd) is measured within each vertical plane at a 5 degree vertical angle increment (maximum) from 0 degree to 135 degree). JEL 801 of Japan regulates the flux from the zone within 120 degrees along the light axis should be not less than 70% of total flux of the bulb.

In the embodiment of FIG. 44A, the LED light bulb 10a comprises two conductive supports 14a, 14b. In an embodiment, the LED light bulb may comprise more than two conductive supports 14a, 14b depending upon the design.

The bulb shell 12 may be shell having better light transmittance and thermal conductivity; for example, but not limited to, glass or plastic shell. Considering a requirement of low color temperature light bulb on the market, the interior of the bulb shell 12 may be appropriately doped with a golden yellow material or a surface inside the bulb shell 12 may be plated a golden yellow thin film for appropriately absorbing a trace of blue light emitted by a part of the LED chips 102, 104, so as to downgrade the color temperature performance of the LED bulb 10a, 10b. A vacuum pump may swap the air as the nitrogen gas or a mixture of nitrogen gas and helium gas in an appropriate proportion in the interior of the bulb shell 12, so as to improve the thermal conductivity of the gas inside the bulb shell 12 and also remove the water mist in the air. The air filled within the bulb shell 12 may be at least one selected from the group substantially consisting of helium (He), and hydrogen ($H_2$). The volume ratio of Hydrogen to the overall volume of the bulb shell 12 is from 5% to 50%. The air pressure inside the bulb shell may be 0.4 to 1.0 atm (atmosphere).

According to the embodiments of FIGS. 44A and 44B, each of the LED light bulbs 10a, 10b comprises a stem 19 in the bulb shell 12 and a heat dissipating element 17 between the bulb shell 12 and the bulb base 16. In the embodiment, the bulb base 16 is indirectly connected with the bulb shell 12 via the heat dissipating element 17. Alternatively, the bulb base 16 can be directly connected with the bulb shell 12 without the heat dissipating element 17. The LED filament 100 is connected with the stem 19 through the conductive supports 14a, 14b. The stem 19 may be used to swap the air inside the bulb shell 12 with nitrogen gas or a mixture of nitrogen gas and helium gas. The stem 19 may further provide heat conduction effect from the LED filament 100 to outside of the bulb shell 12. The heat dissipating element 17 may be a hollow cylinder surrounding the opening of the bulb shell 12, and the interior of the heat dissipating element 17 may be equipped with the driving circuit 18. The exterior of the heat dissipating element 17 contacts outside gas for thermal conduction. The material of the heat dissipating element 17 may be at least one selected from a metal, a ceramic, and a plastic with a good thermal conductivity effect. The heat dissipating element 17 and the stem 19 may be integrally formed in one piece to obtain better thermal conductivity in comparison with the traditional LED light bulb whose thermal resistance is increased due that the screw of the bulb base is glued with the heat dissipating element.

Referring to FIG. 44A, the height of the heat dissipating element 17 is L1 and the height from the bottom of the heat dissipating element 17 to the top of the bulb shell 12 is L2. The ratio of L1 to L2 is from ⅕₀ to ⅓. The lower the ratio, the higher the cutoff angle of illumination of the light bulb. In other words, the lower ratio increases the higher light-emission angle and the light from the bulb is closer to omnidirectional light.

Please referring to FIG. 44B, the LED filament 100 is bent to form a portion of a contour and to form a wave shape having wave crests and wave troughs. In the embodiment, the outline of the LED filament 100 is a circle when being observed in a top view and the LED filament 100 has the wave shape when being observed in a side view. Alternatively, the outline of the LED filament 100 can be a wave shape or a petal shape when being observed in a top view and the LED filament 100 can have the wave shape or a line shape when being observed in a side view. In order to appropriately support the LED filament 100, the LED light bulb 10b further comprises a plurality of supporting arms 15 which are connected with and supports the LED filament 100. The supporting arms 15 may be connected with the wave crest and wave trough of the waved shaped LED filament 100. In this embodiment, the arc formed by the filament 100 is around 270 degrees. However, in other embodiment, the arc formed by the filament 100 may be approximately 360 degrees. Alternatively, one LED light bulb 10b may comprise two LED filaments 100 or more. For example, one LED light bulb 10b may comprise two LED filaments 100 and each of the LED filaments 100 is bent to form approximately 180 degrees arc (semicircle). Two semicircle LED filaments 100 are disposed together to form an approximately 360 circle. By the way of adjusting the arc formed by the LED filament 100, the LED filament 100 may provide with omnidirectional light. Further, the structure of one-piece filament simplifies the manufacturing and assembly procedures and reduces the overall cost.

In some embodiment, the supporting arm 15 and the stem 19 may be coated with high reflective materials, for example, a material with white color. Taking heat dissipating characteristics into consideration, the high reflective materials may be a material having good absorption for heat radiation like graphene. Specifically, the supporting arm 15 and the stem 19 may be coated with a thin film of graphene.

Please refer to FIG. 45A and FIG. 46A. FIG. 45A illustrates a perspective view of an LED light bulb according to a third embodiment of the present disclosure. FIG. 46A illustrates a cross-sectional view of an LED light bulb according to a fourth embodiment of the present disclosure. According to the third embodiment, the LED light bulb 10c comprises a bulb shell 12, a bulb base 16 connected with the bulb shell 12, two conductive supports 14a, 14b disposed in the bulb shell 12, a driving circuit 18 electrically connected with both the conductive supports 14a, 14b and the bulb base 16, a stem 19, supporting arms 15 and a single LED filament 100. The LED light bulb 10d of the fourth embodiment is similar to the third embodiment illustrated in FIG. 45A and comprises two LED filaments 100a, 100b arranged at the different vertical level in FIG. 46A. The LED filaments 100a, 100b are bent to form a contour from the top view of FIG. 46A.

The cross-sectional size of the LED filaments 100, 100a, 100b is small than that in the embodiments of FIGS. 44A and 44B. The conductive electrodes 110, 112 of the LED filaments 100, 100a, 100b are electrically connected with the conductive supports 14a, 14b to receive the electrical power from the driving circuit 18. The connection between the conductive supports 14a, 14b and the conductive electrodes 110, 112 may be a mechanical pressed connection or soldering connection. The mechanical connection may be formed by firstly passing the conductive supports 14a, 14b through the through holes 111, 113 (shown in FIG. 33 and secondly bending the free end of the conductive supports 14a, 14b to grip the conductive electrodes 110, 112. The soldering connection may be done by a soldering process with a silver-based alloy, a silver solder, a tin solder.

Similar to the first and second embodiments shown in FIGS. 44A and 44B, each of the LED filaments 100, 100a, 100b is bent to form a contour from the top view of FIGS. 45A and 46A. In the embodiments of FIGS. 45A, 46A, each of the LED filaments 100, 100a, 100b is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100, 100a, 100b. Please refer to FIG. 45B which illustrates an enlarged cross-sectional view of the dashed-line circle of FIG. 45A. The second end of each of the supporting arms 15 has a clamping portion 15a which clamps the body of the LED filament 100, 100a, 100b. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100, 100a, 100b. The dimension of the inner shape (through hole) of the clamping portion 15a may be a little bit smaller than the outer shape of the cross-section of the LED filament 100, 100a, 100b. During manufacturing process, the LED filament 100, 100a, 100b may be passed through the inner shape of the clamping portion 15a to form a tight fit. Alternatively, the clamping portion 15a may be formed by a bending process. Specifically, the LED filament 100, 100a, 100b may be placed on the second end of the supporting arm 15 and a clamping tooling is used to bend the second end into the clamping portion to clamp the LED filament 100, 100a, 100b.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 10c are close to that of the traditional light bulb including illumination brightness. The illumination uniformity of LED light bulb 10c is better. In the embodiment, at least a half of the LED filaments 100 is around a center axle of the LED light bulb 10c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100, 100a, 100b such that the supporting arms 15 are not used as connections for electrical power transmission. In an embodiment where the stem 19 is made of glass, the stem 19 would not be cracked or exploded because of the thermal expansion of the supporting arms 15 of the LED light bulb 10c.

Figure 45B:
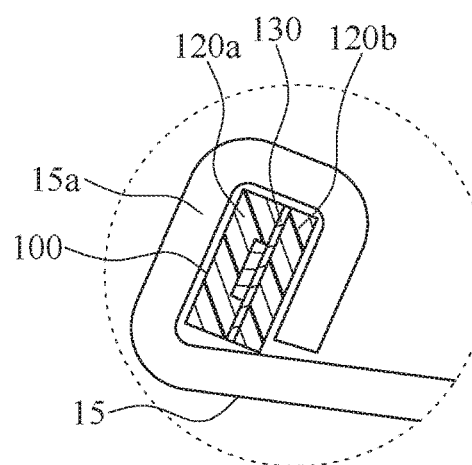
FIG. 45B illustrates an enlarged cross-sectional view of the dashed-line circle of FIG. 45A.

Since the inner shape (shape of through hole) of the clamping portion 15a fits the outer shape of the cross-section of the LED filament 100, the orientation of the cross-section of the LED filament 100, if necessary, may be properly adjusted. As shown in FIG. 45B, the top layer 120a is fixed to face around ten o'clock direction such that illumination surfaces of the LED filament 100 are facing substantially the same direction.

Figure 46B:
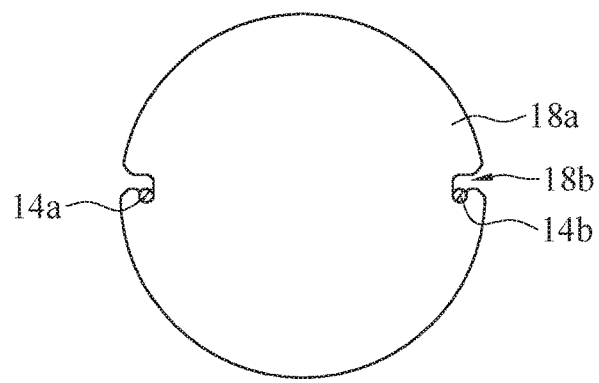
FIG. 46B illustrates the circuit board of the driving circuit of the LED light bulb according to the fourth embodiment of the present disclosure.

Please refer to FIG. 46B which illustrates the circuit board of the driving circuit of the LED light bulb from the top view of FIG. 46A according to the fourth embodiment of the present disclosure. The driving circuit 18 comprises a circuit board 18a which is fixed to the bulb base 16. The conductive supports 14a, 14b are electrically connected with the circuit board 18a and passes through the stand 19a to be electrically connected with the conductive electrodes 110, 112 of the LED filament 100a, 100b. The circuit board 18a comprises notches 18b. The notches 18b are of hook shape. The size of the tip of the notches 18b is slightly smaller than that of the cross-section of the conductive supports 14a, 14b for fixing the conductive supports 14a, 14b. The tip of the notches 18b is beneficial to the soldering between the circuit board 18a and the conductive supports 14a, 14b.

In the embodiments of FIGS. 45A and 46A, the length of the conductive supports 14a, 14b is better to meet the below equation to prevent two conductive supports 14a, 14b from short circuit or to prevent the conductive supports 14a, 14b from unable to reach the circuit board 18a.

$$L = A + \sqrt{((B-3.2))^2 + H^2}$$

Wherein, referring to FIG. 46A, 3.2 is the electricity safety spacing; L is the calculated length of the conductive supports 14a, 14b and its unit is mini-meter; A is the sum of the thickness of the circuit board 18a and the height of the portion of the conductive supports 14a, 14b exposed from the surface of the circuit board 18a; B is the horizontal distance between the two conductive supports 14a, 14b; and H is the height from the circuit board 18a to the point the conductive supports 14a, 14b enters the stem 19. The actual length of the conductive supports 14a, 14b may be, but not limited to, between 0.5 L and 2 L, and more particularly between 0.75 L and 1.5 L.

In the embodiment of FIG. 46A, the LED light bulb 10d has two LED filaments 100a, 100b disposed on different vertical levels. The conductive supports 14a, 14b for the upper LED filaments 100a has a length Z=L+Y. Y is the distance between the upper LED filament 100a and the lower LED filament 100b.

Please refer to FIG. 47A. FIG. 47A illustrates a top view of an LED filament module 30a according to an embodiment of the present disclosure. Specifically, the LED filament module 30a shown in FIG. 47A is not shaped yet and is going to be shaped by a jig. A shaping process of the LED filament module 30a is described later. As shown in FIG. 47A, the LED filament module 30a comprises a plurality of LED filaments 300, a first connecting portion 320, and a second connecting portion 322. Two conductive electrodes 310, 312 of each of the LED filaments 300 are respectively connected to the first connecting portion 320 and the second connecting portion 322. In the embodiment, the LED filament 300 can be referred to, but not limited to, the aforementioned description of the LED filaments 100, 200 regarding structures, materials, and manufacturing processes. In other embodiments, the LED filament 300 can be different from the LED filaments 100, 200. For example, the LED filament 300 can comprise a substrate such as glass and therefore is harder than the LED filaments 100, 200.

In the embodiment, a difference between the LED filament 300 and the LED filaments 100, 200 is that all of the conductive electrodes 310 of the LED filaments 300 are connected to the first connecting portion 320, and all of the conductive electrodes 312 of the LED filaments 300 are connected to the second connecting portion 322. In the embodiment, the LED filaments 300, the first connecting portion 320, and the second connecting portion 322 are formed in a manufacturing process. In the embodiment, the first step of a manufacturing process of the LED filament module 30a is that the conductive electrodes 310 are formed with the first connecting portion 320, and the conductive electrodes 312 are formed with the second connecting portion 322. For example, the conductive electrodes 310 and the first connecting portion 320 are formed in a molding process, and the conductive electrodes 312 and the second connecting portion 322 are formed in another molding process. Alternatively, the conductive electrodes 310 are respectively soldered to the first connecting portion 320 in a soldering process, and the conductive electrodes 312 are respectively soldered to the second connecting portion 322 in another soldering process. The molding process is efficiency since the molded elements (e.g., the conductive electrodes 310 and the first connecting portion 320) can be formed in single procedure. The soldering process is easily practiced since the soldered elements can be soldered along two dimension directions but not three dimension directions.

The second step of the manufacturing process of the LED filament module 30a is that the LED filaments 300 are formed and are respectively connected to the conductive electrodes 310 and the conductive electrodes 312. A manufacturing process of the LED filaments 300 can be referred to, but not limited to, that of the LED filaments 100, 200 described above. The LED filaments 300, the first connecting portion 320, and the second connecting portion 322 are formed on a two-dimension plane into a two-dimensional form in the beginning, which is benefit to productivity and is of convenience regarding manufacturing, and are going to be shaped into three-dimension pose in a later process.

The first connecting portion 320 and the second connecting portion 322 are made by materials with conductibility. That is to say, currents can flow between the first connecting portion 320, the LED filaments 300, and the second connecting portion 322. For example, the first connecting portion 320 can be anode of the LED filament module 30a, and the second connecting portion 322 can be cathode of the LED filament module 30a. Under the circumstances, the LED filaments 300 are connected in parallel. One power line of a power source is connected to the first connecting portion 320, and the other one power line of the power source are connected to the second connecting portion 322. Positive charges flow into the LED filaments 300 via the first connecting portion 320 and the conductive electrodes 310, and positive charges leave the LED filaments 300 via the conductive electrodes 312 and the second connecting portion 322.

In the embodiment, the LED filament module 30a being not shaped yet has a sector outline in the top view. The first connecting portion 320 and the second connecting portion 322 respectively have arc shapes. The arc length of the first connecting portion 320 is less than that of the second connecting portion 322.

Please refer to FIG. 47B. FIG. 47B illustrates a top view of an LED filament module 30b according to an embodiment of the present disclosure. The LED filament module 30b is analogous to and can be referred to the LED filament module 30a. A difference between the LED filament modules 30a and 30b is that the LED filament module 30b is separated into two parts. The first connecting portion 320 of the LED filament module 30a is separated into first connecting portions 320*l* and 320*r* of the LED filament module 30b. The second connecting portion 322 of the LED filament module 30a is separated into second connecting portions 322*l* and 322*r* of the LED filament module 30b. A number of the all LED filaments 300, e.g., three of the six LED filaments 300, are connected with the first connecting portions 320*l* and the second connecting portions 322*l*. The others of the all LED filaments 300, e.g., the other three of the six LED filaments 300, are connected with the first connecting portions 320*r* and the second connecting portions 322*r*. The separated LED filament module 30b is benefit to manufacture and transportation and may be easier to be shaped and to be assembled to an LED light bulb.

Please refer to FIG. 47C. FIG. 47C illustrates a top view of an LED filament module 30c according to an embodiment of the present disclosure. The LED filament module 30c is analogous to and can be referred to the LED filament module 30a. A difference between the LED filament module 30c and the LED filament module 30a is that the LED filament module 30c being not shaped yet has a rectangular outline in the top view. The first connecting portion 320 and the second connecting portion 322 of the LED filament module 30c respectively have straight shapes. The straight length of the first connecting portion 320 is substantially equal to that of the second connecting portion 322.

Please refer to FIG. 47D. FIG. 47D illustrates a top view of an LED filament module 30d according to an embodiment of the present disclosure. The LED filament module 30d is analogous to and can be referred to the LED filament module 30a. A difference between the LED filament module 30d and the LED filament module 30a is that the LED filament module 30d further comprises a plurality of filament brackets 324. The filament brackets 324 are connected between the first connecting portion 320 and the second connecting portion 322. Each of the LED filaments 300 is respectively attached to each of the filament brackets 324. The conductive electrodes 310, 312 of each of the LED filaments 300 are respectively connected to the first connecting portion 320 and the second connecting portion 322. The LED filament module 30d is stronger than the LED filament module 30 since the filament brackets 324 can hold and support the LED filaments 300. In the embodiment, the first connecting portion 320, the filament brackets 324 and the second connecting portion 322 may be made into a one-piece component. In a case that the one-piece component of the first connecting portion 320, the filament brackets 324 and the second connecting portion 322 is made by insulation materials, the LED filaments 300 of the LED filament module 30d can be individually connected to an outer power source via power lines respectively connected to the conductive electrodes 310, 312. In a case that the one-piece component of the first connecting portion 320, the filament brackets 324 and the second connecting portion 322 is made by conductive materials, the first connecting portion 320 and the second connecting portion 322 can be respectively anode and cathode of the LED filament module 30d, and currents can flow through each of the LED filaments 300 in one direction to avoid short circuit in a circuit-arrangement manner (e.g., diodes can be added in the circuit) or a mechanic-arrangement manner. The circuit-arrangement manner can be, for example, diodes can be added in the circuit to restrain the direction of the currents. The mechanic-arrangement manner is described as following examples.

Please refer to FIG. 47E. FIG. 47E illustrates a bottom view of an LED filament module 30e according to an embodiment of the present disclosure. The LED filament module 30e is analogous to and can be referred to the LED filament module 30d. The viewing angle of FIG. 47E is opposite to that of FIG. 47D; therefore, the LED filaments 300 and the conductive electrodes 310, 312 are in rear of the filament brackets 324 in FIG. 47E. A difference between the LED filament module 30e and the LED filament module 30d is that each of the filament brackets 324 of the LED filament module 30e comprises an insulation portion 324i. Specifically, the first connecting portion 320, the second connecting portion 322, and the filament brackets 324 are made by conductive materials except the insulation portions 324i of the filament brackets 324. The insulation portions 324i are made by insulation materials. The design of the insulation portions 324i of the filament brackets 324 can be considered as forming a circuit loop in a mechanic-arrangement manner, which allows currents to flow through each of the LED filaments 300 in one direction and inhibits the currents from flowing through the filament brackets 324 due to the insulation portions 324i to avoid short circuit. The first connecting portion 320, the second connecting portion 322, the filament brackets 324, and the insulation portions 324i can be formed into a one-piece component by a double-molding process, metal injection molding process, or the like.

Please refer to FIG. 47F. FIG. 47F illustrates a bottom view of an LED filament module 30f according to an embodiment of the present disclosure. The LED filament module 30f is analogous to and can be referred to the LED filament module 30e. A difference between the LED filament module 30f and the LED filament module 30e is that each of the filament brackets 324 of the LED filament module 30f is separated into two parts, i.e., a top filament bracket 324t and a bottom filament bracket 324b. The top filament brackets 324t are connected with the first connecting portion 320. The bottom filament brackets 324b are connected with the second connecting portion 322. The top filament brackets 324t and the bottom filament brackets 324b are physically separated; therefore, currents do not flow through the filament brackets 324. The design of the top filament bracket 324t and the bottom filament bracket 324b of the filament brackets 324 can be considered as forming a circuit loop in a mechanic-arrangement manner, which allows the currents to flow through each of the LED filaments 300 in one direction.

Please refer to FIG. 47G. FIG. 47G illustrates a top view of an LED filament module 30g according to another embodiment of the present disclosure. The LED filament module 30g is analogous to and can be referred to the LED filament module 30c. A difference between the LED filament module 30g and the LED filament module 30c is that the first connecting portion 320 further comprises insulation portions 320i, and the second connecting portion 320 further comprises insulation portions 322i. Specifically, the first connecting portion 320 and the second connecting portion 322 are made by conductive materials except the insulation portions 320i and 322i. The insulation portions 320i and 322i are made by insulation materials. The insulation portions 320i and 322i are arranged in a staggered manner, meaning that the first insulation portions 322i are between the first LED filament 300 (the leftmost one in FIG. 47G) and the second LED filament 300 (next to the leftmost one in FIG. 47G), the first insulation portions 320i are between the second and the third LED filaments 300, the second insulation portions 322i are between the third and the fourth LED filaments 300, and so on. The design of the insulation portions 320i and 322i of the first and the second connecting portions 320 and 322 can be considered as forming a circuit loop in a mechanic-arrangement manner, which allows currents to flow through each of the LED filaments 300 in one direction.

Please refer to FIG. 47H. FIG. 47H illustrates a schematic circuit of the LED filament module 30g of FIG. 47G. Currents do not flow through the insulation portions 320i and 322i of the first and the second connecting portions 320 and 322; therefore, the LED filaments 300 are connected in series. The conductive electrode 312 of the leftmost LED filament 300 in FIG. 47G can be cathode, and the conductive electrode 312 of the rightmost LED filament 300 in FIG. 47G can be anode. Positive charges flow into the LED filaments 300 via the second connecting portion 322 and the conductive electrode 312 of the rightmost LED filament 300 in FIG. 47G, flow through the LED filaments 300 in sequence from the rightmost one to the leftmost one, and leave the LED filaments 300 via the conductive electrode 312 of the leftmost LED filament 300 in FIG. 47G and the second connecting portion 322.

Please refer to FIG. 47I. FIG. 47I illustrates a perspective view of a jig 32 for shaping the LED filament module according to an embodiment of the present disclosure. The jig 32 comprises a first limiting portion 32a and a second limiting portion 32b. The first limiting portion 32a and the second limiting portion 32b are respectively connected to two opposite ends of the jig 32. The first limiting portion 32a and the second limiting portion 32b respectively form a cap shape with respect to the jig 32. In particular, the cross-sectional size of the first limiting portion 32a in the radial direction is greater than that of the end of the jig 32 to which the first limiting portion 32a is connected, and the cross-sectional size of the second limiting portion 32b in the radial direction is greater than that of the end of the jig 32 to which the second limiting portion 32b is connected. The jig 32 has a shape of frustum of a cone, meaning that the two opposite ends of the jig 32 have different cross-sectional sizes. The perimeter of jig 32 gradually increases from the end connected the first limiting portion 32a to the end connected to the second limiting portion 32b. The different perimeters of the two opposite ends of the jig 32 are corresponding to the different arc lengths of the first connecting portion 320 and the second connecting portion 322. The jig 32 is utilized for shaping the LED filament module into a predetermined shape, e.g., a column shape or a frustum shape.

Please refer to FIG. 47J and FIG. 47K. FIG. 47J illustrates a perspective view of the LED filament module 30a being shaped by the jig 32 according to the embodiment of the present disclosure. FIG. 47K illustrates a perspective view of the shaped LED filament module 30a according to the embodiment of the present disclosure. The LED filament module 30a is forced to attach to and around the jig 32 and is shaped into a three-dimensional form with a shape of frustum of a cone. The first connecting portion 320 and the second connecting portion 322 are bended to be turned from straight line shape into curve shape to fit the jig 32, and the LED filaments 300 are around the jig 32 along with the bended first connecting portion 320 and second connecting portion 322. During the shaping process of the LED filament module 30a, the first limiting portion 32a limits the first connecting portion 320, and the second limiting portion 32b limits the second connecting portion 322; therefore, the LED filament module 30a which is being shaped can be kept between the first limiting portion 32a and the second limiting portion 32b. After the shaped LED filament module 30a is detached from the jig 32, the shaped LED filament module 30a is turned from two-dimensional form (as shown in FIG. 47A) into three-dimensional form with the shape of frustum of a cone (as shown in FIG. 47K).

In some embodiment, the jig 32 can have a shape different from the shape shown in FIG. 47I. The jig 32 having a column shape can be utilized for shaping the LED filament module 30c which has a rectangular shape in the beginning into a column shape. For example, the LED filament module 30c shown in FIG. 47C can be shaped by the jig 32 having a column shape. The shaped LED filament module 30c will have a column shape, accordingly.

Please refer to FIG. 47L. FIG. 47L illustrates a perspective view of the shaped LED filament module 30b of FIG. 15B. The separated LED filament module 30b can also be shaped by the jig 32 of FIG. 47I. In some embodiments, the separated parts of the LED filament module 30b can be shaped in one shaping process. In other embodiments, the separated parts of the LED filament module 30b can be shaped one by one or be shaped by different jigs 32.

According to above description, the LED filament module 30a-30g may have a first type and a second type. The LED filaments 300, the first connecting portion 320, and the second connecting portion 322 of the first type are in a three-dimensional form, as shown in FIGS. 47K and 47L. The LED filaments 300, the first connecting portion 320, and the second connecting portion 322 of the second type are in a two-dimensional form, as shown in FIGS. 47A to 47G. In the embodiments, the LED filaments 300, the first connecting portion 320, and the second connecting portion 322 of the second type may be formed in advance in the beginning and, optionally, formed in one piece. Next, the shaping process is performed to have the LED filaments 300, the first connecting portion 320, and the second connecting portion 322 of the second type in the two-dimensional form shaped into the LED filaments 300, the first connecting portion 320, and the second connecting portion 322 of the first type in the three-dimensional form by the jig 32. It is advantageous to the manufacture of the LED filaments 300, the first connecting portion 320, and the second connecting portion 322 of the second type on the two-dimension plane. Nevertheless, in some embodiments, the LED filaments 300, the first connecting portion 320, and the second connecting portion 322 of the first type may be formed directly in the beginning and, optionally, be formed in one piece. In other words, the LED filament module 30a-30g may have the first type only and have no need of the shaping process for shaping the second type into the first type.

In some embodiments, in the first type of the LED filament module, at least one (preferably both) of the first connecting portion and the second connecting portion is substantially a toms surrounding a center axle (e.g. the center axle of the bulb shell). The term "toms" means a shape surrounding a center and is not limited to a circle shape but can be any geometric shape (e.g. triangle shape, or rectangular shape, or polygonal shape, etc.). In some embodiments, at least one of the first connecting portion and the second connecting portion has an opening for purposes of arranging the direction of current or avoiding a short circuit.

Please refer to FIG. 48A. Please FIG. 48A illustrates a perspective view of an LED light bulb 10e according to another embodiment of the present disclosure. The LED light bulb 10e is analogous to and can be referred to the LED light bulb 10c shown in FIG. 48A. Differences between the LED light bulb 10e and the LED light bulb 10c are that the LED light bulb 10e utilizes the LED filament module 30a and non-conductive supporting arms 315. The LED light bulb 10e comprises a bulb shell 12, a bulb base 16 connected with the bulb shell 12, two conductive supports 14a, 14b disposed in the bulb shell 12, a driving circuit 18 electrically connected with both the conductive supports 14a, 14b and the bulb base 16, a stem 19, the supporting arms 315, and the LED filament module 30a. The stem 19 in the bulb shell 12 has a stand 19a extending to the center of the bulb shell 12. The supporting arms 315 are fixed to the stand 19a of the stem 19. The shaped LED filament module 30a is assembled to the supporting arms 315. The first connecting portion 320 is supported by the supporting arms 315. In the embodiment, the first connecting portion 320 is hung on the supporting arms 315. The shaped LED filament module 30a is around the stand 19a. The LED filament module 30a is electrically connected with the conductive supports 14a, 14b to receive the electrical power from the driving circuit 18. The second connecting portion 322 larger than the first connecting portion 320 (i.e., the arc length of the second connecting portion 322 is larger than that of the first connecting portion 320) is closer to the bulb base 16 than the first connecting portion 320, which helps the stability of the configuration of the LED filament module 30a of which the first connecting portion 320 is hung on the supporting arms 315.

Please refer to FIG. 48B. FIG. 48B illustrates a partial cross-sectional view of FIG. 48A. The supporting arm 315 comprises a hook end 315a and a fixed end 315b. In the embodiment, the number of the supporting arm 315 is, but not limited to, two. The fixed ends 315b of the supporting arms 315 are embedded into the stand 19a but not connected with each other. There is a gap 316 between the fixed ends 315b in the stand 19a to keep the supporting arms 315 being not electrically connected with each other, i.e., the supporting arms 315 are insulated from each other. The hook ends 315a of the supporting arms 315 extend radially from the stand 19a. The hook end 315a forms a hook structure such that the first connecting portion 320 can be hung on the hook structures of the hook ends 315a of the supporting arms 315. In some embodiments, a greater curvature of the hook structure of the hook ends 315a can be adopted to allow the first connecting portion 320 to be tightly fitted in the hook structure so as to meet the requirement of fixation between the supporting arms 315 and the first connecting portion 320.

In the embodiment, the current loop comprises the LED filament module 30a, the conductive supports 14a, 14b, the driving circuit 18, and an outer power source. Currents do not flow through the supporting arms 315 since the supporting arms 315 are not electrically connected with each other, and the stem 19 and the stand 19a are made by insulation materials. As a result, the risk of electrocorrosion regarding the supporting arms 315 can be avoided.

As shown in FIG. 48A, the second connecting portion 322 is connected with the conductive supports 14a, 14b. In some embodiments, the conductive support 14a is connected to one end of the second connecting portion 322 while the conductive support 14b is connected to another end of the second connecting portion 322. The LED filament module 30a can form a circuit loop with an outer power source in a circuit-arrangement manner. Each of the LED filaments 300 can comprise a diode allowing current to flow through the LED filaments 300 in one direction. Accordingly, the LED filaments 300 are connected in series. For example, positive charges flow into the LED filament module 30a via the conductive support 14a, and then flow through, in sequence, the second connecting portion 322, the first one of the LED filaments 300, the first connecting portion 320, the second one of the LED filaments 300, the second connecting portion 322, the third one of the LED filaments 300, and so on. Finally, positive charges flow through the last one of the LED filaments 300 and leave the LED filament module 30a via the conductive support 14b. Alternatively, the LED filament module 30a can form a circuit loop with an outer power source in a mechanic-arrangement manner. The distance between the second connecting portion 322 and the stem 19 is shorter than that between the first connecting portion 320 and the stem 19; therefore, the conductive supports 14a, 14b both connected to the second connecting portion 322 have relative shorter lengths and a better supporting effect to keep the LED filament module 30a steady and avoid swaying. In other embodiments, the conductive supports 14a, 14b can be connected to the first connecting portion 320. In other embodiments, the conductive supports 14a, 14b can be respectively connected to the first connecting portion 320 and the second connecting portion 322. Under the circumstances, the LED filaments 300 may be connected in parallel.

As shown in FIG. 48B, each of the LED filaments 300 comprises a main illuminating face 300a and secondary illuminating faces 300b, 300c. A front side of each of the LED chips 102, 104 (referring to the LED filament 100 of FIG. 33) faces the main illuminating face 300a. The front side is the side the most emitted light passes through. A rear side of each of the LED chips 102, 104 (referring to the LED filament 100 of FIG. 33) faces the secondary illuminating face 300c. The secondary illuminating face 300b are between the main illuminating face 300a and the secondary illuminating face 300c. As shown in FIG. 48B, the main illuminating faces 300a of all of the LED filaments 300 face toward outside of the LED light bulb 10e. Depending on the needs, the main illuminating faces 300a of a part of the LED filaments 300 face toward outside of the LED light bulb 10e, and the secondary illuminating faces 300b or 300c of another part of the LED filaments 300 face toward outside of the LED light bulb 10e. Alternatively, the main illuminating faces 300a of all of the LED filaments 300 face toward inside of the LED light bulb 10e (face toward the stand 19a).

In some embodiments, the LED filament 300 may comprise through holes (not shown). The through holes penetrate through the light conversion coating 120 (referring to the LED filament 100 of FIG. 33) and are corresponding to the LED chips 102, 104. Light emitted from the LED chips 102, 104 can directly pass through the through holes.

In the embodiments, all of the LED filaments 300 of the LED filament module 30a are equally spaced. In some embodiments, the LED filaments 300 of the LED filament module 30a may be not equally spaced, i.e., unequally spaced. For example, a part of the LED filaments 300 are crowded together, and another part of the LED filaments 300 are scattered. An interval between each two of the crowded LED filaments 300 is less than that between each two of the scattered LED filaments 300. Finally, an omnidirectional light circumstance with a partial emphasized illumination can be achieved because the part that the LED filaments 300 crowded together has better brightness.

In some embodiments, the LED filament module can be separated parts, as shown in FIG. 47L. It is benefit to a manufacturing procedure of the LED filament module 30. For example, the LED filament module 30a of the LED light bulb 10e shown in FIG. 48A can be replaced by the separated LED filament module 30b shown in FIG. 47L. Each of the separated parts includes a part of the first connecting portion 320 (e.g., 320l, 320r), a part of the second connecting portion 322 (e.g., 322l, 322r), and a number of the LED filaments 300. The separated parts can be assembled to each other by, for example, soldering the first connecting portion 320 and the second connecting portion 322. Alternatively, the separated parts can be assembled to the stand 19a by the supporting arms 315.

Please refer to FIG. 48C. FIG. 48C illustrates a perspective view of an LED light bulb 10f according to another embodiment of the present disclosure. The LED light bulb 10f is analogous to and can be referred to the LED light bulb 10e. Differences between the LED light bulb 10f and 10e are that the first connecting portion of the LED filament module of the LED light bulb 10f is separated into two parts, i.e., a first connecting portion 320l and a first connecting portion 320r, and the conductive supports 14a, 14b are respectively connected to the first connecting portion 320l and the first connecting portion 320r. The LED filament module can form a circuit loop in a circuit-arrangement manner (e.g., diodes can be added in the circuit) or a mechanic-arrangement manner (e.g., a part of the first connecting portions 320l, 320r and the second connecting portion 322 can be insulated, and other parts of the first connecting portions 320l, 320r and the second connecting portion 322 can be conductive) so that currents can flow through each of the LED filaments 300 in one direction to avoid short circuit.

Please refer to FIG. 48D. FIG. 48D illustrates a perspective view of an LED light bulb 10g according to another embodiment of the present disclosure. The LED light bulb 10g is analogous to and can be referred to the LED light bulb 10e. Differences between the LED light bulb 10g and 10e are that the second connecting portion of the LED filament module of the LED light bulb 10g is separated into two parts, i.e., a second connecting portion 322l and a second connecting portion 322r, and the conductive supports 14a, 14b are respectively connected to the second connecting portion 322l and the second connecting portion 322r. Under the circumstances, the second connecting portion 322l can be anode, and the second connecting portion 322r can be cathode. The LED filament module can form a circuit loop in a circuit-arrangement manner (e.g., diodes can be added in the circuit) or a mechanic-arrangement manner (e.g., a part of the first connecting portion 320 and the second connecting portions 322l, 322r can be insulated, and other parts of the first connecting portion 320 and the second connecting portions 322l, 322r can be conductive) so that currents can flow through each of the LED filaments 300 in one direction to avoid short circuit.

Figure 49A:
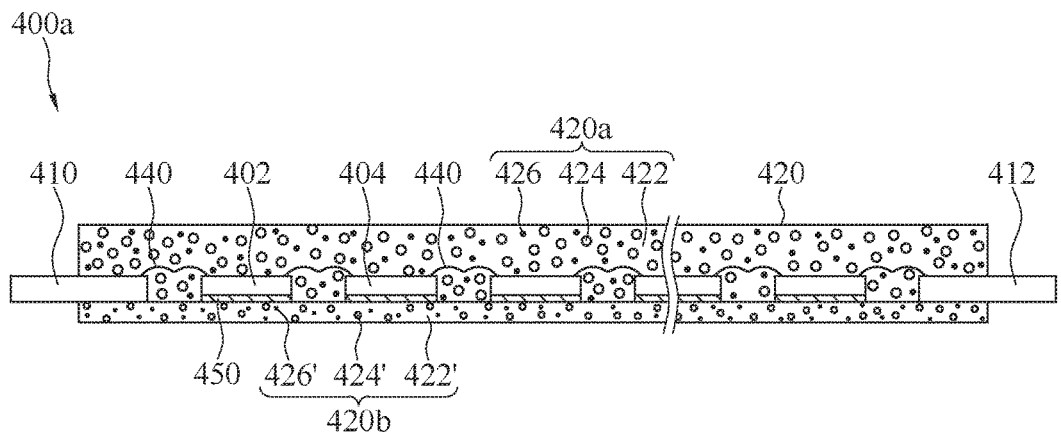
FIGS. 49A to 49G and FIG. 54 illustrate cross-sectional views of LED filaments according to embodiments of the present disclosure.

Please refer to FIG. 49A. FIG. 49A illustrates a cross-sectional view of an LED filament 400a according to an embodiment of the present disclosure. The LED filament 400a is analogous to and can be referred to the LED filament 100 with the top layer 120a and the base layer 120b. The LED filament 400a comprises LED chips 402, 404, conductive electrodes 410, 412, conductive wires 440 for electrically connecting the adjacent LED chips 402, 404 and conductive electrodes 410, 412, and light conversion coating 420 coating on at least two sides of the LED chips 402, 404 and the conductive electrodes 410, 412. The light conversion coating 420 exposes a portion of two of the conductive electrodes 410, 412. The light conversion coating 420 comprises a top layer 420a and a base layer 420b. The base layer 420b coats on one side of the LED chips 402, 404 and the conductive electrodes 410, 412. The top layer 420a coats on another sides of the LED chips 402, 404 and the conductive electrodes 410, 412.

The top layer 420a and the base layer 420b may be distinct by a manufacturing procedure of the LED filament 400a. During a manufacturing procedure, the base layer 420b can be formed in advance. Next, the LED chips 402, 404 and the conductive electrodes 410, 412 can be disposed on the base layer 420b. The LED chips 402, 404 are connected to the base layer 420b via die bond glues 450. The conductive wires 440 can be formed between the adjacent LED chips 402, 404 and conductive electrodes 410, 412. Finally, the top layer 420a can be coated on the LED chips 402, 404 and the conductive electrodes 410, 412.

Both of the top layer 420a and the base layer 420b can comprise at least one of phosphor glue layer(s), phosphor film layer(s), and transparent layer(s). If the top layer 420a or the base layer 420b comprises a transparent layer, it may comprise the other phosphor glue/film player(s). In some embodiments, the surface roughness Rz of the phosphor film layer may be 1 nm-200 µm, and the surface roughness Rz of the phosphor glue layer may be 1 µm-2 mm.

Each of the layers of the phosphor glue layer(s) and the phosphor film layer(s) of the top layer 420a and the base layer 420b can comprise an adhesive, phosphors, and may preferably further comprise inorganic oxide nanoparticles (optional). The transmittance of visible light of the transparent layer can be greater than 40%. The transparent layer can be formed by adhesive made of a silica gel, a silicone resin, a polyimide (PI) gel, the like or a combination thereof. The adhesive with the PI gel is harder than that formed by silicone resin only. The phosphors or the inorganic oxide nanoparticles in different phosphor glue layers or phosphor film layers can have different sizes or densities and can be made by varied materials depending on needs. Different phosphor glue layers or phosphor film layers can have varied thickness. According to the adhesive, the phosphors, the inorganic oxide nanoparticles, or other possible elements, the phosphor glue layer or phosphor film layer can have different hardness and wavelength conversion properties. The percent transmittance of the phosphor glue layer or the phosphor film layer of the top layer 420a or the base layer 420b can be varied depending on needs. For example, the percent transmittance of the phosphor glue layer or the phosphor film layer of the top layer 420a or the base layer 420b can be greater than 20%, 50%, or 70%. The layers of the top layer 420a or the base layer 420 can have different transmittance.

It should be understood that when the top layer 420a or the base layer 420b comprise continuous layers of same definition, at least one property of the continuous layers capable of being distinct from one layer to another layer should exist between the continuous layers. For example, when the two continuous layers are phosphor glue layers or phosphor film layers, the properties (e.g. particle size, wavelength conversion properties, ingredient proportion, thickness, hardness, etc.) of the continuous may be different. When the two continuous layers are transparent layers, the properties (e.g. adhesive type, thickness, ingredient proportion, optical properties like transmittance, refraction index, etc.) of the continuous transparent layers may be different.

In the embodiment, the top layer 420a is the phosphor glue layer, and the base layer 420b is the phosphor film layer. The phosphor glue layer comprises an adhesive 422, a plurality of phosphors 424, and a plurality of inorganic oxide nanoparticles 426. The adhesive 422 may be silica gel or silicone resin. The plurality of the inorganic oxide nanoparticles 426 may be, but not limited to, aluminium oxides ($Al_2O_3$). The phosphor film layer comprises an adhesive 422', a plurality of phosphors 424', and a plurality of inorganic oxide nanoparticles 426'. The compositions of the adhesives 422 and adhesive 422' may be different. The adhesive 422' may be harder than the adhesive 422 to facilitate the disposition of the LED chips 402, 404 and the conductive wires 440. For example, the adhesive 422 may be silicone resin, and the adhesive 422' may be a combination of silicone resin and PI gel. The mass ratio of the PI gel of the adhesive 422' can be equal to or less than 10%. The PI gel can strengthen the hardness of the adhesive 422'. The plurality of the inorganic oxide nanoparticles 426 may be, but not limited to, aluminium oxides ($Al_2O_3$). The size of the phosphors 424' may be smaller than that of the phosphors 424. The size of the inorganic oxide nanoparticles 426' may be smaller than that of the inorganic oxide nanoparticles 426. The size of inorganic oxide nanoparticles may be around 100 to 600 nanometers (nm). The inorganic oxide nanoparticles are beneficial of heat dissipating. In some embodiment, part of inorganic oxide nanoparticles may be replaced by inorganic oxide particles which have the size of 0.1 to 100 μm.

The Shore Hardness of the phosphor glue layer may be D40-70. The Shore Hardness of the phosphor film layer may be D20-70. The thickness of the phosphor film layer is substantially between 0.1 mm and 0.5 mm. The index of refraction of the phosphor film layer is substantially equal to or greater than 1.4. The percent transmittance of the phosphor film layer is 40% to substantially equal to or greater than 95%. The adhesive may be mixed with polyimide (PI) gel (WT % of the PI gel is substantially equal to or less than 10%) to form the light conversion coating 420 to improve the toughness of the light conversion coating 420 and to reduce possibility of cracking or embrittlement. The PI gel is highly electrically insulated and is insensitive to temperature. In some embodiments, the solid content of the PI gel in terms of WT % is substantially between 5% and 40%. The rotation viscosity of the PI gel may be substantially between 5 Pa·s and 20 Pa·s. In some embodiment, the mass ratio of the polyimide in the light conversion coating is equal to or less than 10%.

Figure 49B:
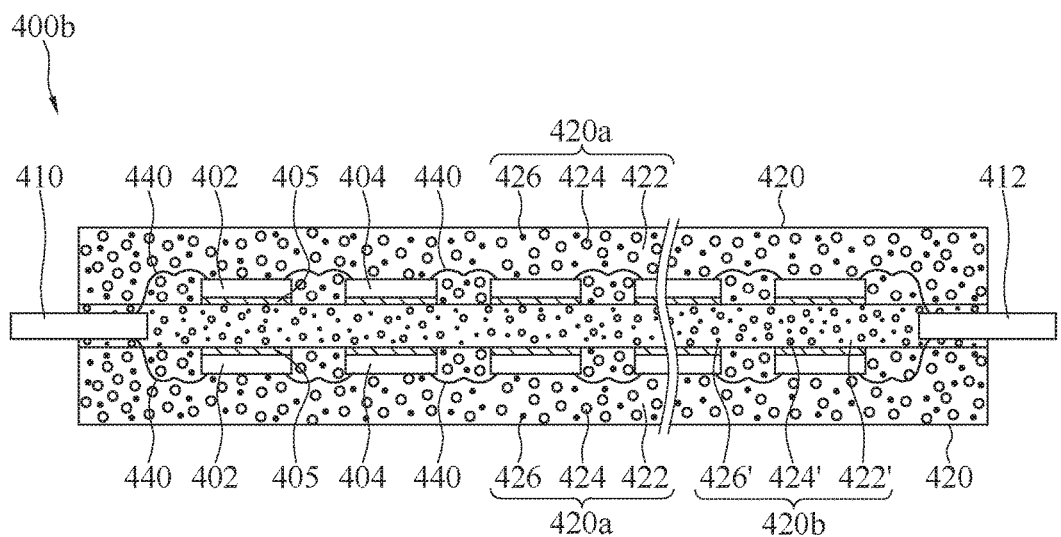

Please refer to FIG. 49B. FIG. 49B illustrates a cross-sectional view of an LED filament 400b according to an embodiment of the present disclosure. The LED filament 400b is analogous to and can be referred to the LED filament 400a. In the embodiment, the LED chips 402, 404, the conductive wires 440, and the top layer 420a are disposed on two opposite sides of the base layer 420b. In other words, the base layer 420b is between the two top layers 420a. The conductive electrodes 410, 412 are at two opposite ends of the base layer 420b. The LED chips 402 of both of the two top layers 420a can be connected to the same conductive electrodes 410, 412 via the conductive wires 440.

Figure 49C:
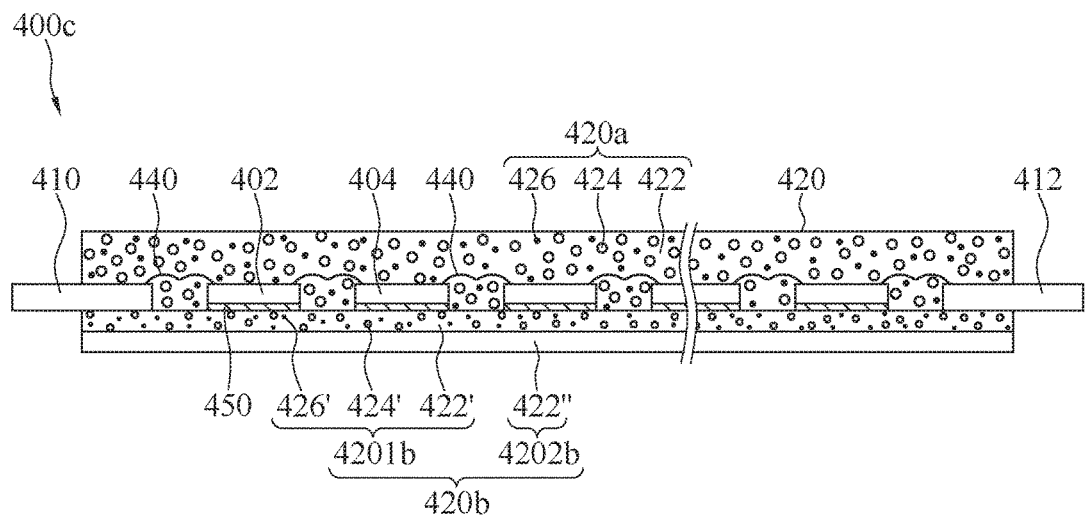

Please refer to FIG. 49C. FIG. 49C illustrates a cross-sectional view of an LED filament 400c according to an embodiment of the present disclosure. The LED filament 400c is analogous to and can be referred to the LED filament 400a. In the embodiments, the base layer 420b of the LED filament 400c is further divided into a phosphor film layer 4201b and a transparent layer 4202b with different hardness. The phosphor film layer 4201b may be harder than the transparent layer 4202b. The harder layer (i.e., the phosphor film layer 4201b) of the base layer 420b is between the softer layer (i.e., the transparent layer 4202b) of the base layer 420b and the top layer 420a. The harder layer is a layer on which the LED chips 402, 404 and the conductive electrodes 410, 412 are directly disposed. Due to the greater hardness of the harder layer, the disposition of the LED chips 402, 404, the conductive electrodes 410, 412, and the conductive wires 440 is easier. Due to the greater flexibility of the softer layer, the light conversion coating 420 is still of toughness. In the embodiment, the phosphor film layer 4201b comprises the adhesive 422' mixed with the PI gel. The transparent layer 4202b comprises an adhesive 422" only. The adhesive 422" may be silicone resin. The transparent layer 4202b may be of highest transmittance than other layers.

In some embodiment, the transparent layers, which may be disposed in the top layer or the base layer, can function as one or more refraction-altering layers, and which can alter the index of refraction so that the angle of emergence of light rays emitted from the LED chips 402, 404, the phosphor film layer 4201b and penetrating through the transparent layer(s) is adjustable. For example, the thickness of the transparent 4202b may be ¼ wavelength of optical thickness and may be different according to the wavelength of light; therefore, interference phenomenon may occur due to multiple reflection of interfaces (e.g. interfaces between LED chip 402, 404 and the phosphor film layer 4201b, the phosphor film layer 4201b and the transparent layer 4202b, and the transparent layer 4202b and the atmosphere), and thus the reflected light may be reduced. In some embodiments, the number of transparent layers may be more than one. For example, when there are two or three transparent layers, the reflectivity may be lower. For example, when there are three transparent layers respectively with ¼, ½, and ¼ wavelength of thickness, it can bring the effect of wideband low reflection. In some embodiments, the thickness of transparent layer may be regulated according to different wavelengths of LED chips, the phosphor glue layers, the phosphor film layers within a range of the ratio to reduce the interference phenomenon. For example, the thickness of the transparent layer may be integral multiples of ±20% of ½, ¼ wavelength. The thickness of the transparent layer may be regulated according to the inner layer thereof (e.g. LED chip, the phosphor glue layer, or the phosphor film layer). It refers to mainly regulate the waveband of emergent light that the luminous intensity is greater than 60% (preferably 80%) of the luminous intensity of total wavelength. The material of the transparent layer may be selected from materials with the index of refraction within ±20% of square root of the index of refraction of the inner layer. For example, when the index of refraction of the phosphor film layer 4201b (i.e. the inner layer of the transparent layer 4202b) is 2, the index of refraction of the transparent layer 4202b will be 1.414±20%. Hence, loss of light reflection can be reduced efficiently.

In some embodiments, the shore hardness of the phosphor film layer 4201b equals to 40 plus the shore hardness of the transparent layer 4202b. The shore hardness of the transparent layer 4202b is D20-40.

In some embodiment, the base layer 420b may be further divided into two layers with different thickness.

Figure 49D:
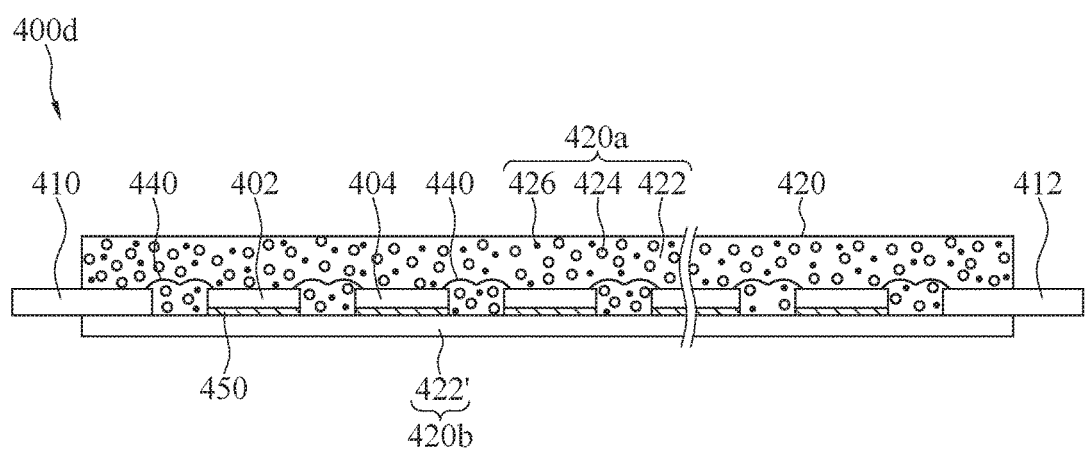

Please refer to FIG. 49D. FIG. 49D illustrates a cross-sectional view of an LED filament 400d according to an embodiment of the present disclosure. The LED filament 400d is analogous to and can be referred to the LED filament 400a. A difference between the LED filament 400d and 400a is that the base layer 420b of the LED filament 400d comprises an adhesive 422' only. The adhesive 422' may be silicone resin mixed with PI gel to increase the hardness of the base layer 420b so as to facilitate the deposition of the LED chips 402, 404, the conductive electrodes 410, 412, and the conductive wires 440. The base layer 420b may be of highest transmittance than other layers.

Figure 49E:
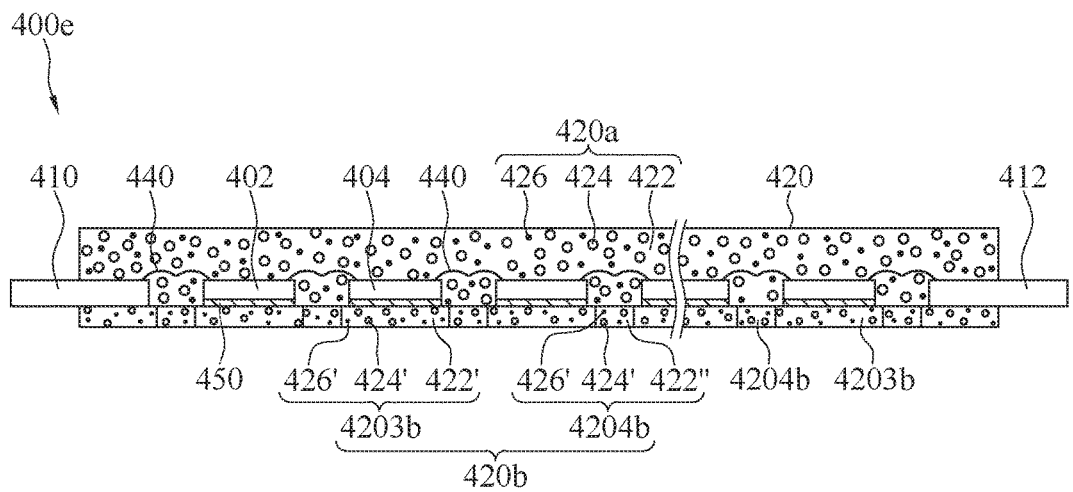

Please refer to FIG. 49E. FIG. 49E illustrates a cross-sectional view of an LED filament 400e according to an embodiment of the present disclosure. The LED filament 400e is analogous to and can be referred to the LED filament 400a. A difference between the LED filament 400e and 400a is that the base layer 420b of the LED filament 400e is divided into different portions (not layers). The base layer 420b of the LED filament 400e is divided into first hard portions 4203b and second soft portions 4204b. The first hard portions 4203b and the second soft portions 4204b are arranged in a staggered manner. The first hard portions 4203b comprise an adhesive 422', phosphors 424', and inorganic oxide nanoparticles 426'. The second soft portions 4204b comprise an adhesive 422", phosphors 424', and inorganic oxide nanoparticles 426'. The adhesive 422' can be PI gel or silicone resin mixed with PI gel, and the adhesive 422" can be silicone resin without PI gel; therefore, the first hard portions 4203b is harder than the second soft portion 4204b. The first hard portions 4203b are aligned with the LED chips 402, 404 and the conductive electrodes 410, 412, which facilitates the disposition of the LED chips 402, 404 and the conductive electrodes 410, 412. The second soft portions 4204b can improve the flexibility of the base layer 420b. In some embodiments (not shown), a flexible LED filament installed in an LED light bulb can be defined as, for example, three parts according to their positions related to a bulb base or a stem of the LED light bulb. A part of the flexible LED filament the closest to the bulb base or the stem is defined as a bottom segment. A part of the flexible LED filament the farthest to the bulb base or the stem is defined as a top segment. A part of the flexible LED filament between the bottom segment and the top segment is defined as a middle segment. The curvatures of shapes of each of the top segment, the middle segment, and the bottom segment being bent can be defined as, for example, three degrees, which are the highest one, the lowest one, and an average one. As needed, the bottom segment, the top segment, or the middle segment can be formed with different ingredient/proportion and thus have the different curvature.

Figure 49F:
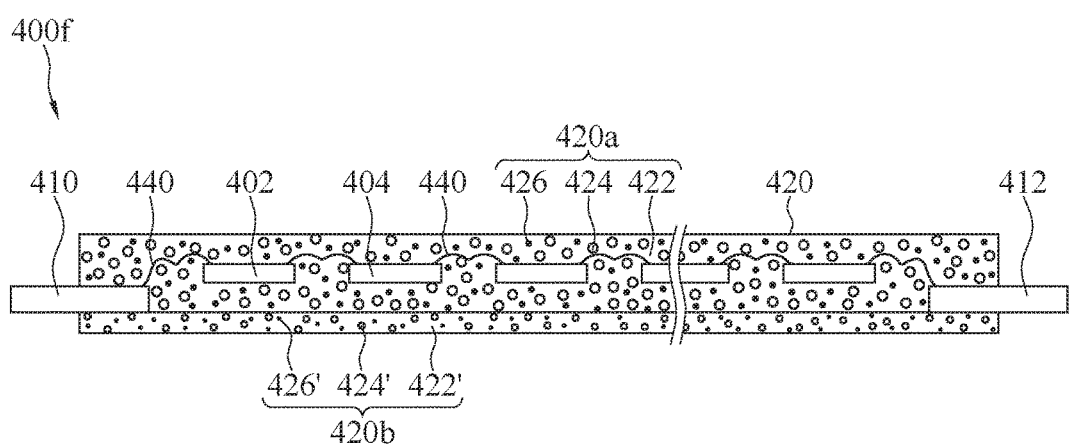

Please refer to FIG. 49F. FIG. 49F illustrates a cross-sectional view of an LED filament 400f according to an embodiment of the present disclosure. The LED filament 400f is analogous to and can be referred to the LED filament 400a. A difference between the LED filament 400f and 400a is that the LED chips 402, 404 are enclosed by the top layer 420a. The top layer 420a directly contacts each side of the LED chips 402, 404. The base layer 420b does not contact the LED chips 402, 404. During a manufacturing procedure, the base layer 420b can be formed in advance, and then the LED chips 402, 404 and the top layer 420a can be formed.

Figure 49G:
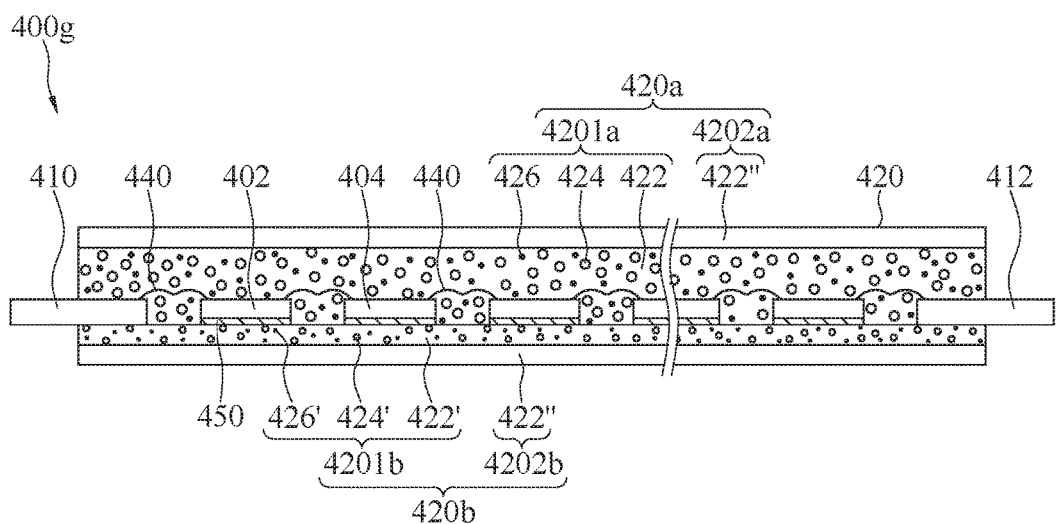

Please refer to FIG. 49G. FIG. 49G illustrates a cross-sectional view of an LED filament 400g according to an embodiment of the present disclosure. The LED filament 400g is analogous to and can be referred to the LED filament 400c. A difference between the LED filament 400g and 400c is that the top layer 420a of the LED filament 400g is further divided into two layers, a phosphor glue layer 4201a and a transparent layer 4202a. The phosphor glue layer 4201a comprises an adhesive 422, phosphors 424, and inorganic oxide nanoparticles 426. The transparent layer 4202a comprises an adhesive 422" only. The transparent layer 4202a may be of highest transmittance than other layers and can protect the phosphor glue layer 4201a. In some embodiments (not shown), the transparent layer 4202a encloses the phosphor glue layer 4201a, i.e., all sides of the phosphor glue layer 4201a except the one adjacent to the phosphor film layer 4201b are covered by the transparent layer 4202a. Additionally, the transparent layer 4202b encloses the phosphor film layer 4201b, i.e., all sides of the phosphor film layer 4201b except the one adjacent to the phosphor glue layer 4201a are covered by the transparent layer 4202b. The transparent layers 4202a, 4202b not only protect the phosphor glue layer 4201a and the phosphor film layer 4201b but also strengthen the whole structure of the LED filament. Preferably, the transparent layer 4202a, 4202b may be thermal shrink film with high transmittance.

Figure 50:
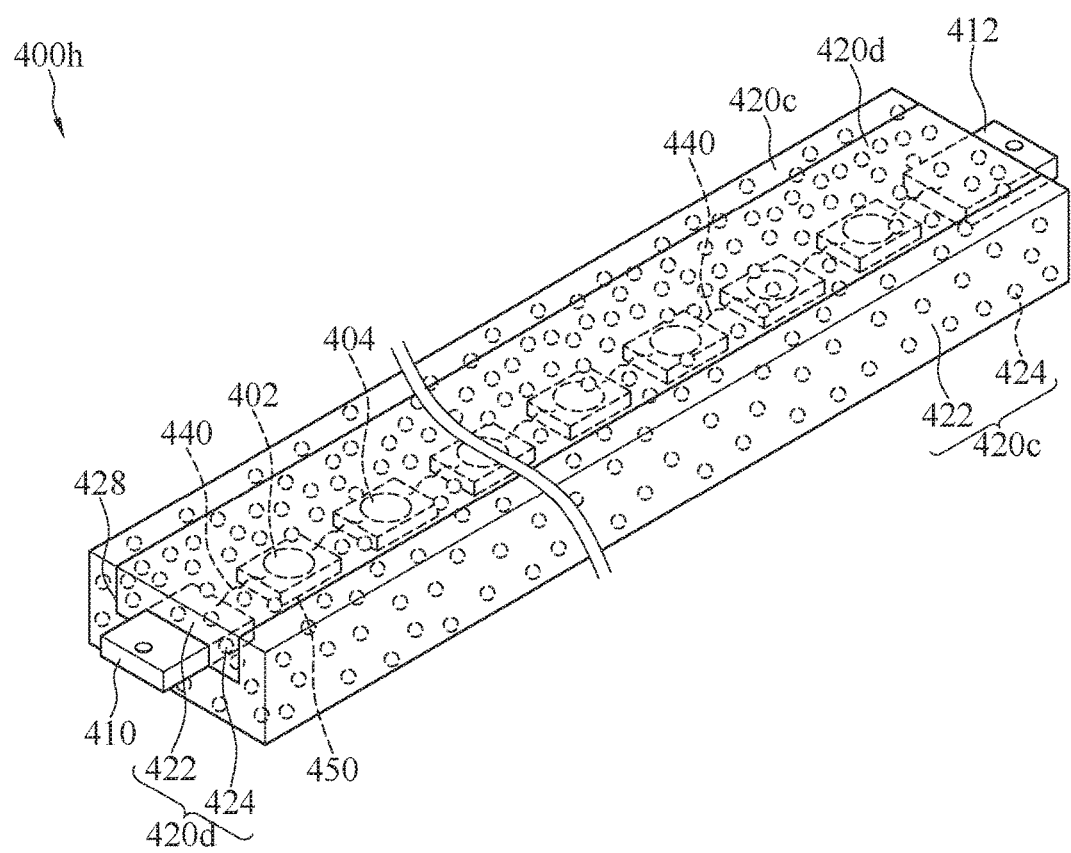
FIG. 50 illustrates a perspective view of an LED filament according to another embodiment of the present disclosure.

Please refer to FIG. 50. FIG. 50 illustrates a perspective view of an LED filament 400h according to another embodiment of the present disclosure. The LED filament 400h comprises LED chips 402, 404, conductive electrodes 410, 412, conductive wires 440 for electrically connecting the adjacent LED chips 402, 404 and conductive electrodes 410, 412, and light conversion coating 420 coating on at least two sides of the LED chips 402, 404 and the conductive electrodes 410, 412. The light conversion coating 420 exposes a portion of two of the conductive electrodes 410, 412. The light conversion coating 420 comprises a base layer 420c and a top layer 420d. The base layer 420c coats on one side of the LED chips 402, 404 and the conductive electrodes 410, 412. Furthermore, the base layer 420c is formed with a trough 428. The LED chips 402, 404 and portions of the conductive electrodes 410, 412 are disposed in the trough 428. One of the top layer 420d and the base layer 420c extends into the other one of the top layer 420d and the base layer 420c. In other words, the interface between the base layer 420c and the top layer 420d includes a three-dimensional surface for strengthening the interconnection. A portion of the LED chips 402, 404 are connected to the base layer 420c via die bond glues 450. The top layer 420d is filled in the troughs 428 and coats on the other side of the LED chips 402, 404 and the conductive electrodes 410, 412. The top layer 420d comprises an adhesive 422 and a plurality of phosphors 424. The base layer 420c comprises an adhesive 422 and a plurality of phosphors 424. The mass ratio of the phosphors 424 of the base layer 420c is less than that of the phosphors 424 of the top layer 420d since the base layer 420c requires a better flexibility, and the top layer 420d requires a better illuminating effect. The mass ratio of the phosphors 424 of the top layer 420d is substantially between 60% and 85%. The mass ratio of the phosphors 424 of the base layer 420c is substantially between 40% and 65%. In some embodiments, the conversion efficiency of the phosphors 424 of the top layer 420d is greater than that of the phosphors 424' of the base layer 420c. Under the circumstances, the top layer 420d has a better illuminating effect.

Figure 51:
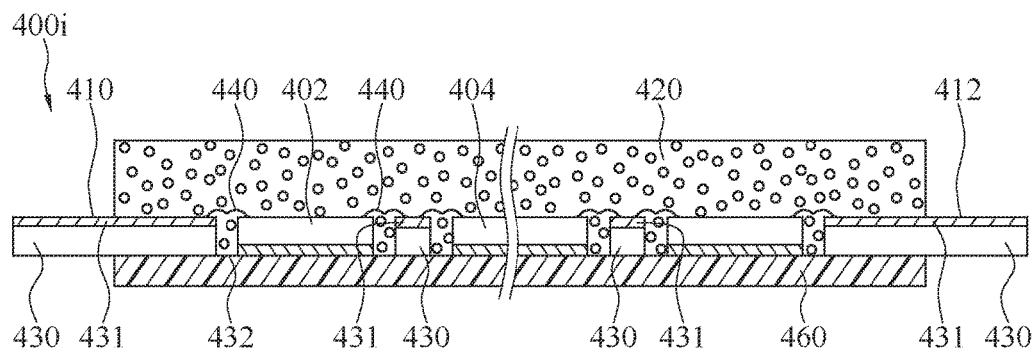
FIGS. 51 to 53 illustrate cross-sectional views of LED filament according to embodiments of the present disclosure.

Please refer to FIG. 51. FIG. 51 illustrates a cross-sectional view of an LED filament 400i according to an embodiment of the present disclosure. The LED filament 400i comprises LED chips 402, 404, conductive electrodes 410, 412 formed by two ends of a layer of conductive foil 430, conductive wires 440 for electrically connecting the adjacent LED chips 402, 404 and conductive electrodes 410, 412, light conversion coating 420 coating on at least one side of the LED chips 402, 404 and the conductive electrodes 410, 412, and an insulation substrate 460 on which the LED chips 402, 404 and conductive electrodes 410, 412 are disposed. In particular, the conductive foil 430 has a plurality of openings 432. The width of each of the openings 432 is greater than that of each of the LED chips 402, 404. The LED chips 402, 404 are individually received in the openings 432. The LED chips 402, 404 and the conductive electrodes 410, 412 are electrically connected together through conductive foil 430 and conductive wire 440. The conductive foil 430 may be, but not limited to, a copper foil coated with a silver layer 431 to increase the reflection of light.

Figure 52:
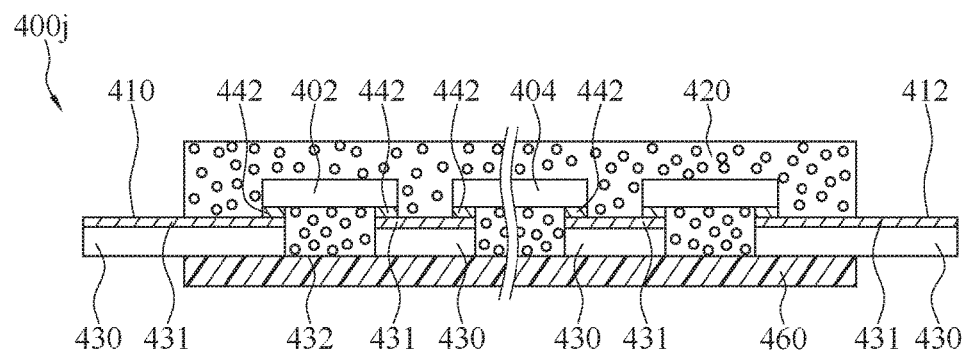

Please refer to FIG. 52. FIG. 52 illustrates a cross-sectional view of an LED filament 400j according to an embodiment of the present disclosure. The LED filament 400j can be referred to the LED filament 400i. Differences between the LED filament 400j and the LED filament 400i are that the LED chips 402, 404 of the LED filament 400j are flip chips (i.e. chip having equal-height electrodes), and the width of each of the opening 432 is less than that of each of the LED chips 402, 404. Each of the LED chips 402, 404 comprises soldering bumps 442. The LED chips 402, 404 are disposed on the conductive foil 430 respectively corresponding to the openings 432. The soldering bumps 442 of each of the LED chips 402, 404 are respectively soldered on two sides of the conductive foil 430 divided by each of the openings 432. The LED chips 402, 404 and the conductive electrodes 410, 412 are electrically connected together through conductive foil 430 without the conductive wires 440.

Figure 53:
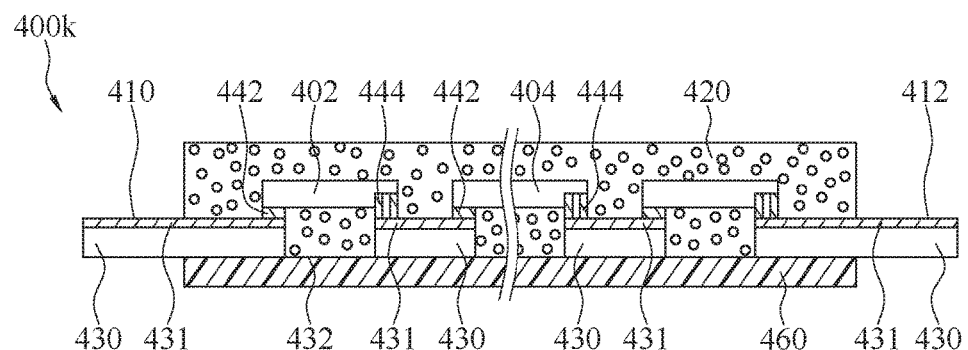

Please refer to FIG. 53. FIG. 53 illustrates a cross-sectional view of an LED filament 400k according to an embodiment of the present disclosure. The LED filament 400k can be referred to the LED filament 400j. A difference between the LED filament 400k and the LED filament 400j is that the LED chips 402, 404 of the LED filament 400k are face-up chips (i.e. chip having unequal-height electrodes). Each of the LED chips 402, 404 of the LED filament 400k comprises a soldering bump 442 and an extended bump 444. The soldering bump 442 and the extended bump 444 of each of the LED chips 402, 404 reach the same elevation, meaning that the thickness of the LED chips 402, 404 in the cross-sectional view from a side with the soldering bump 442 to another side with the extended bump 444 is identical. Each of the LED chips 402, 404 of the LED filament 400k can be aligned in a upside-down position and electrically connected to the conductive foil 430 via the soldering bump 442 and the extended bump 444. The soldering bump 442 and the extended bump 444 of each of the LED chips 402, 404 are respectively soldered on two sides of the conductive foil 430 divided by each of the openings 432. The LED chips 402, 404 and the conductive electrodes 410, 412 are electrically connected together through conductive foil 430 without the conductive wires 440.

Figure 54:
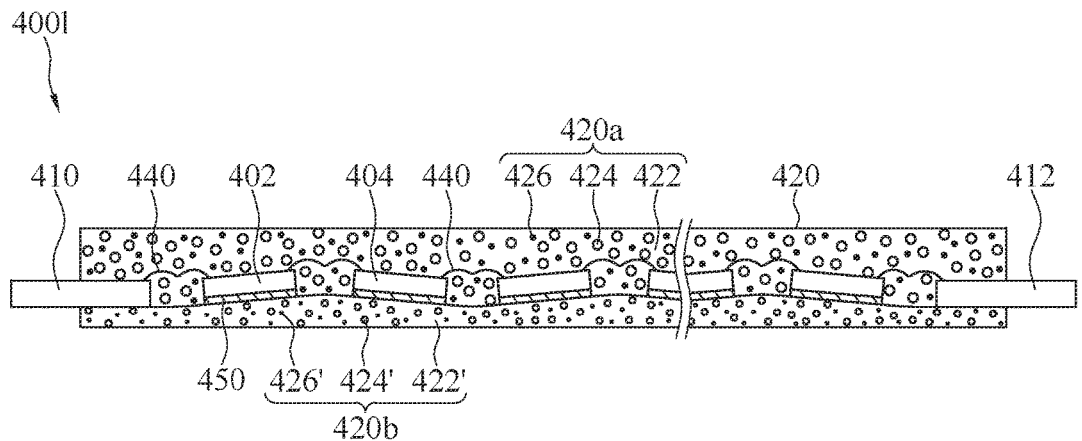

Please refer to FIG. 54. FIG. 54 illustrates a cross-sectional view of an LED filament 400l according to an embodiment of the present disclosure. The LED filament 400l can be referred to the LED filament 400a. A difference between the LED filament 400l and the LED filament 400a is regarding the alignment of the LED chips 402, 404. The LED chips 402, 404 of the LED filament 400a are aligned along a direction from the conductive electrode 410 to the conductive electrode 412 and parallel with a horizontal plane on which the base layer 420b of the LED filament 400a is laid (referring to FIG. 49A). In contrast, the LED chips 402, 404 of the LED filament 400l are not aligned along a direction from the conductive electrode 410 to the conductive electrode 412 and not parallel with a horizontal plane on which the base layer 420b of the LED filament 400l is laid (referring to FIG. 54). The LED chips 402, 404 of the LED filament 400l may respectively have different angles related to the horizontal plane. Correspondingly, the illuminating directions of the LED chips 402, 404 may be different from one another. Under the circumstances, a side of the base layer 420b of the LED filament 400l carrying the LED chips 402, 404 (or the die bond glues 450) may be not a flat plane but may be a successively concave-convex plane so that each of the LED chips 402, 404 disposed on different positions of the successively concave-convex plane have different angles, accordingly. In some embodiments, all of the LED chips 402, 404 of the LED filament 400l have angles related to the horizontal plane different from one another. Alternatively, a part of the LED chips 402, 404 of the LED filament 400l have a first angle related to the horizontal plane, and another part of LED chips 402, 404 of the LED filament 400l have a second angle related to the horizontal plane. In some embodiments, the first angle equals to 180 degrees minus the second angle. Additionally, the LED chips 402, 404 of the LED filament 400l may have different heights related to the horizontal plane. As a result, the LED filament 400l with the LED chips 402, 404 having different illuminating directions (different angles related to the horizontal plane) and/or different heights may generate a more even illumination, such as an omni-directional illumination.

Figure 55:
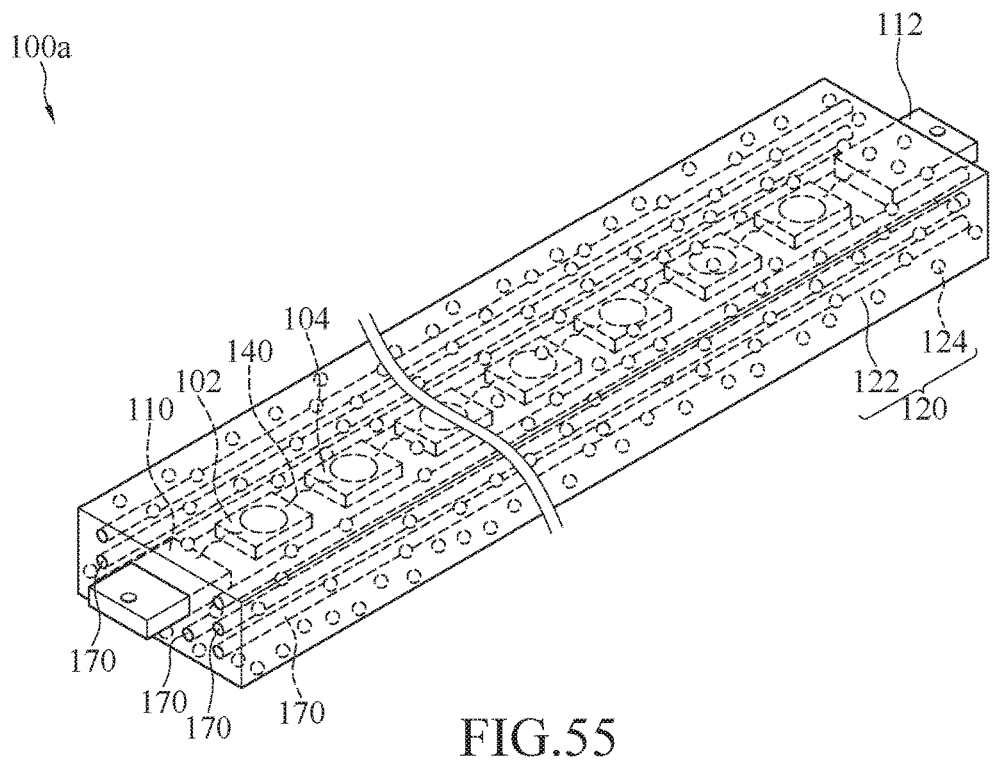
FIG. 55 illustrates a perspective view of an LED filament according to another embodiment of the present disclosure.

Please refer to FIG. 55. FIG. 55 illustrates a perspective view of an LED filament 100a according to another embodiment of the present disclosure. The LED filament 100a can be referred to the LED filament 100. A difference between the LED filament 100a and the LED filament 100 is that the LED filament 100a further comprises a plurality of auxiliary wires 170. The auxiliary wires 170 are enclosed by the light conversion coating 120. The auxiliary wires 170 extend from a side of the LED filament 100a with conductive electrode 110 to another side of the LED filament 100a with conductive electrode 112. The auxiliary wires 170 may be around the LED chips 102, 104. The auxiliary wires 170 improve the toughness of the light conversion coating 120 and reduce possibility of damage of the conductive wires 140. In some embodiments, the auxiliary wires could be made replaced from by material such as metal (e.g. copper), glass fiber, carbon nanotube, or the like. In some embodiments, the light conversion coating 120 comprises a top layer and a base layer. The top layer comprises phosphor glue layer(s) or phosphor film layer(s). The base layer comprises a flexible tempered glass of which a thickness is substantially 0.1-0.5 mm, a hardness is substantially 1H, and a percent transmittance is substantially equal to or greater than 90%.

Figure 56:
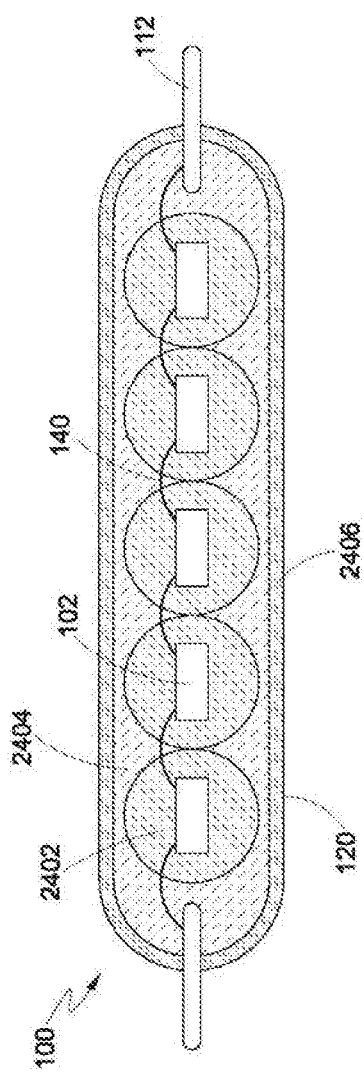
FIG. 56 is a cross sectional view of the LED filament according to an embodiment of the present enclosure.

Referring to FIG. 56, in accordance with an embodiment, the LED filament 100 configured for emitting omnidirectional light comprises a linear array of LED chips 102 operably interconnected to emit light upon energization; a conductive electrode 112; a plurality of conductive wires 140 for electrically connecting the linear array of LED chips 102 and the conductive electrode 112; and a light conversion coating 120 enclosing the linear array of LED chips 102 and the conductive electrode 112, wherein: the light conversion layer 120 includes a first phosphor glue layer 2402, a second phosphor glue layer 2404 and a transparent layer 2406; the first phosphor glue layer 2402 includes a linear series of pairwise tangent globular structures; the LED chip 102 is enclosed in a central portion of the first phosphor glue layer 2402; the transparent layer 2406 forms an external layer of the LED filament 100; and the second phosphor glue layer 2404 fills the gap between the transparent layer 2406 and the first phosphor glue layer 2402.

What is claimed is:

1. An LED filament, comprising:
a linear array of LED chips operably interconnected to emit light upon energization;
a conductive electrode;
a plurality of electrical conductors to electrically connect the linear array of LED chips and the conductive electrode; and
a light conversion coating to cover the linear array of LED chips and the plurality of electrical conductors, wherein:
the light conversion coating includes a top layer and a base layer conformally interconnected to form a unitary enclosure;
the top layer and the base layer jointly configure an uneven interface;
the linear array of LED chips is sandwiched between the top layer and the base layer; and
a first LED chip in the linear array of LED chips is guided by the uneven interface to a different angle in relation to a second LED chip in the linear array of the LED chips.

2. The LED filament in claim 1, wherein:
the plurality of electrical conductors includes a plurality of conductive wires and a plurality of conductive foils;
the top layer is coated on a first side of the linear array of LED chips and the conductive electrode;
the base layer is coated on a second side of the linear array of LED chips and the conductive electrode;
the top layer includes at least one of a phosphor glue layer and a phosphor film layer;
the top layer further includes, optionally, a transparent layer;
the base layer includes at least one of a phosphor glue layer and a phosphor film layer; and
the base layer further includes, optionally, a transparent layer.

3. The LED filament in claim 1, wherein the weight of the linear array of the LED chips is carried by the base layer.

4. The LED filament in claim 3, wherein an LED chip in the linear array of the LED chips is guided by the uneven interface to a different angle in relation to an adjacent LED chip in the linear array of the LED chips.

5. The LED filament in claim 3, wherein:
a first set of LED chips in the linear array of the LED chips are guided by the uneven interface to a first angle;
a second set of LED chips in the linear array of the LED chips are guided by the uneven interface to a second angle; and
the first angle is different from the second angle.

6. The LED filament in claim 2, further comprising:
a first portion of the LED filament for emitting light; and
a second portion of the LED filament for absorbing mechanical energy that could otherwise damage the LED filament when the LED filament is stretched or compressed, wherein:
the first portion of the LED filament includes the linear array of LED chips, the plurality of conductive wires and a first slice of the light conversion coating covering the linear array of LED chips and covering the plurality of conductive wires; and
the second portion of the LED filament includes the plurality of conductive foils and a second slice of the light conversion coating covering the plurality of conductive foils.

7. The LED filament in claim 6, wherein the first portion of the LED filament alternates with the second portion of the LED filament along an axial direction in relation to the LED filament.

8. The LED filament in claim 6, wherein the light conversion coating includes a posture maintainer such that the LED filament is capable of self-sustained plastic deformation.

9. The LED filament in claim 6, wherein the second slice of the light conversion coating includes a posture maintainer such that the LED filament is capable of self-sustained plastic deformation.

10. The LED filament in claim 9, wherein the posture maintainer includes a wire system embedded in the light conversion coating.

11. The LED filament in claim 10 wherein the wire system includes a set of straight wires extending longitudinally in the light conversion coating.

12. The LED filament in claim 9, wherein the posture maintainer includes an aperture system on a surface of the second slice of the light conversion coating where tight turns are planned for a posture the LED filament is expected to maintain.

13. The LED filament in claim 7, wherein the first portion of the LED filament is thickened.

14. The LED filament in claim 7, wherein the first portion of the LED filament includes a hardener.

15. The LED filament in claim 7, wherein a conductive wire defines an M-shape.

16. The LED filament in claim 7, wherein:
the light conversion coating includes an adhesive and a phosphor; and
a plurality of heat transfer paths is formed by adjacent and contacted phosphors.

17. The LED filament in claim 14, wherein:
the plurality of heat transfer paths defines spokes of a wheel; and
an LED chip defines a hub of the wheel.

18. The LED filament in claim 17, wherein the light conversion coating further includes an auxiliary wire extending longitudinally in the LED filament for improving toughness of the LED filament.

* * * * *